US012581893B2

(12) United States Patent (10) Patent No.: US 12,581,893 B2

Sykora et al. (45) Date of Patent: Mar. 17, 2026

(54) MODULAR FITTING ASSEMBLY AND SYSTEM INCORPORATING SAME

(71) Applicant: Ichor Systems, Inc., Fremont, CA (US)

(72) Inventors: Lukas Sykora, Wilsonville, OR (US); Stephen Carson, Woodstock, NY (US); Zachary Smith, Tucson, AZ (US)

(73) Assignee: Ichor Systems, Inc.

( * ) Notice: Subject to any disclaimer, the term of this patent is extended or adjusted under 35 U.S.C. 154(b) by 785 days.

(21) Appl. No.: 17/872,340

(22) Filed: Jul. 25, 2022

(65) Prior Publication Data

US 2023/0032252 A1 Feb. 2, 2023

Related U.S. Application Data

(60) Provisional application No. 63/352,955, filed on Jun. 16, 2022, provisional application No. 63/312,974, filed on Feb. 23, 2022, provisional application No. 63/286,168, filed on Dec. 6, 2021, provisional application No. 63/226,389, filed on Jul. 28, 2021.

(51) Int. Cl.
*F16K 27/00* (2006.01)
*F16L 41/12* (2006.01)
*H01L 21/67* (2006.01)

(52) U.S. Cl.
CPC ...... *H01L 21/67017* (2013.01); *F16K 27/003* (2013.01); *F16L 41/12* (2013.01)

(58) Field of Classification Search
None
See application file for complete search history.

(56) References Cited

U.S. PATENT DOCUMENTS

| | | | |
|---|---|---|---|
| 3,989,787 A | 11/1976 | Scott, Jr. et al. | |
| 4,042,291 A | 8/1977 | Moriyama | |
| 4,848,718 A | 7/1989 | Harrison | |
| 5,979,944 A | 11/1999 | Yokoyama et al. | |
| 6,039,360 A * | 3/2000 | Ohmi | F16K 27/003 |
| | | | 285/125.1 |

(Continued)

FOREIGN PATENT DOCUMENTS

| | | |
|---|---|---|
| CN | 110735986 A | 1/2020 |
| DE | 10238883 A1 | 3/2004 |

(Continued)

OTHER PUBLICATIONS

International Search Report and Written Opinion of PCT/US2022/38174 Issued Dec. 28, 2022.

(Continued)

*Primary Examiner* — Binu Thomas
(74) *Attorney, Agent, or Firm* — The Belles Group, P.C.

(57) ABSTRACT

Apparatuses for controlling fluid flow are important components for delivering process fluids for semiconductor fabrication. These apparatuses for controlling fluid flow frequently rely on large numbers of fitting assemblies. Fitting assemblies often require tight tolerances, requiring expensive manufacturing processes. Fitting assemblies formed as multiple components can reduce manufacturing costs. Fitting assemblies may be formed of a housing having an insert receiving cavity and an insert having a port, a seal cavity, and a tube stub. A flow path extends from the port to the tube stub to enable flow of fluid therebetween.

15 Claims, 120 Drawing Sheets

(56) References Cited

U.S. PATENT DOCUMENTS

| | | | |
|---|---|---|---|
| 6,095,790 | A | 8/2000 | Gellert et al. |
| 6,202,284 | B1 | 3/2001 | Joblin |
| 6,283,155 | B1 | 9/2001 | Vu |
| 6,520,190 | B2 | 2/2003 | Thompson et al. |
| 6,644,353 | B1 | 11/2003 | Eidsmore |
| 7,562,677 | B2 | 7/2009 | Perusek et al. |
| 7,708,923 | B1 | 5/2010 | Helicke et al. |
| 7,841,628 | B2 | 11/2010 | Tokuda et al. |
| 8,573,247 | B2 | 11/2013 | Ushigusa et al. |
| 9,683,685 | B2 | 6/2017 | Ismert |
| 10,094,497 | B2 | 10/2018 | Ogawa et al. |
| 10,167,984 | B2 | 1/2019 | Kang |
| 10,443,775 | B2 | 10/2019 | Dean et al. |
| 10,782,165 | B2 | 9/2020 | Mudd et al. |
| 2002/0060360 | A1 | 5/2002 | Sugiyama et al. |
| 2005/0224121 | A1* | 10/2005 | Milburn ................ F16K 27/003 |
| | | | 137/884 |
| 2007/0132231 | A1 | 6/2007 | Tokuda et al. |
| 2007/0267081 | A1 | 11/2007 | Perusek et al. |
| 2015/0000773 | A1 | 1/2015 | Yogo et al. |
| 2021/0125842 | A1 | 4/2021 | Iwasawa et al. |

FOREIGN PATENT DOCUMENTS

| | | | |
|---|---|---|---|
| EP | 1239203 | A1 | 9/2002 |
| EP | 2554889 | A1 | 2/2013 |
| EP | 2653794 | B1 | 6/2016 |
| WO | 2020169763 | A1 | 8/2020 |

OTHER PUBLICATIONS

Search Report in the Concurrent Singapore Application No. 11202310047X, issued on Sep. 10, 2025.

* cited by examiner

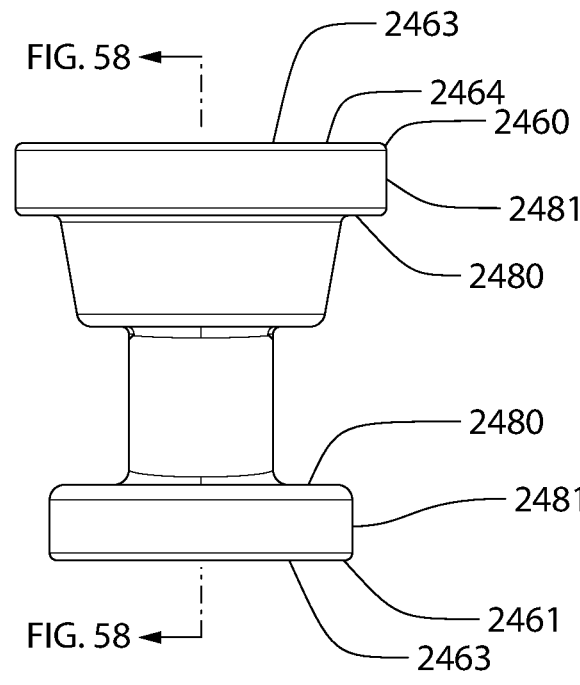
FIG. 58
2463
2464
2460
2481
2480
2480
2481
2461
FIG. 58
2463
FIG. 52
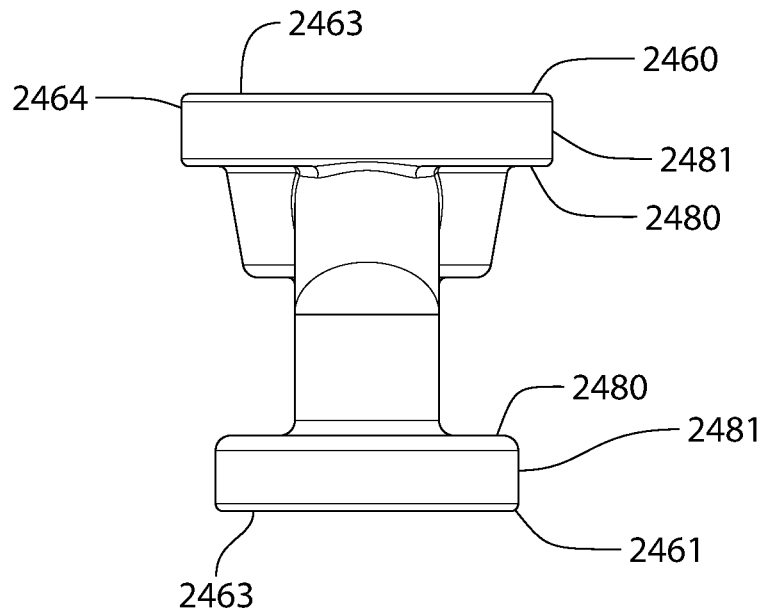
2463
2464
2460
2481
2480
2480
2481
2461
2463
FIG. 53

MODULAR FITTING ASSEMBLY AND SYSTEM INCORPORATING SAME

CROSS-REFERENCE TO RELATED APPLICATIONS

This application claims the benefit of U.S. Provisional Application 63/352,955, filed Jun. 16, 2022, U.S. Provisional Application 63/312,974, filed Feb. 23, 2022, U.S. Provisional Application 63/286,168, filed Dec. 6, 2021, and U.S. Provisional Application 63/226,389, filed Jul. 28, 2021, which are incorporated herein by reference in their entireties.

BACKGROUND OF THE INVENTION

Flow control has been one of the key technologies in semiconductor chip fabrication. Apparatuses for controlling fluid flow are important for delivering known flow rates of process fluids for semiconductor fabrication and other industrial processes. Such devices are used to measure and accurately control the flow of fluids for a variety of applications. This control relies on fitting assemblies which enable flexible configuration of components to create apparatuses for controlling fluid flow and fluid delivery modules comprising one or more apparatuses for controlling fluid flow.

As the technology of chip fabrication has improved, so has the demand on the apparatuses for controlling flow. Semiconductor fabrication processes increasingly require increased performance, including more accurate measurements, lower equipment costs, improved transient response times, and more consistency in timing in the delivery of gases. In order to improve cost of equipment and modularity of components, improved fitting assemblies are desired.

SUMMARY OF THE INVENTION

The present technology is directed to a fitting assembly for use in a mass flow controller or other gas or liquid delivery device. One or more of these gas or liquid delivery devices may be used in a wide range of processes such as semiconductor chip fabrication, solar panel fabrication, etc.

In one implementation, the invention is a system for processing articles. The system has a fluid supply configured to supply a process fluid, a process chamber configured to process articles, and a fluid delivery module. The fluid delivery module has an inlet fluidly coupled to the fluid supply, an outlet fluidly coupled to the process chamber, a flow passage extending from the inlet to the outlet, and a substrate panel. The fluid delivery module further has a first component for controlling flow, a plurality of substrate blocks, and a seal. The first component for controlling flow has a first port having a seal cavity, a second port having a seal cavity, and a first flow path extending from the first port to the second port, the first flow path forming a first portion of the flow passage. The plurality of substrate blocks includes a first substrate block, the first substrate block having a housing and an insert, the insert having a port and a second flow path extending from the port. The port has a seal cavity. The second flow path forms a second portion of the flow passage. The insert is positioned within an insert receiving cavity of the housing. The seal is positioned within the seal cavity of the first port of the first component and the seal cavity of the insert of the first substrate block. The plurality of substrate blocks are in contact with the substrate panel and the first component is coupled to the substrate panel and the first substrate block.

In another implementation, the invention is a system for processing articles. The system has a fluid supply configured to supply a process fluid, a process chamber configured to process articles, and a fluid delivery module. The fluid delivery module has an inlet fluidly coupled to the fluid supply, an outlet fluidly coupled to the process chamber, a flow passage extending from the inlet to the outlet, and a substrate panel. The fluid delivery module further has a first component for controlling flow, a plurality of substrate blocks, and a seal. The first component for controlling flow has a housing having an insert receiving cavity, an insert located within the insert receiving cavity. The insert has a first port, the first port having a seal cavity. The first component further has a second port having a seal cavity and a first flow path extending from the first port to the second port, the flow path forming a first portion of the flow passage. The plurality of substrate blocks includes a first substrate block having a seal cavity and a second flow path, the second flow path forming a second portion of the flow passage. The seal is positioned within the seal cavity of the first port of the first component and the seal cavity of the first substrate block. The plurality of substrate blocks are in contact with the substrate panel and the first component is coupled to the substrate panel and the first substrate block.

In yet another implementation, the invention is a fitting assembly, the fitting assembly having a housing and an insert. The housing has an insert receiving cavity, a seal surface, and a mounting surface. The insert receiving cavity has an entry portion and an insert portion. The insert has a port, a flow path extending from the port, the port comprising a seal cavity and a distal surface. The insert is positioned within insert receiving cavity. The distal surface of the port extends beyond the seal surface of the housing.

In another implementation, the invention is a fitting assembly, the fitting assembly having a housing and an insert. The housing has an insert receiving cavity, a seal surface, and a mounting surface. The insert has a first port, a second port, and a flow path extending from the first port to the second port, the first and second ports each having a seal cavity and a distal surface. The insert is positioned within the insert receiving cavity.

In yet another implementation, the invention is a fluid flow component, the fluid flow component having a housing and an insert. The housing has an insert receiving cavity. The insert is located within the insert receiving cavity and has a first port, a second port, and a component port. The first port has a seal cavity, the second port has a seal cavity, and a flow path extends from the first port to the second port. The component port is fluidly coupled to the flow path between the first port and the second port. An upper component assembly is fluidly coupled to the component port.

In another implementation, the invention is a system for processing articles. The system has a fluid supply configured to supply a process fluid, a process chamber configured to process articles, and a fluid delivery module. The fluid delivery module has an inlet fluidly coupled to the fluid supply, an outlet fluidly coupled to the process chamber, a flow passage extending from the inlet to the outlet, and a substrate panel. The fluid delivery module further has a first component for controlling flow, a second component for controlling flow, and a first seal. The first component for controlling flow has a housing having an insert receiving cavity, an insert located within the insert receiving cavity. The insert has a first port and a second port, the first port and the second port each having a seal cavity. A first flow path extends from the first port to the second port, the first flow path forming a first portion of the flow passage. The second component for controlling flow has a housing having an insert receiving cavity, an insert located within the insert receiving cavity. The insert has a first port and a second port, the first port and the second port each having a seal cavity. A second flow path extends from the first port to the second port, the second flow path forming a second portion of the flow passage. The first seal is positioned within the seal cavity of the second port of the first component and the seal cavity of the first port of the second component.

In yet another implementation, the invention is a fluid flow component having a fitting assembly, an upper component assembly, a sensor, and a sensor bracket. The fitting assembly has a housing and an insert, the insert having a first port and a component port. The upper component assembly is coupled to the fitting assembly and fluidly coupled to the component port, the upper component assembly having an upper housing and a piston within the upper housing. The sensor is configured to sense a state of the piston. The sensor bracket is coupled to the upper housing, the sensor coupled to the sensor bracket.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein:

FIG. 52 is a front view of the insert of the fluid flow component of FIG. 25.

FIG. 53 is a rear view of the insert of the fluid flow component of FIG. 25.

FIG. 61 is a perspective view of the sensor bracket of the fluid flow component of FIG. 59.

FIG. 62 is a detail view of the fluid flow component of FIG. 59 with the sensor and sensor bracket removed.

FIG. 63 is a cross-sectional view of a portion of the fluid flow component, sensor, and sensor bracket of FIG. 60, taken along line 63-63.

FIG. 64 is a perspective view of another embodiment of a fluid flow component according to the present invention.

FIG. 65 is a bottom perspective view of the fluid flow component of FIG. 64.

FIG. 66 is a cross-sectional view of the fluid flow component of FIG. 64, taken along line 66-66.

FIG. 67 is a perspective view of a fitting assembly of the fluid flow component of FIG. 64, the fitting assembling comprising a housing and an insert.

FIG. 68 is a bottom perspective view of the fitting assembly of the fluid flow component of FIG. 64.

FIG. 69 is a perspective view of a first portion of the housing of the fitting assembly of FIG. 67.

FIG. 70 is a bottom perspective view of the first portion of the housing of the fitting assembly of FIG. 67.

FIG. 71 is a perspective view of a second portion of the housing of the fitting assembly of FIG. 67.

FIG. 72 is a bottom perspective view of the second portion of the housing of the fitting assembly of FIG. 67.

Figure 67:
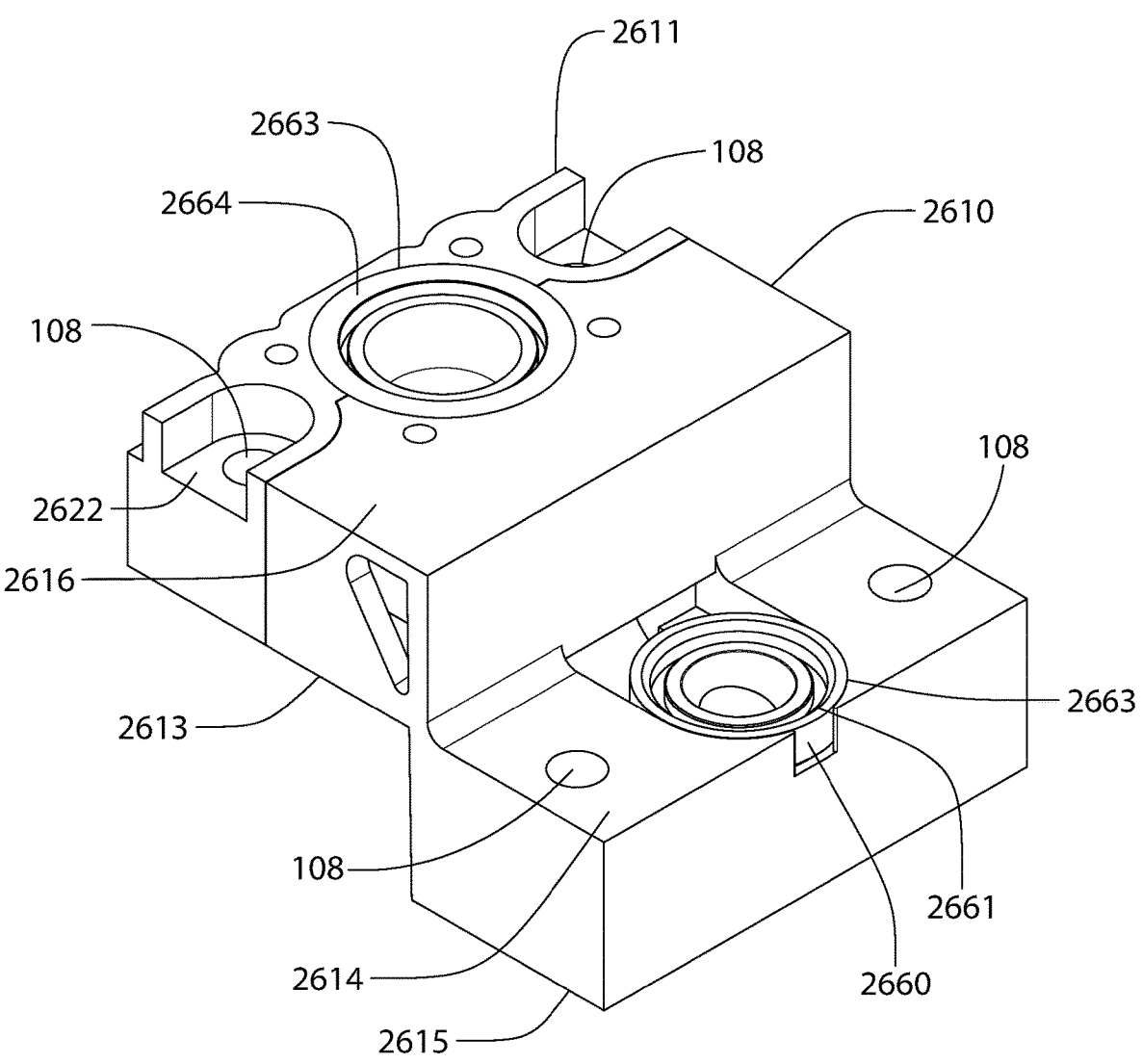
Figure 68:
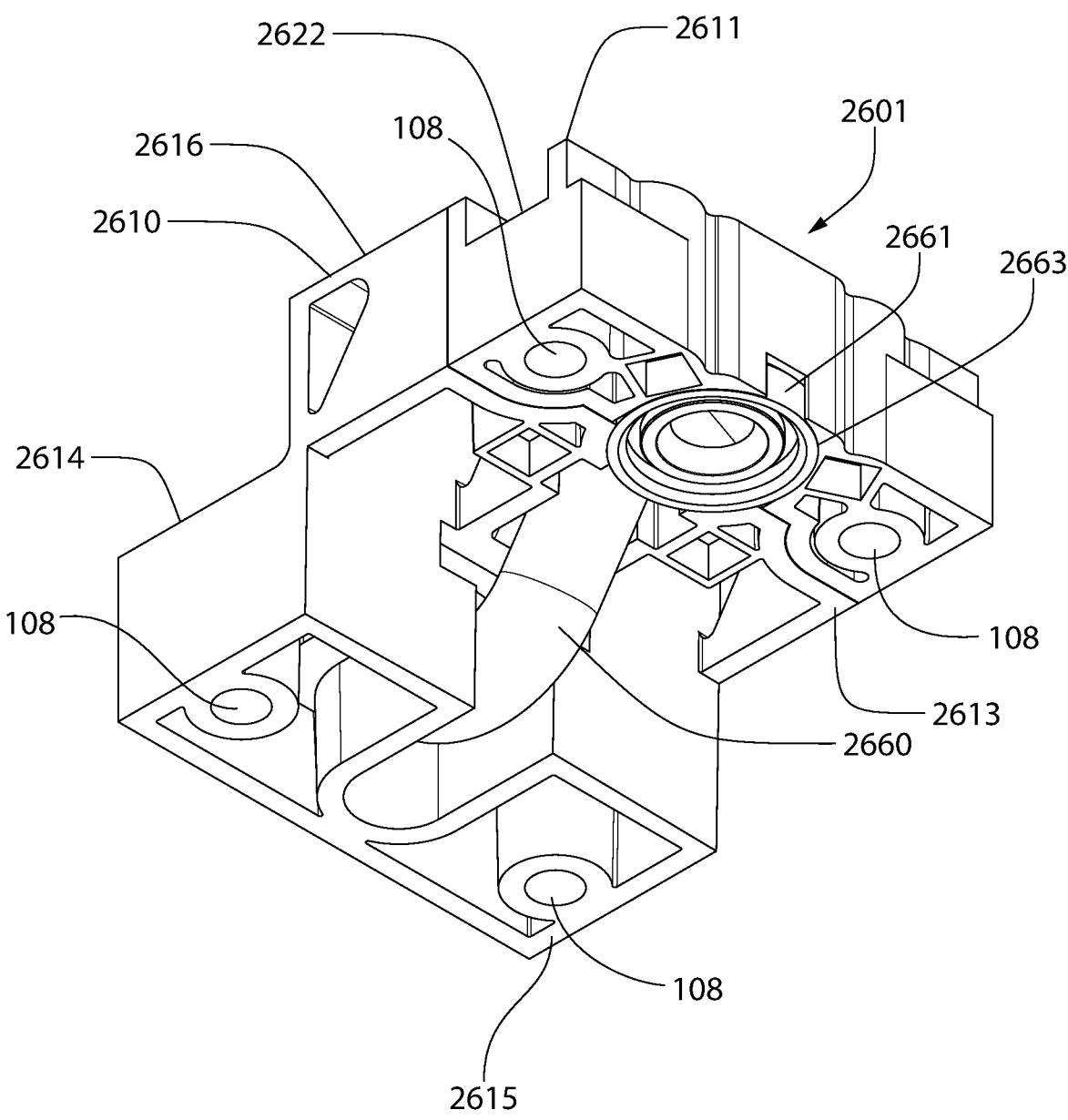
Figure 73:
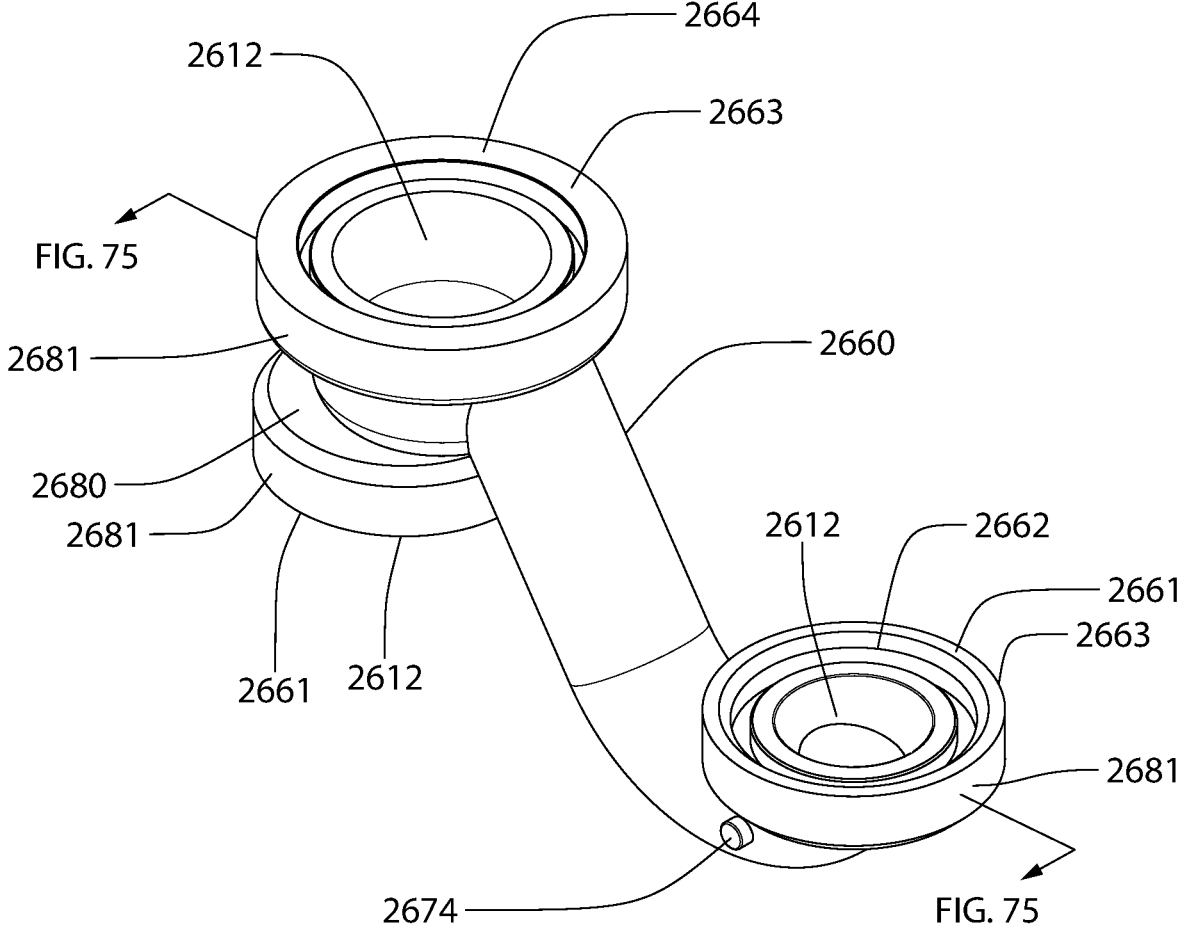

FIG. 73 is a perspective view of the insert of the fitting assembly of FIG. 67.

Figure 74:
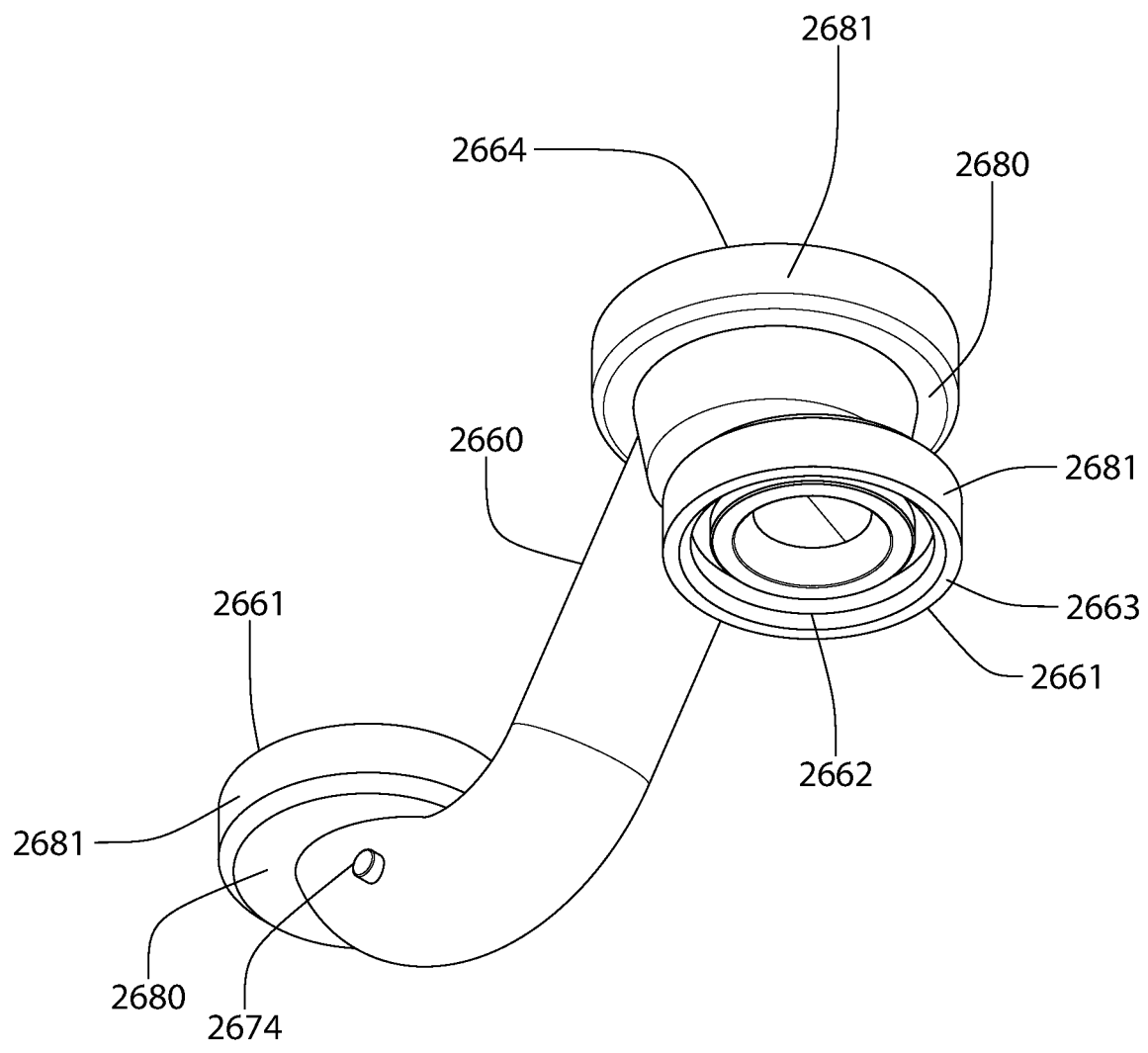

FIG. 74 is a bottom perspective view of the insert of the fitting assembly of FIG. 67.

Figure 75:
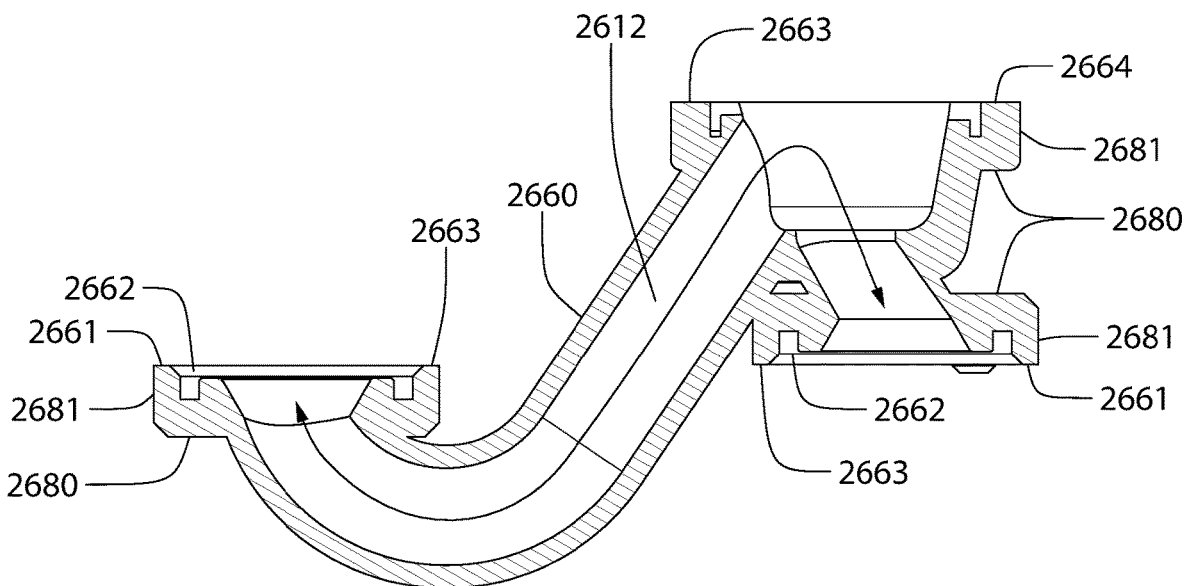

FIG. 75 is a cross-sectional view of the insert of FIG. 73, taken along line 75-75.

Figure 76:
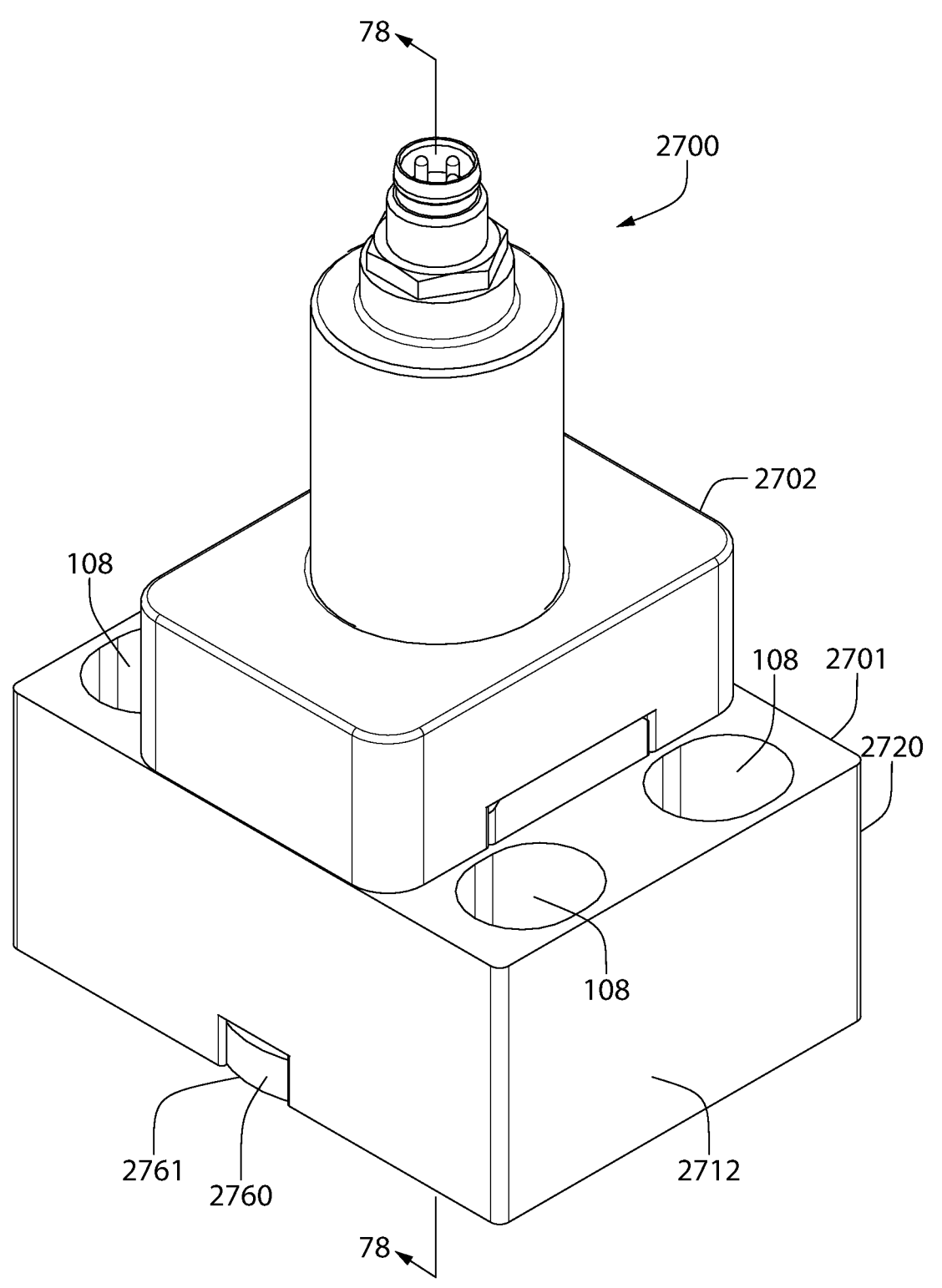

FIG. 76 is a perspective view of another embodiment of a fluid flow component according to the present invention.

Figure 77:
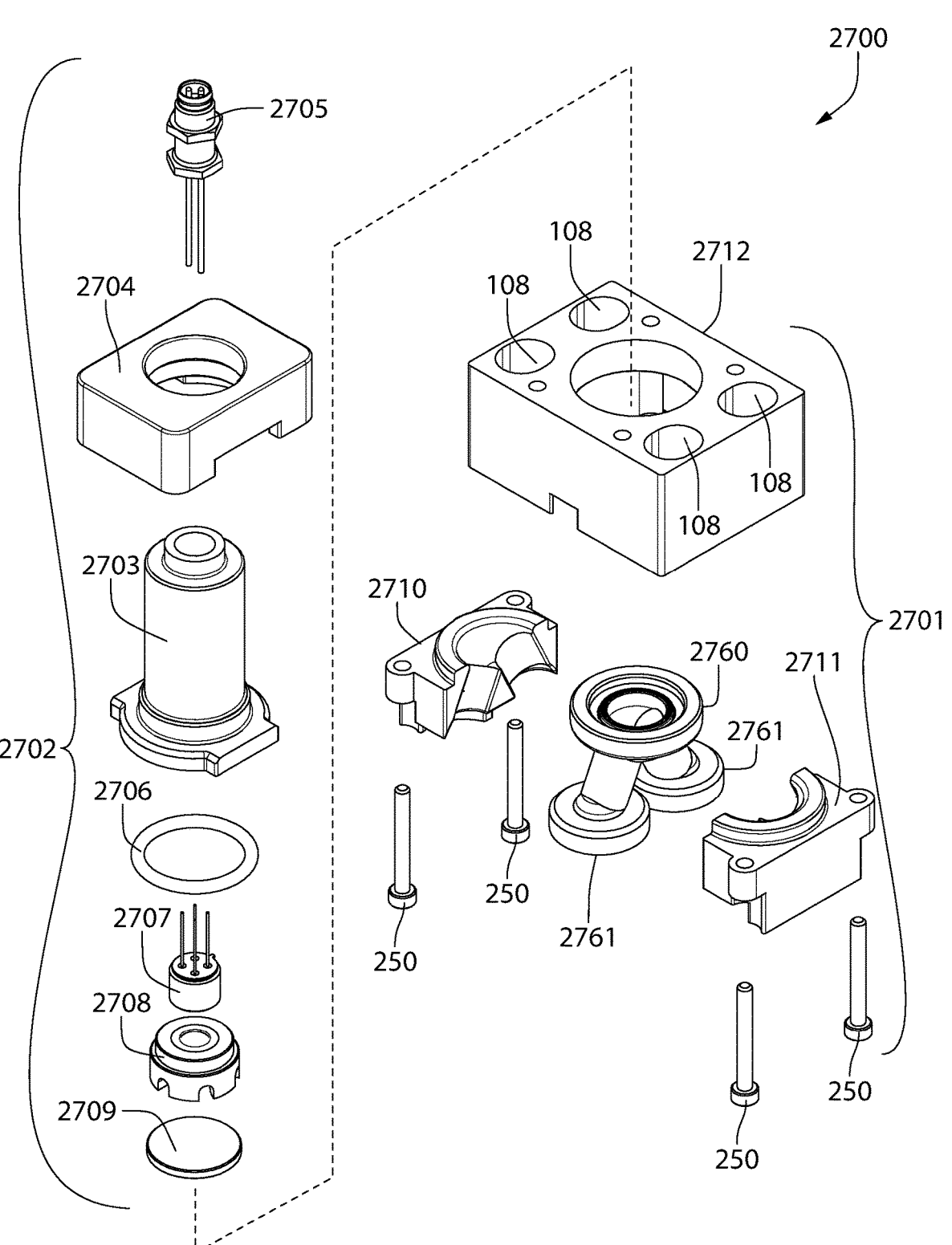

FIG. 77 is an exploded perspective view of the fluid flow component of FIG. 76.

Figure 78:
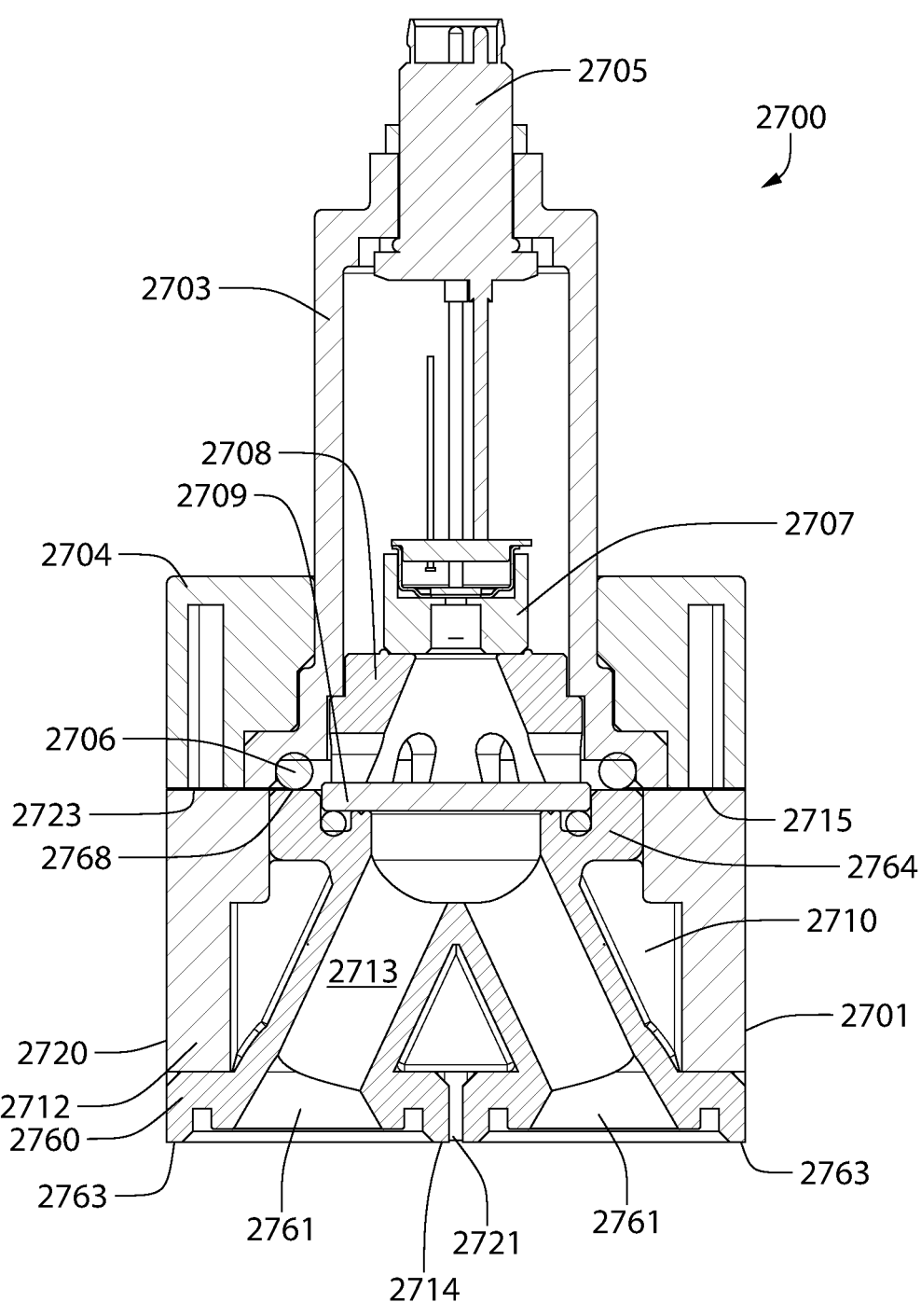

FIG. 78 is a cross-sectional view of the fluid flow component of FIG. 76, taken along line 78-78.

Figure 79:
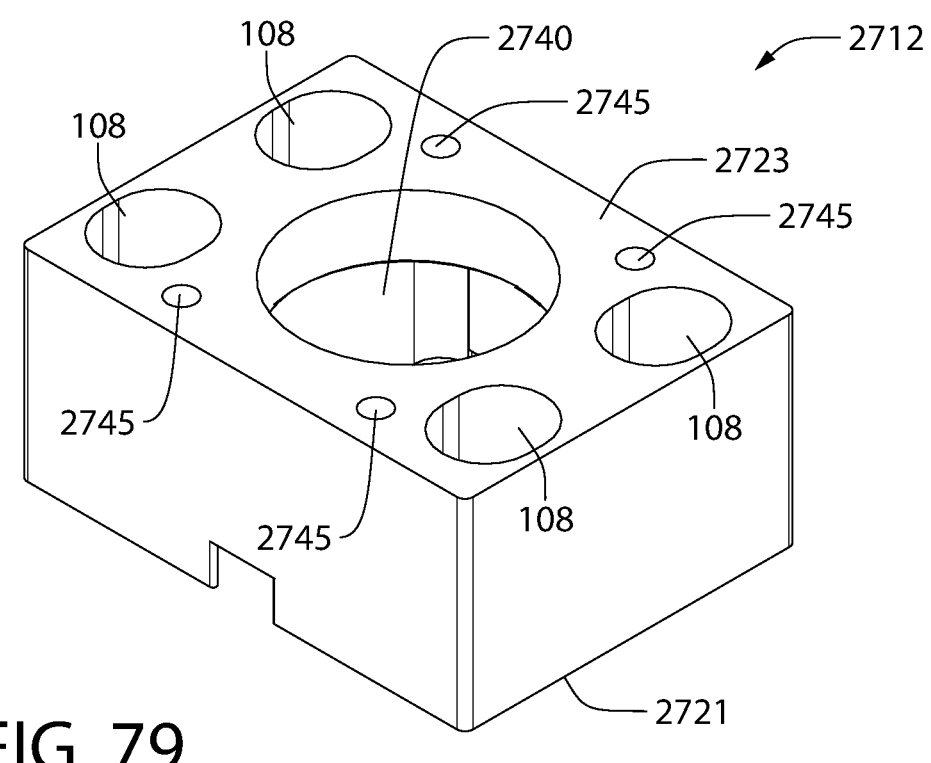

FIG. 79 is a perspective view of a base portion of a housing of the fluid flow component of FIG. 76.

Figure 80:
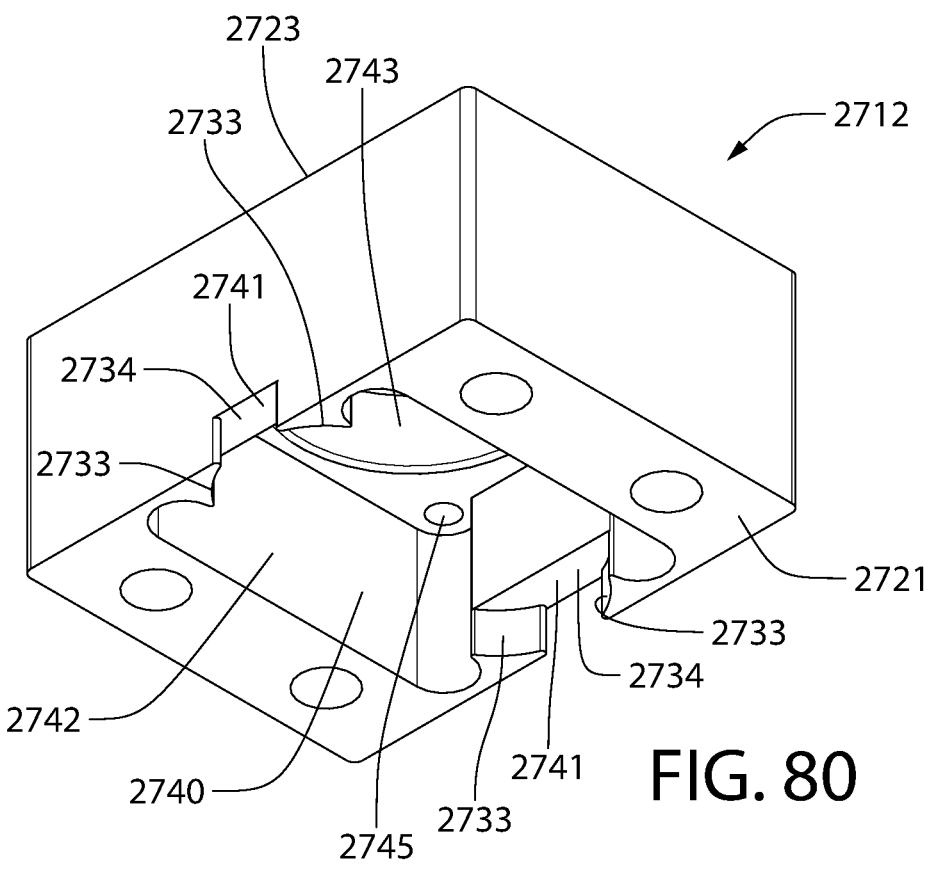

FIG. 80 is a bottom perspective view of the base portion of the housing of the fluid flow component of FIG. 76.

Figures 81, 82:
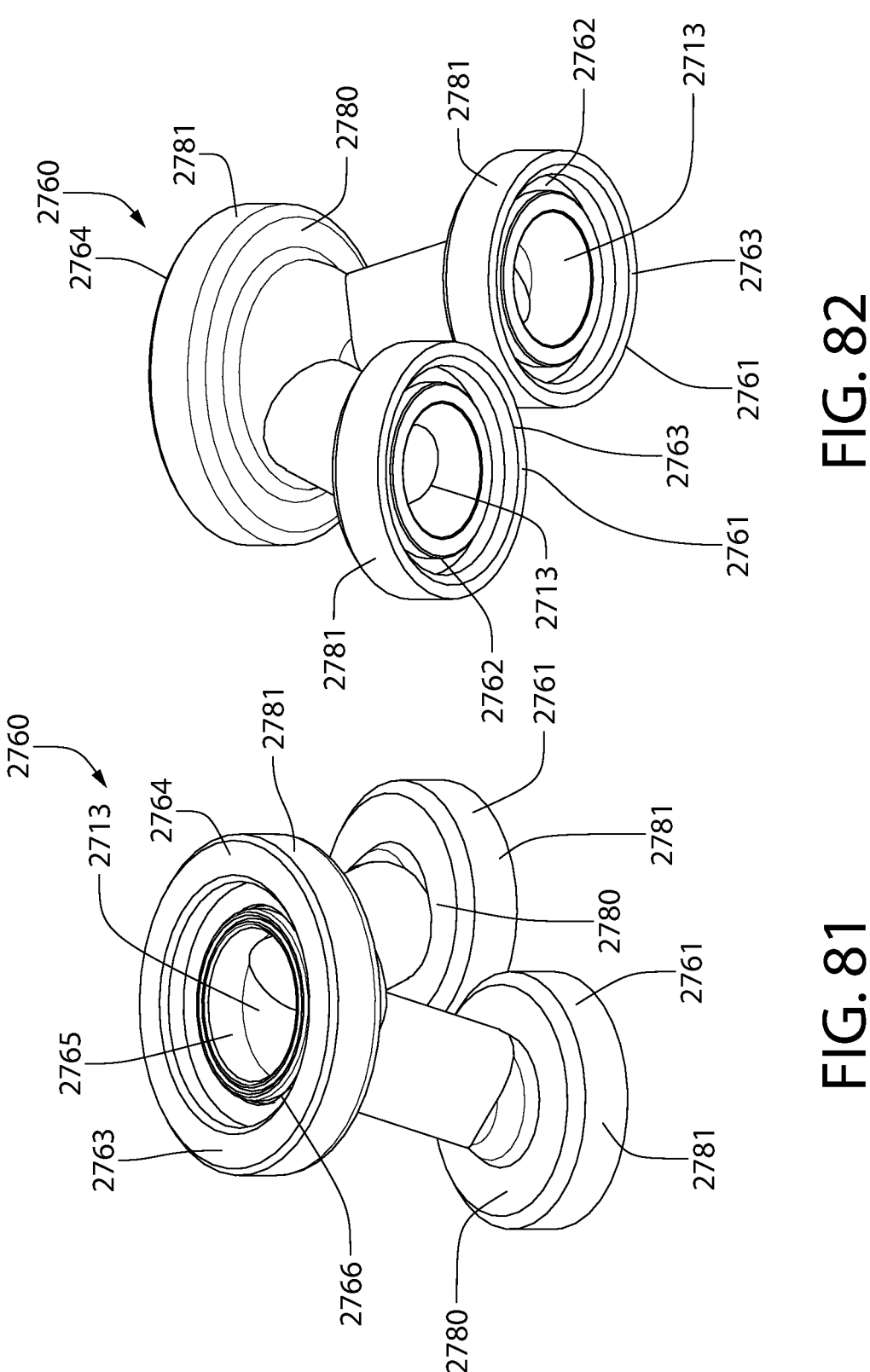

FIG. 81 is a perspective view of an insert of the housing of the fluid flow component of FIG. 76.

FIG. 82 is a bottom perspective view of the insert of the housing of the fluid flow component of FIG. 76.

Figures 83, 84:
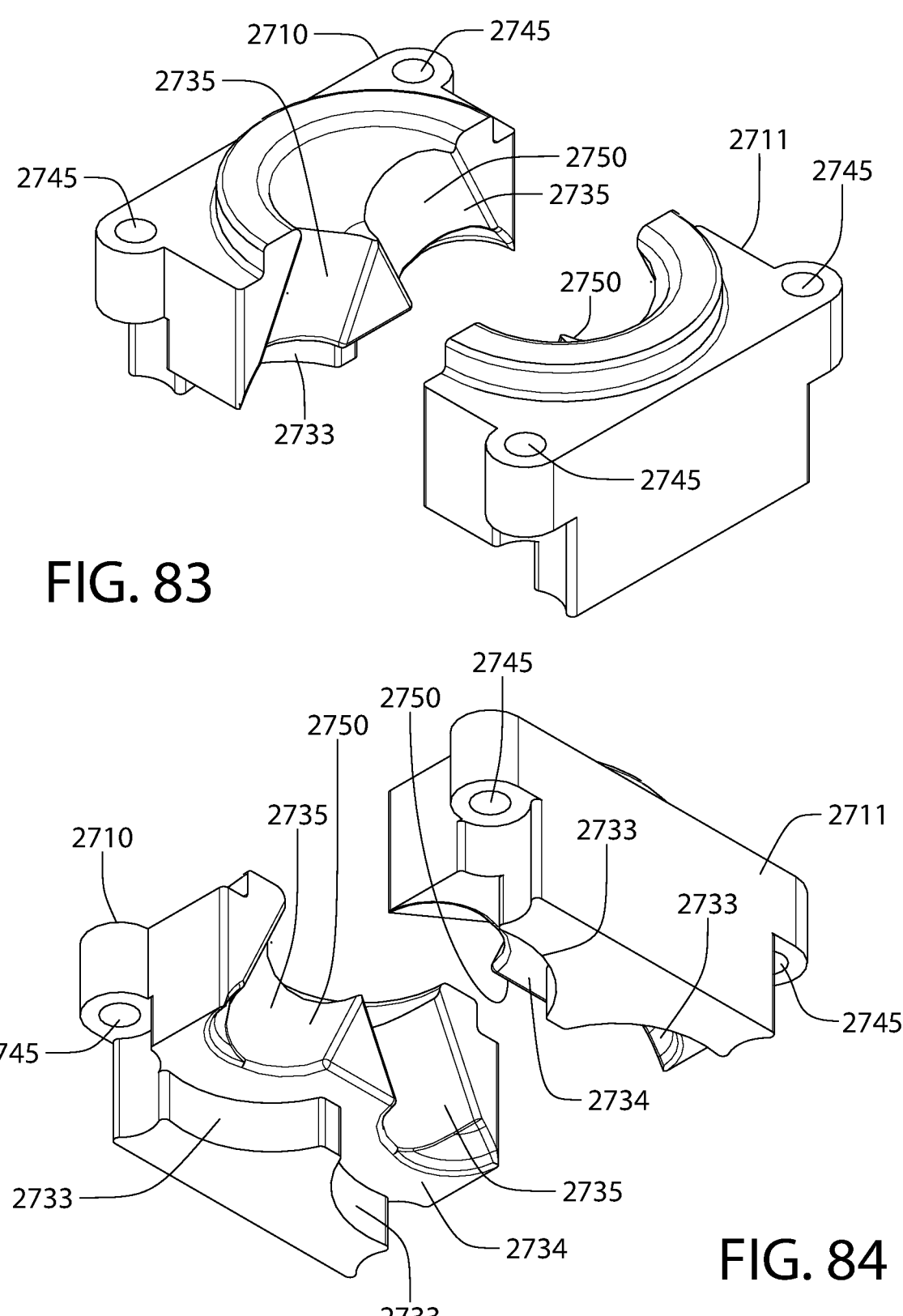

FIG. 83 is a perspective view of first and second portions of the housing of the fluid flow component of FIG. 76.

FIG. 84 is a bottom perspective view of the first and second portions of the housing of the fluid flow component of FIG. 76.

Figure 85:
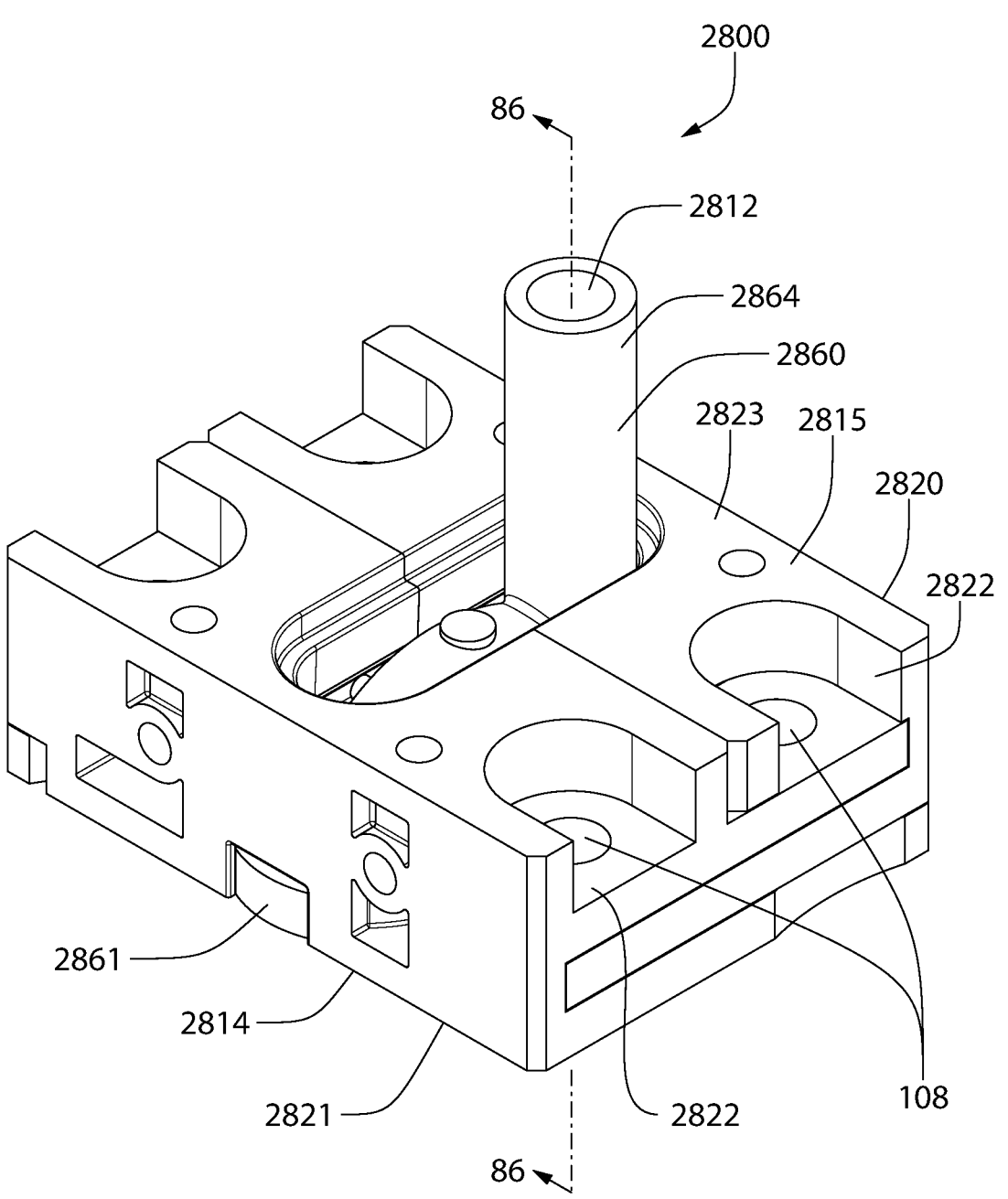

FIG. 85 is a perspective view of an embodiment of a fitting assembly of the present invention, the fitting assembly having an insert and a housing.

Figure 86:
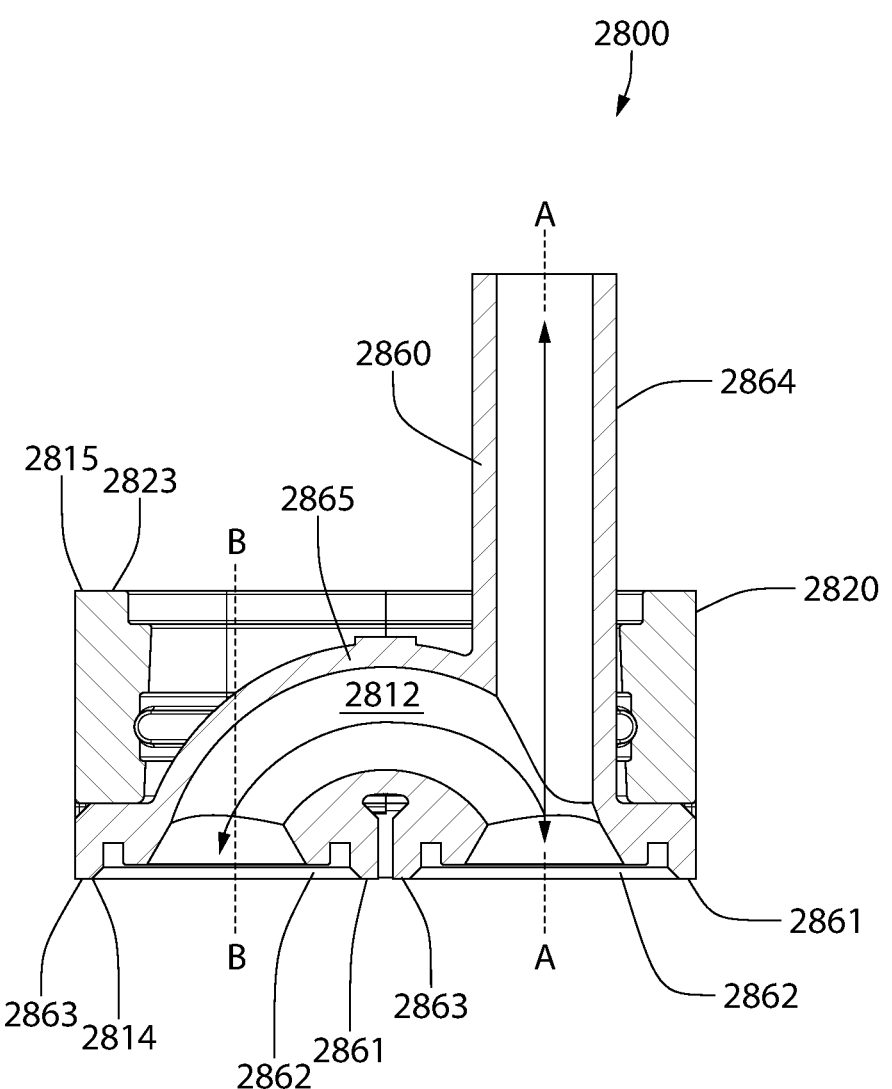

FIG. 86 is a cross-sectional view of the fitting assembly of FIG. 85, taken along line 86-86.

Figure 87:
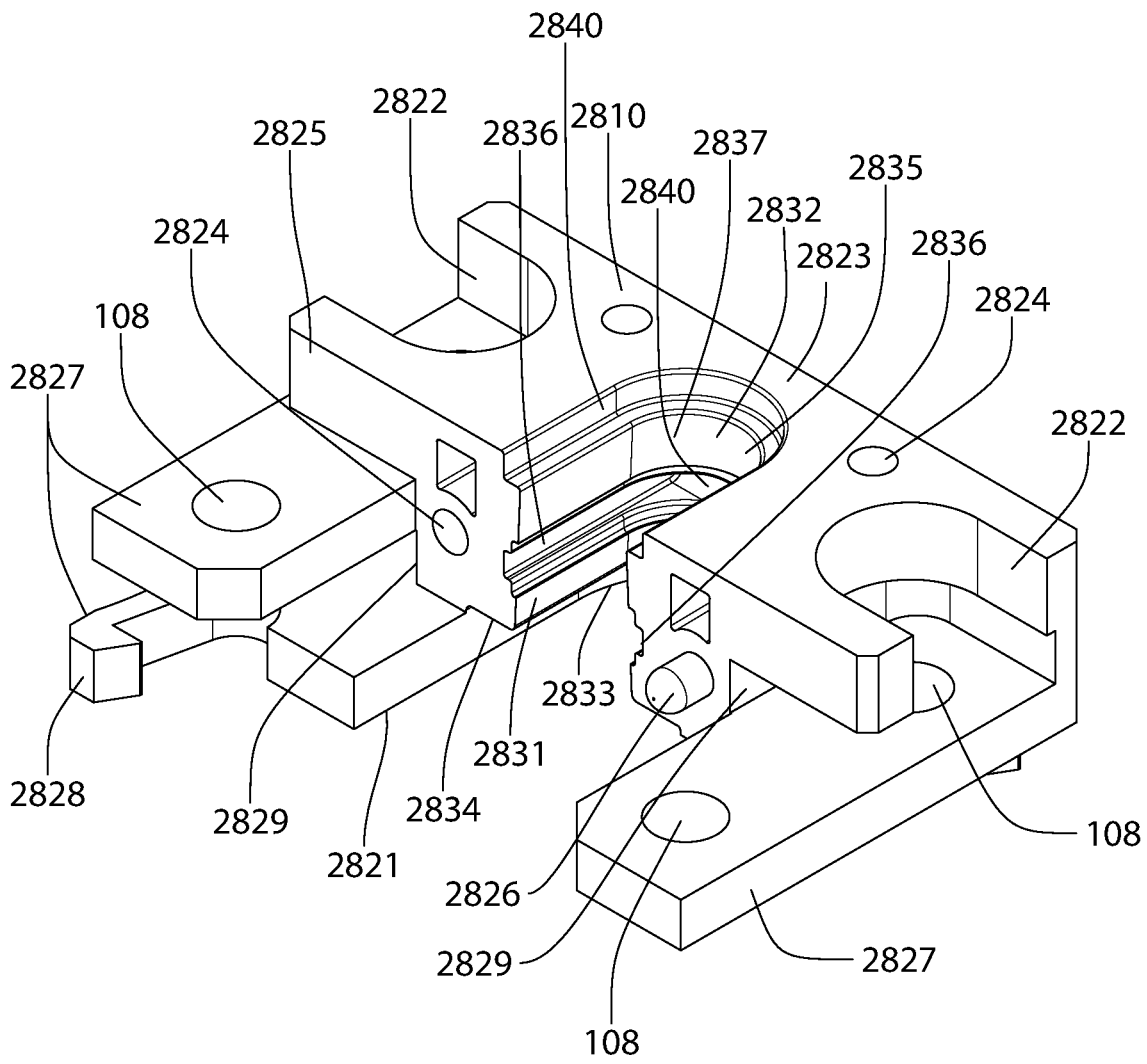

FIG. 87 is a top perspective view of a portion of the housing of the fitting assembly of FIG. 85.

Figure 88:
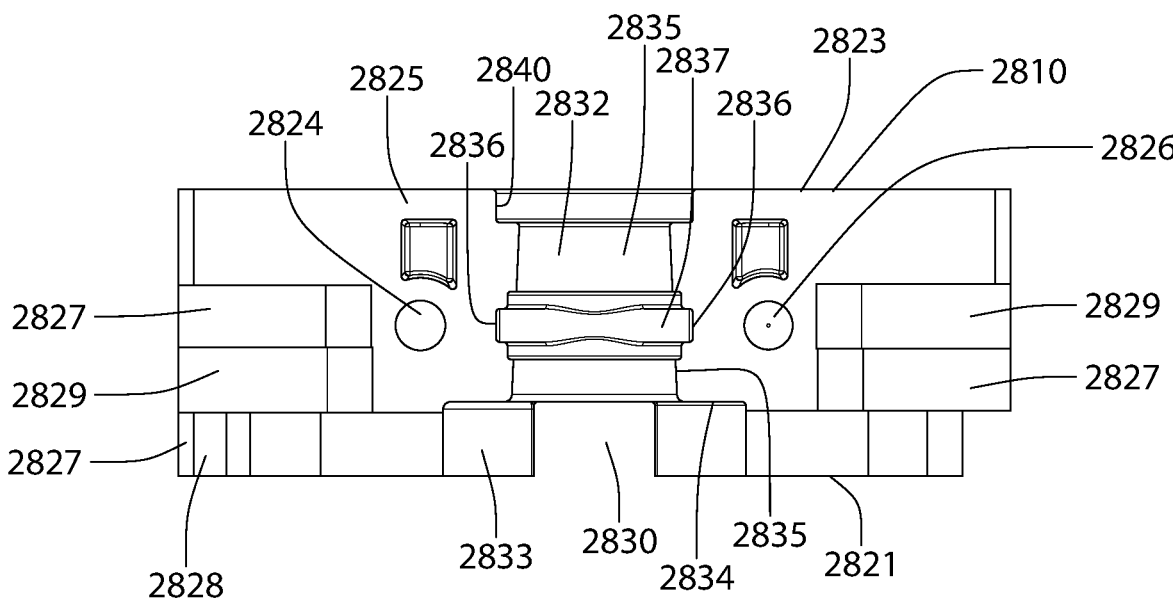

FIG. 88 is a front view of the portion of the housing of FIG. 87.

Figure 89:
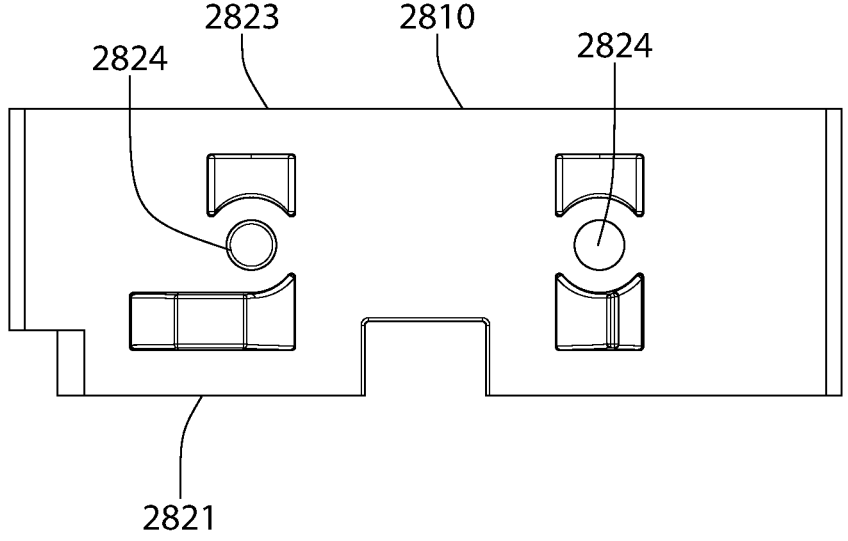

FIG. 89 is a rear view of the portion of the housing of FIG. 87.

Figure 90:
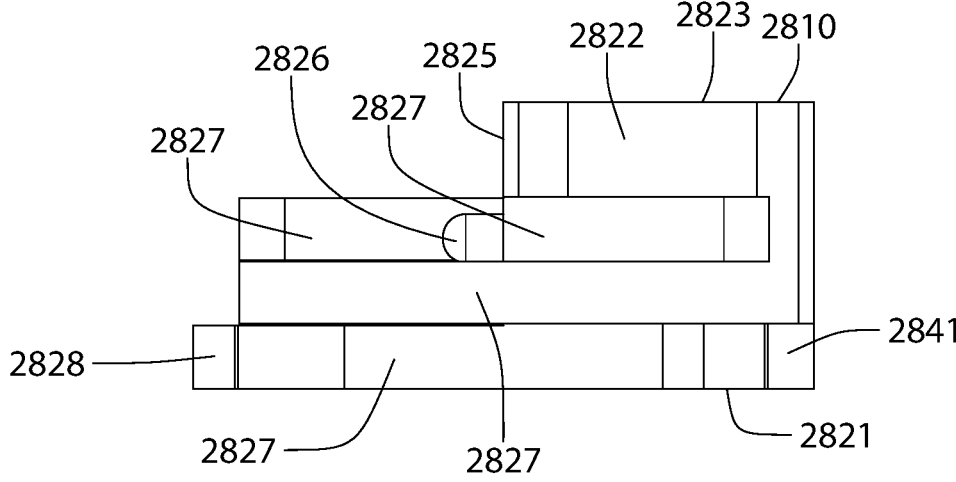

FIG. 90 is a right side view of the portion of the housing of FIG. 87.

Figure 91:
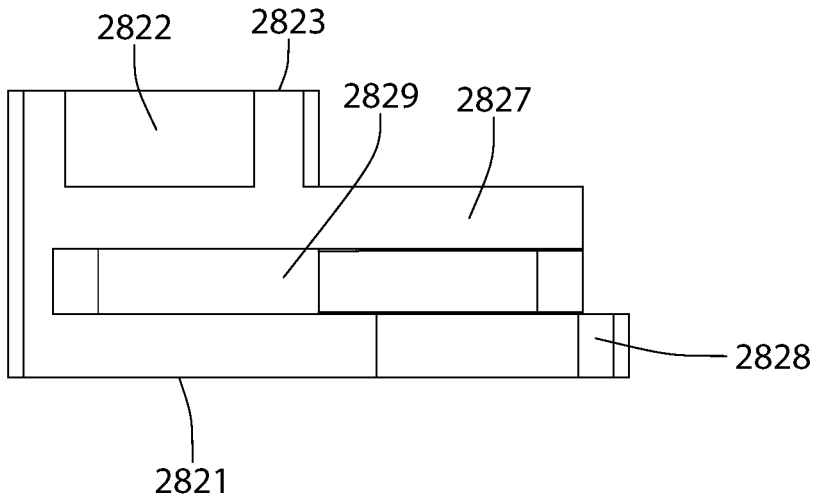

FIG. 91 is a left side view of the portion of the housing of FIG. 87.

Figures 92, 93:
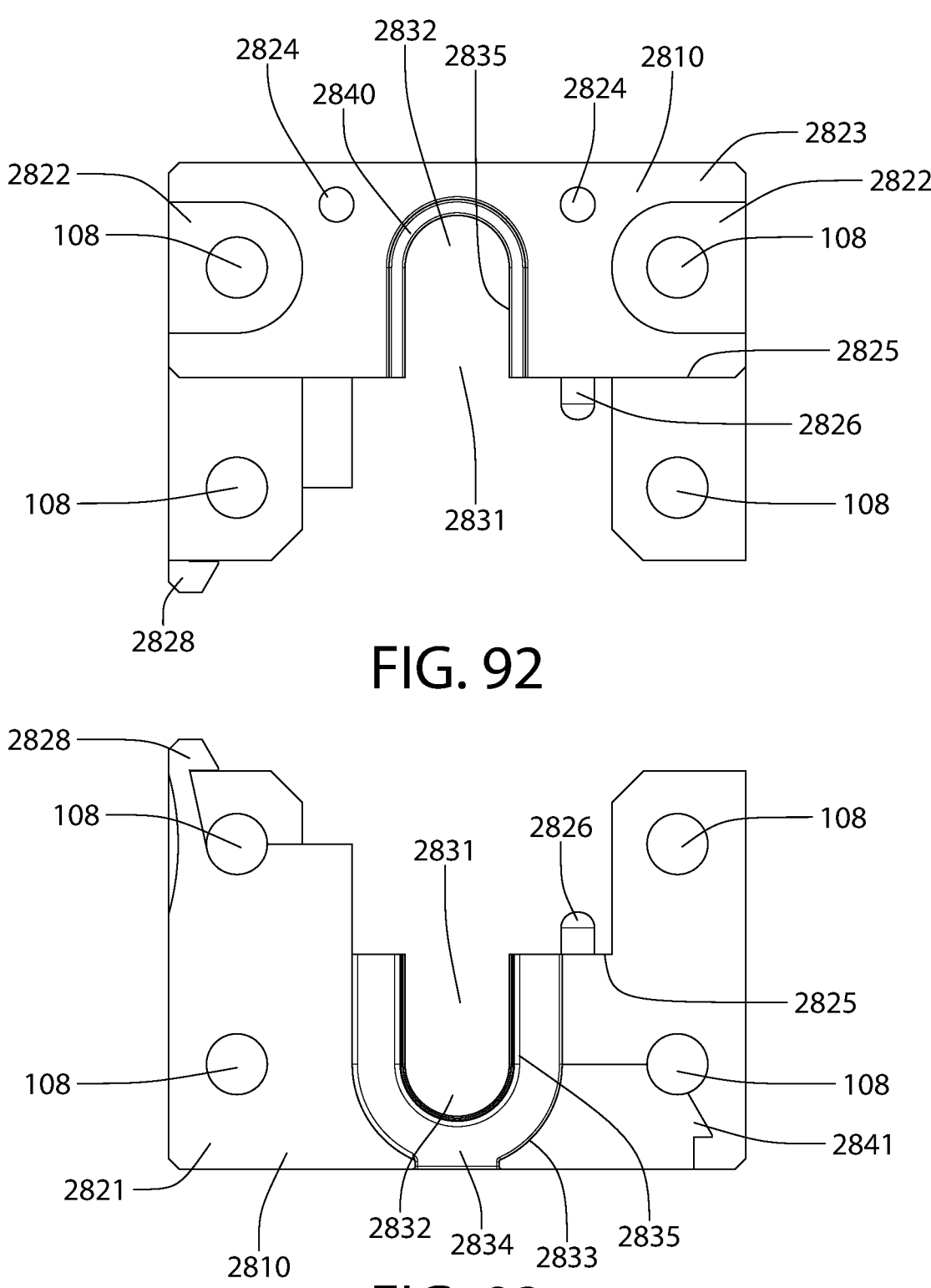

FIG. 92 is a top view of the portion of the housing of FIG. 87.

FIG. 93 is a bottom view of the portion of the housing of FIG. 87.

Figure 94:
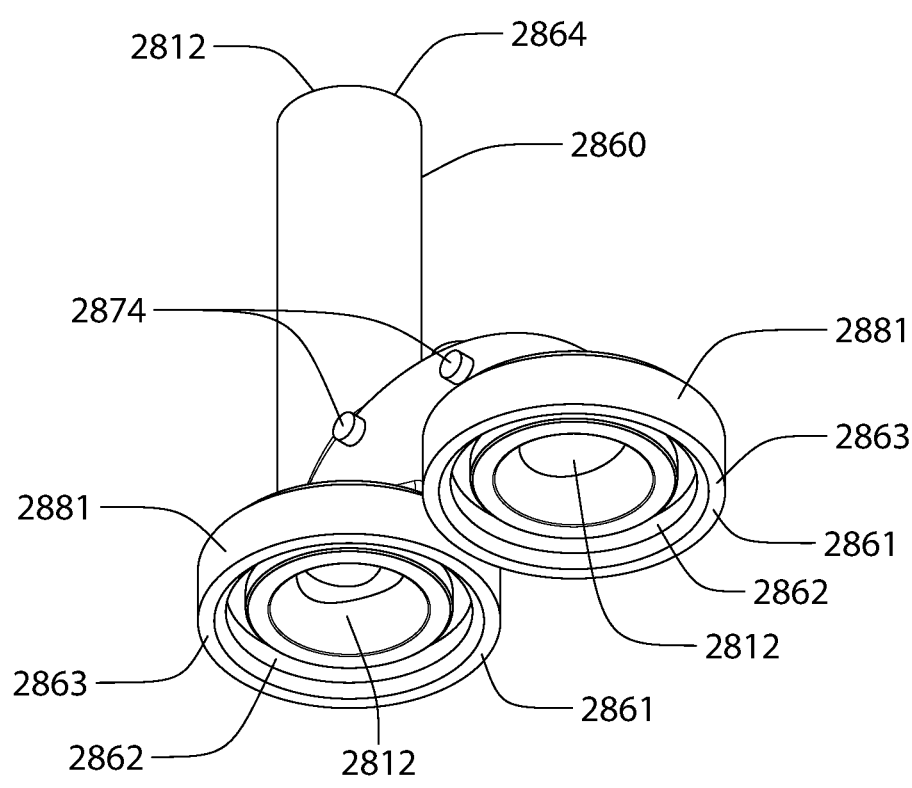

FIG. 94 is a bottom perspective view of an insert of the fitting assembly of FIG. 85.

Figure 95:
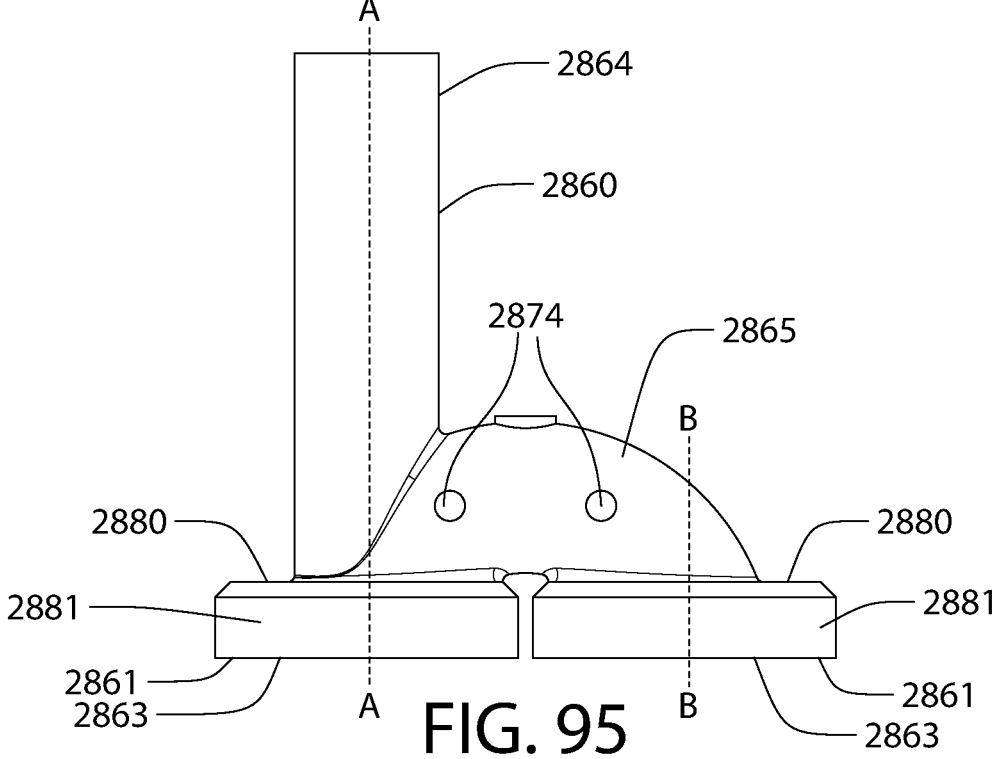

FIG. 95 is a front view of the insert of FIG. 94.

Figure 96:
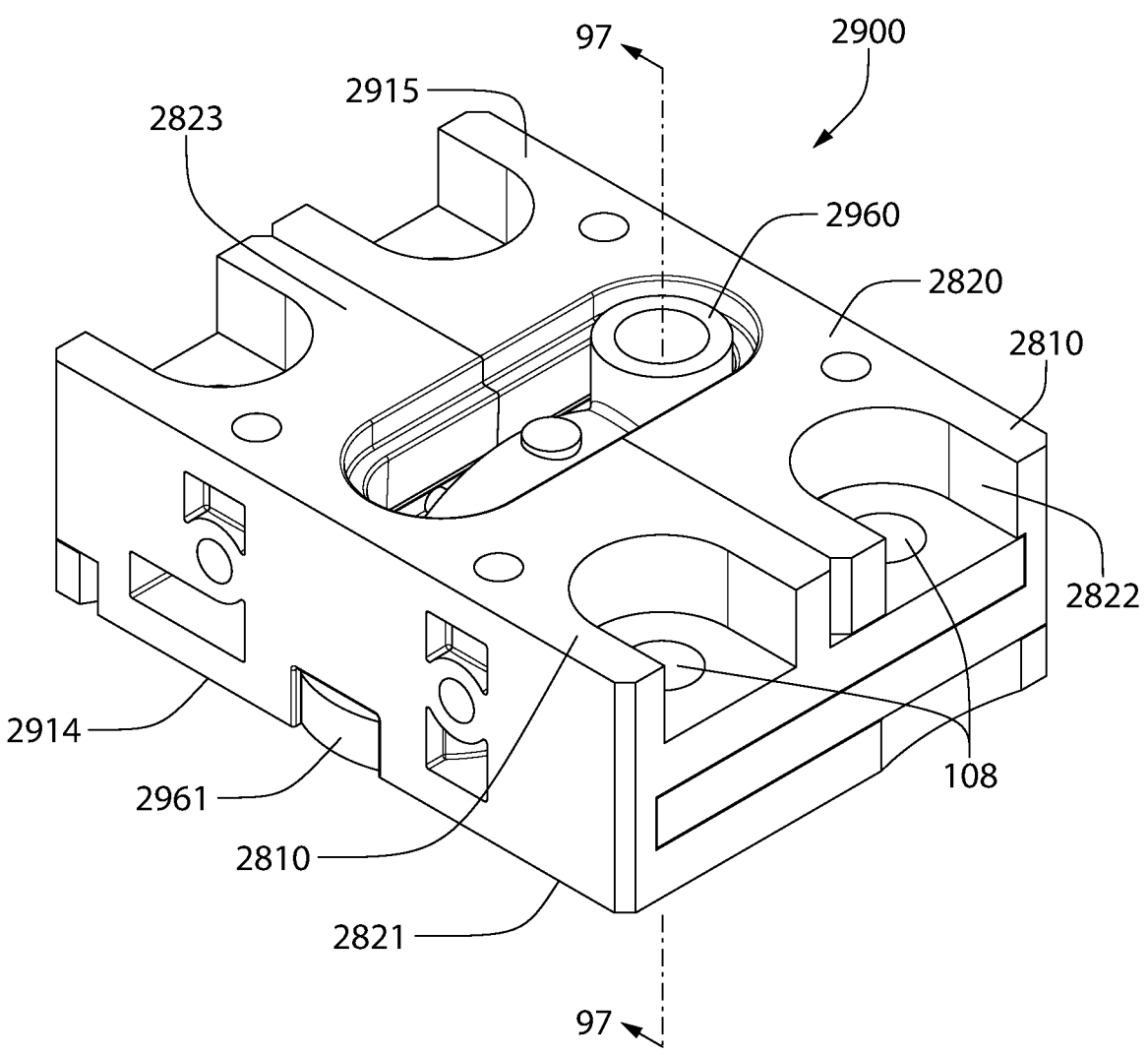

FIG. 96 is a perspective view of an embodiment of a fitting assembly of the present invention, the fitting assembly having an insert and a housing.

Figure 97:
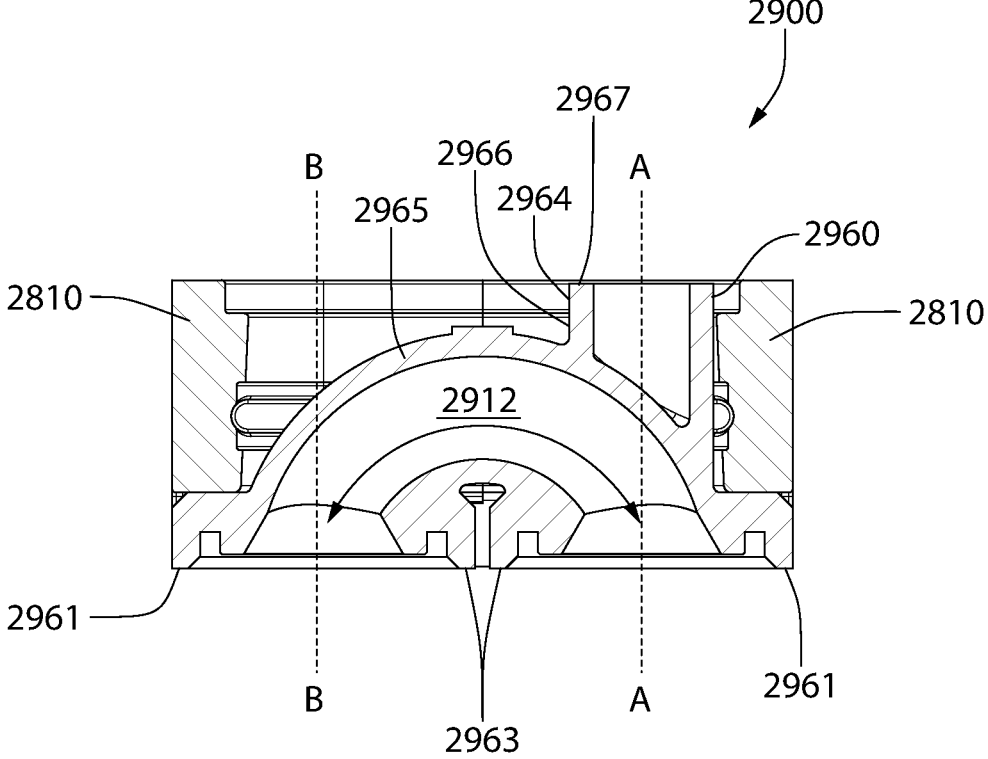

FIG. 97 is a cross-sectional view of the fitting assembly of FIG. 96, taken along line 97-97.

Figure 98:
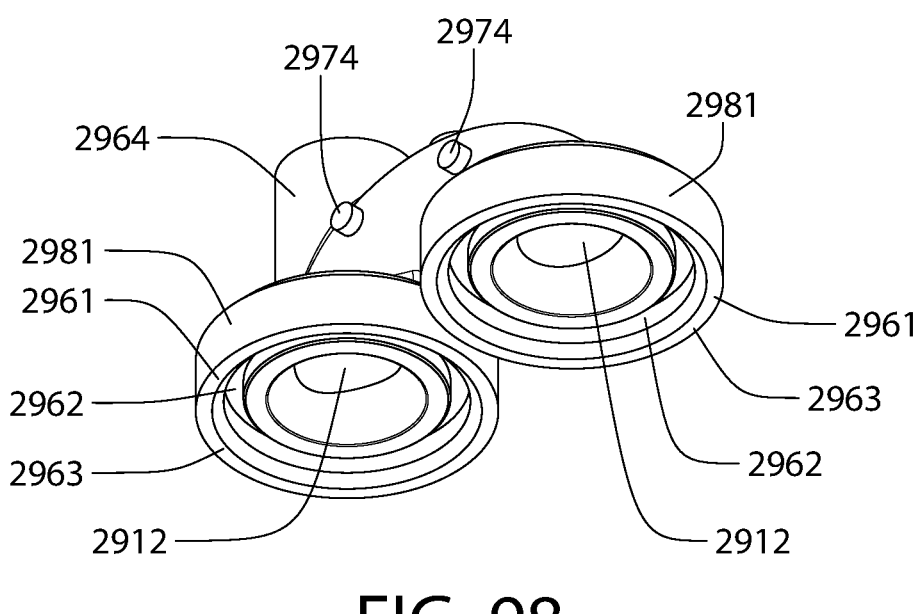

FIG. 98 is a bottom perspective view of an insert of the fitting assembly of FIG. 96.

Figure 99:
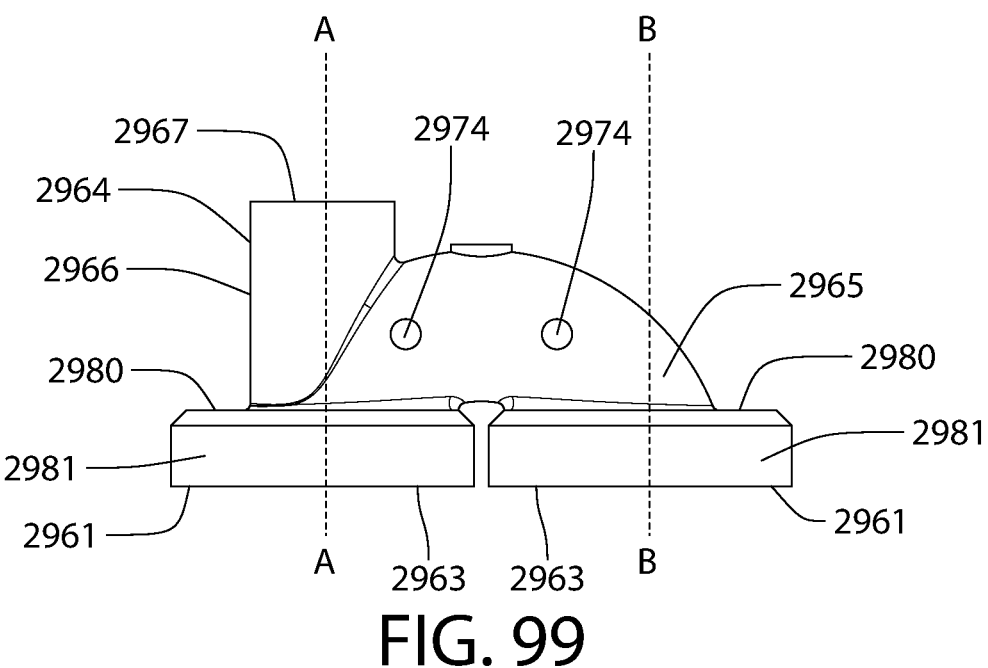

FIG. 99 is a front view of the insert of FIG. 96.

Figure 100:
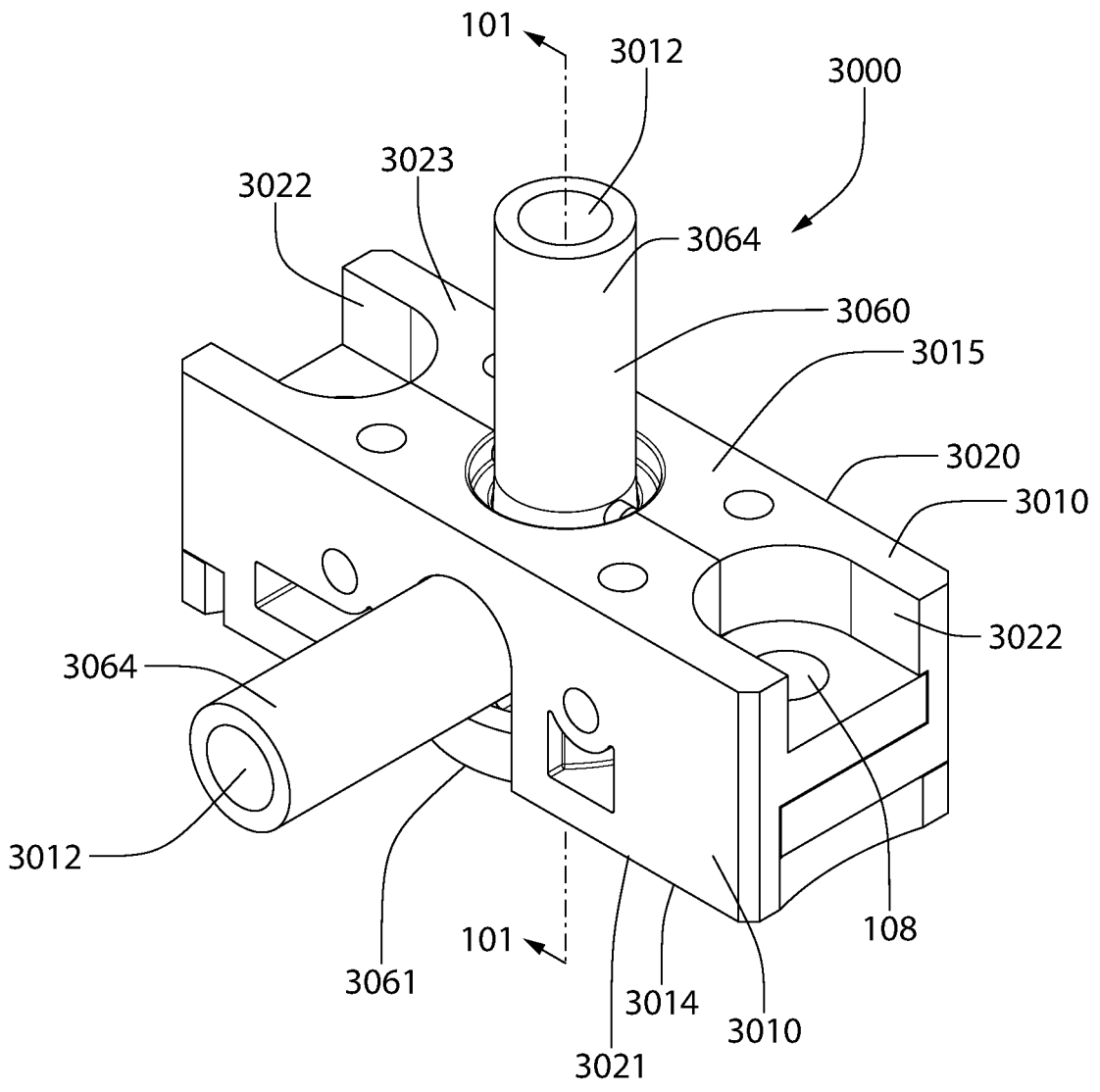

FIG. 100 is a perspective view of an embodiment of a fitting assembly of the present invention, the fitting assembly having an insert and a housing.

Figure 101:
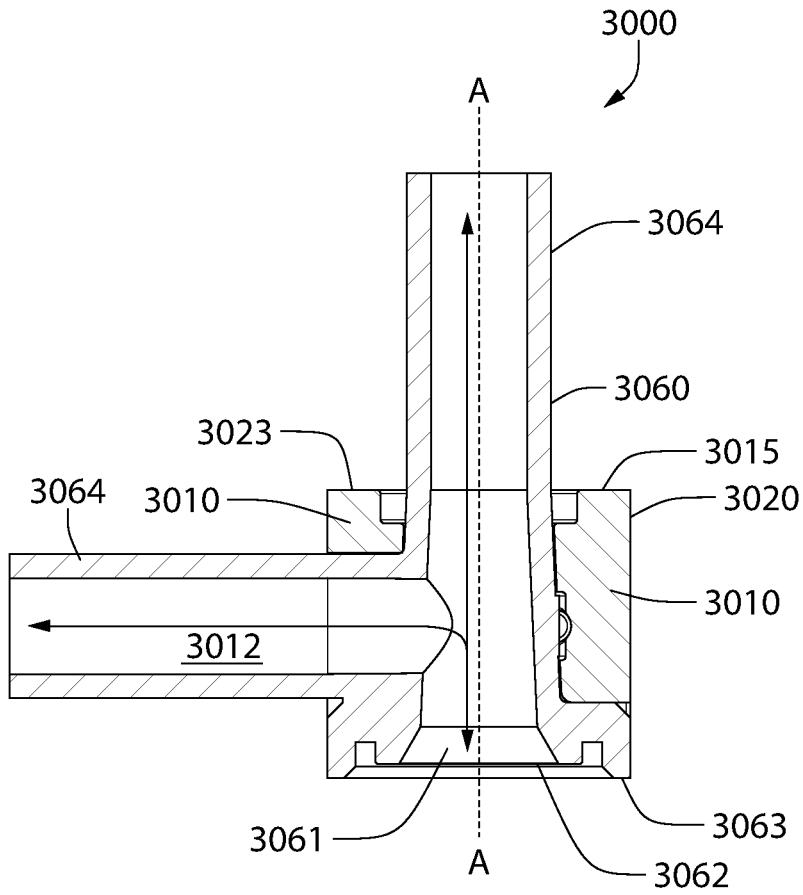

FIG. 101 is a cross-sectional view of the fitting assembly of FIG. 100, taken along line 101-101.

Figure 102:
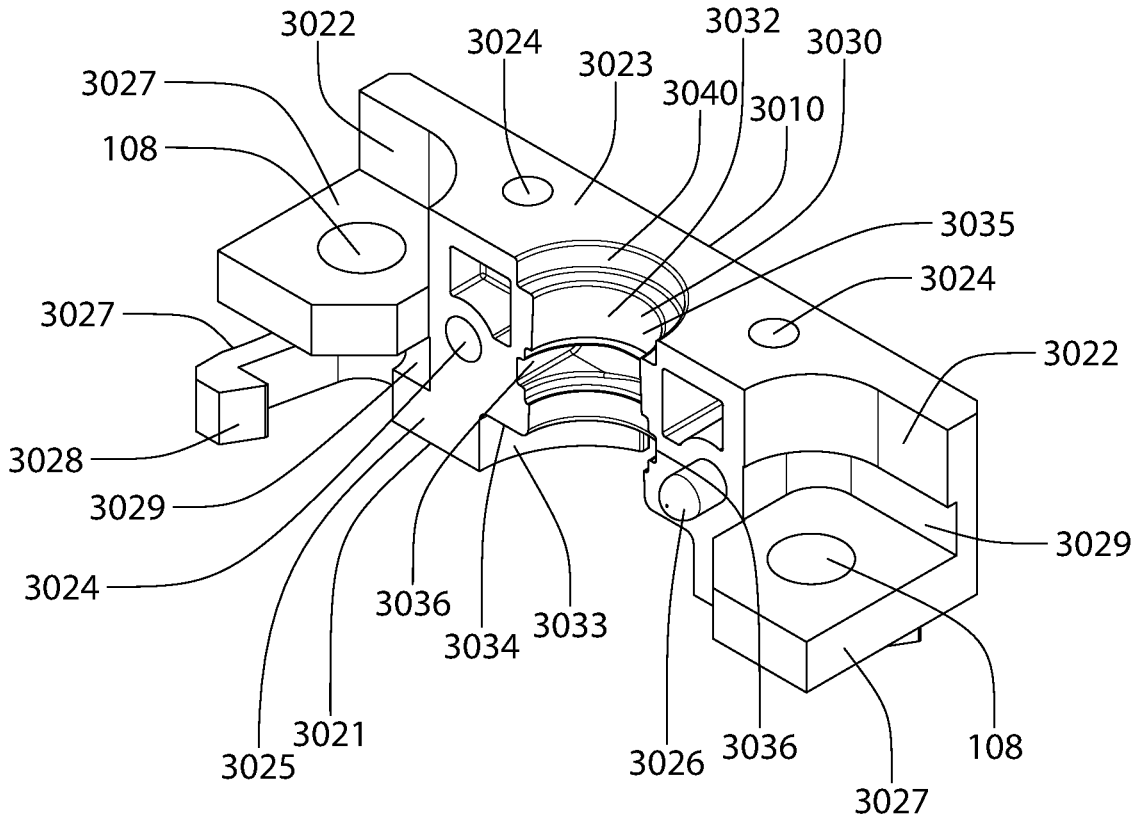

FIG. 102 is a top perspective view of a first portion of the housing of the fitting assembly of FIG. 100.

Figure 103:
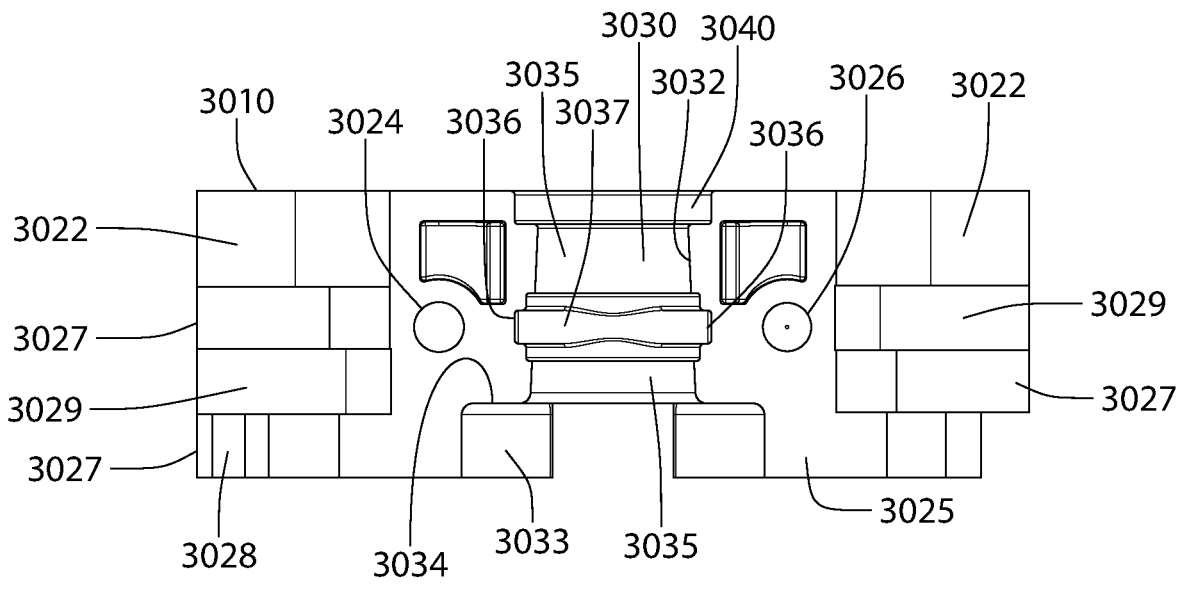

FIG. 103 is a front view of the first portion of the housing of FIG. 102.

Figure 104:
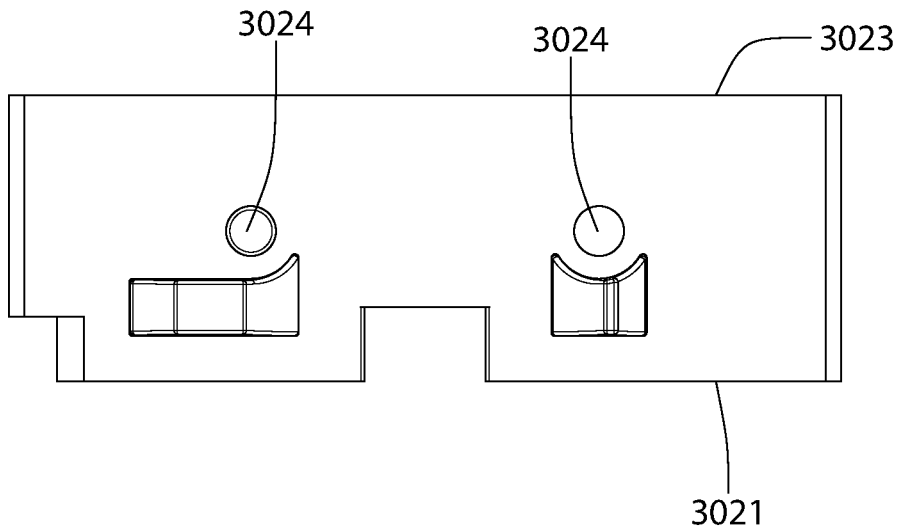

FIG. 104 is a rear view of the first portion of the housing of FIG. 102.

Figure 105:
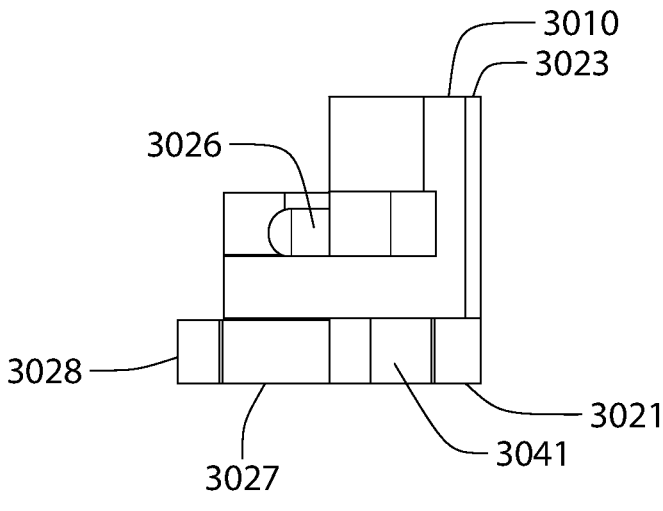

FIG. 105 is a right side view of the first portion of the housing of FIG. 102.

Figure 106:
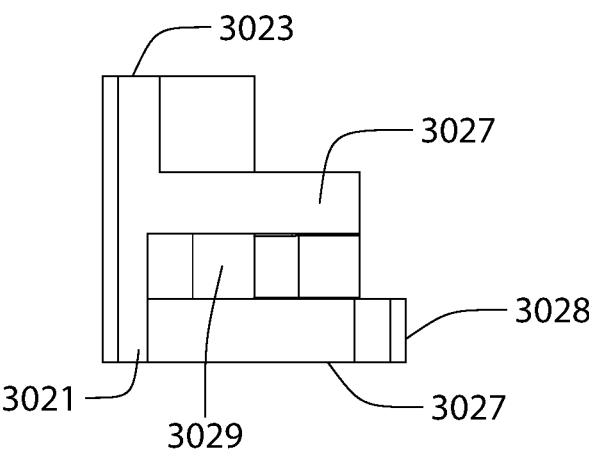

FIG. 106 is a left side view of the first portion of the housing of FIG. 102.

Figure 107:
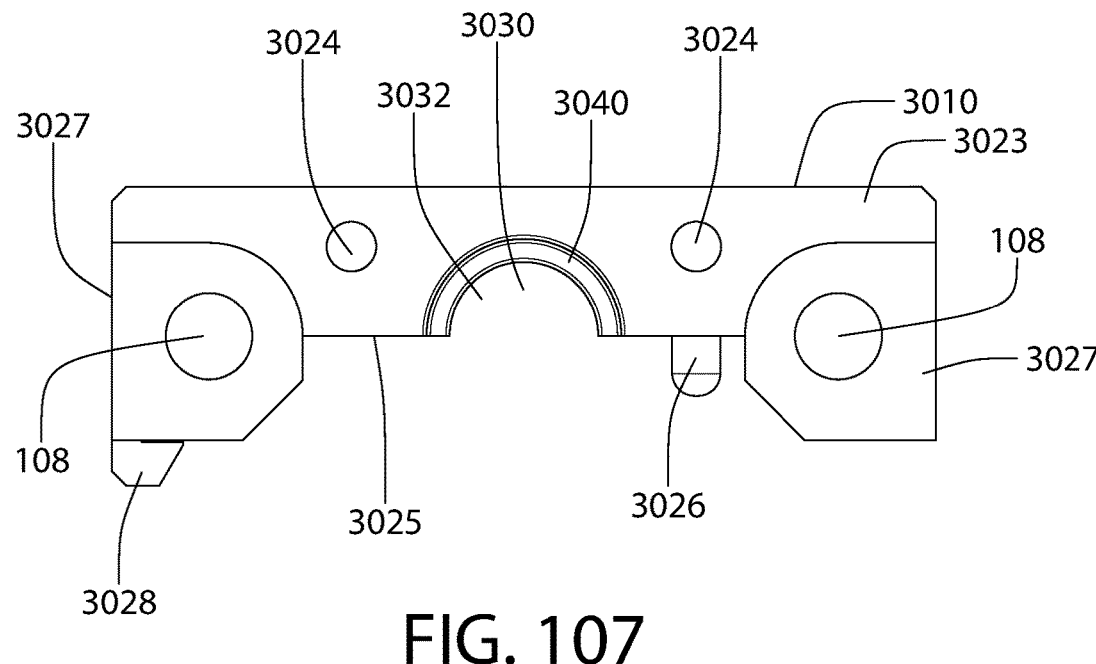

FIG. 107 is a top view of the first portion of the housing of FIG. 102.

Figure 108:
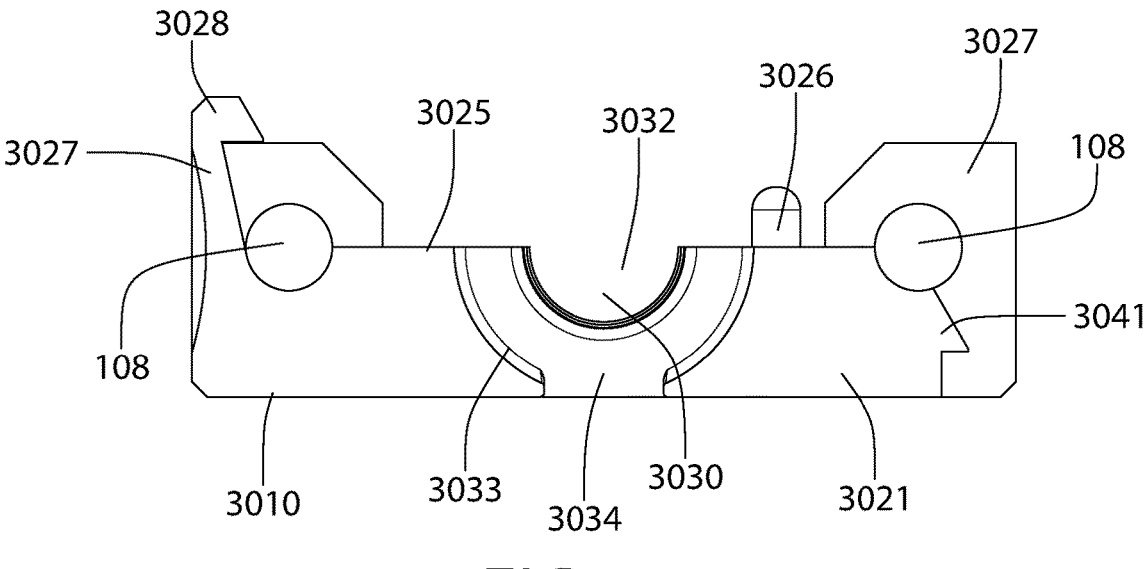

FIG. 108 is a bottom view of the first portion of the housing of FIG. 102.

Figure 109:
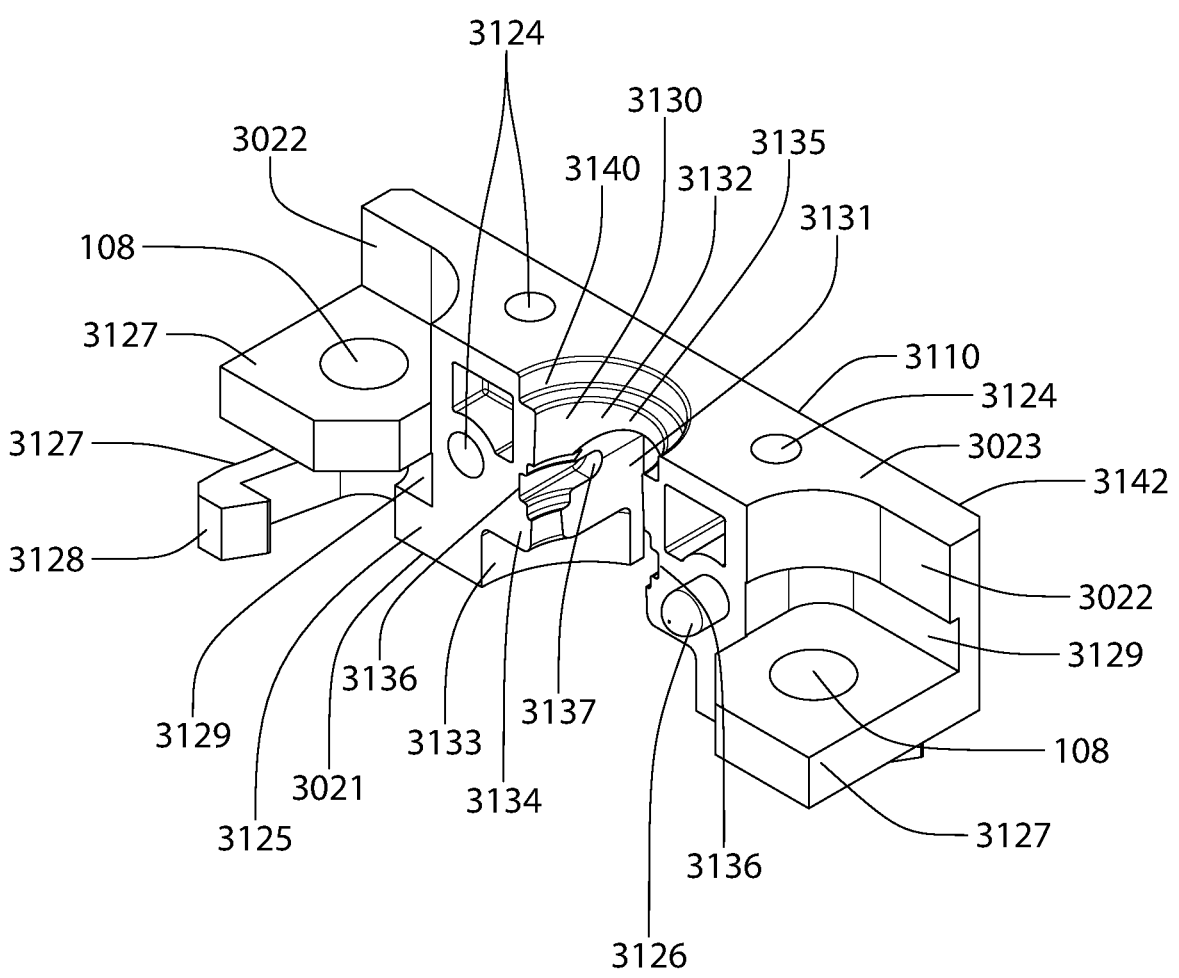

FIG. 109 is a top perspective view of a second portion of the housing of the fitting assembly of FIG. 100.

Figure 110:
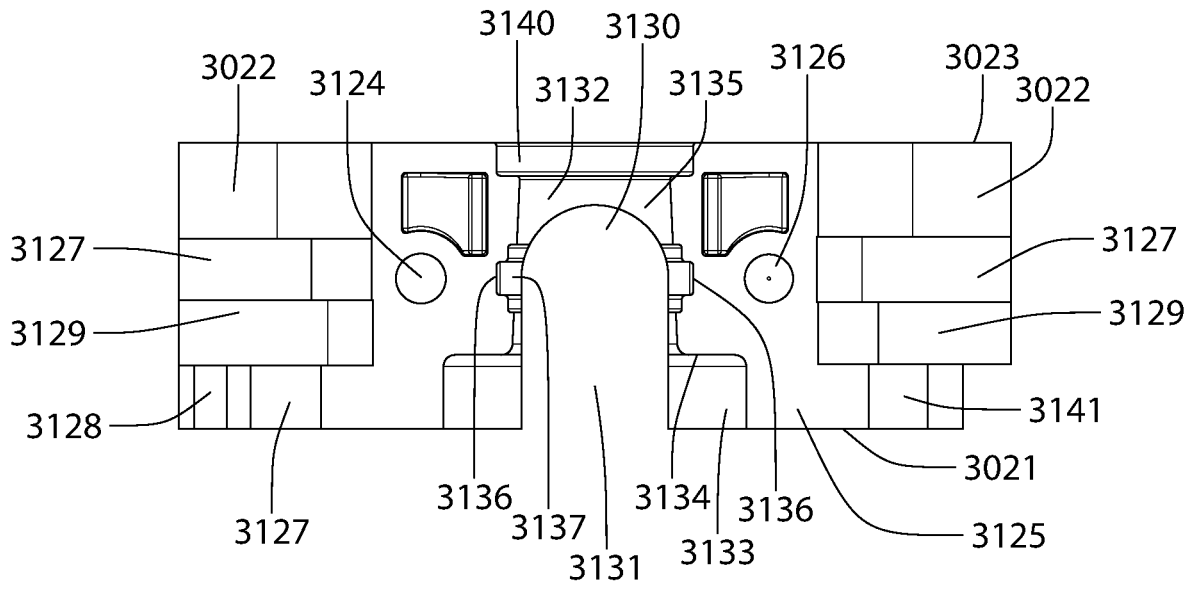

FIG. 110 is a front view of the second portion of the housing of FIG. 109.

Figure 111:
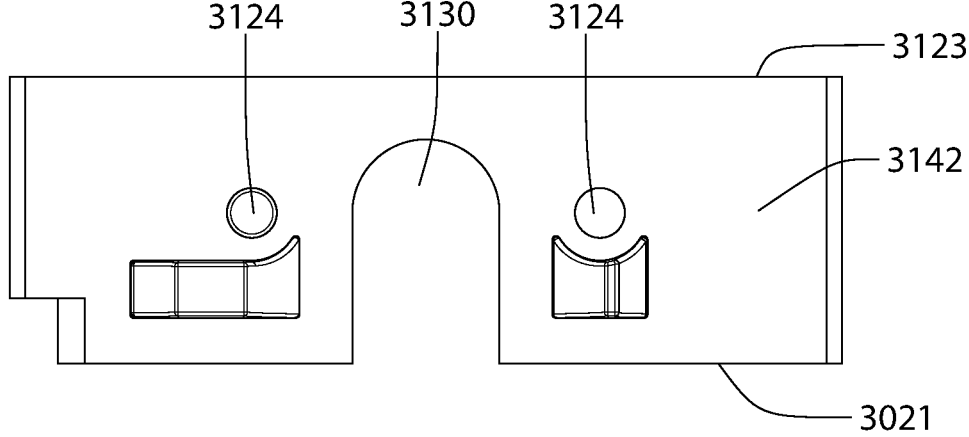

FIG. 111 is a rear view of the second portion of the housing of FIG. 109.

Figure 112:
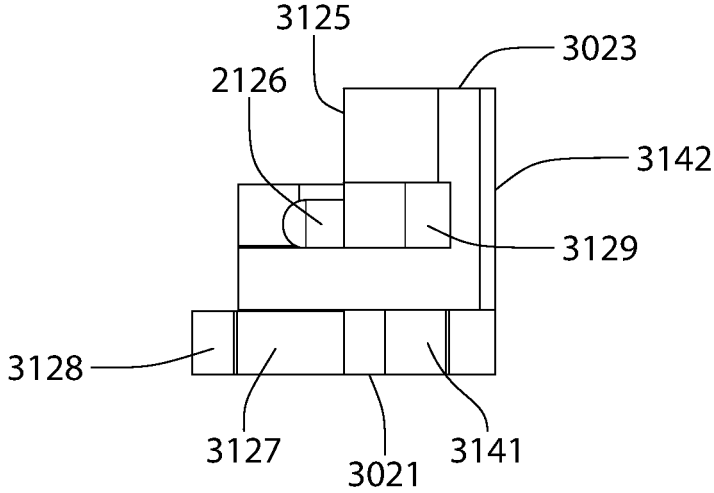

FIG. 112 is a right side view of the second portion of the housing of FIG. 109.

Figure 113:
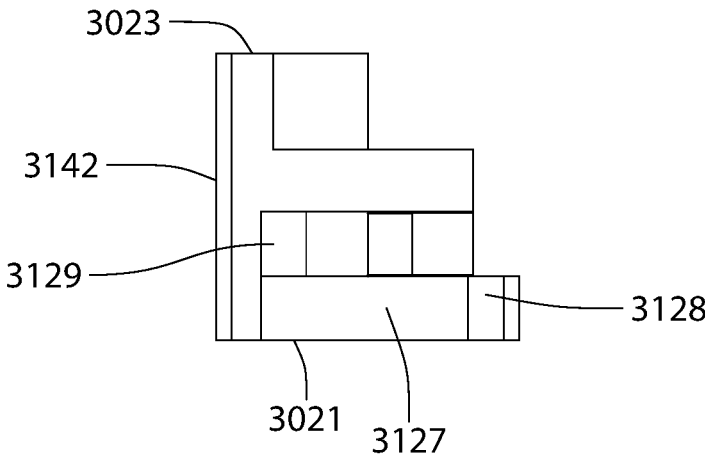

FIG. 113 is a left side view of the second portion of the housing of FIG. 109.

Figure 114:
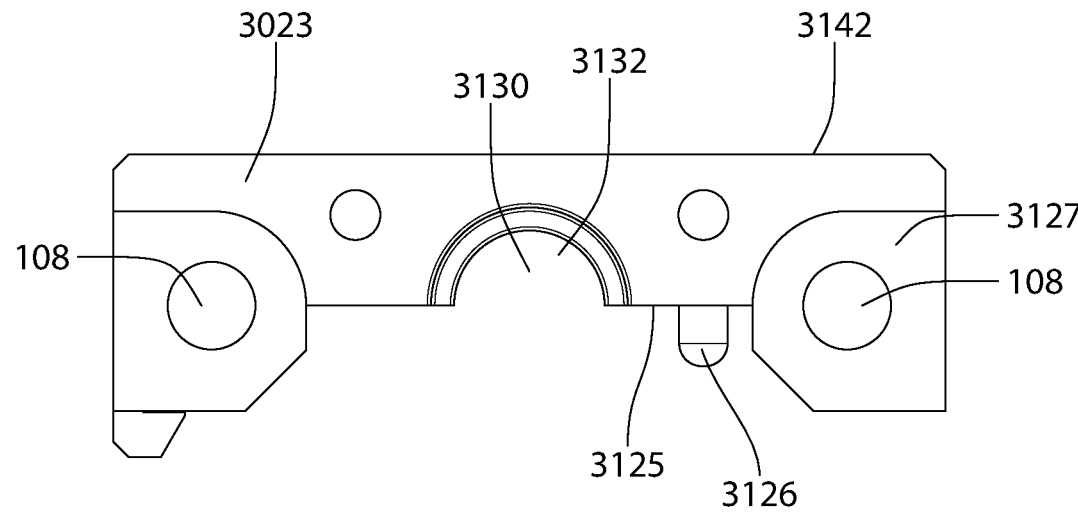

FIG. 114 is a top view of the second portion of the housing of FIG. 109.

Figure 115:
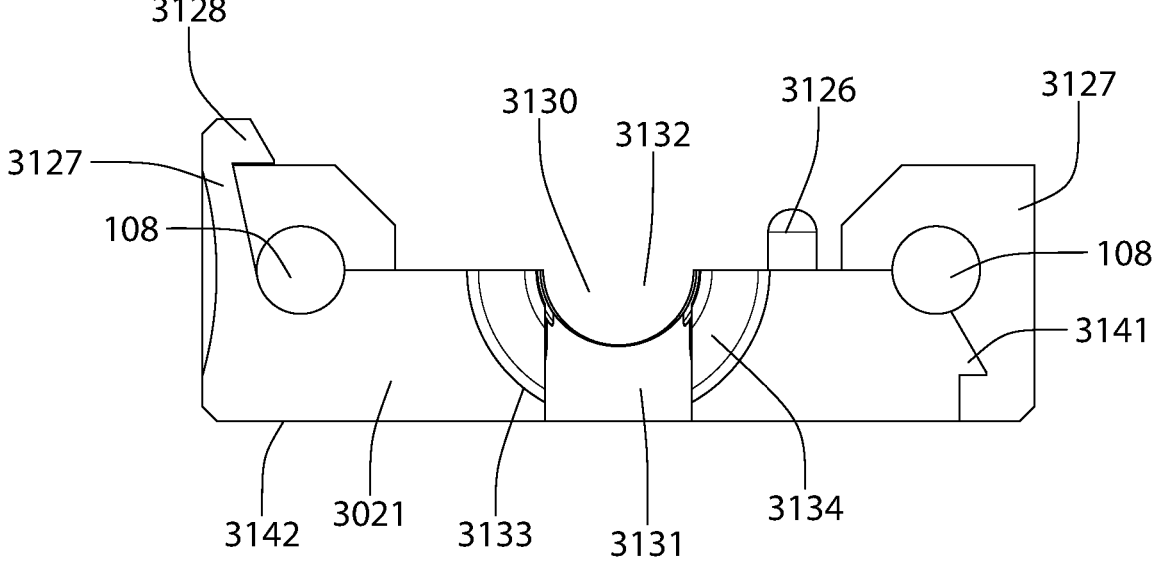

FIG. 115 is a bottom view of the second portion of the housing of FIG. 109.

Figures 116, 117:
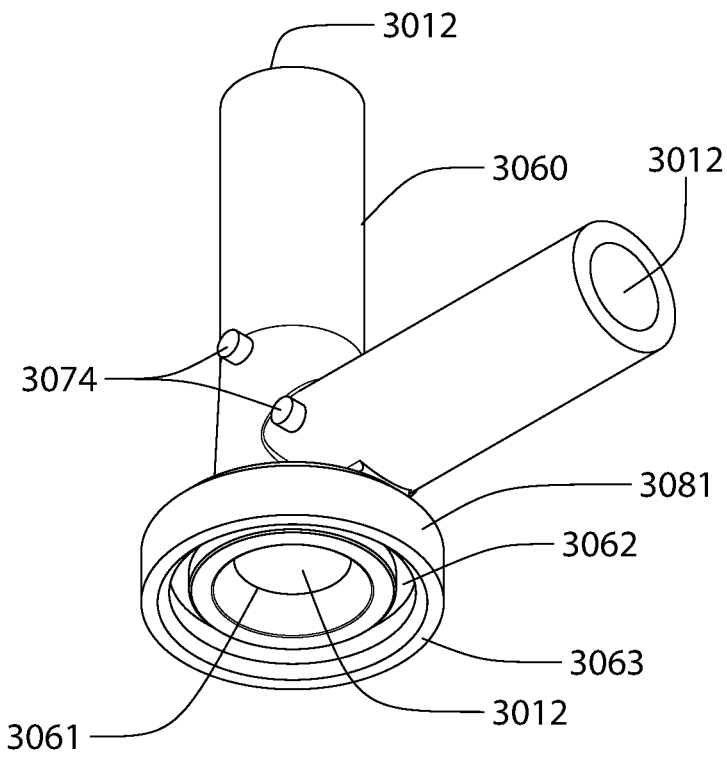

FIG. 116 is a bottom perspective view of an insert of the fitting assembly of FIG. 100, the insert having a run tee configuration.

FIG. 117 is a front view of the insert of FIG. 100.

Figure 118:
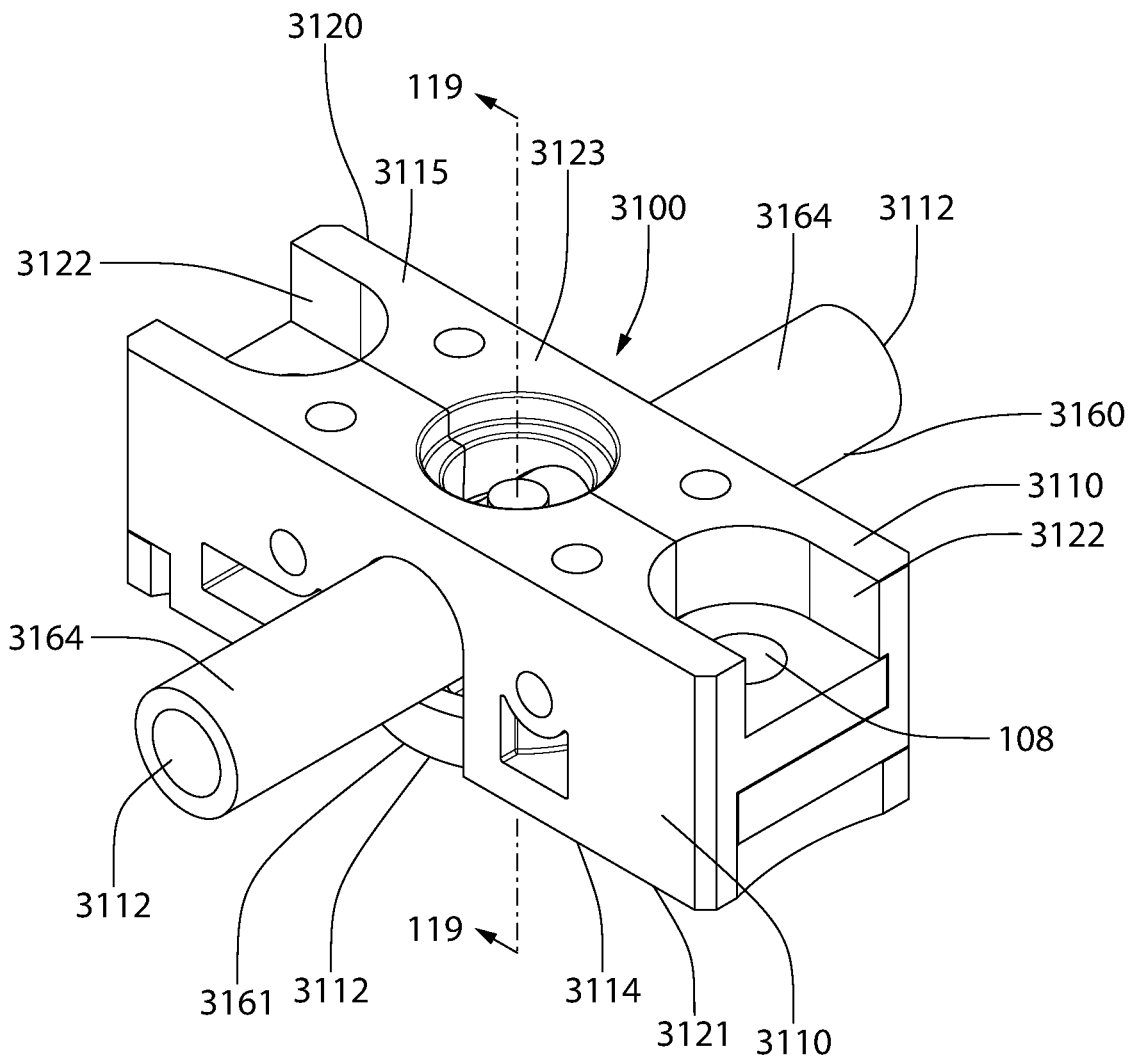

FIG. 118 is a perspective view of an embodiment of a fitting assembly of the present invention, the fitting assembly having an insert and a housing.

Figure 119:
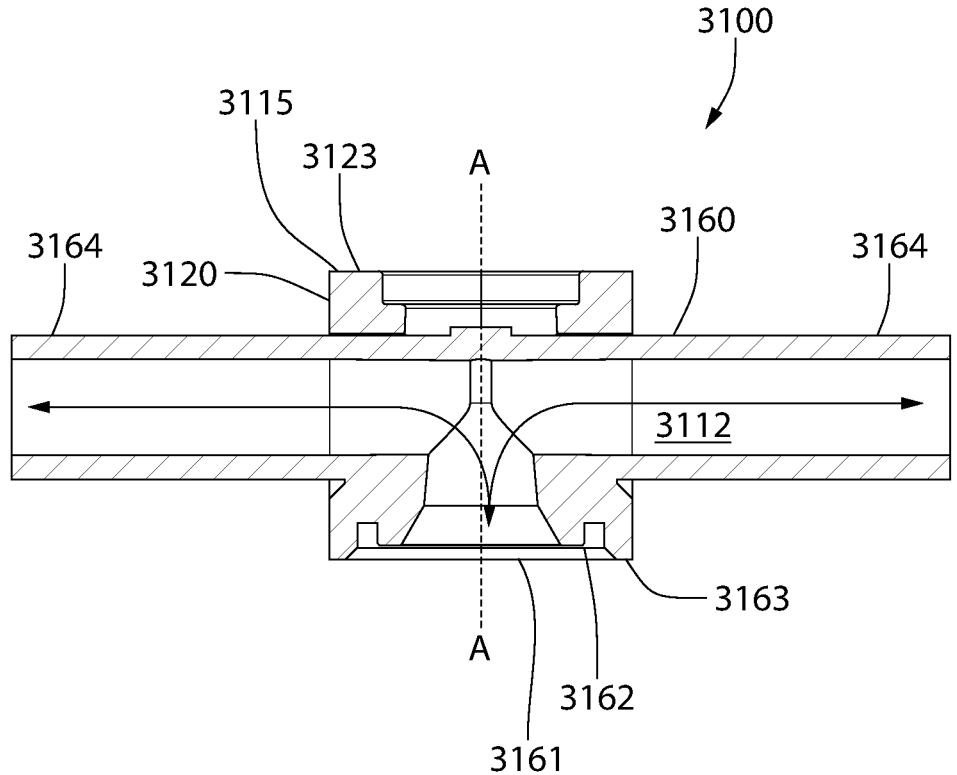

FIG. 119 is a cross-sectional view of the fitting assembly of FIG. 118, taken along line 119-119.

Figure 120:
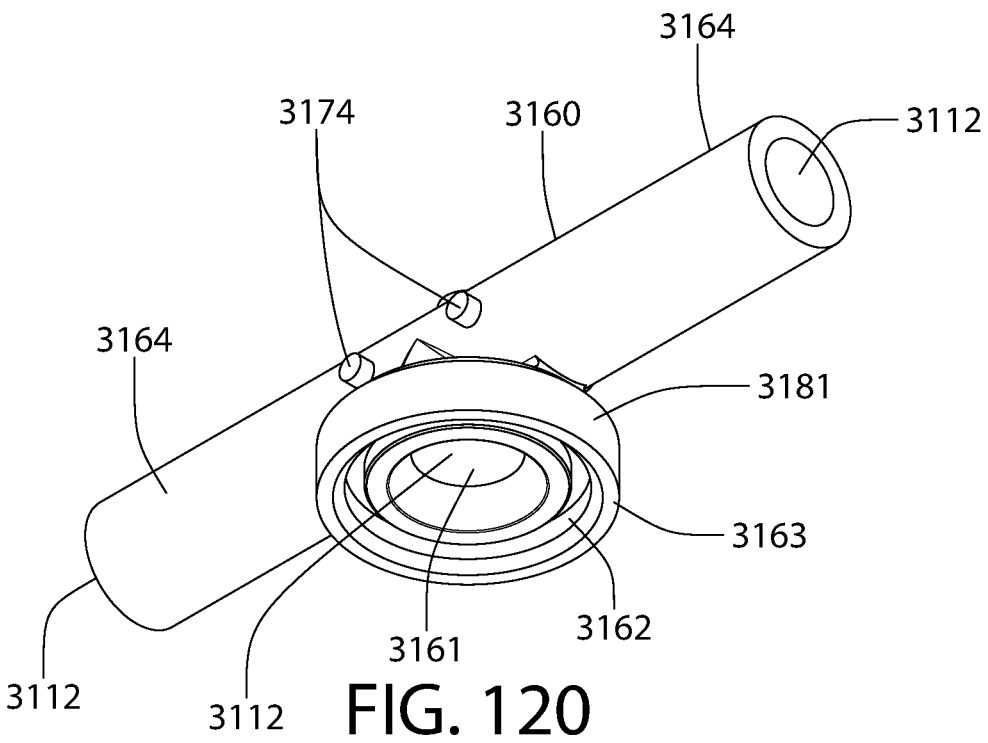

FIG. 120 is a bottom perspective view of an insert of the fitting assembly of FIG. 118, the insert having a branch tee configuration.

Figure 121:
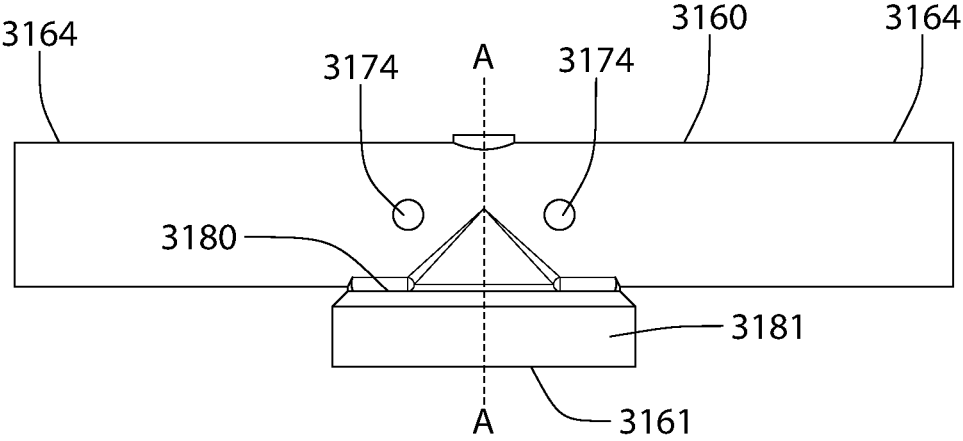

FIG. 121 is a front view of the insert of FIG. 120.

Figure 122:
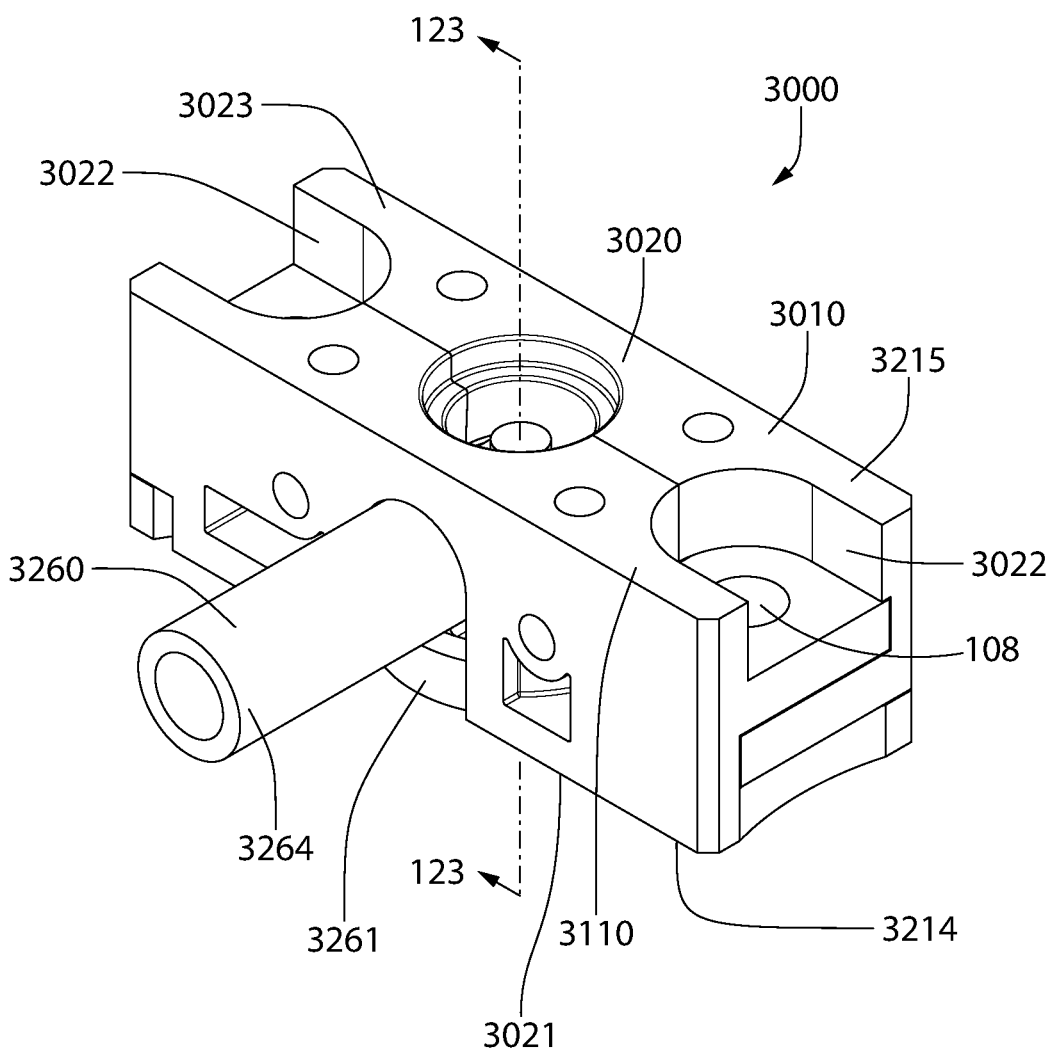

FIG. 122 is a perspective view of an embodiment of a fitting assembly of the present invention, the fitting assembly having an insert and a housing.

Figure 123:
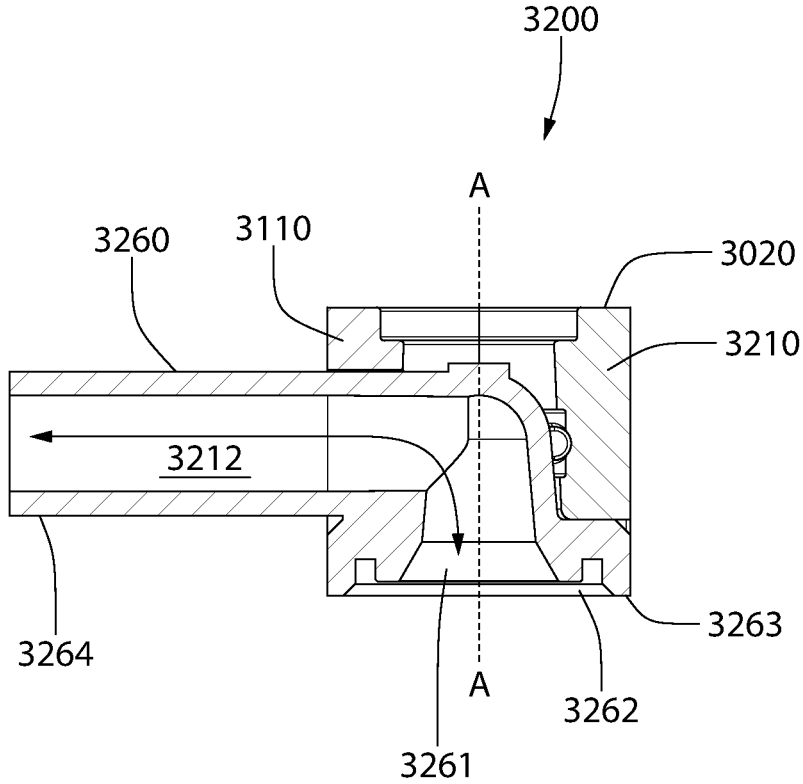

FIG. 123 is a cross-sectional view of the fitting assembly of FIG. 122, taken along line 123-123.

Figure 124:
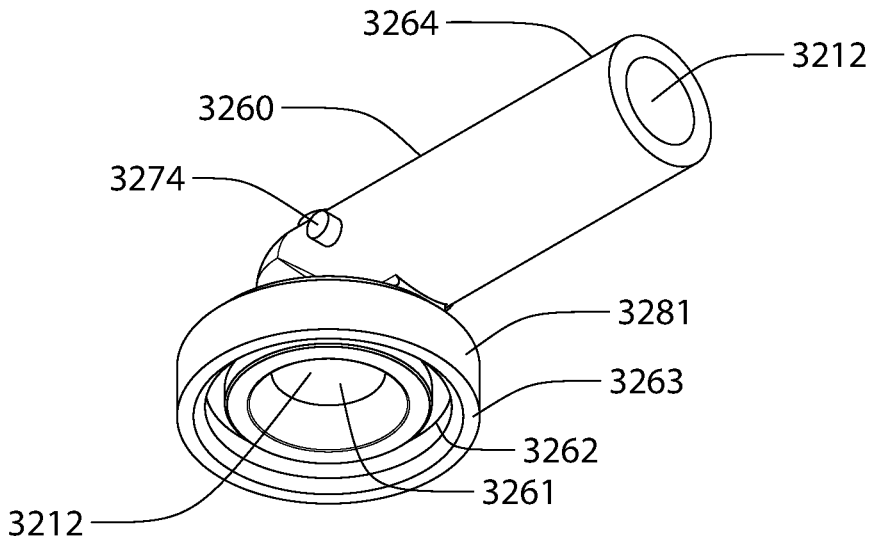

FIG. 124 is a bottom perspective view of an insert of the fitting assembly of FIG. 122, the insert having an elbow configuration.

Figure 125:
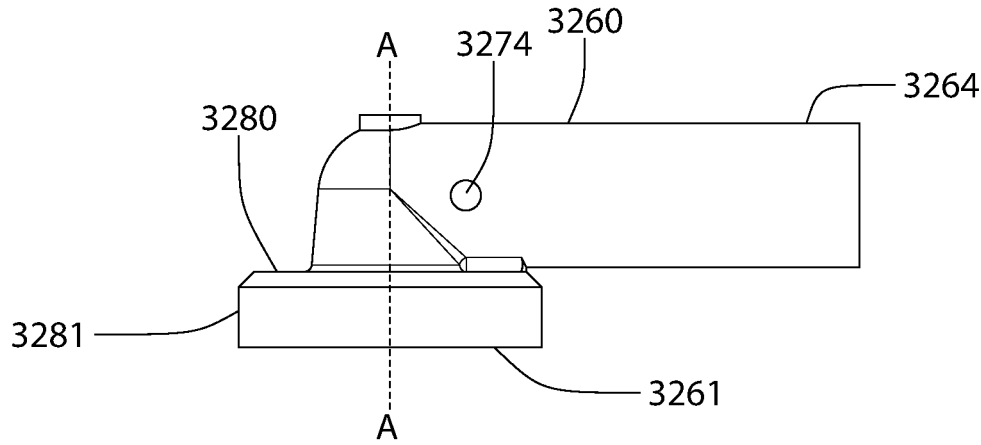

FIG. 125 is a front view of the insert of FIG. 124.

Figure 126:
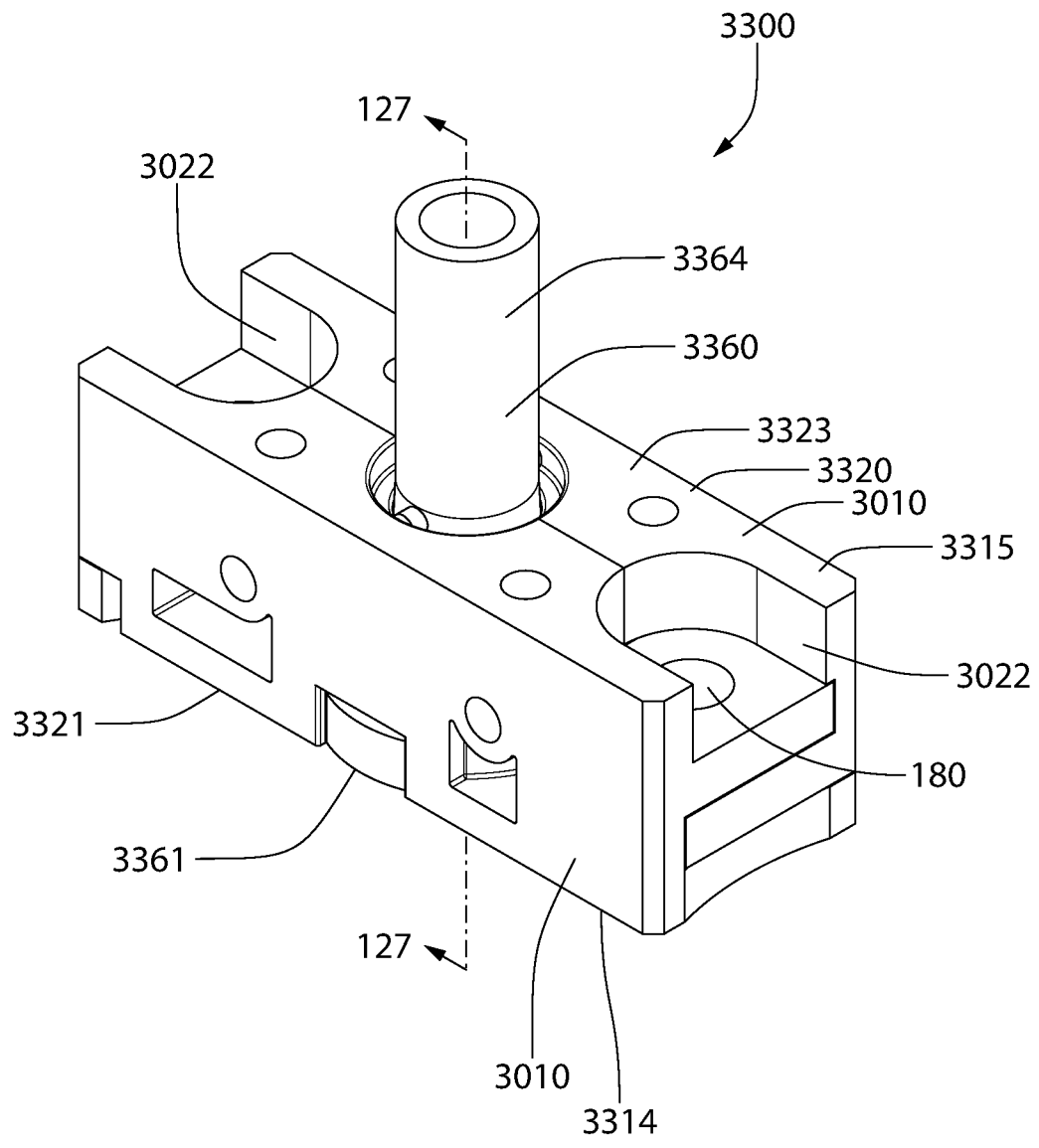

FIG. 126 is a perspective view of an embodiment of a fitting assembly of the present invention, the fitting assembly having an insert and a housing.

Figure 127:
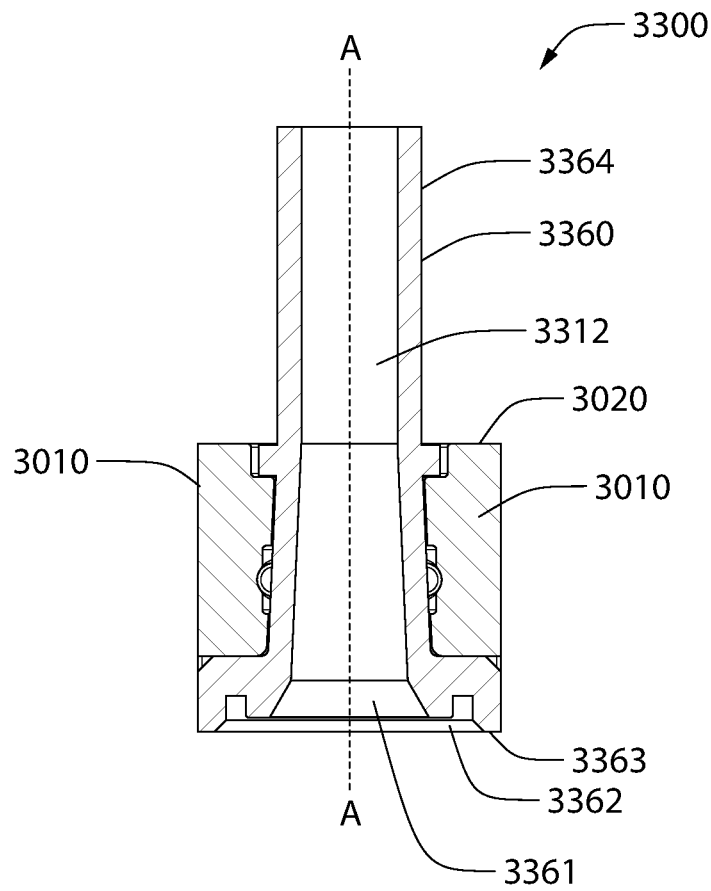

FIG. 127 is a cross-sectional view of the fitting assembly of FIG. 126, taken along line 127-127.

Figures 128, 129:
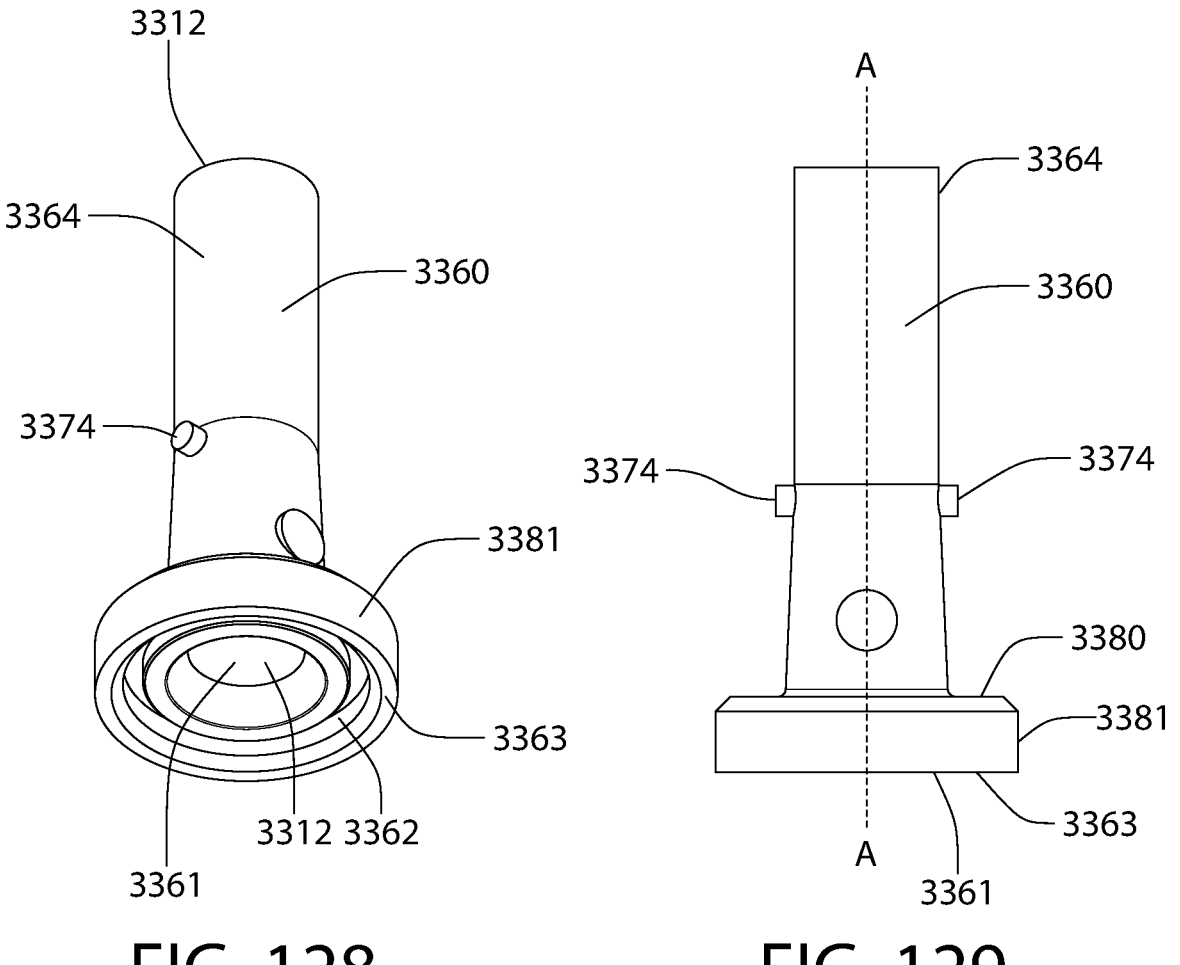

FIG. 128 is a bottom perspective view of an insert of the fitting assembly of FIG. 126, the insert having a straight configuration.

FIG. 129 is a front view of the insert of FIG. 128.

Figure 130:
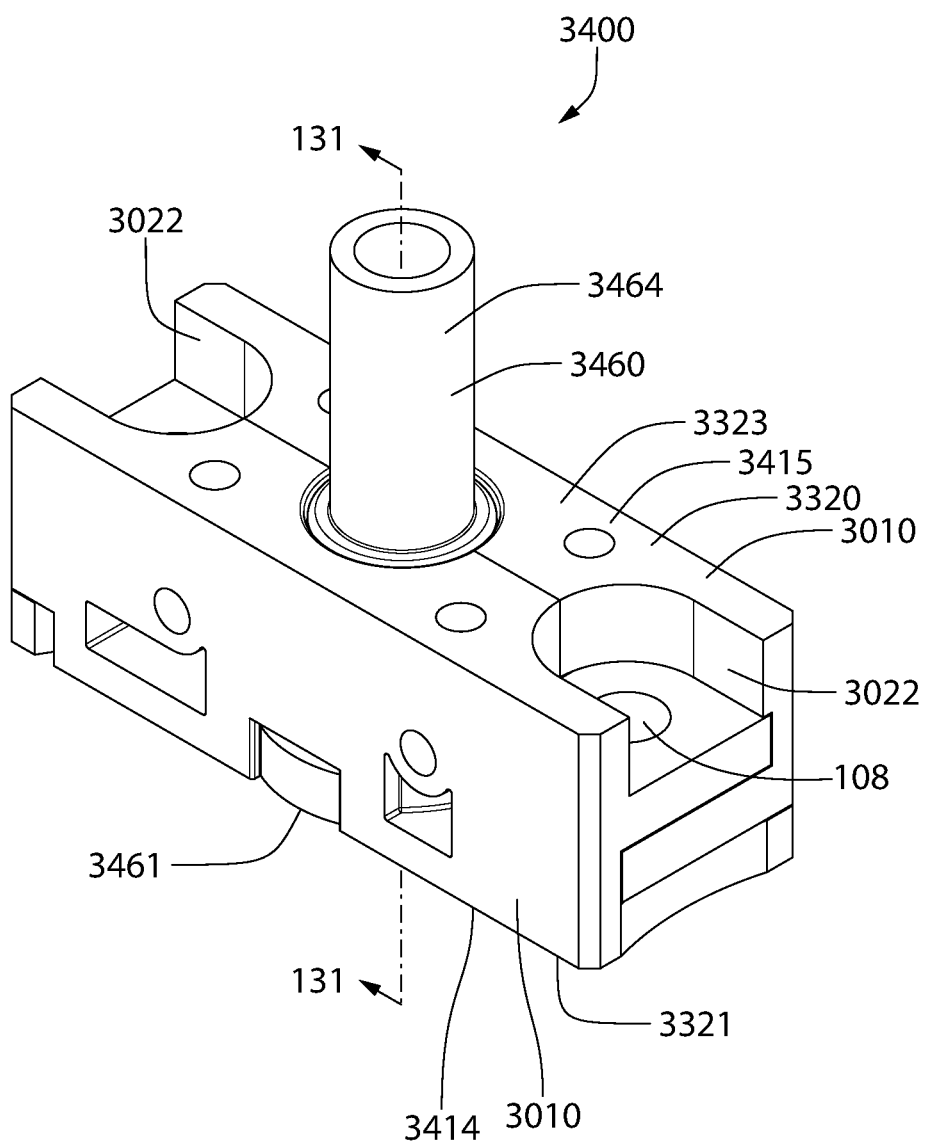

FIG. 130 is a perspective view of an embodiment of a fitting assembly of the present invention, the fitting assembly having an insert and a housing.

Figure 131:
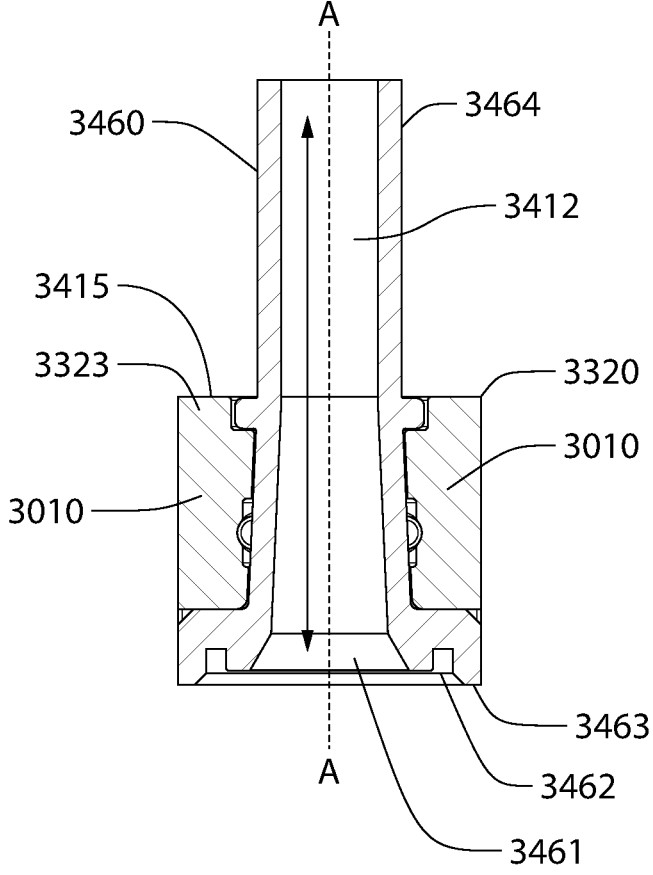

FIG. 131 is a cross-sectional view of the fitting assembly of FIG. 130, taken along line 131-131.

Figures 132, 133:
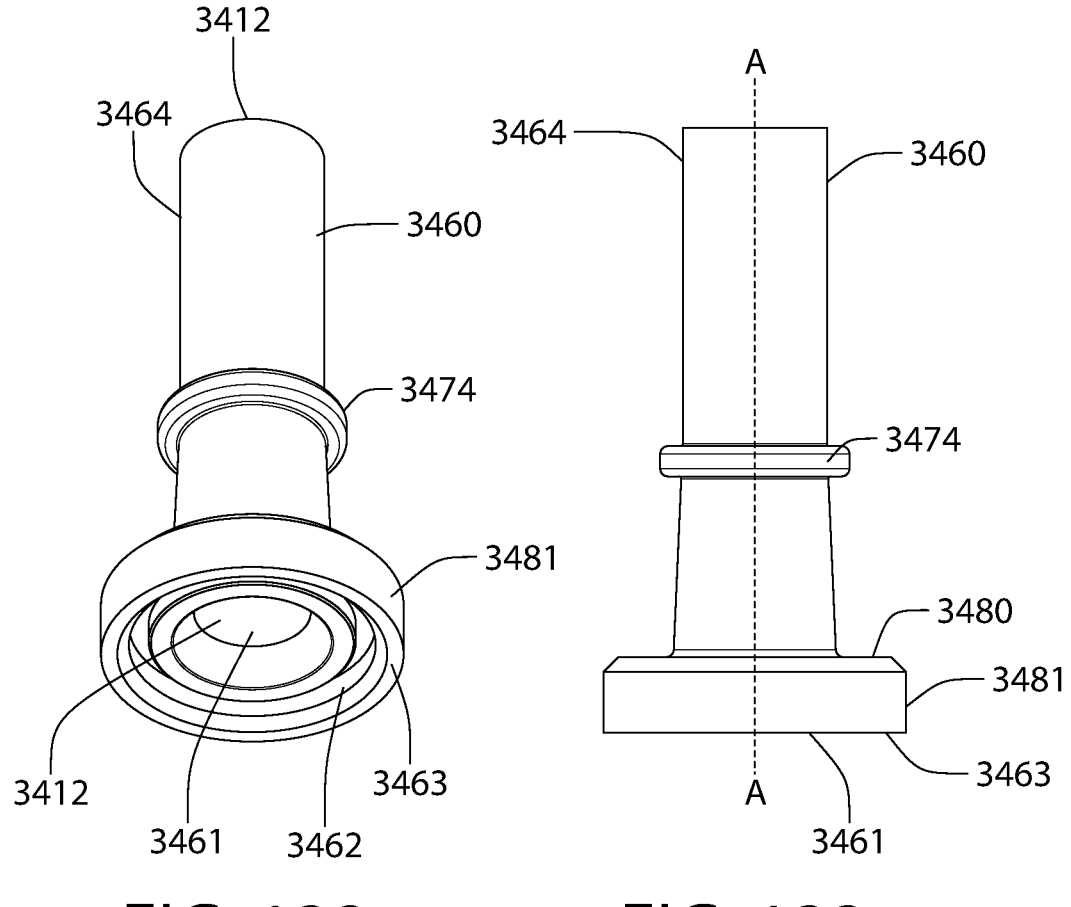

FIG. 132 is a bottom perspective view of an insert of the fitting assembly of FIG. 130, the insert having a straight configuration.

FIG. 133 is a front view of the insert of FIG. 132.

All drawings are schematic and not necessarily to scale. Features shown numbered in certain figures which may appear un-numbered in other figures are the same features unless noted otherwise herein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a fitting assembly for use in a fluid delivery module comprising at least one apparatus for controlling fluid flow. In some embodiments, the fluid delivery module may include a mass flow controller to deliver a known mass flow of fluid to a semiconductor process or similar process. Semiconductor fabrication is one industry which demands high performance in control of fluid flows. As semiconductor fabrication techniques have advanced, customers have recognized the need for flow control devices with increased complexity and capability. Modern semiconductor processes require that the cost of the fluid delivery modules is reduced and parts interchangeability is maximized. The present invention provides for a modular fitting assembly which can be utilized in a variety of applications within the fluid delivery module.

Figure 1:
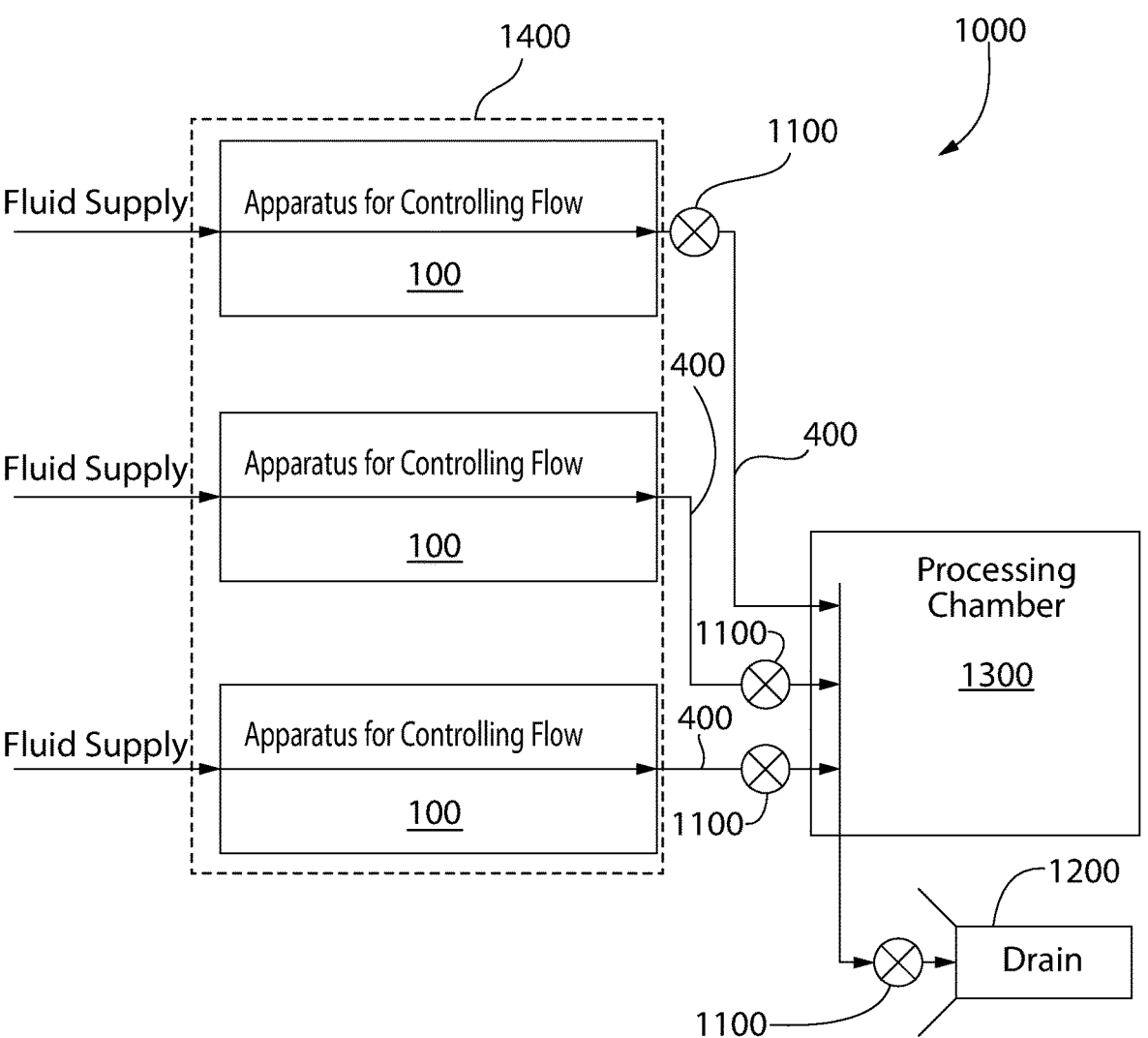
FIG. 1 is a schematic of a system for manufacturing semiconductor devices utilizing one or more apparatuses for controlling flow.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies, or fluid sources. Collectively, the plurality of apparatus for controlling flow 100 belong to a fluid delivery module 1400. Optionally, more than one fluid delivery module 1400 may be utilized in the processing system 100. The plurality of apparatus for controlling flow 100 are connected to the processing chamber 1300 by an outlet manifold 400. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a drain 1200 which is isolated from the processing chamber 1300 by a valve 1100 to enable evacuation of process fluids or facilitate purging one or more of the apparatus for controlling flow 100 to enable switching between process fluids in the same apparatus for controlling flow 100. Optionally, the drain 1200 may be a source of vacuum or may be a liquid drain configured to remove liquids from the processing chamber 1300. Optionally, the apparatus for controlling flow 100 may be mass flow controllers, flow splitters, or any other device which controls the flow of a process fluid in a processing system. Furthermore, the valves 1100 may be integrated into the apparatus for controlling flow 100 if so desired.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, electroplating, or any other process utilizing fluids.

Figure 2:
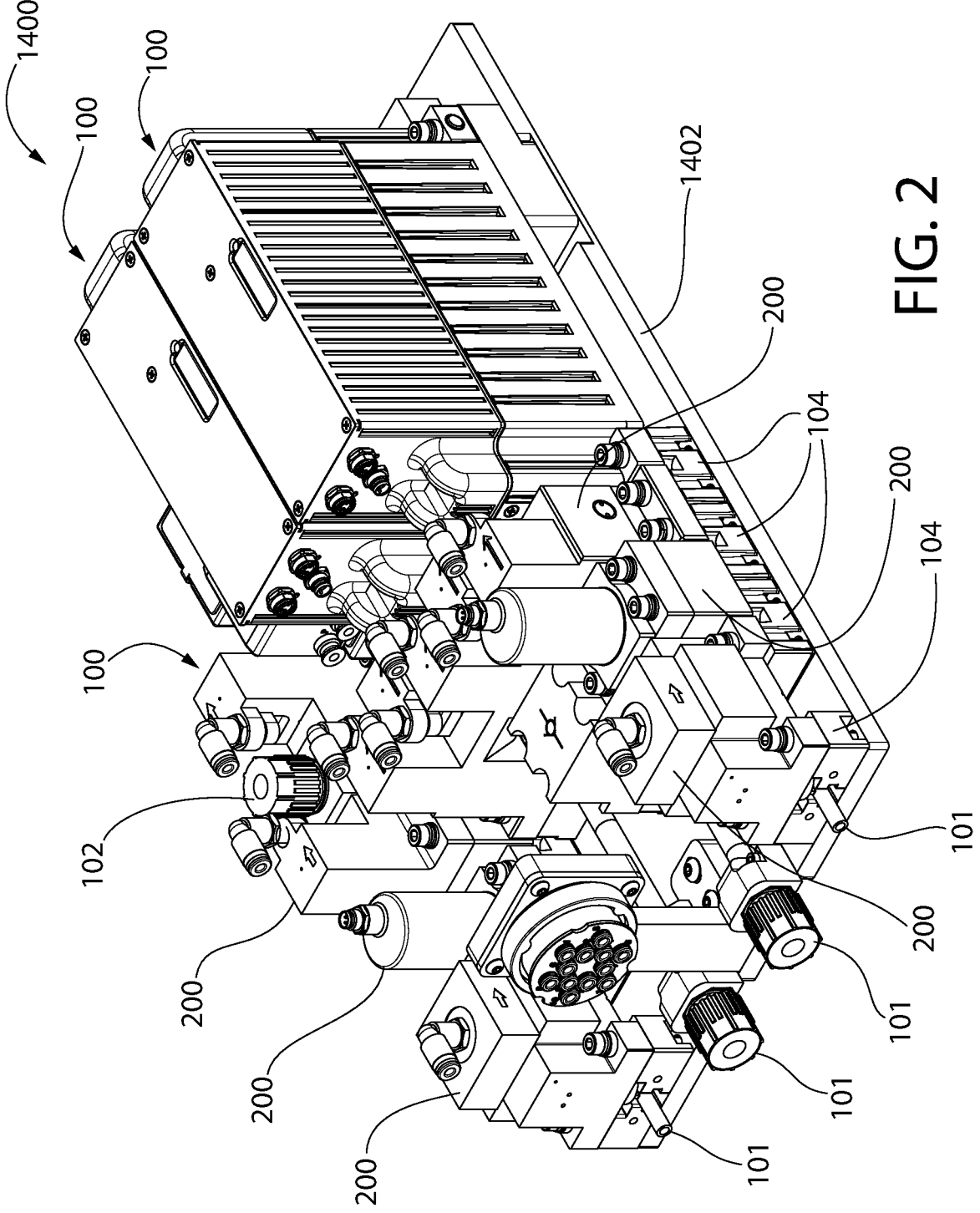
FIG. 2 is a perspective view of a fluid delivery module comprising a plurality apparatuses for controlling flow as may be utilized in the process of FIG. 1.
Figure 3:
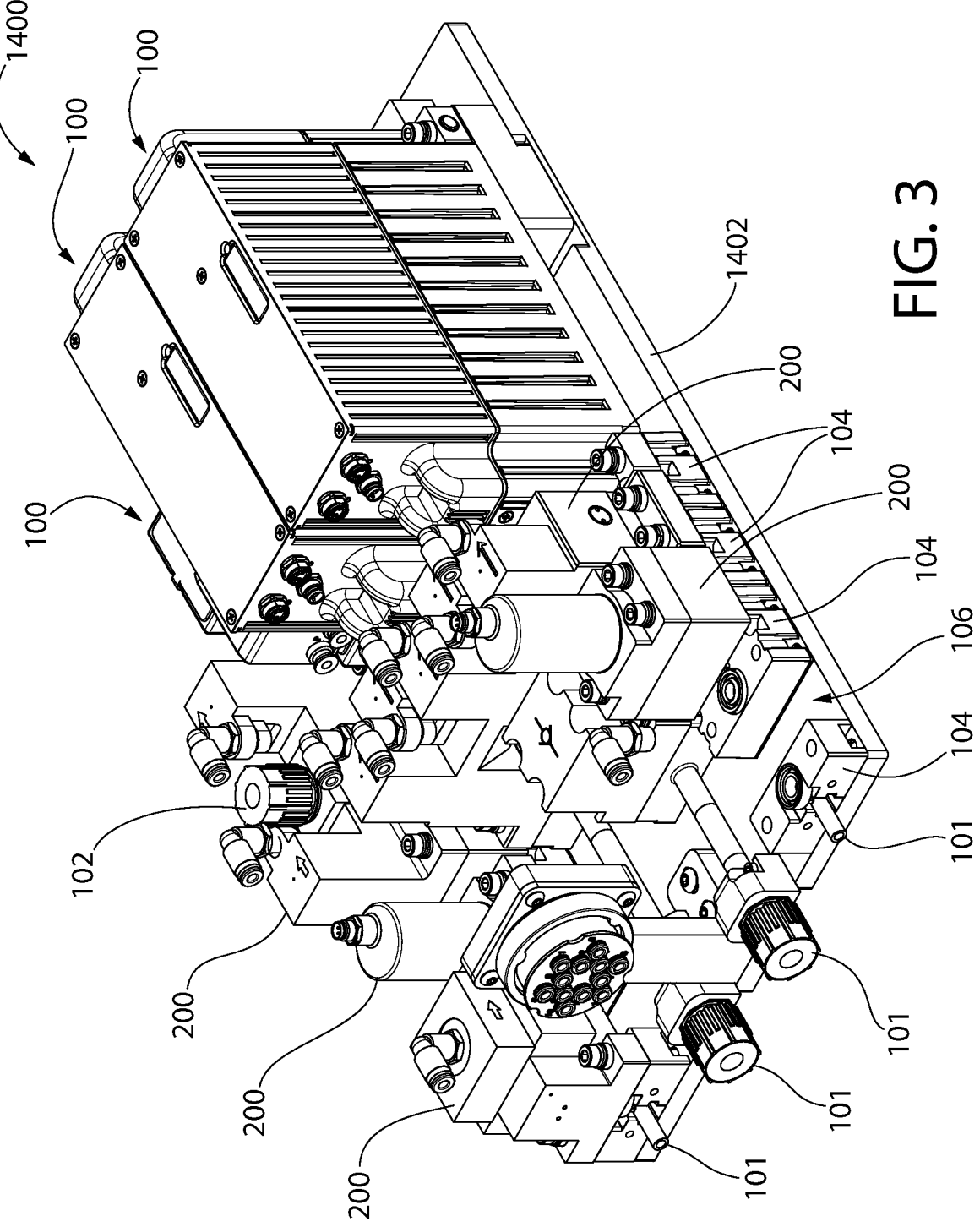
FIG. 3 is a perspective view of the module of FIG. 2 showing one fluid flow component removed.

FIGS. 2 and 3 show a schematic of an exemplary fluid delivery module 1400. In this embodiment, the fluid delivery module 1400 has a plurality of apparatus for controlling flow 100 having a plurality of inlets 101 and a plurality of outlets 102. In some embodiments, the plurality of inlets 101 do not correspond to the plurality of outlets 102 in a one to one manner. Instead, a plurality of inlets 101 may be joined into a single outlet 102 and a single inlet 101 may be split into a plurality of outlets 102. This may be done to achieve mixing or combination of different fluids prior to providing them to the process chamber 1300. Nonetheless, at least one flow passage extends from one of the inlets 101 to one of the outlets 102, the flow passage being formed by the various components of the fluid delivery module 1400.

As can be seen, each of the apparatus for controlling flow 100 is arranged generally in a row, with the plurality of apparatus 100 in parallel rows. This need not be the case, and any packaging configuration may be used. The fluid delivery module 1400 has a substrate panel 1402. The substrate panel 1402 serves as support structure for the fluid delivery module 1400, but it may be simply used to facilitate assembly. Other structural support configurations are contemplated. A plurality of substrate blocks 104 rest on the substrate panel 1402 and comprise fluid ports therein to conduct flow to one or more fluid flow components 200 having corresponding fluid ports as discussed in greater detail below. The fluid flow components 200 may be considered active components while the substrate blocks 104 may be considered passive components. The fluid flow components 200 may be one or more of a valve, a flow controller, a pressure transducer, a flow measurement sensor, a pressure regulator, a flow restrictor, an actuator, an inlet 101 or outlet 102, or any other known flow control component. A plurality of anchors are used to couple the fluid flow components 200 to the substrate blocks 104. The anchors may be threaded inserts or threads in the substrate blocks 104, threaded inserts or threads in the substrate panel 1402, nuts, or other anchoring features which permit secure fastening of the fluid flow components 200.

As can be seen by comparing FIG. 2 with FIG. 3, a fluid flow component 200 is removed from the fluid delivery module 1400 of FIG. 3. The removal of the fluid flow component 200 exposes portions of two substrate blocks 104. A component mounting location 106 is formed by the portions of the two substrate blocks 104. The component mounting location 106 may vary in size depending on the dimensions of the component 200 mounted to the component mounting location 106. Thus, different component mounting locations 106 may comprise different portions of the same substrate block 104. Each and every component 200 has a component mounting location 106 in the fluid delivery module 1400. More than two substrate blocks 104 may be utilized to form a component mounting location 106. Alternatively, only one substrate block 104 may be utilized to form a component mounting location 106. This will depend on the type of component 200 which is mounted to the component mounting location 106.

Turning to FIGS. 4A-D, a portion of the fluid delivery module 1400 is shown. Specifically, a fluid flow component 200 is shown mounted to a pair of substrate blocks 104 which form a component mounting location 106. The fluid flow component 200 is mounted to the substrate blocks 104 via fasteners 250. The fasteners 250 may be used for alignment as well as for fastening and may be replaced by any suitable type of fastener capable of fastening the fluid flow components 200 to the substrate blocks 104. The fasteners 250 may be fasteners such as bolts, screws, pins, or other known fastening device. However, in other embodiments, the fasteners 250 may be separate from the alignment features. For instance, dowel pins or other pins may be used to align the fluid flow component 200 to the substrate blocks 104. Then, a separate component fastener may be used for fastening the fluid flow component 200 to the substrate blocks 104. As can be seen in FIGS. 4A-D, the fasteners 250 extend through the substrate blocks 104.

Although not shown in FIGS. 4A-D, the substrate panel 1402 has anchors. The anchors comprise portions of the substrate panel 1402 which are threaded or have threaded inserts which receive the fasteners 250. Thus, the fasteners 250 extend through fastener passageways 208 in the fluid flow component 200, fastener passageways 108 in the substrate blocks 104, and install into anchors in the substrate panel 1402. The fasteners 250 are intended for rough alignment, but precision alignment is provided by other geometry. Thus, the fastener passageways 108, 208 need not be a precision fit on the fasteners 250. In alternate embodiments, the fasteners 250 may install directly to the substrate blocks 104 via threaded holes or inserts within the fastener passageways 108. In these embodiments, the substrate blocks 104 may be separately attached to the substrate panel 1402 via additional fasteners. In other embodiments, the fasteners 250 may install into supports or other components which are beneath the substrate panel 1402.

As can be seen in FIGS. 4A-D, the substrate blocks 104 are not identical. As can be seen from the figures, the first substrate block 104 has a single fluid port while the second substrate block 104 has two fluid ports. The second substrate block 104 may receive two separate components 200 while the first substrate block 104 may only receive a single component 200. The first substrate block 104 is shown at left in FIG. 4A while the second substrate block 104 is shown at right. The first substrate block 104 is a fitting assembly 400. The fitting assembly 400 is an assembly comprising a housing 420 and an insert 460. The fitting assembly 400 is modular, so that a variety of inserts 460 may be utilized to permit a wide variety of uses. The fitting assembly 400 need not be utilized exclusively as a substrate block 104, and may also be used to form a component or a portion of a component as will be discussed in greater detail below. The second substrate block 104 is formed as a single piece, but may also be formed as a multi-component assembly like the fitting assembly 400.

Figure 4B:
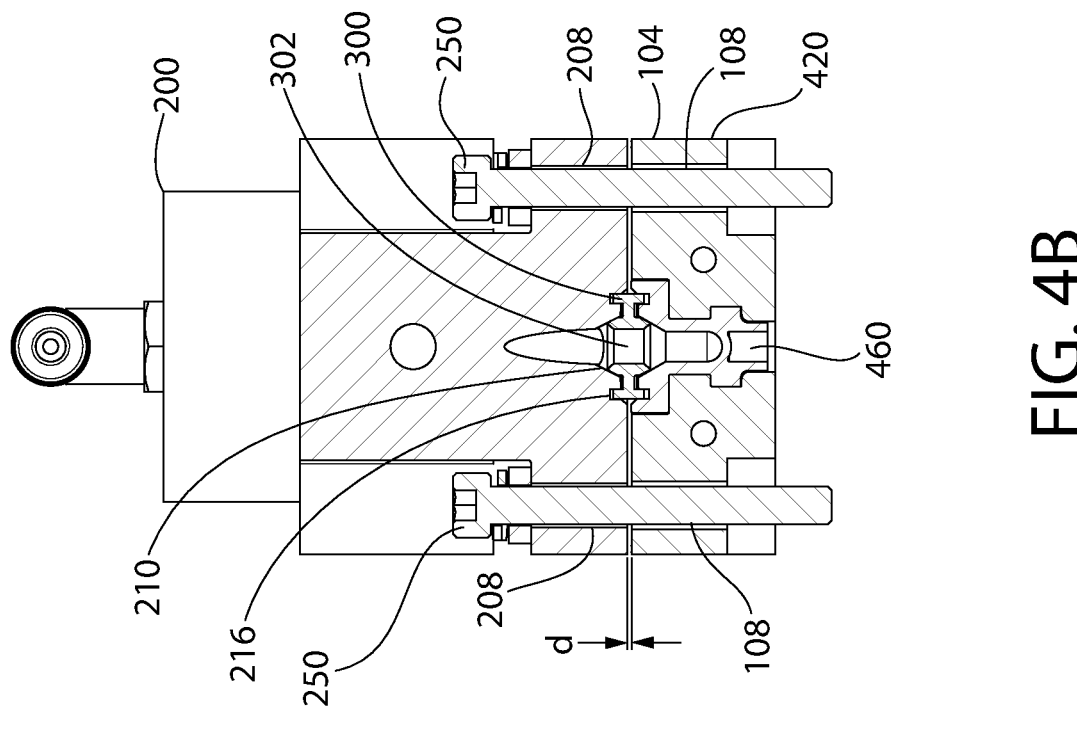
FIG. 4B is a cross-sectional view of the component and one of the substrate blocks of FIG. 4A, taken along line 4B-4B.
Figure 4A:
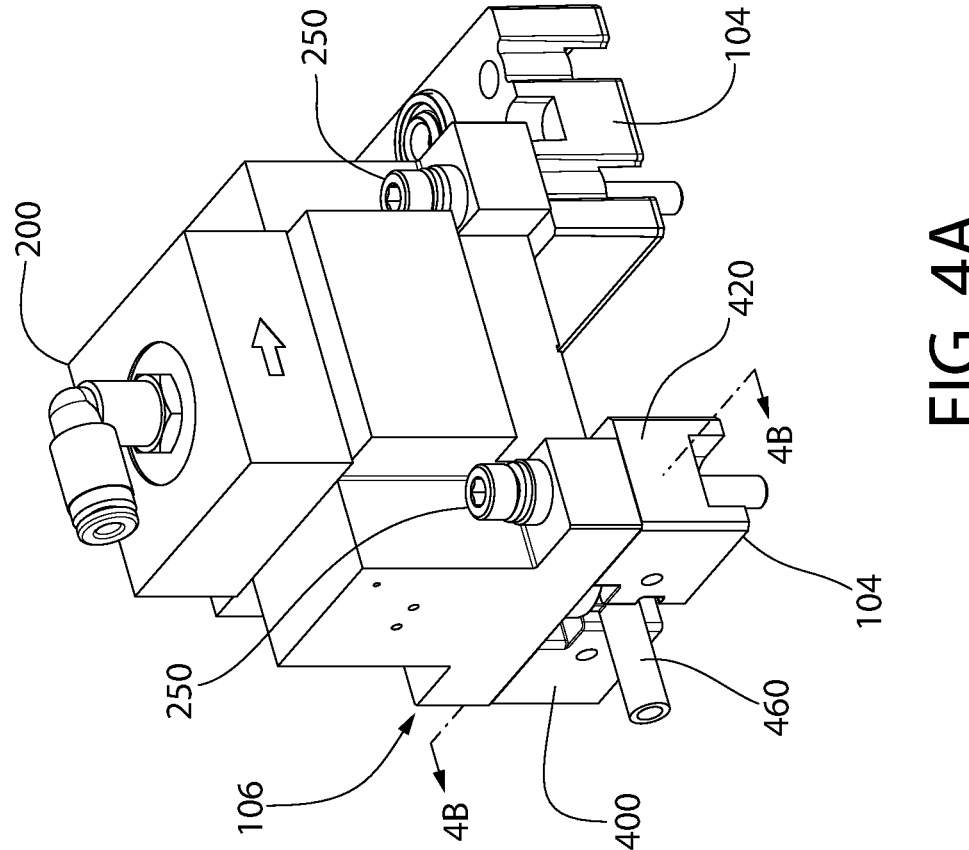
FIG. 4A is a perspective view of a component mounted to a pair of substrate blocks, one of the substrate blocks being a fitting assembly according to the present invention.

As best shown in FIG. 4B, an annular seal 300 is positioned between the fluid flow component 200 and the fitting assembly 400. Similarly, another annular seal 300 is positioned between the fluid flow component 200 and the substrate block 104. The seal 300 has a flow path 302 through the center which permits passage of fluid therethrough. The seal 300 provides a hermetic seal between a fluid port 210 of the fluid flow component 200 and a fluid port 461 of the insert 460 of the fitting assembly 400. The fluid port 461 of the insert 460 of the fitting assembly 400 comprises a seal cavity 462. Each of the fluid ports 210 of the fluid flow component 200 comprises a seal cavity 216. Similarly, the second substrate block 104 has two fluid ports 110 comprising seal cavities 116. The seal 300 is positioned between the seal cavity 462 of the insert 460 and the seal cavity 216 of the fluid flow component 200. Similarly, a second seal 300 (not shown) is positioned between a second seal cavity 216 of the fluid flow component 200 and the seal cavity 116 of the second substrate block 104. A distance d separates the fluid flow component 200 from the fitting assembly 400. This ensures that the seal 300 is compressed between the fluid flow component 200 and the fitting assembly 400. Optionally, the distance d may go to zero as the seal 300 is compressed, depending on the sizing of the seal 300, the fluid flow component 200, and the fitting assembly 400 and the desired compression applied to the seal 300, fluid flow component 200, and fitting assembly 400.

Figure 4C:
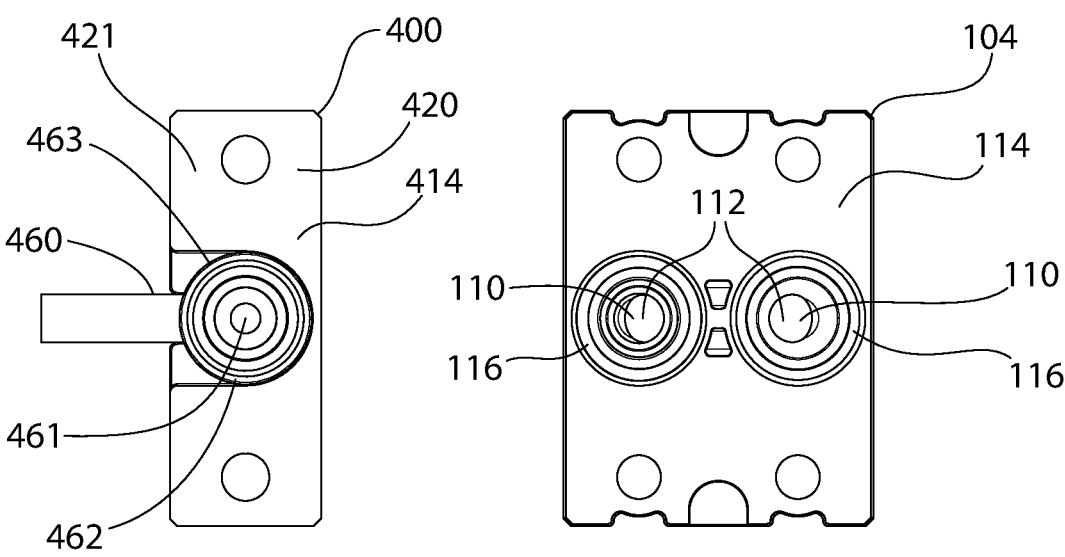
FIG. 4C is a top view of the substrate blocks of FIG. 4A.

FIG. 4C shows the fitting assembly 400 and the second substrate block 104 as viewed from above. As discussed above, the insert 460 has a single fluid port 461 while the second substrate block 104 has two fluid ports 110. Seals 300 may be inserted into seal cavities 116, 462 to seal with components 200 mounted to the fitting assembly 400 and the second substrate block 104. The fitting assembly 400 comprises a seal side mounting surface 414. The second substrate block 104 also comprises a seal side mounting surface 114. The seal side mounting surfaces 414, 114 are the side which receives the seal 300 in a seal cavity 462, 116. As will be discussed in greater detail below, the seal side mounting surface 414 is primarily formed by a first surface 421 of the housing 420, but a portion is also formed by a distal surface 463 of the insert 460. In contrast, the second substrate block 104 is formed as a single component and an entirety of the seal side mounting surface 114 is formed by the second substrate block 104. Thus, except for the port 110, the seal side mounting surface 114 is substantially planar. A fluid flow path 112 extends through the second substrate block 104 from the first port 110 to the second port 110.

Figure 4D:
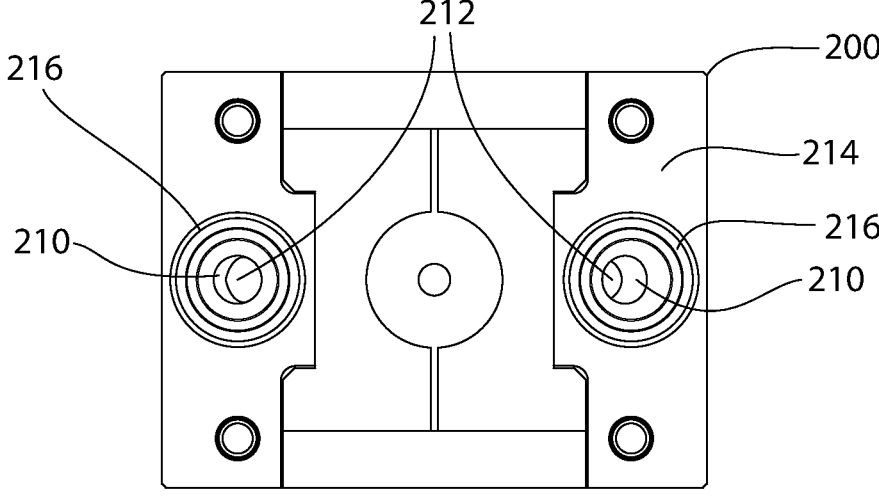
FIG. 4D is a bottom view of the component of FIG. 4A.

Turning to FIG. 4D, the fluid flow component 200 comprises a seal side mounting surface 214 comprising two fluid ports 210, with one fluid port 210 being an inlet and the other being an outlet. A fluid flow path 212 extends from a fluid opening of one fluid port 210 to a fluid opening of the other fluid port 210. Returning to FIG. 4B, it can be seen that, when the seal 300 is installed between the fluid flow component 200 and the fitting assembly 400, there is a distance d between the seal side mounting surface 414 and the seal side mounting surface 214. Thus, the seal 300 is compressed between the fluid flow component 200 and the seal assembly 400. The seal side mounting surface 214 of the fluid flow component 200 and the seal side mounting surface 114 of the second mounting block 104 are similarly separated by a distance d. Once again, the distance d may go to zero as the seal 300 is compressed, depending on the sizing of the seal 300, the fluid flow component 200, and the mounting block 104 and the desired compression applied to the seal 300, fluid flow component 200, and mounting block 104. During assembly, the seal side mounting surfaces 114, 214, 414 are drawn closer together by the fasteners 250, reducing the distance d between the seal side mounting surfaces 114, 414 of the fitting assembly 400 and the second mounting block 104 and the seal side mounting surface 214 of the fluid flow component 200.

Turning to FIGS. 5A-F, the fitting assembly 400 will be described in greater detail. The fitting assembly 400 shown in FIGS. 5A-F comprises the insert 460 and the housing 420 as shown previously. The insert 460 has an elbow configuration. Thus, a fluid flow path 412 extends from the port 461 to a tube stub 464. The tube stub 464 is configured to be joined to tubing or another fluid conducting device via welding, a compression fitting, or any other means of making a fluid-tight connection. For instance, the tube stub 464 may be fitted with a coupling means to mechanically couple to another device. Alternately, the tube stub 464 may simply be joined to tubing so that fluid can be routed to another location.

Figure 5A:
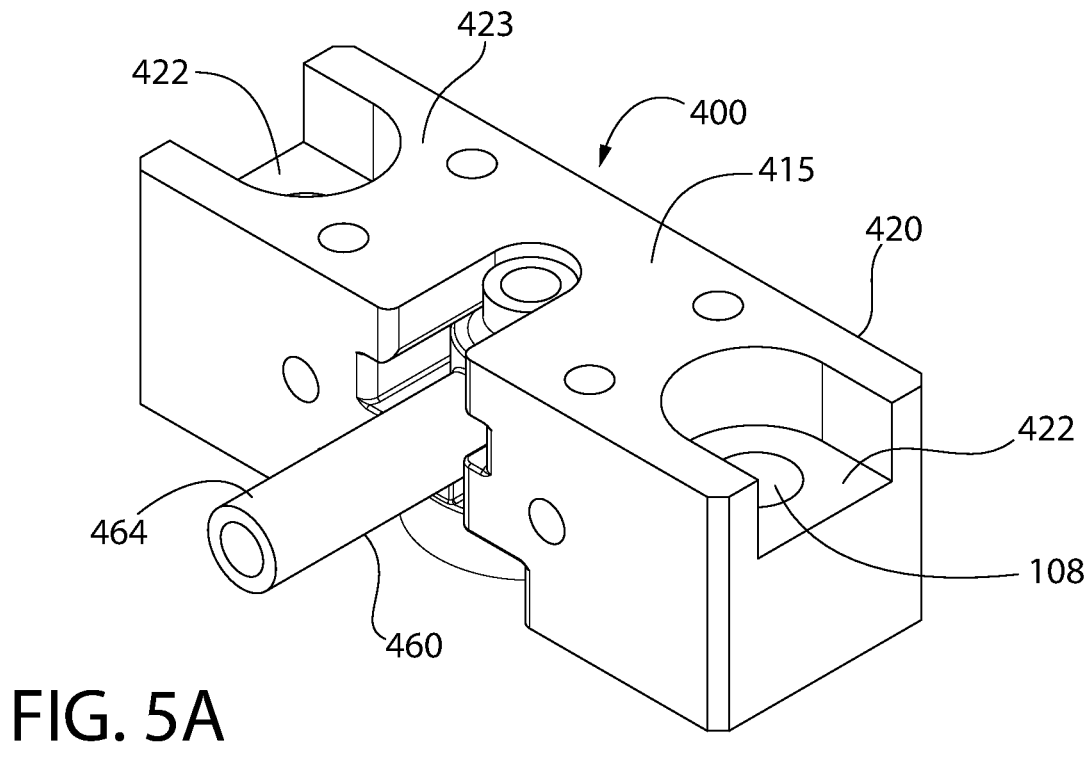
FIG. 5A is a perspective view of an embodiment of a fitting assembly of the present invention, the fitting assembly having an insert and a housing.
Figure 5B:
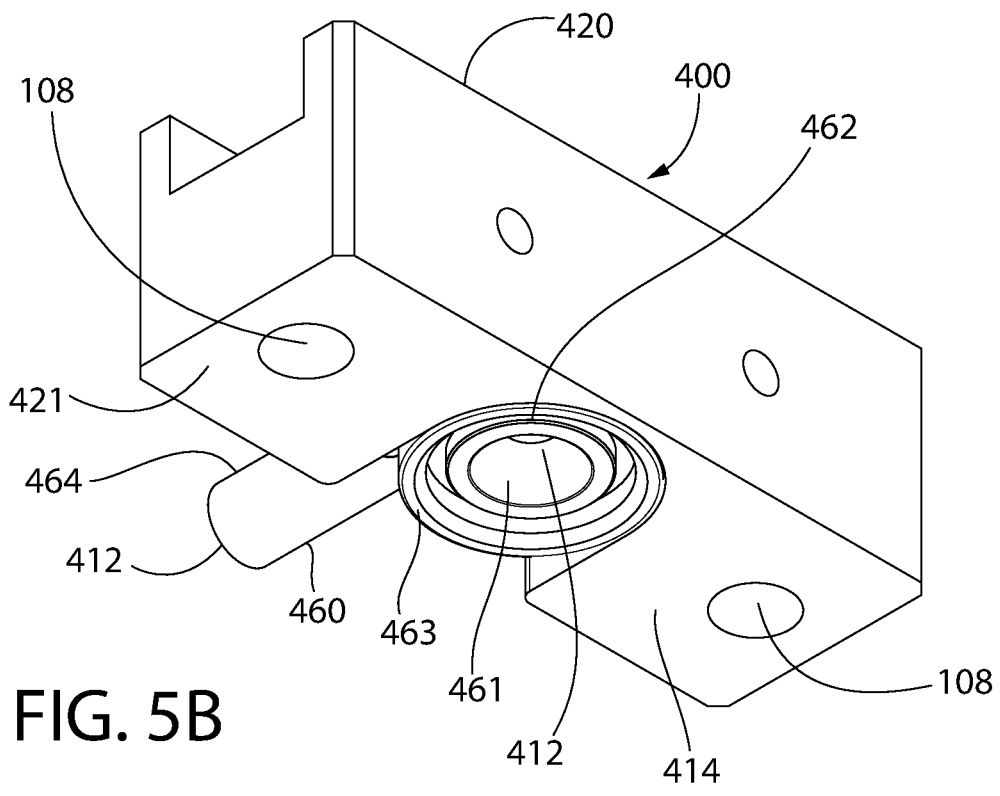
FIG. 5B is a bottom perspective view of the fitting assembly of FIG. 5A.

As best seen in FIG. 5B, the seal side mounting surface 414 is formed by the first surface 421 of the housing 420 and the distal surface 463 of the insert 460. The port 461 of the insert 460 comprises the seal cavity 462 to receive a seal 300. As best seen in FIG. 5A, an assembly surface 415 is opposite the seal side mounting surface 414. The assembly surface 415 may engage another object such as the substrate panel 1402. Fastener passageways 108 in the housing 420 are utilized to secure the fitting assembly 400 to the object to which the fitting assembly 400 is assembled. The fastener passageways 108 may extend to the assembly surface 415 or may terminate in a recess 422 formed into the housing 420. As is apparent, the assembly surface 415 is formed by a second surface 423 of the housing 420. However, in some embodiments, a portion of the assembly surface 415 may be formed by the insert 460.

Figures 5C, 5D, 5E:
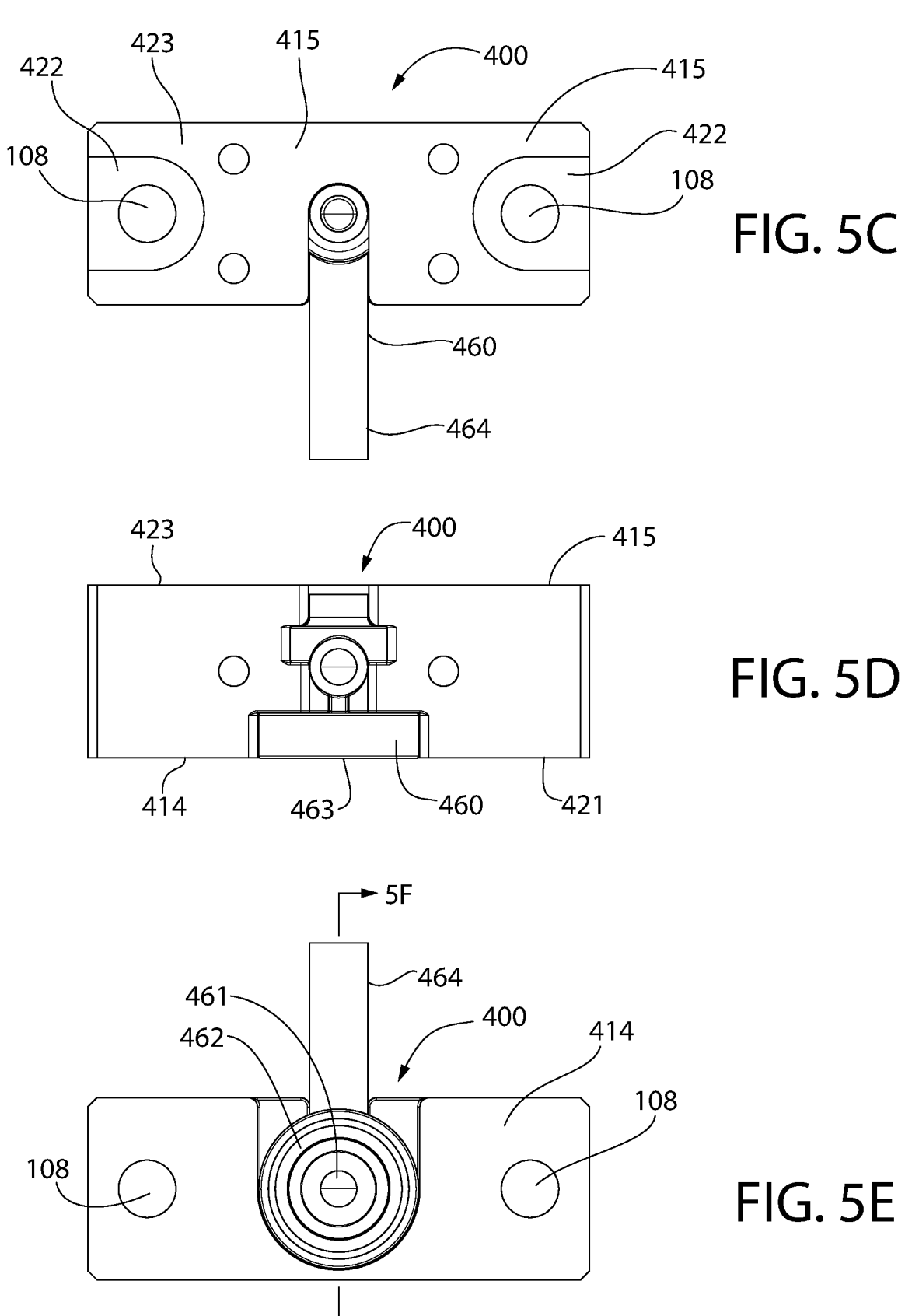
FIG. 5C is a top view of the fitting assembly of FIG. 5A.
FIG. 5D is a front view of the fitting assembly of FIG. 5A.
FIG. 5E is a bottom view of the fitting assembly of FIG. 5A.
Figure 5F:
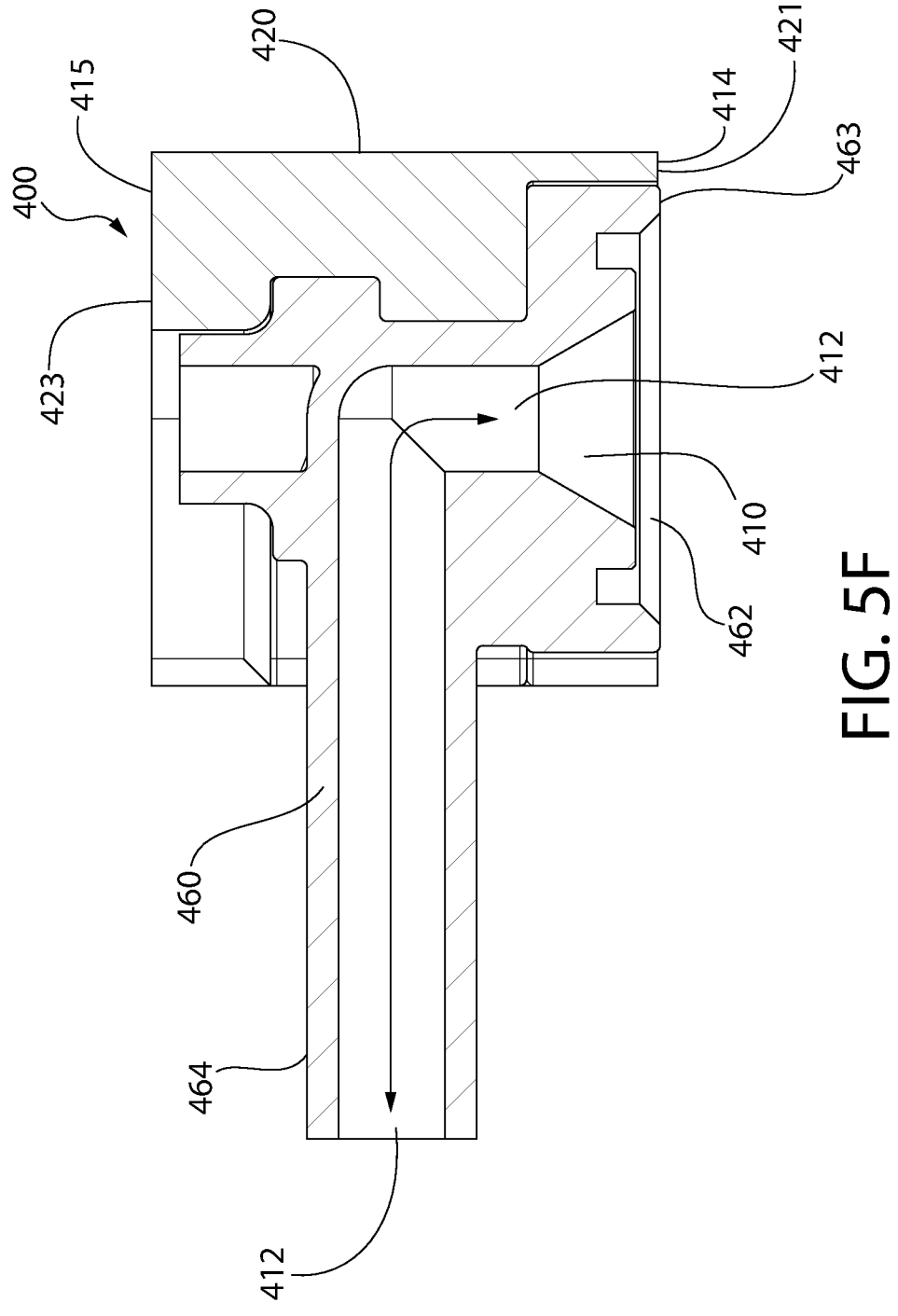
FIG. 5F is a cross-sectional view of the fitting assembly of FIG. 5A, taken along the line 5F-5F.
Figure 6A:
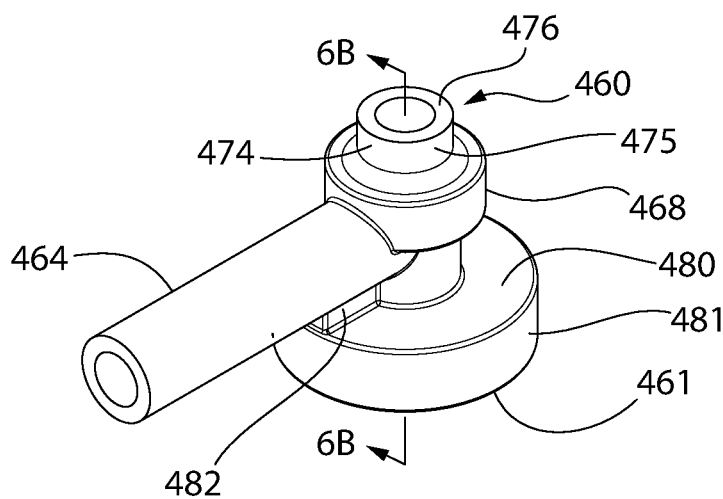
FIG. 6A is a perspective view of an insert as may be used in the housing of the fitting assembly of FIG. 5A, the insert having an elbow configuration.
Figure 6B:
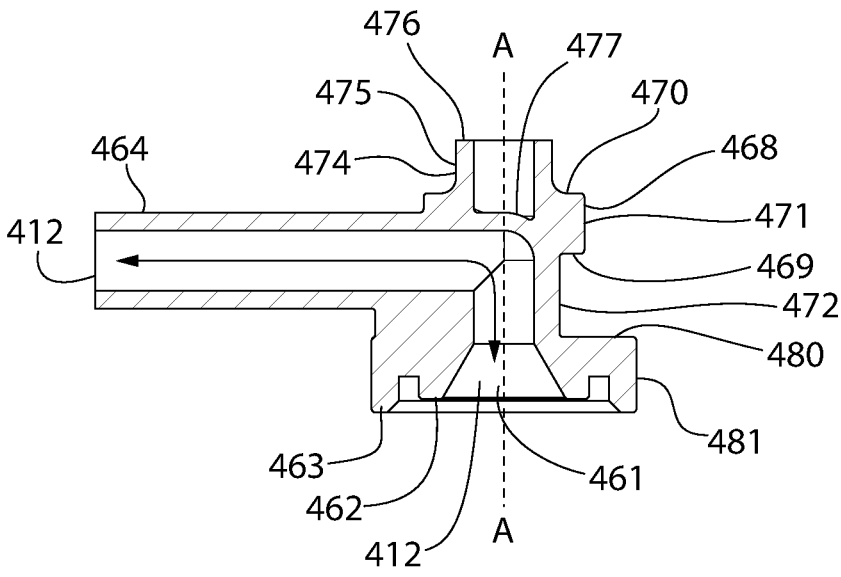
FIG. 6B is a cross-sectional view of the insert of FIG. 6A, taken along line 6B-6B.

Turning to FIGS. 6A and 6B, an insert 460 is shown having an elbow configuration. The insert 460 is identical to that shown in FIGS. 4A-5F. As can be better seen in FIGS. 6A and B, the insert 460 has a port 461, a seal cavity 462, a distal surface 463, and a tube stub 464. A fluid flow path extends from the port 461 to the tube stub 464. The insert 460 further comprises a collar 468. The collar 468 and the port 461 are aligned along a longitudinal axis A-A, with the longitudinal axis A-A extending through centers of the port 461 and the collar 468. The collar 468 comprises a first collar surface 469, an opposite second collar surface 470, and an outer diameter 471. The first and second collar surfaces 469, 470 are preferably parallel. In addition, the first and second collar surfaces 469, 470 are preferably perpendicular to the longitudinal axis A-A. The outer diameter 471 need not be circular, and may instead be an outer surface having any desired shape. For instance, the outer diameter 471 may actually have a rectangular shape, a splined shape, or other shape so long as it is configured to engage the housing 420.

The insert 460 also comprises an alignment feature 474. The alignment feature 474 extends from the collar 468 and does not form a part of the flow path 412. The alignment feature 474 comprises an outer diameter 475 and a proximal surface 476. The alignment feature 474 is also axially aligned with the longitudinal axis A-A, a center of the alignment feature 474 coincident with the longitudinal axis A-A. The proximal surface 476 is recessed with respect to the second surface 423 of the housing 420 as best seen in FIG. 5D. The tube stub 464 extends substantially perpendicular to the longitudinal axis A-A because the insert 460 is an elbow. In other configurations, the tube stub 464 may extend in a different direction, depending on the type of insert utilized.

As can be seen, the alignment feature 474 has a wall 477 which isolates the flow path 412 from the remainder of the alignment feature 474 and ensures that the insert 460 has no undesired openings. Optionally, the wall 477 may be the same thickness as the wall of the tube stub 464 or it may be a different thickness. The port 461 of the insert 461 further comprises a flange surface 480 opposite the distal surface 463 and a port outer diameter 481 extending between the distal surface 463 and the flange surface 480. Preferably, the distal surface 463 and the flange surface 480 are parallel. Preferably, both the distal surface 463 and the flange surface 480 are perpendicular to the longitudinal axis A-A. A rib 482 extends between the tube stub 464 and the flange surface 480 of the port 461, providing additional strength to the tube stub 464 and preventing unwanted deflection.

An outer diameter 472 extends from the first collar surface 469 to the flange surface 480. The outer diameter 472 is a smaller diameter than either the port outer diameter 481 or the outer diameter 471 of the collar 468. The outer diameter 471 of the collar 468 is smaller than the port outer diameter 481 but greater than the outer diameter 472. In some embodiments, the outer diameter 471 of the collar 468 may be equal to or larger than the port outer diameter 481.

Figure 7A:
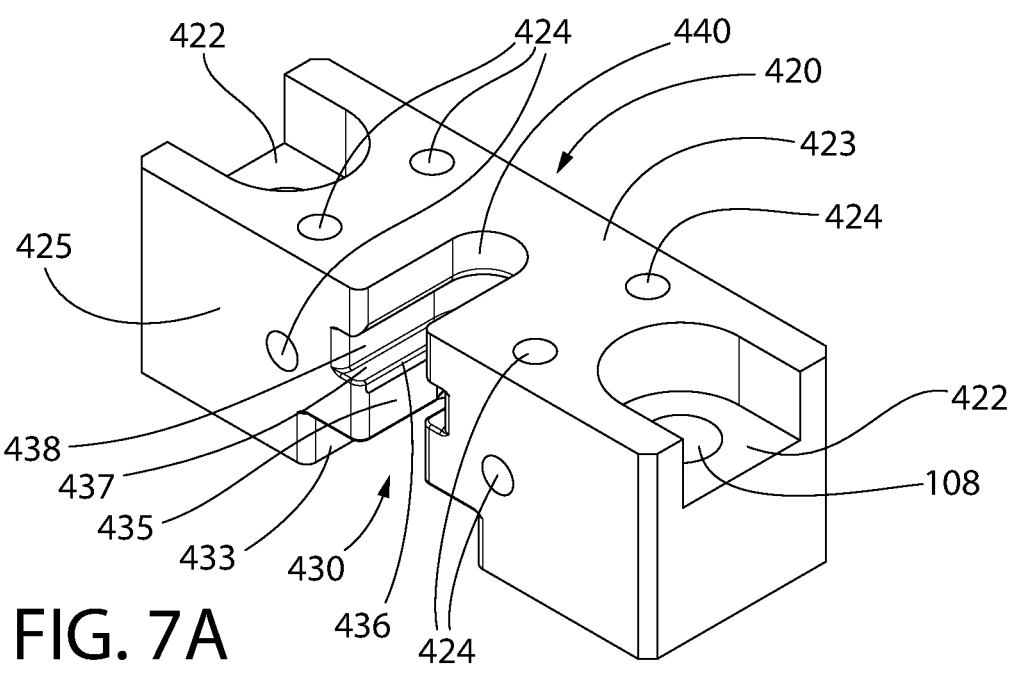
FIG. 7A is a perspective view of the housing of the fitting assembly of FIG. 5A.
Figure 7B:
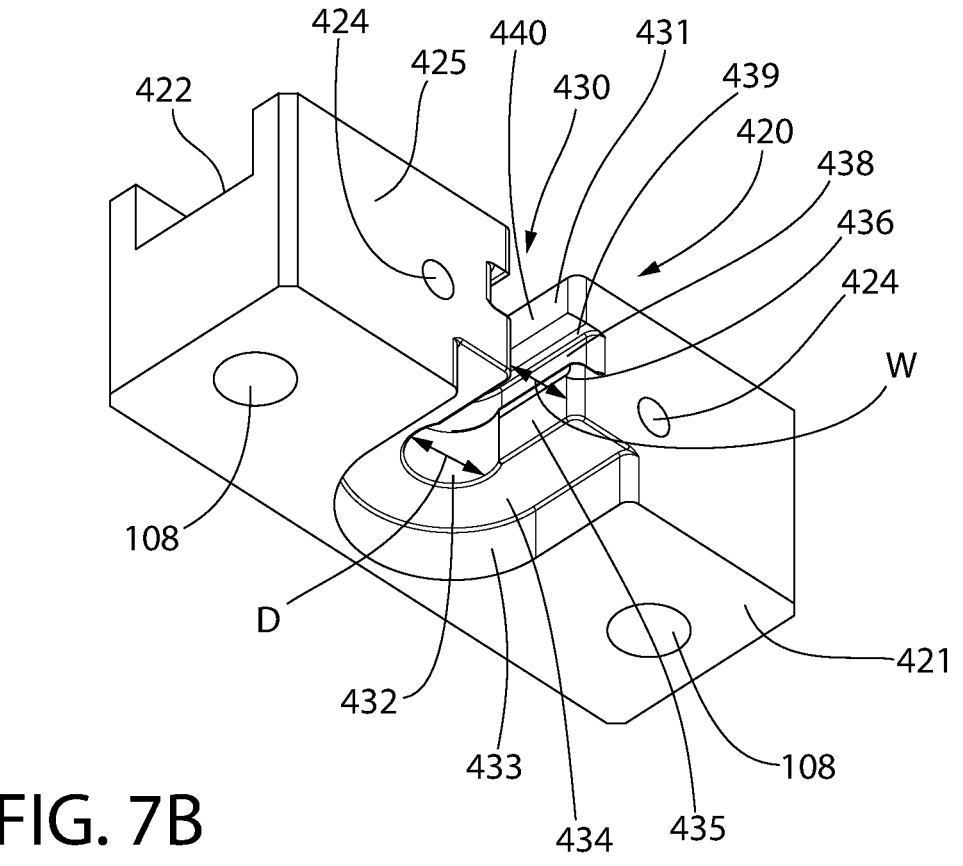
FIG. 7B is a bottom perspective view of the housing of the fitting assembly of FIG. 5A.

FIGS. 7A & 7B show the housing 420 as illustrated in FIGS. 4A-5F. As discussed previously, the housing 420 has recesses 422 formed in the second surface 423 and fastener passageways 108 extending from the first surface 421 to the recesses 422. A plurality of additional fastener passageways 424 are formed in the second surface 423 and a third surface 425. The fastener passageways 424 may be threaded or un-threaded holes and may be utilized for fastening various devices to the housing 420 to enable the creation of various assemblies or functional components which incorporate the fitting assembly 400. As can be seen, the third surface 425 is substantially perpendicular to the first and second surfaces 421, 423.

The housing 420 further comprises an insert receiving cavity 430. The insert receiving cavity 430 is formed into the first surface 421, second surface 423, and third surface 425 of the housing 420. The insert receiving cavity 430 comprises an entry portion 431 and an insert portion 432. The entry portion 431 is the portion of the insert receiving cavity 430 which has a plurality of substantially parallel side surfaces, enabling the insert 460 to slide through the entry portion 431 to the insert portion 432. The insert portion 432 has a plurality of substantially circular side surfaces which receive the insert 460 and hold it in position as will be discussed in greater detail below.

The insert receiving cavity 430 comprises a plurality of surfaces which form both the entry portion 431 and the insert portion 432. The insert receiving cavity 430 comprises a port receiving wall 433 which extends from the first surface 421. The port receiving wall 433 receives the port outer diameter 481 of the port 461. Adjacent the port receiving wall 433, a flange receiving surface 434 extends substantially parallel to the first surface 421. The flange receiving surface 434 receives the flange surface 480 of the port 461.

Adjacent the flange receiving surface 434 is a perimeter surface 435, the perimeter surface 435 engaging the outer diameter 472 of the insert 460. Adjacent the perimeter surface 435 is the first collar receiving surface 437, the first collar receiving surface 437 substantially parallel to the first surface 421 and the flange receiving surface 434. The first collar receiving surface 437 receives the first collar surface 469 of the collar 468.

Cradle surfaces 436 are formed in the entry portion 431 of the insert receiving cavity 430. The cradle surfaces 436 join the perimeter surface 435 to the first collar receiving surface 437 and may be formed as chamfers or other angled surfaces which are arranged at an angle with respect to both the first collar receiving surface 437 and the perimeter surface 435. Alternately, the cradle surfaces 436 may have a convex or concave shape. The cradle surfaces 436 may engage the tube stub 464 or another alignment feature of the insert 460 or other inserts discussed in greater detail below.

The inset receiving cavity 430 also comprises a second collar receiving surface 439 and a third collar receiving surface 438. The third collar receiving surface 438 extends from the first collar receiving surface 437 to the second collar receiving surface 439. Each of the first and second collar receiving surfaces 437, 439 are substantially parallel to one another and to the first surface 421. The second collar receiving surface 439 receives the second collar surface 470 while the third collar receiving surface 438 receives the outer diameter 471 of the collar 468. Finally, an alignment surface 440 forms an alignment slot extending from the second collar receiving surface 439 to the second surface 423 of the housing 420. The alignment surface 440 engages the outer diameter 475 of the alignment feature 474.

The perimeter surface 435 comprises a width W in the entry portion 431 and a diameter D in the insert portion 432. As can be seen from the figures, the diameter D is greater than the width W. This serves to retain the insert 460 in the insert portion 432 and prevent unwanted movement of the insert portion 432. When assembled, the insert 460 engages the surfaces of the insert receiving cavity 430 to provide positioning of the insert 460 within the housing 420 and minimize any relative motion. The outer diameter 472 has a diameter that is equal to or slightly larger than the diameter D of the perimeter surface 435. This constrains the insert 460 in a radial direction, preventing movement of the insert 460 laterally with respect to the first surface 421. As discussed above, the width W of the perimeter surface 435 is less than the diameter D, providing an interference fit that ensures retention of the insert 460 but also aids in preventing movement of the insert 460 in the direction of the entry portion 431.

The distance between the flange receiving surface 434 and the first collar receiving surface 437 are also configured to be equal to or greater than the distance between the first collar surface 469 and the flange surface 480. This results in a close fit or a clearance fit which prevents unwanted axial motion between the insert 460 and the housing 420. Thus, the axial and radial motion of the insert 460 is constrained with respect to the longitudinal axis A-A. Finally, the cradle surfaces 436 are configured to engage the tube stub 464 in a close fit or interference fit to ensure that the insert 460 is constrained from rotation about the longitudinal axis A-A. This ensures that the insert 460 is well supported while preventing unwanted relative motion.

The remaining surfaces are a free fit with the insert 460 to ensure that the insert 460 is not over-constrained. For instance, the port receiving wall 433 is spaced from the port outer diameter 481 so that the port receiving wall 433 does not engage the port outer diameter 481 and adequate clearance is maintained therebetween. The outer diameter 471 of the collar 468, the second collar receiving surface 470, and the outer diameter 475 of the alignment feature 474 are all smaller than the corresponding third collar receiving surface 438, second collar receiving surface 439, and alignment surface 440. These surfaces are only used for gross alignment during initial assembly of the insert 460 with the housing 420. These surfaces can also prevent excessive deflection, but are not configured to be in contact with one another absent deformation of the insert 460 or the housing 420. However, in some embodiments, the outer diameter of the alignment feature may be in contact with one of the surfaces of the insert receiving cavity 430.

Figure 8A:
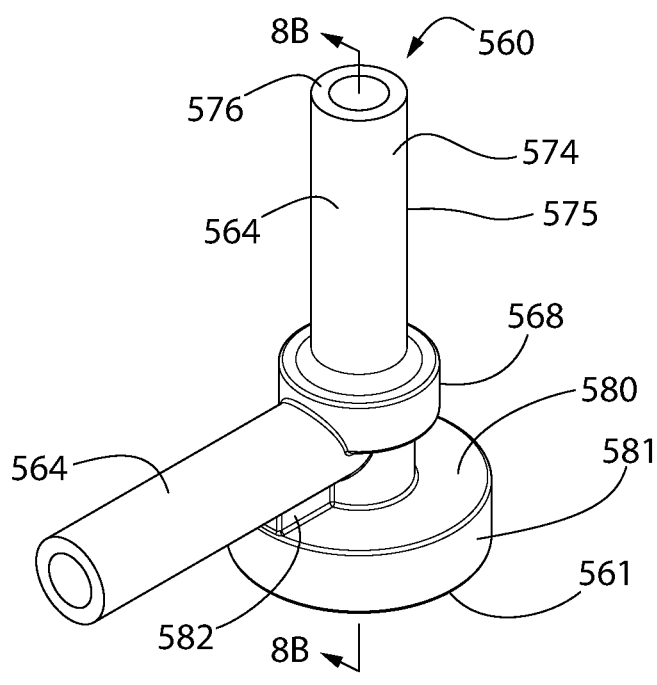
FIG. 8A is a perspective view of an insert as may be used in the housing of the fitting assembly of FIG. 5A, the insert having a run tee configuration.
Figure 8B:
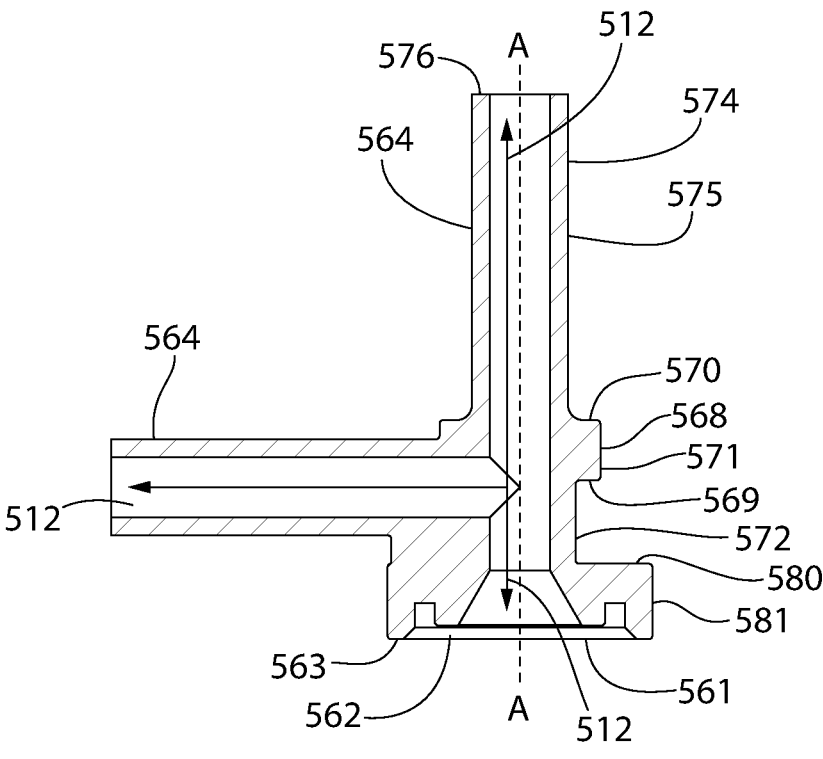
FIG. 8B is a cross-sectional view of the insert of FIG. 8A, taken along line 8B-8B.

Turning to FIGS. 8A and 8B, an insert 560 is shown having a run tee configuration. The insert 560 differs in that a tube stub 564 extends perpendicular to a longitudinal axis A-A and a second tube stub 564 also serves as an alignment feature 574, the second tube stub extending along the longitudinal axis A-A. Thus, a flow path 512 extends from the port 561 to both of the tube stubs 564. Thus, it is possible to split or join fluids in a fitting assembly 400 comprising the insert 560.

As before, the insert 560 also comprises a collar 568, a port 561, and a rib 582. The collar 568 comprises a first collar surface 569, an opposite second collar surface 570, and an outer diameter 571. The alignment feature 574, the collar 568, and the port 561 are all axially aligned along the longitudinal axis A-A. The alignment feature 574, which is also one of the tube stubs 564, extends beyond the housing 420 when the fitting assembly 400 is assembled. The other tube stub 564 also extends beyond the housing 420 when the fitting assembly 400 is assembled. This ensures that there is adequate material to couple components, tubing, or other devices to the tube stubs 564. The alignment feature 574 further comprises a proximal surface 576 and an outer diameter 575. As is apparent, the outer diameter engages the housing 420 to perform alignment. The proximal surface 576 forms the end of the alignment feature 574 which protrudes beyond the housing 420 in this embodiment. As is apparent, there is no wall which isolates the flow path 512 from the alignment feature 574.

The port 561 comprises a flange surface 580, a distal surface 563, a seal cavity 562, and a port outer diameter 581. The flange surface 580, distal surface 563, first collar surface 569, and second collar surface 570 are all substantially parallel to one another and perpendicular to the longitudinal axis A-A. An outer diameter 572 extends from the first collar surface 569 to the flange surface 580 and is substantially parallel to the longitudinal axis A-A.

Figure 9A:
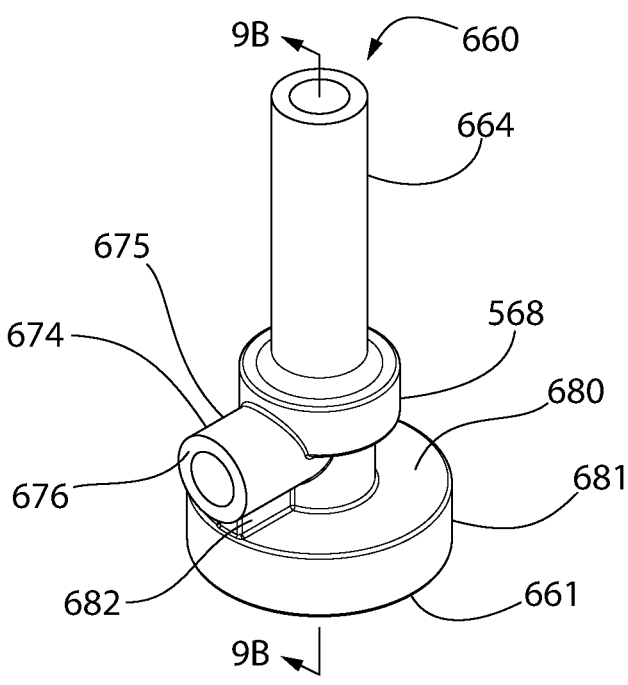
FIG. 9A is a perspective view of an insert as may be used in the housing of the fitting assembly of FIG. 5A, the insert having a straight configuration.
Figure 9B:
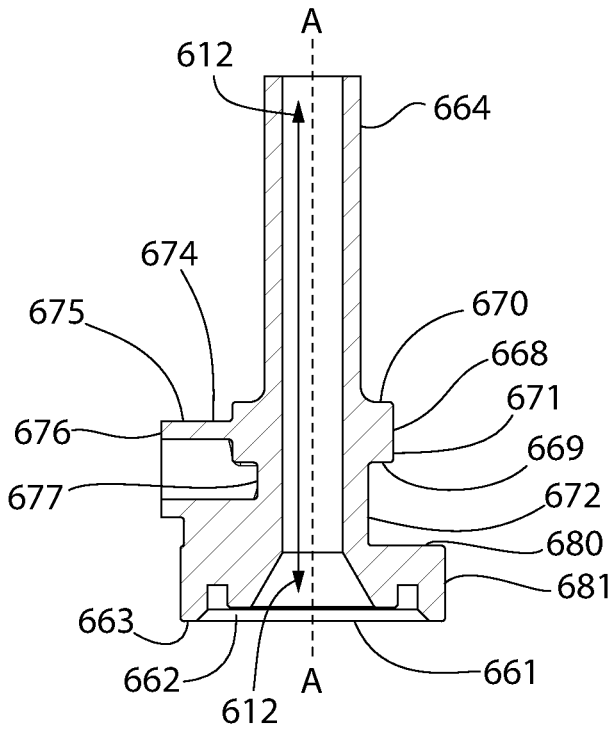
FIG. 9B is a cross-sectional view of the insert of FIG. 9A, taken along line 9B-9B.

Turning to FIGS. 9A and 9B, an insert 660 is shown having a straight configuration. The insert 660 is similar to the insert 460 except that an alignment feature 674 and a tube stub 664 are reversed. Thus, a flow path 612 extends from a port 661 along a longitudinal axis A-A to the tube stub 664, with no bends or tees. The tube stub 664 extends beyond the housing 420 so that other tubing, devices, or components can be coupled thereto. The alignment feature 674 extends substantially perpendicular to the longitudinal axis A-A and comprises an end surface 676 and an outer diameter 675. A wall 677 isolates the flow path 612 from the outside environment.

The insert 660 further comprises a collar 668 having a first collar surface 669, an opposite second collar surface 670, and an outer diameter 671 extending between the first collar surface 669 and the second collar surface 670. The port 661 comprises a seal cavity 662, a distal surface 663, and a flange surface 680. A port outer diameter 681 extends from the distal surface 663 to the flange surface 680. The first collar surface 669, second collar surface 670, flange surface 680, and distal surface 663 are substantially parallel. Each of these surfaces are substantially perpendicular to the longitudinal axis A-A. A rib 682 extends from the first collar surface 669 to the flange surface 680 to provide additional strength to the insert 660.

Figure 10A:
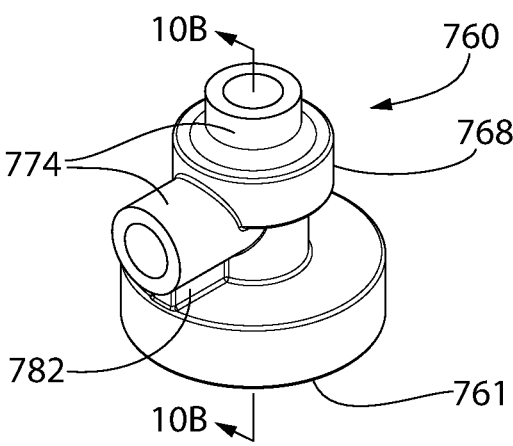
FIG. 10A is a perspective view of an insert as may be used in the housing of the fitting assembly of FIG. 6A, the insert having a cap configuration.
Figure 10B:
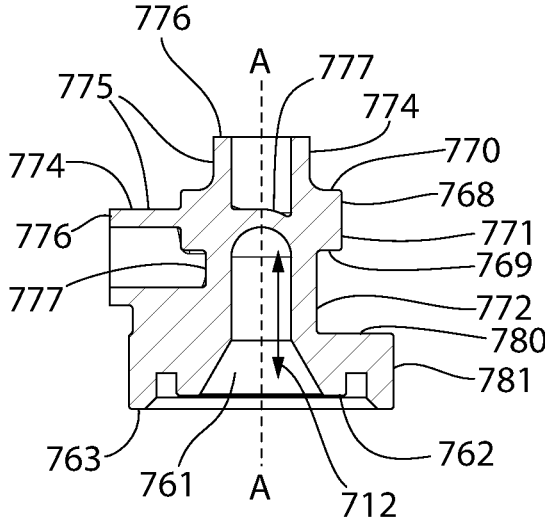
FIG. 10B is a cross-sectional view of the insert of FIG. 10A, taken along line 10B-10B.

Turning to FIGS. 10A and 10B, an insert 760 is shown having a cap configuration. In the case of the insert 760, the flow path 712 terminates within the insert 760. The flow path 712 extends from a port 761 and extends within the insert 760 at walls 777 which form a part of alignment features 774. A longitudinal axis A-A extends through a center of the port 761 and a center of a first alignment feature 774. A second alignment feature 774 extends perpendicular to the longitudinal axis A-A. Both alignment features 774 comprise end surfaces 776 and outer diameters 775. The walls 777, discussed above, isolate the flow path 712 from the outside environment.

A collar 768 is aligned along the longitudinal axis A-A, the collar 768 having a first collar surface 769, a second collar surface 770, and an outer diameter 771. The port 761 has a flange surface 780, a distal surface 763, a seal cavity 762, and an outer surface 781 extending from the flange surface 780 to the distal surface 763. The flange surface 780 and the distal surface 763 are substantially parallel. The flange surface 780 and the distal surface 763 are substantially perpendicular to the longitudinal axis A-A. Similarly, the first collar surface 769 and the second collar surface 770 are substantially parallel. The first and second collar surfaces 769, 770 are substantially perpendicular to the longitudinal axis A-A. A rib 782 extends from the first collar surface 769 to the flange surface 780 and an outer surface 772 also extends from the first collar surface 769 to the flange surface 780. As is apparent, there are no tube stubs because the insert 760 is intended to terminate a fluid flow path or branch.

Figure 11A:
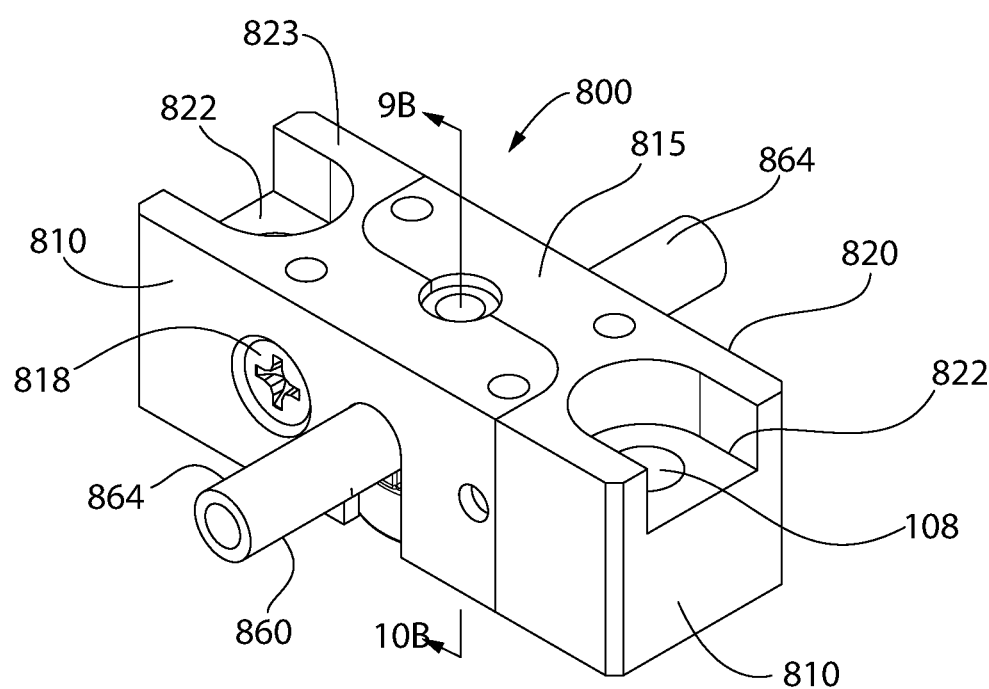
FIG. 11A is a perspective view of an alternative fitting assembly, the fitting assembly comprising an insert having a branch tee configuration.
Figure 11B:
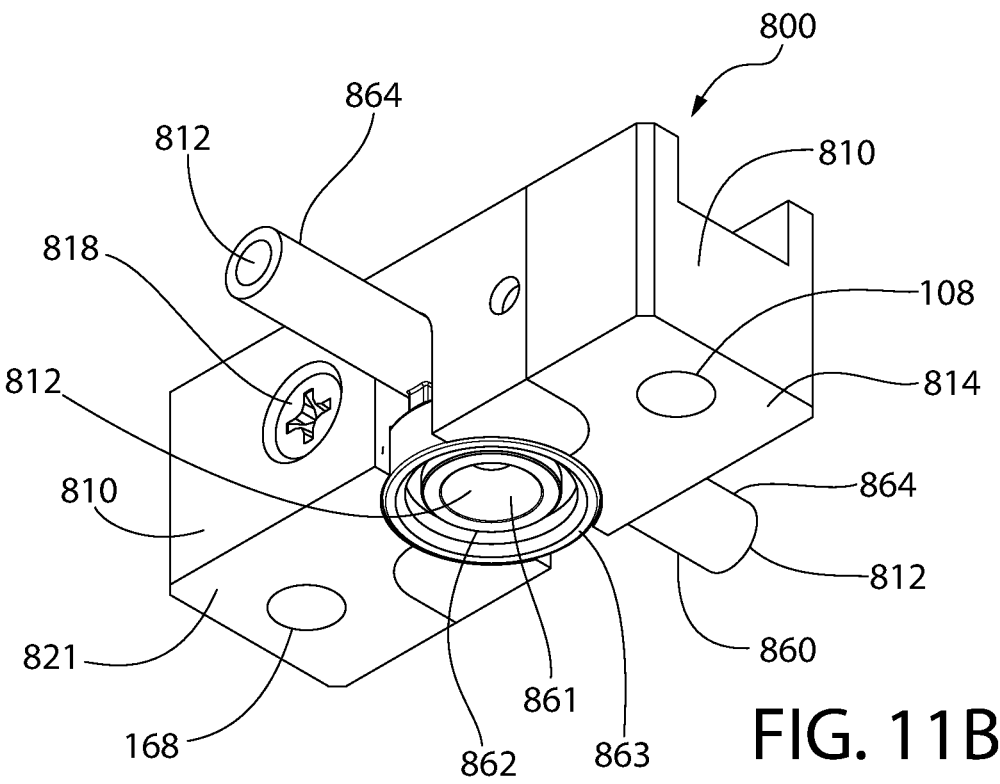
FIG. 11B is a bottom perspective view of the fitting assembly of FIG. 11A.
Figure 11C:
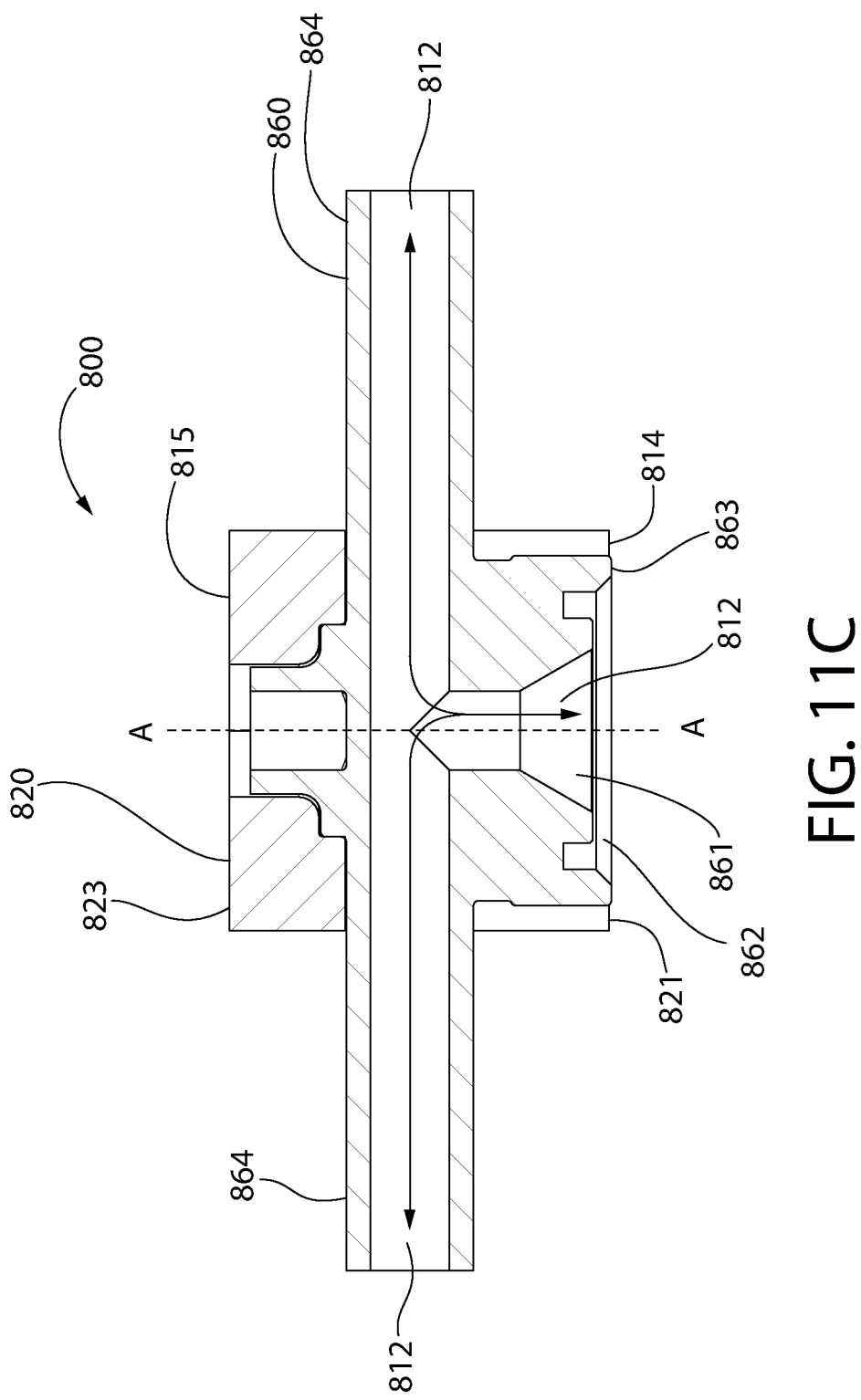
FIG. 11C is a cross-sectional view of the insert of FIG. 11A, taken along line 11C-11C.

FIG. 11A-11C show an alternate embodiment of a fitting assembly 800 arranged in a branch tee configuration. In the fitting assembly 800, a housing 820 is formed of two portions 810. In this embodiment, the portions 810 are identical. In other embodiments, the portions 810 need not be identical and may differ. The fitting assembly 800 further comprises an insert 860 having two tube stubs 864 extending perpendicular to a longitudinal axis A-A. The two tube stubs 864 enable branching or joining of fluid flows, similar to the insert 560 discussed above. A fluid flow path 812 extends from a port 861 to the two tube stubs 864.

The housing 820 comprises fastener passageways 108 that terminate in recesses 822. Optionally, the recesses 822 may be omitted. The fitting assembly 800 further comprises a seal side mounting surface 814 formed by a first surface 821 of the housing 820 and a distal surface 863 of the port 861 of the insert 860. An opposite assembly surface 815 of the fitting assembly 800 is formed by a second surface 823 of the housing 820. One or more fasteners 818 may be used to join the portions 810 of the housing 820. Optionally, the fasteners 818 may be integrally formed with the portions 810 or may be separate fasteners such as bolts or screws.

As can be seen best in FIGS. 11B and 11C, the flow path extends from the port 861 to the tube stubs 864. The port 861 comprises a distal surface 863 and a seal cavity 862 to receive a seal 300. The distal surface 863 extends beyond the first surface 821 of the housing 820 so that adequate contact between the seal cavity 862 and the seal 300 is ensured.

Optionally, the distal surface 863 may be flush with the first surface 821, but it is generally preferred that it extend beyond the first surface 821.

Figure 12A:
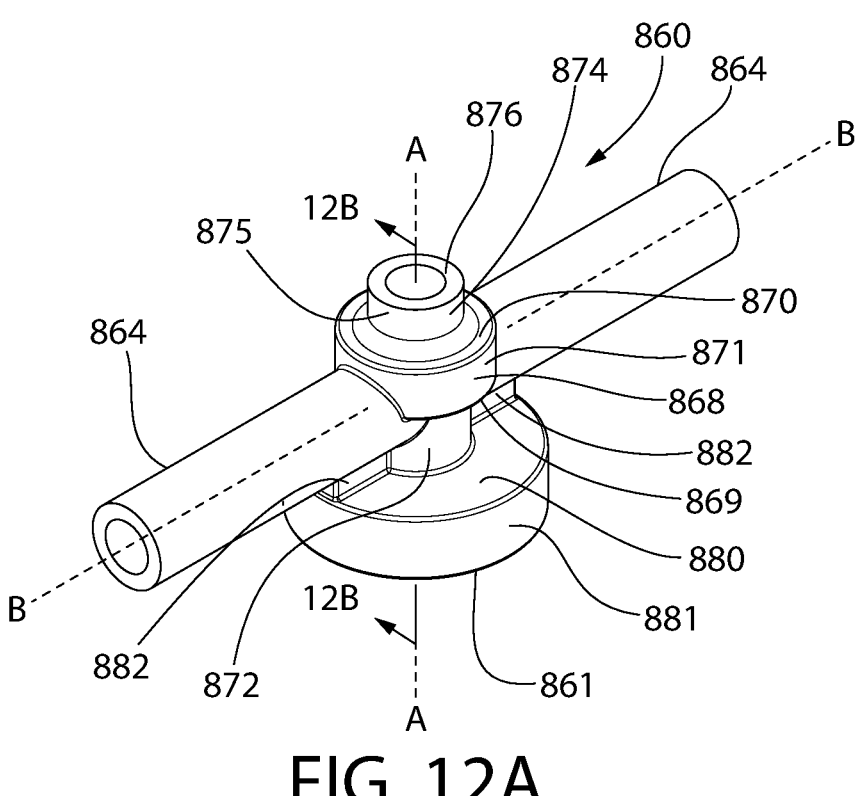
FIG. 12A is a perspective view of the insert used in the fitting assembly of FIG. 11A, the insert having a branch tee configuration.
Figure 12B:
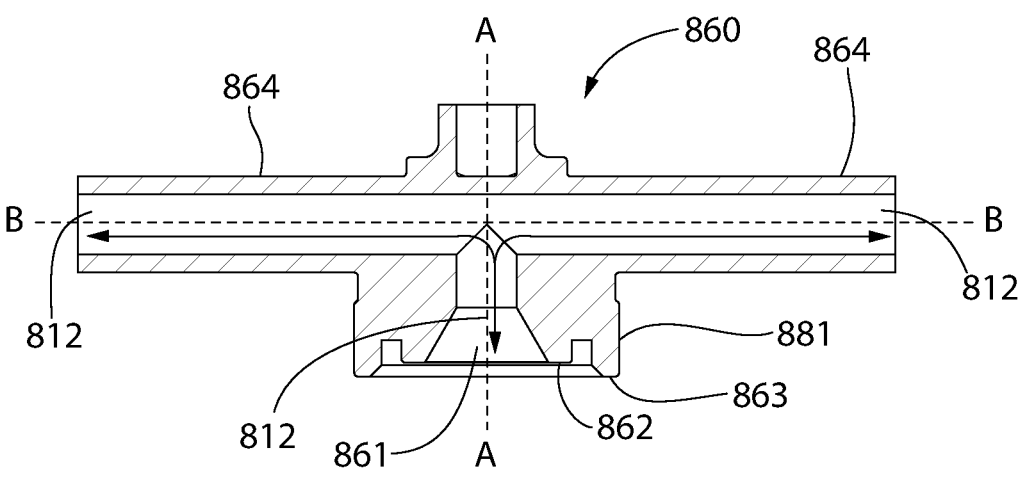
FIG. 12B is a cross-sectional view of the insert of FIG. 12A, taken along line 12B-12B.
Figure 13A:
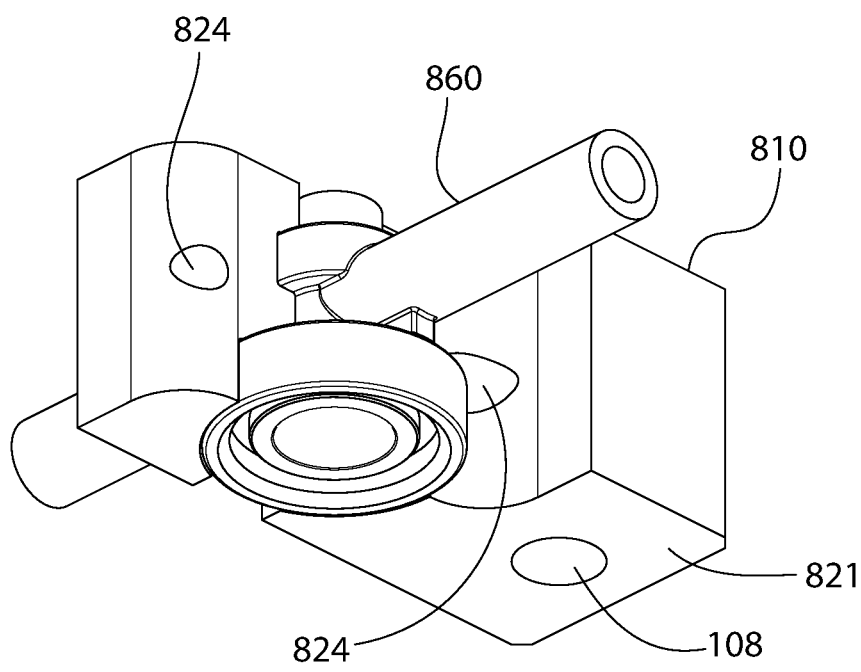
FIG. 13A is a perspective view of a portion of the fitting assembly of FIG. 11A.
Figure 13B:
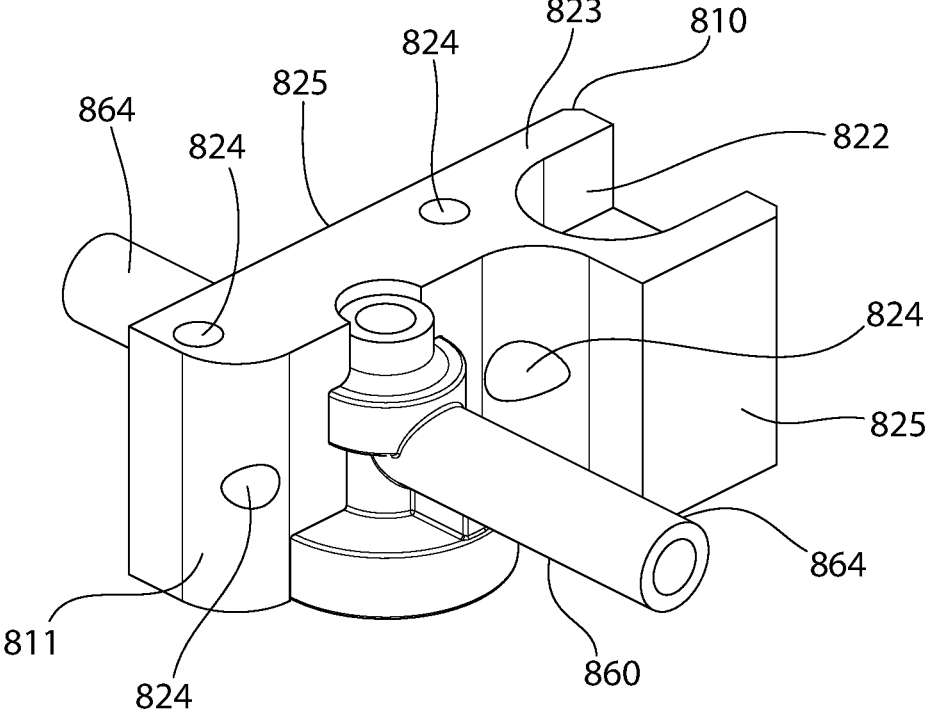
FIG. 13B is a bottom perspective view of the portion of the fitting assembly of FIG. 13A.

FIGS. 12A & 12B show the insert 860 in greater detail. As can be seen, the insert 860 has a port 861 and a flow path 812 extending from the port 861 to first and second tube stubs 864. The port 861 has a seal cavity 862 and a distal surface 863. As with other embodiments, ribs 882 extend from the tube stubs 864 to a flange surface 880 of the port 861. An outer surface 881 extends from the flange surface 880 to the distal surface 863.

The insert 860 further comprises a collar 868. The collar 868 has a first collar surface 869, a second collar surface 870, and an outer diameter 771. An outer surface 872 extends from a first collar surface 769 to the flange surface 880. An alignment feature 874 comprises an outer surface 875 and an end surface 876. The outer surface 875 of the alignment feature 874 extends from the end surface 876 to the second collar surface 870.

A longitudinal axis A-A extends through the port 861, collar 868, and the alignment feature 874. The tube stubs 864 extend in opposite directions and are substantially perpendicular to the longitudinal axis A-A. Thus, the tube stubs 864 extend along an axis B-B that is perpendicular to the longitudinal axis A-A.

FIGS. 13A, 13B, 14A, and 14B show the insert 860 and one portion 810 of the housing 820 of FIGS. 11A-11C with one of the portions 810 of the housing 820 removed. The portion 810 has a first surface 821 and an opposite second surface 823. Extending between the first and second surfaces 821, 823 are a third surface 825 and an opposite fourth surface 826. The third surface is substantially planar while the fourth surface 826 has a planar portion and a generally "S" shaped mating portion 811. The mating portion 811 engages with a mating portion 811 of another one of the portions 810 to form a generally rectangular housing 820. A single fastener passageway 108 is formed through the housing 820. A recess 822 is also formed into the second surface 823.

Figure 14A:
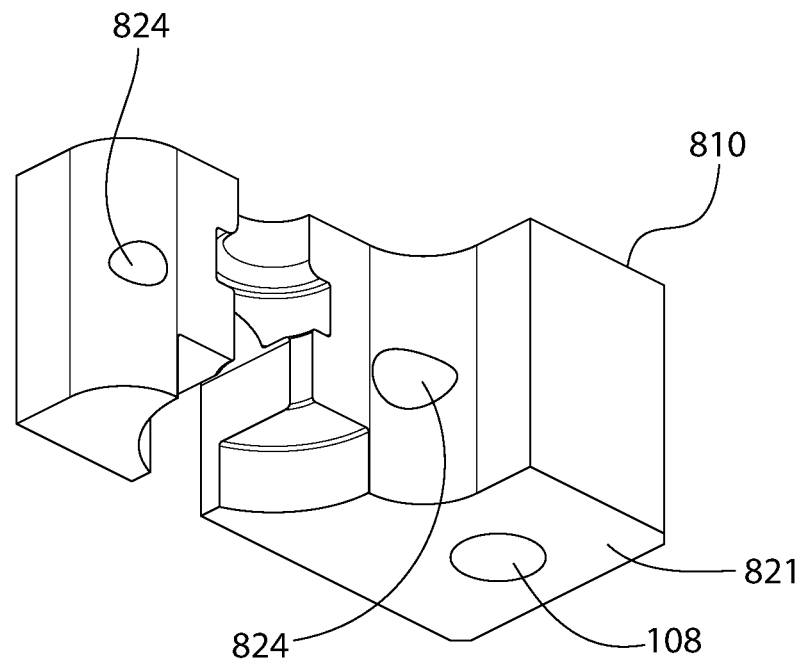
FIG. 14A is a perspective view of a portion of the housing of FIG. 11A.
Figure 14B:
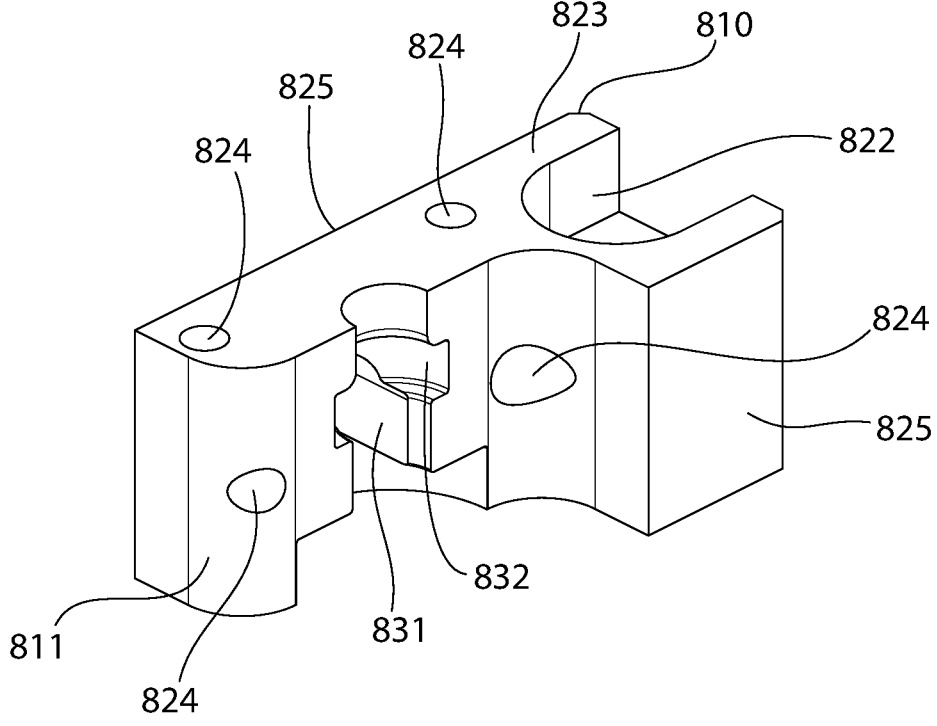
FIG. 14B is a bottom perspective view of the portion of the housing of FIG. 14A.

Turning to FIGS. 14A and 14B, the insert receiving cavity 830 comprises an entry portion 831 and an insert portion 832. The insert portion 832 receives the port 861, collar 868, and alignment portion 874. However, the entry portion 831 is only configured to receive a single tube stub 864 and corresponding rib 882. Thus, the insert 860 is not slid through the entry portion 831 until it reaches the insert portion 832 like with the housing 420. Instead, the tube stub 864 is inserted through the entry portion 831 until the remainder of the insert 860 is engaged with the corresponding insert portion 832. When two portions 810 are secured together via the fastener passageways 424, such as with fasteners 818, the insert 860 is secured within the insert portion 832 of the insert receiving cavity 830. The surfaces of the insert receiving cavity 830 engage the insert 860 in the same manner as that of the insert receiving cavity 430.

Figure 15A:
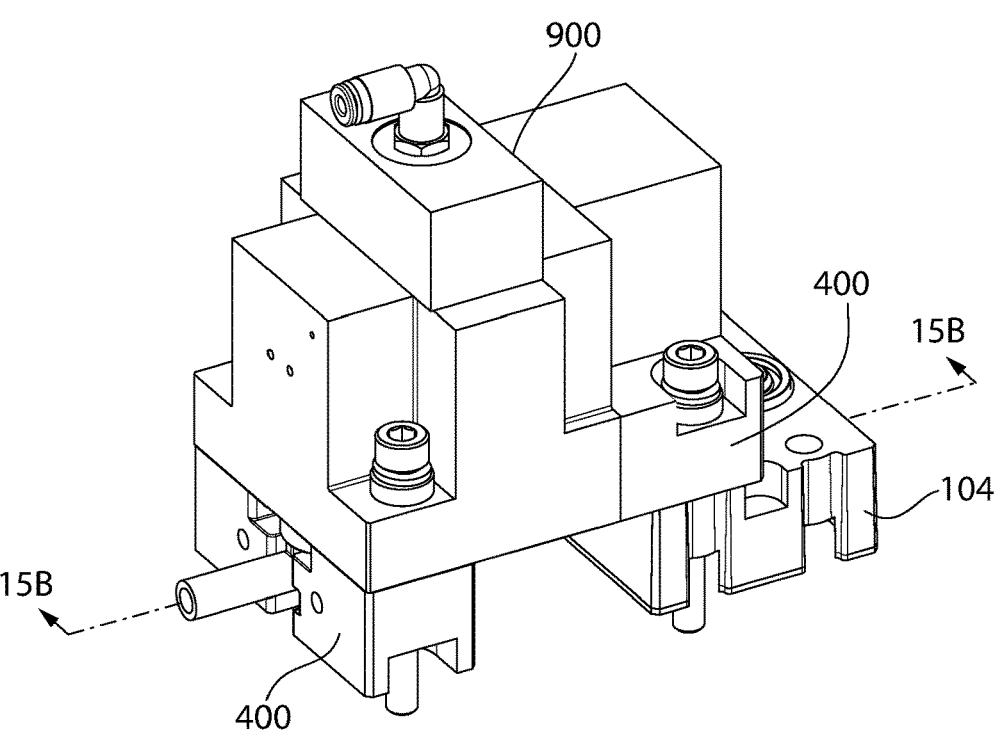
FIG. 15A is a perspective view of a component mounted to a pair of substrate blocks, a portion of the component formed by a fitting assembly according to the present invention.
Figure 15B:
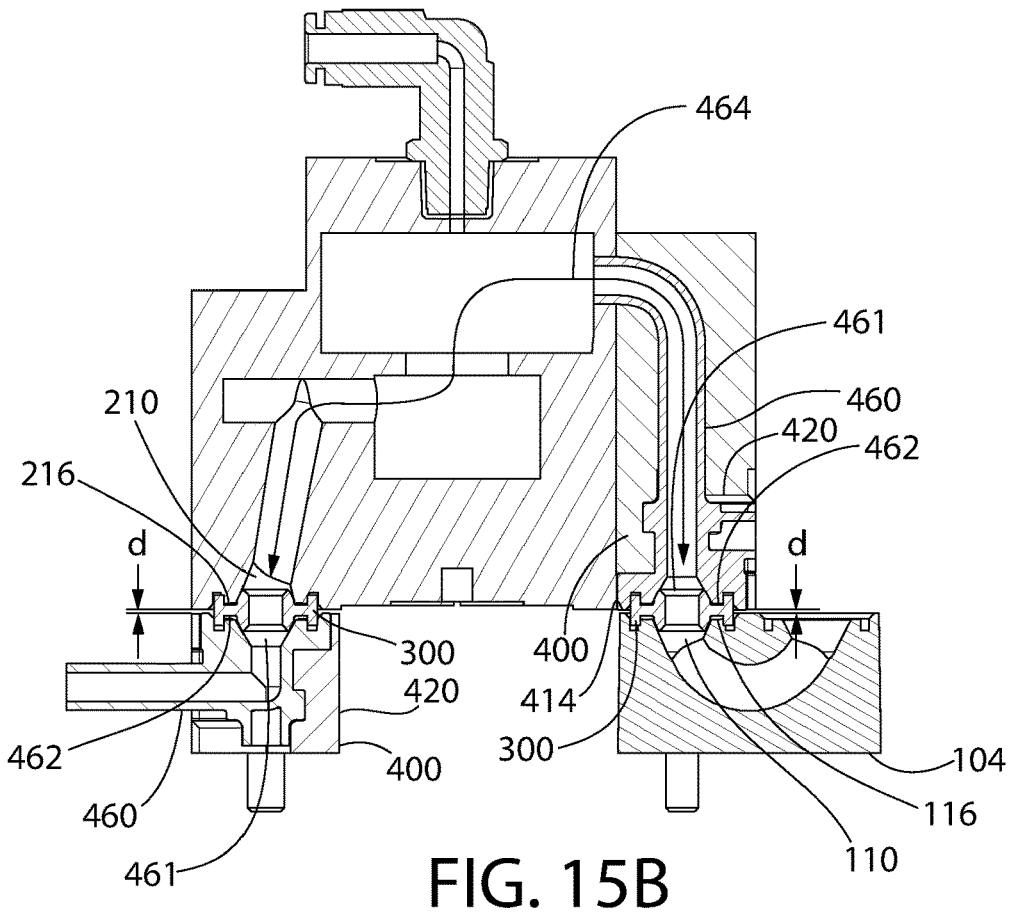
FIG. 15B is a cross-sectional view of the component and the pair of substrate blocks of FIG. 15A, taken along line 15B-15B.

FIGS. 15A and 15B show an alternate embodiment of a component 900 comprising a fitting assembly 400 and mounted to a second fitting assembly 400 and a substrate block 104. As can be seen, the fitting assemblies 400 are identical to the fitting assembly 400 described above, but one is utilized as a part of the component 900 while the other is utilized as a substrate block 104. Separately, a second substrate block 104 is utilized, this second substrate block 104 being identical to the second substrate blocks 104 disclosed above. As can be seen, the fitting assemblies 400 may be utilized in any position. As above, all reference numbers are repeated where they are otherwise identical.

As can be seen, the component 900 incorporates a fitting assembly 400 with the seal side mounting surface 414 facing downward. A seal 300 is positioned between the fitting assembly 400 on the top and the substrate block 104 on the bottom. As can be seen, the insert 460 is coupled internally to the component 900 to form a fluid flow passage through the component 900 from a first fluid port 210 to a second port 461, the second port 461 being a port formed in an insert 460 of the fitting assembly 400. A flow path 464 extends from the first fluid port 210 to the second port 461 and seals 300 seal the first and second ports 210, 461 to corresponding ports 461, 110 of the lower fitting assembly 400 and substrate block 104. Each of the ports 461, 210, 110 comprises a seal cavity 462, 216, 116 to receive the seal 300.

Turning to FIGS. 16A-16F, another embodiment of a fitting assembly 1500 will be described in greater detail. The fitting assembly 1500 shown in FIGS. 16A-F comprises an insert 1560 and a housing 1520 as shown previously. The insert 1560 has a branch tee configuration. Thus, a fluid flow path 1512 extends from a port 1561 to first and second tube stubs 1564. The tube stubs 1564 are configured to be joined to tubing or another fluid conducting device via welding, a compression fitting, or any other means of making a fluid-tight connection. For instance, the tube stubs 1564 may be fitted with a coupling means to mechanically couple to another device. Alternately, the tube stubs 1564 may simply be joined to tubing so that fluid can be routed to another location.

The housing 1520 of the fitting assembly 1500 is formed of two portions 1510, each portion 1510 being identical. The fitting assembly 1500 comprises a seal side mounting surface 1514 formed by a first surface 1521 of the housing 1520 and a distal surface 1563 of the insert 1560. An assembly surface 1515 of the fitting assembly 1500 is opposite the seal side mounting surface 1514. The assembly surface 1515 may engage another object such as the substrate panel 1402. Fastener passageways 108 in the housing 1520 are utilized to secure the fitting assembly 1500 to the object to which the fitting assembly 1500 is assembled. The fastener passageways 108 may extend from the seal side mounting surface 1514 to the assembly surface 1515 or may terminate in a recess 1522 formed into the housing 1520. The assembly surface 1515 is formed by a second surface 1523 of the housing 1520. However, in some embodiments, a portion of the assembly surface 1515 may be formed by the insert 1560.

Figures 16A, 16B:
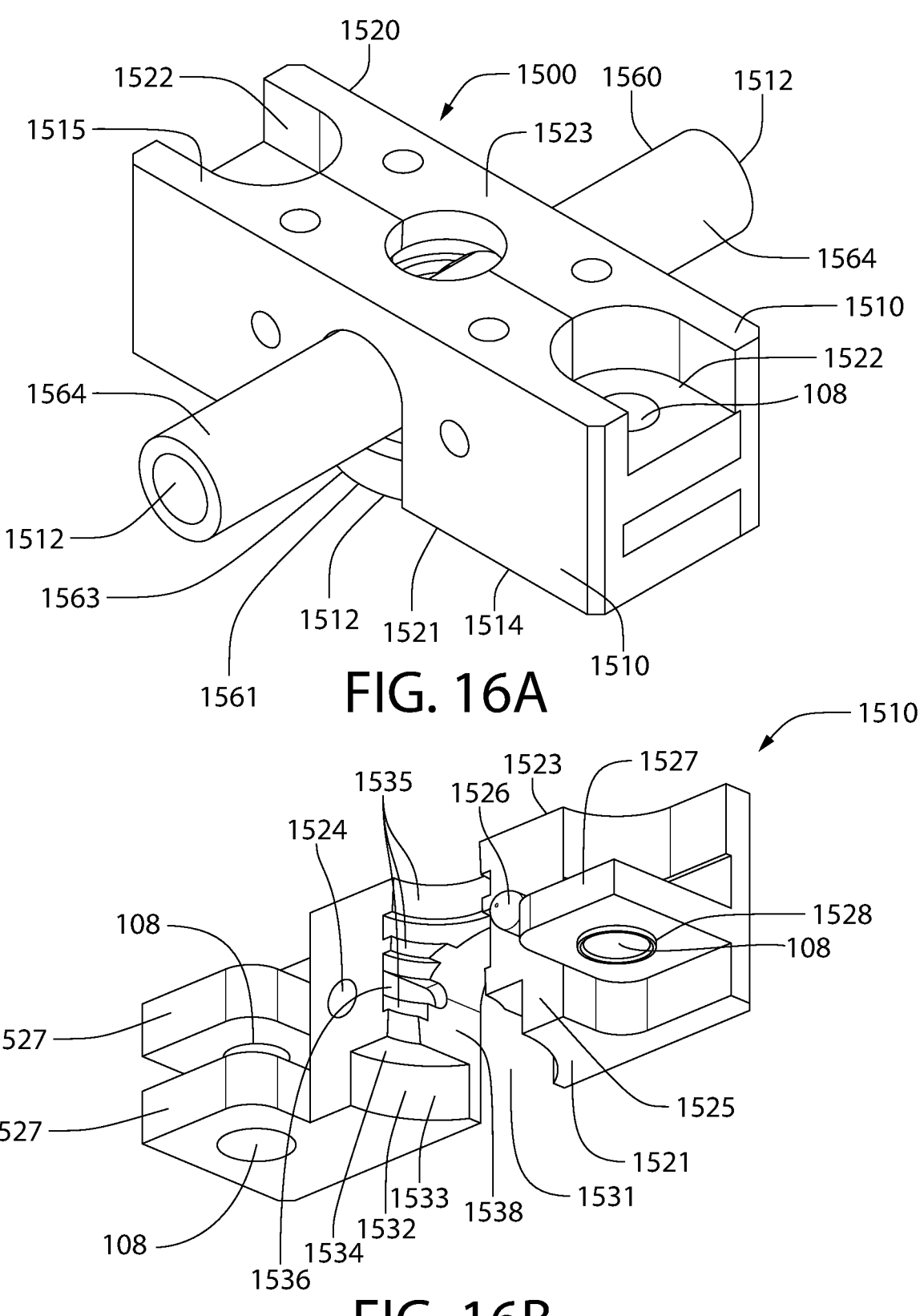
FIG. 16A is a perspective view of an embodiment of a fitting assembly of the present invention, the fitting assembly having an insert and a housing.
FIG. 16B is a bottom perspective view of a portion of the housing of the fitting assembly of FIG. 16A.
Figure 16C:
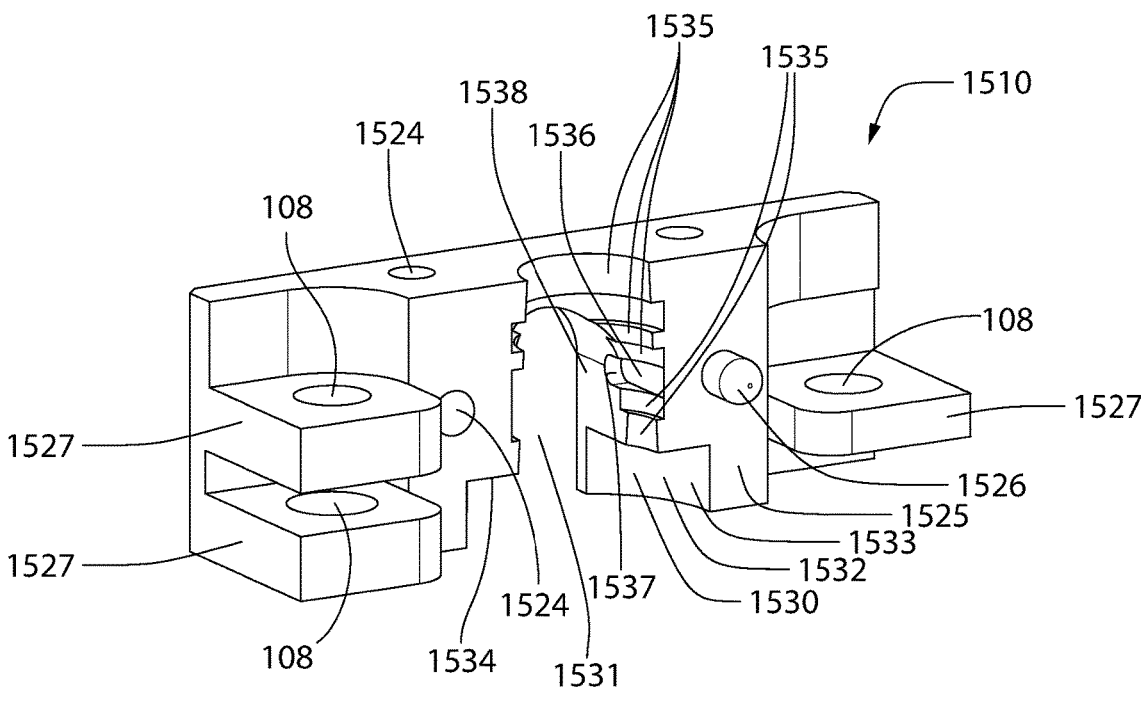
FIG. 16C is a top perspective view of the portion of the housing of FIG. 16B.
Figure 16D:
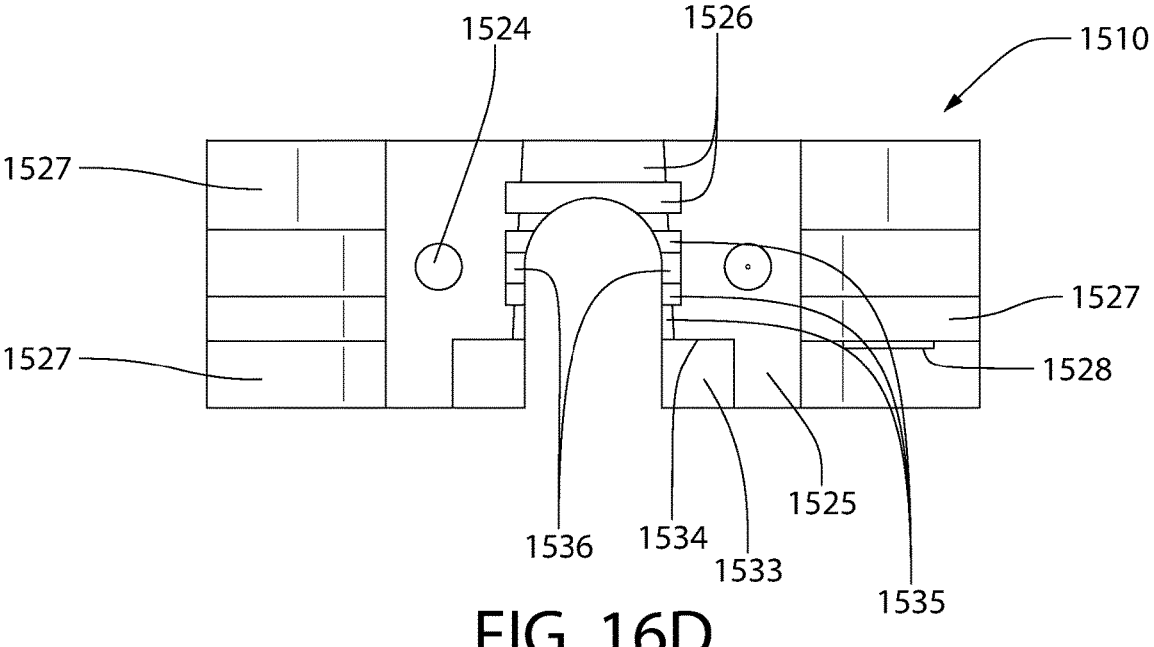
FIG. 16D is a front view of the portion of the housing of FIG. 16B.

FIGS. 16B-16D show a portion 1510 of the housing 1520. As can be seen, two identical portions 1510 of the housing 1520 form a single housing 1520. However, the portions 1510 need not be identical. A portion 1510 may be combined with another portion to form a housing, particularly if the insert 1560 has a different configuration. This enables modularity and a minimum of distinct components for a wide variety of flow configurations. The first surface 1521 and the opposite second surface 1523 are shown. When the portions 1510 are assembled, the first surface 1521 of the first portion 1510 and the first surface 1521 of a second portion 1510 form an entirety of the first surface 1521 of the housing 1520. Similarly, the second surface 1523 of the first portion 1510 and the second surface 1523 of a second portion 1510 collectively form an entirety of the second surface 1521 of the housing 1520.

The portion 1510 of the housing 1520 also comprises a recess 1522 formed into the second surface 1523. The recess 1522 of the portion 1510 forms the recess 1522 of the housing 1520. Fastener passageways 108 extend through the portion 1510. When two portions 1510 are coupled together, the fastener passageways 108 permit fasteners to extend through the fastener passageways 108 to mate to components such as the substrate panel 1402. Additional holes 1524 are provided in the second surface 1523 and in an interface surface 1525. The holes 1524 are intended to be used for additional mounting options such as additional component attachment means.

The interface surface 1525 receives a corresponding interface surface 1525 of another portion 1510 to form a complete housing 1520. The interface surface 1525 further includes a protuberance 1526 which engages the hole 1524 provided in the interface surface 1525. The protuberance 1526 may have a concave tip, a conical tip, or a flat tip, and may further include a fillet or chamfer joining the tip to the body of the protuberance 1526. The protuberance 1526 is sized to limit movement in a radial direction with respect to the hole 1524 when the protuberance 1526 is inserted into the hole 1524. Thus, the portions 1510 are secured together along the plane of the interface surface 1525 and are not free to translate along the interface surface 1525 or rotate with respect to the interface surface 1525.

The portion 1510 further comprises a plurality of fingers 1527. The fingers 1527 are arranged such that two fingers 1527 are located on one end of the portion 1510 and one finger 1527 is located on an opposite end of the portion 1510. The fingers 1527 are spaced apart such that they interlock with fingers 1527 of a second portion 1510 when two portions 1510 are joined to form a housing 1520. The fingers 1527 may incorporate snap features such as the feature 1528 that aid in keeping the two portions 1510 coupled to form a housing 1520. As can be seen, the fastener passageways 108 extend through all three fingers 1527 when two portions 1510 are joined to form a housing 1520, extending from the recess 1522 to the first surface 1521.

The portion 1510 also comprises an insert receiving cavity 1530 which receives an insert 1560. The insert receiving cavity 1530 comprises an entry portion 1531 and an insert portion 1532. The entry portion 1531 receives one of the tube stubs 1564 while the insert portion 1532 receives the port 1561. The insert receiving cavity 1530 comprises a port receiving wall 1533 that has a generally cylindrical shape. The port receiving wall 1533 meets a flange receiving surface 1534 that extends substantially parallel to the first surface 1521. Thus, the flange receiving surface 1534 is substantially planar.

Adjacent the flange receiving surface 1534 is a perimeter surface 1535, the perimeter surface 1535 forming a plurality of ribs. Slots 1536 are formed in the perimeter surface 1535. The slots 1536 extend parallel to the entry portion 1531 and terminate in an arcuate wall 1537. The entry portion 1531 has an entry surface 1538 that defines the entry portion 1531.

Figure 16E:
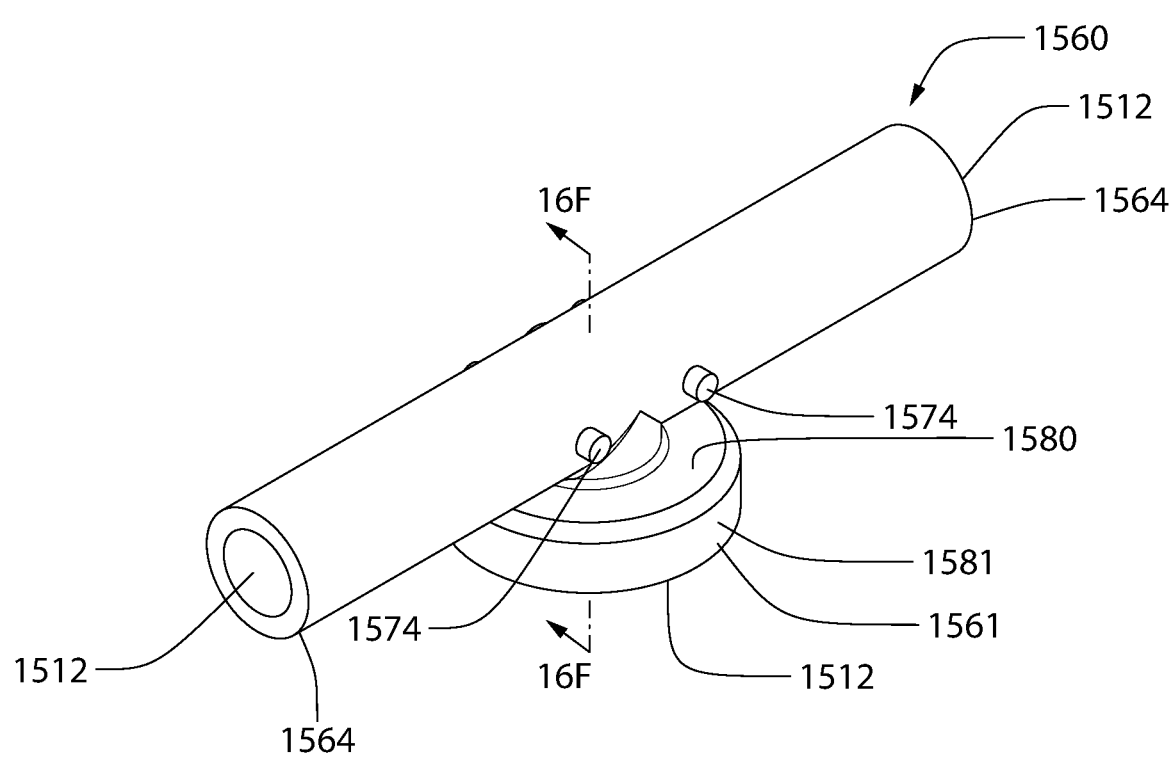
FIG. 16E is a perspective view of the insert of the fitting assembly of FIG. 16A, the insert having a branch tee configuration.
Figure 16F:
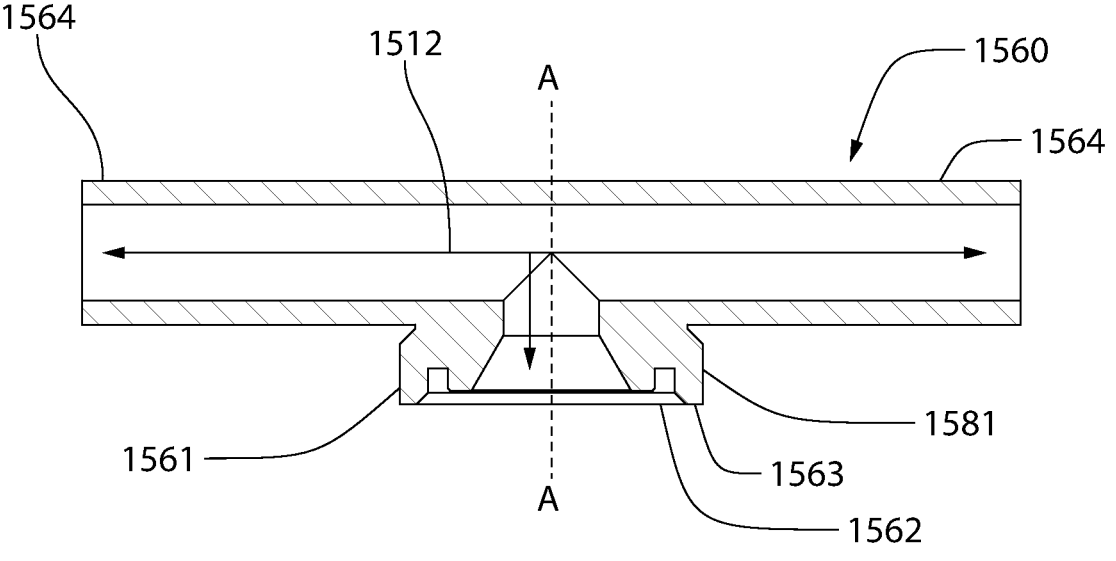
FIG. 16F is a cross-sectional view of the insert of FIG. 16E, taken along the line 16F-16F.

Turning to FIGS. 16E and 16F, the insert 1560 is illustrated. The insert 1560 has a fluid flow path 1512 extending from the port 1561 to first and second tube stubs 1564 as discussed above. The tube stubs 1564 are suitable for joining directly to tubing, other inserts 1560, or other connections and connection methods as are known in the art. The port 1561 extends along a longitudinal axis A-A and is symmetrical about the longitudinal axis A-A. The tube stubs 1564 extend perpendicular to the longitudinal axis A-A.

The insert 1560 further comprises a seal cavity 1562 and a distal surface 1563. The seal cavity 1562 is configured to receive a seal to seal the fluid flow path 1512 to a fluid flow path of a fluid flow component 200 or another fitting assembly. The distal surface 1563, in combination with the first surface 1521 of the housing 1520, collectively form the seal side mounting surface 1514 of the fitting assembly

1500. Preferably, the distal surface 1563 protrudes slightly from the first surface 1521 to ensure proper compression of a seal placed therebetween.

The insert 1560 further comprises a plurality of alignment features 1574, the alignment features 1574 engaging the slots 1536 in the portions 1510 of the housing 1520. The alignment features 1574 aid in positioning the insert 1560 within the housing 1520. The alignment features 1574 may be cylindrical as illustrated, or may be any other shape suitable for engaging the slots 1536 in the portions 1510 of the housing 1520. The port 1561 has a port outer diameter 1581 and a flange surface 1580. The port outer diameter 1581 is sized to be smaller than the port receiving wall 1533 so that the port 1561 does not interfere with the housing 1520. The flange surface 1580 engages the flange receiving surface 1533, preventing the insert 1560 from moving along the longitudinal axis A-A when compressed against the seal and a mating component. As can be seen, the fitting assembly 1500 is functionally equivalent to the fitting assemblies 400, 800 but utilize different geometry to achieve the same function.

Turning to FIGS. 17A-F, another fitting assembly 1600 is illustrated. The fitting assembly 1600 comprises a housing 1620 and an insert 1660. In the fitting assembly 1600, the insert 1660 has a straight configuration. Thus, a fluid flow path 1612 extends from a port 1661 to a tube stub 1664. The tube stub 1664 may be joined to tubing or another connector or device through any known means.

The housing 1620 has two identical portions 1610 which collectively form the housing 1620. The fitting assembly 1600 comprises a seal side mounting surface 1614 formed by a first surface 1621 of the housing 1620 and a distal surface 1663 of the insert 1660. An assembly surface 1615 of the fitting assembly 1600 is opposite the seal side mounting surface 1614. The assembly surface 1615 may engage another object such as the substrate panel 1402. Fastener passageways 108 in the housing 1620 are utilized to secure the fitting assembly 1600 to the object to which the fitting assembly 1600 is assembled. The fastener passageways 108 may extend from the seal side mounting surface 1614 to the assembly surface 1615 or may terminate in a recess 1622 formed into the housing 1620. The assembly surface 1615 is formed by a second surface 1623 of the housing 1620. However, in some embodiments, a portion of the assembly surface 1615 may be formed by the insert 1660.

Figures 17A, 17B:
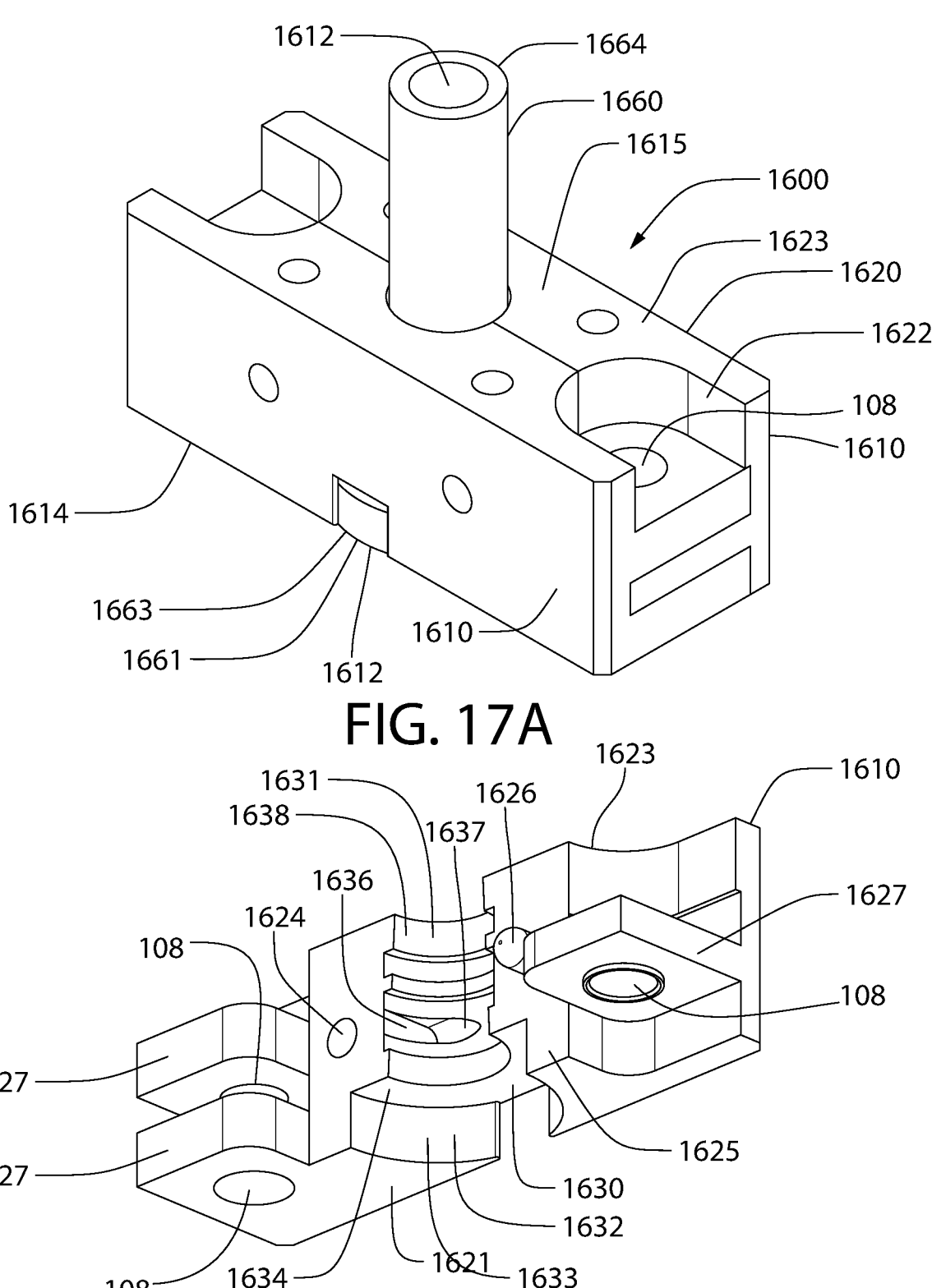
FIG. 17A is a perspective view of a fitting assembly of the present invention, the fitting assembly having an insert and a housing.
FIG. 17B is a bottom perspective view of a portion of the housing of the fitting assembly of FIG. 17A.
Figures 17C, 17D:
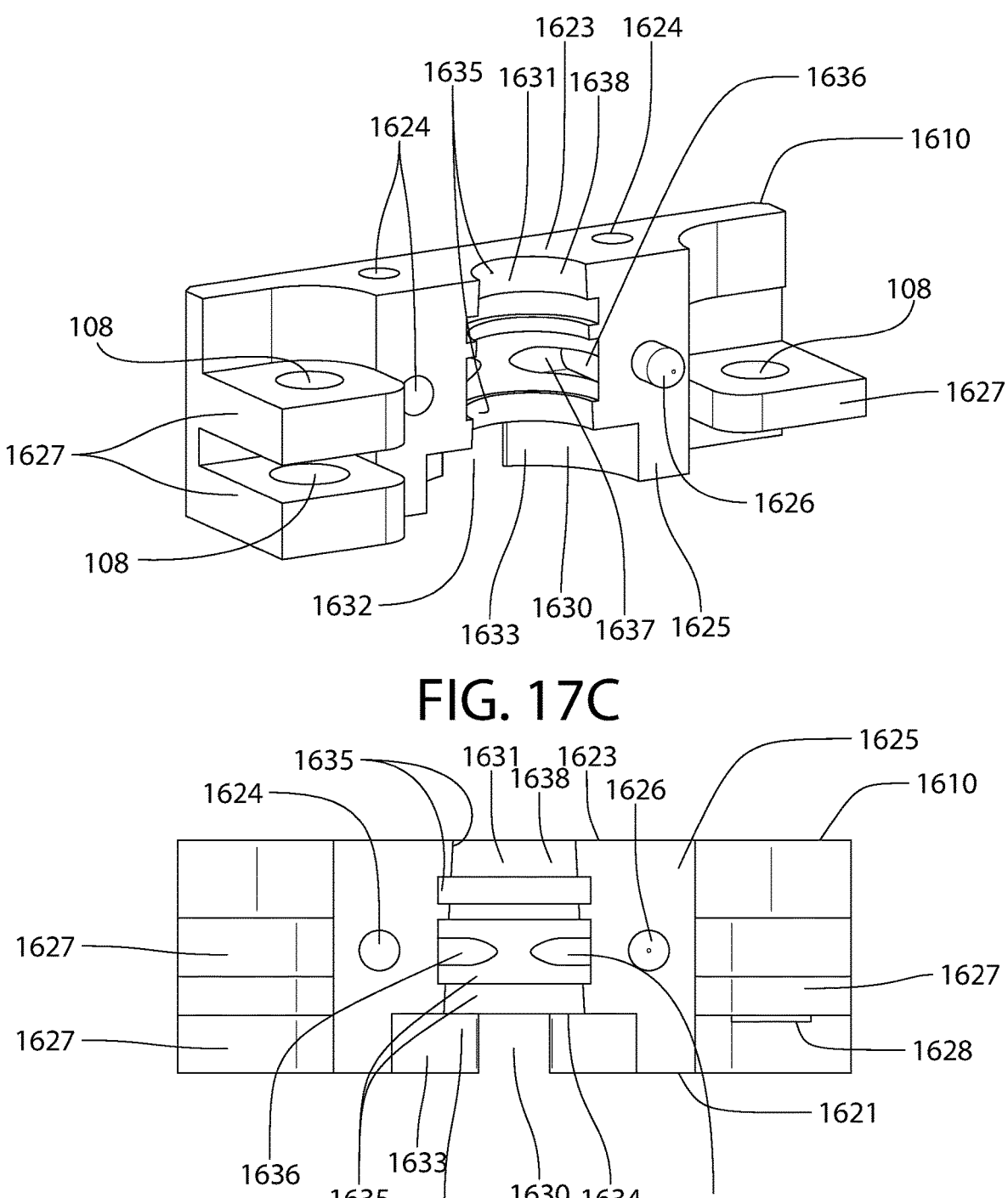
FIG. 17C is a top perspective view of the portion of the housing of FIG. 17B.
FIG. 17D is a front view of the portion of the housing of FIG. 17B.

FIGS. 17B-17D show a portion 1610 of the housing 1620. As can be seen, two identical portions 1610 of the housing 1620 form a single housing 1620. However, the portions 1610 need not be identical. A portion 1610 may be combined with another portion to form a housing, particularly if the insert 1660 has a different configuration. This enables modularity and a minimum of distinct components for a wide variety of flow configurations. The first surface 1621 and the opposite second surface 1623 are shown. When the portions 1610 are assembled, the first surface 1621 of the first portion 1610 and the first surface 1621 of a second portion 1610 form an entirety of the first surface 1621 of the housing 1620. Similarly, the second surface 1623 of the first portion 1610 and the second surface 1623 of a second portion 1610 collectively form an entirety of the second surface 1621 of the housing 1620.

The portion 1610 of the housing 1620 also comprises a recess 1622 formed into the second surface 1623. The recess 1622 of the portion 1610 forms the recess 1622 of the housing 1620. Fastener passageways 108 extend through the portion 1610. When two portions 1610 are coupled together, the fastener passageways 108 permit fasteners to extend through the fastener passageways 108 to mate to components such as the substrate panel 1402. Additional holes 1624 are provided in the second surface 1623 and in an interface surface 1625. The holes 1624 are intended to be used for additional mounting options such as additional component attachment means.

The interface surface 1625 receives a corresponding interface surface 1625 of another portion 1610 to form a complete housing 1620. The interface surface 1625 further includes a protuberance 1626 which engages the hole 1624 provided in the interface surface 1625. The protuberance 1626 may have a concave tip, a conical tip, or a flat tip, and may further include a fillet or chamfer joining the tip to the body of the protuberance 1626. The protuberance 1626 is sized to limit movement in a radial direction with respect to the hole 1624 when the protuberance 1626 is inserted into the hole 1624. Thus, the portions 1610 are secured together along the plane of the interface surface 1625 and are not free to translate along the interface surface 1625 or rotate with respect to the interface surface 1625.

The portion 1610 further comprises a plurality of fingers 1627. The fingers 1627 are arranged such that two fingers 1627 are located on one end of the portion 1610 and one finger 1627 is located on an opposite end of the portion 1610. The fingers 1627 are spaced apart such that they interlock with fingers 1627 of a second portion 1610 when two portions 1610 are joined to form a housing 1620. The fingers 1627 may incorporate snap features such as the feature 1628 that aid in keeping the two portions 1610 coupled to form a housing 1620. As can be seen, the fastener passageways 108 extend through all three fingers 1627 when two portions 1610 are joined to form a housing 1620, extending from the recess 1622 to the first surface 1621.

The portion 1610 also comprises an insert receiving cavity 1630 which receives an insert 1660. The insert receiving cavity 1630 comprises an entry portion 1631 and an insert portion 1632. The entry portion 1631 receives the tube stub 1664 while the insert portion 1632 receives the port 1661. The insert receiving cavity 1630 comprises a port receiving wall 1633 that has a generally cylindrical shape. The port receiving wall 1633 meets a flange receiving surface 1634 that extends substantially parallel to the first surface 1621. Thus, the flange receiving surface 1634 is substantially planar.

Adjacent the flange receiving surface 1634 is a perimeter surface 1635, the perimeter surface 1635 forming a plurality of ribs. Slots 1636 are formed in the perimeter surface 1635. The slots 1636 extend perpendicular to the interface surface 1625 and terminate in an arcuate wall 1637. The entry portion 1631 has an entry surface 1638 that defines the entry portion 1631.

Figures 17E, 17F:
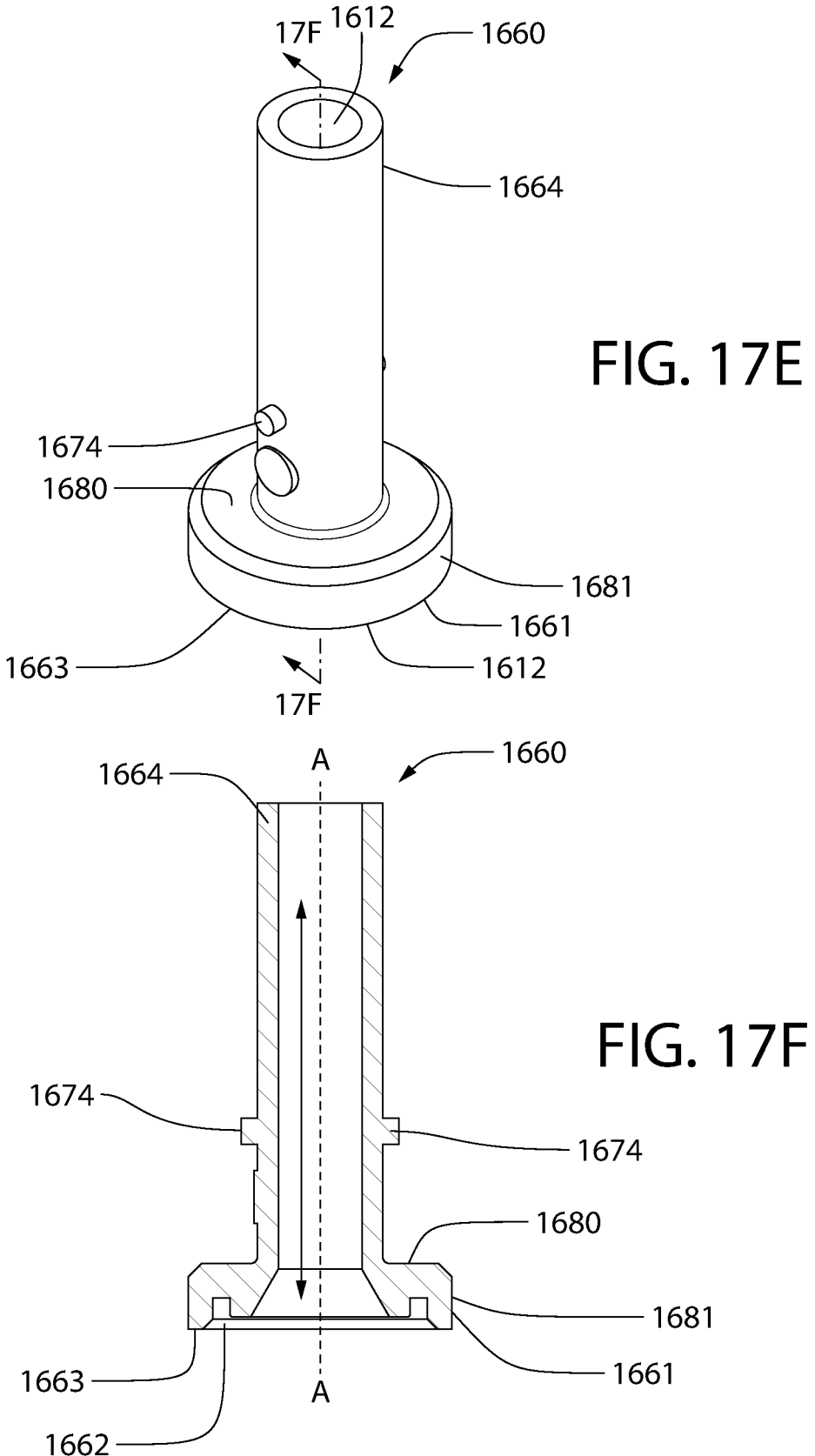
FIG. 17E is a perspective view of the insert of the fitting assembly of FIG. 17A, the insert having a straight configuration.
FIG. 17F is a cross-sectional view of the insert of FIG. 17E, taken along the line 17F-17F.

Turning to FIGS. 17E and 17F, the insert 1660 is illustrated. The insert 1660 has a fluid flow path 1612 extending from the port 1661 to the tube stub 1664 as discussed above. The tube stub 1664 is suitable for joining directly to tubing, other inserts 1660, or other connections and connection methods as are known in the art. The port 1661 extends along a longitudinal axis A-A and is symmetrical about the longitudinal axis A-A. The tube stub 1664 extends perpendicular to the longitudinal axis A-A.

The insert 1660 further comprises a seal cavity 1662 and a distal surface 1663. The seal cavity 1662 is configured to receive a seal to seal the fluid flow path 1612 to a fluid flow path of a fluid flow component 200 or another fitting assembly. The distal surface 1663, in combination with the first surface 1621 of the housing 1620, collectively form the seal side mounting surface 1614 of the fitting assembly

1600. Preferably, the distal surface 1663 protrudes slightly from the first surface 1621 to ensure proper compression of a seal placed therebetween.

The insert 1660 further comprises a plurality of alignment features 1674, the alignment features 1674 engaging the slots 1636 in the portions 1610 of the housing 1620. The alignment features 1674 aid in positioning the insert 1660 within the housing 1620. The port 1661 has a port outer diameter 1681 and a flange surface 1680. The port outer diameter 1681 is sized to be smaller than the port receiving wall 1633 so that the port 1661 does not interfere with the housing 1620. The flange surface 1680 engages the flange receiving surface 1633, preventing the insert 1660 from moving along the longitudinal axis A-A when compressed against the seal and a mating component. It is possible to utilize different inserts in the housings 1520, 1620 to achieve different flow routing as will be discussed in greater detail below.

Figure 18A:
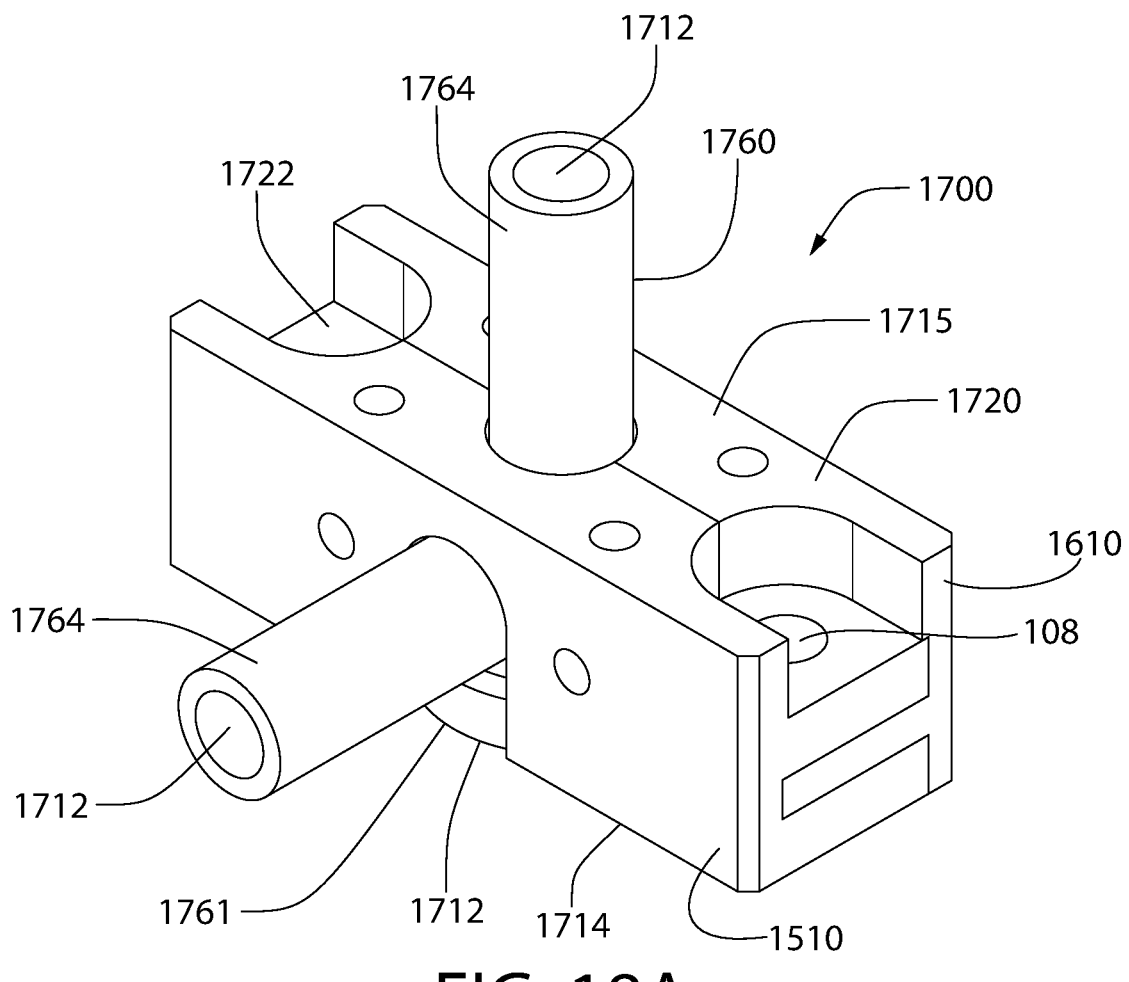
FIG. 18A is a perspective view of a fitting assembly of the present invention, the fitting assembly having an insert and a housing.
Figures 18B, 18C:
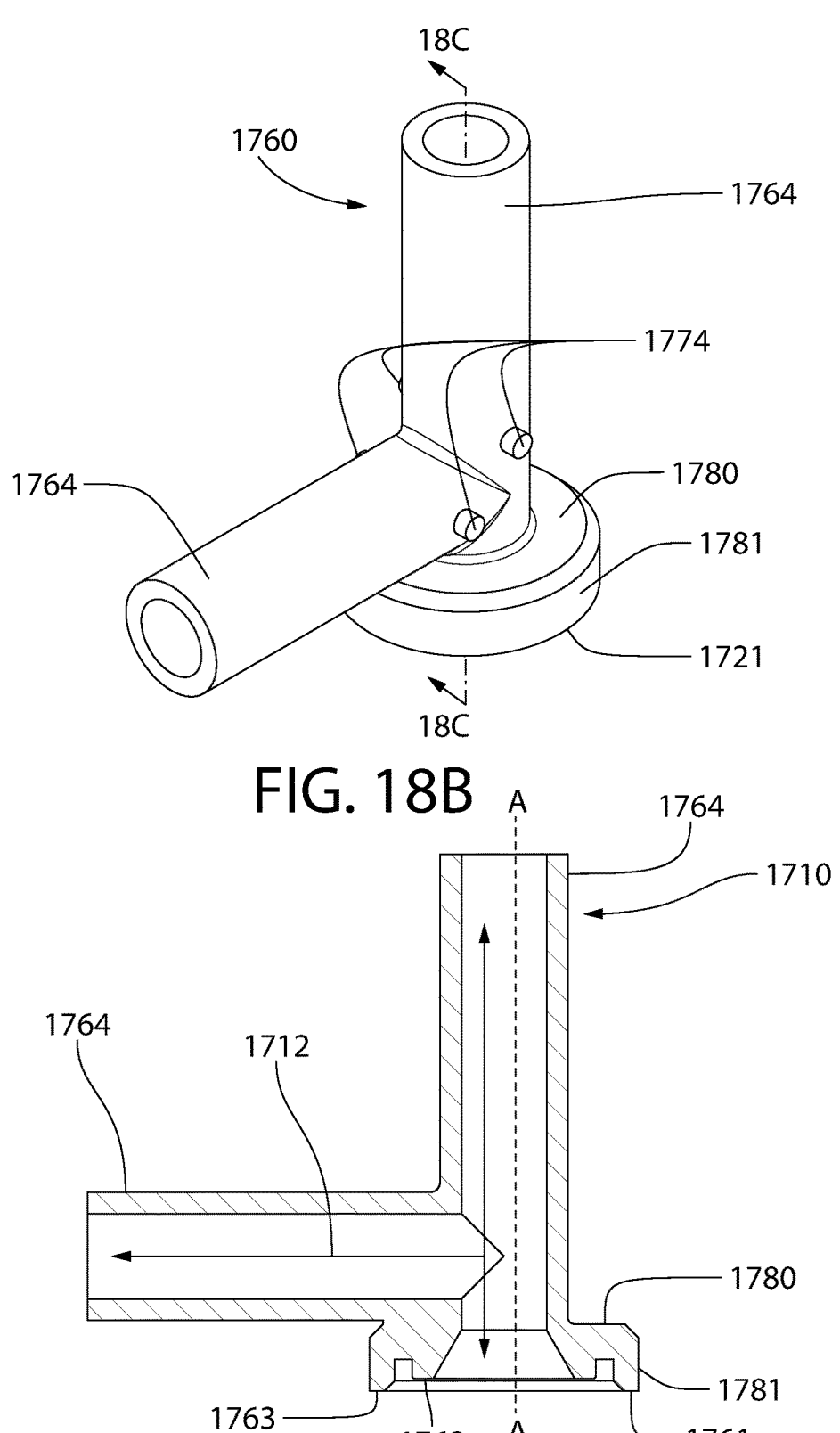
FIG. 18B is a perspective view of the insert of the fitting assembly of FIG. 18A, the insert having a run tee configuration.
FIG. 18C is a cross-sectional view of the insert of FIG. 18B, taken along the line 18C-18C.

Fitting assembly 1700 is illustrated in FIGS. 18A-18C. The fitting assembly 1700 comprises a housing 1720 and an insert 1760. The housing 1720 is formed of portions 1510, 1610 discussed above. The insert 1760 has a run tee configuration, such that a fluid flow path 1712 extends from a port 1761 to first and second tube stubs 1764. Once again, the housing 1720 has fastener passageways 108 that may extend from a recess 1722 to a seal side mounting surface 1714. Optionally, the passageways 108 may extend from the seal side mounting surface 1714 to an assembly surface 1715 instead of from the recess 1722 to the seal side mounting surface 1714. The use of different portion 1510, 1610 to form the housing allows the formation of two different entry portions for the seal cavity. This beneficially enables the use of the insert 1760 having the run tee configuration as shown. One tube stub 1764 can exit the housing 1720 perpendicular to the port 1761 while the other tube stub 1764 can exit parallel to the port 1761.

Turning to FIGS. 18B and 18C, the insert 1760 is illustrated. The insert 1760 has a fluid flow path 1712 extending from the port 1761 to the tube stubs 1764 as discussed above. The tube stubs 1764 are suitable for joining directly to tubing, other inserts 1760, or other connections and connection methods as are known in the art. The port 1761 extends along a longitudinal axis A-A and is symmetrical about the longitudinal axis A-A. The tube stubs 1764 extend perpendicular to the longitudinal axis A-A.

The insert 1760 further comprises a seal cavity 1762 and a distal surface 1763. The seal cavity 1762 is configured to receive a seal to seal the fluid flow path 1712 to a fluid flow path of a fluid flow component 200 or another fitting assembly. The distal surface 1763, in combination with the first surface of the housing 1720, collectively form the seal side mounting surface 1714 of the fitting assembly 1700. Preferably, the distal surface 1763 protrudes slightly from the first surface 1721 to ensure proper compression of a seal placed therebetween.

The insert 1760 further comprises a plurality of alignment features 1774, the alignment features 1774 engaging the slots in the portions 1510, 1610 of the housing 1720. The alignment features 1774 aid in positioning the insert 1760 within the housing 1720. The port 1761 has a port outer diameter 1781 and a flange surface 1780. The port outer diameter 1781 is sized to be smaller than the port receiving wall so that the port 1761 does not interfere with the housing 1720. The flange surface 1780 engages the flange receiving surface, preventing the insert 1760 from moving along the longitudinal axis A-A when compressed against the seal and a mating component. It is possible to utilize different inserts in the housings 1520, 1620 to achieve different flow routing as will be discussed in greater detail below.

Figure 19A:
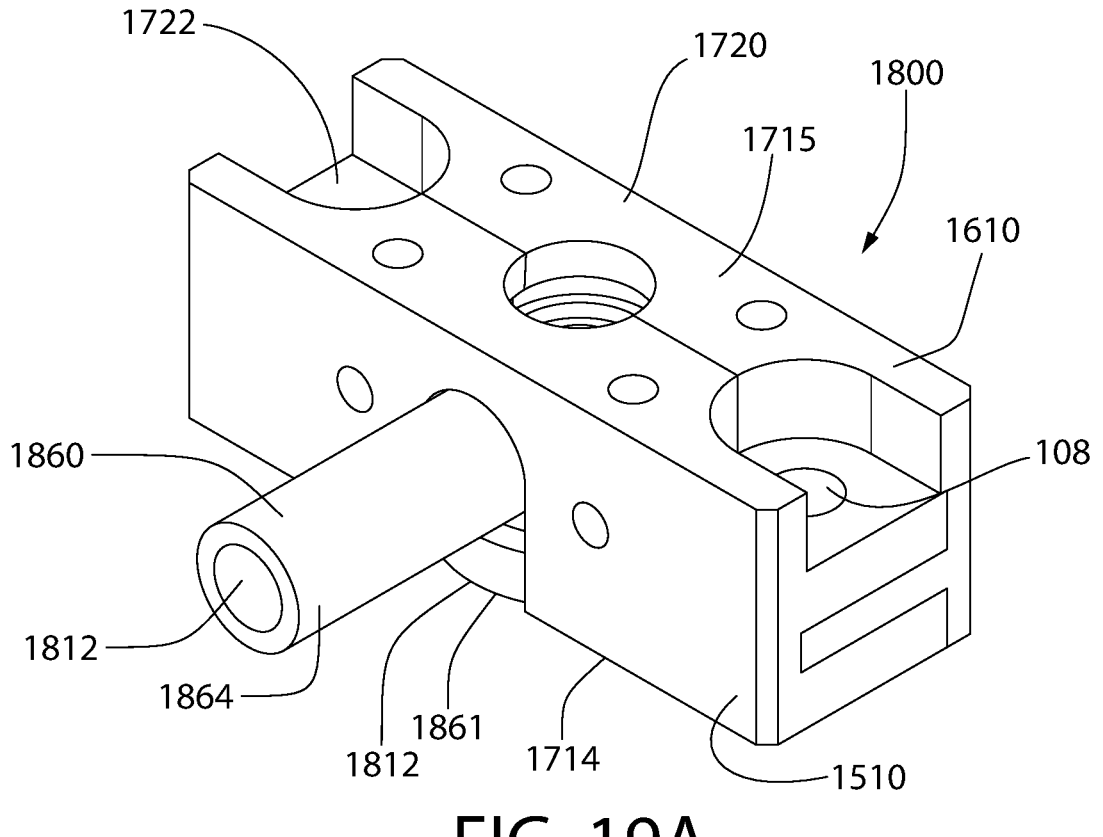
FIG. 19A is a perspective view of a fitting assembly of the present invention, the fitting assembly having an insert and a housing.
Figure 19B:
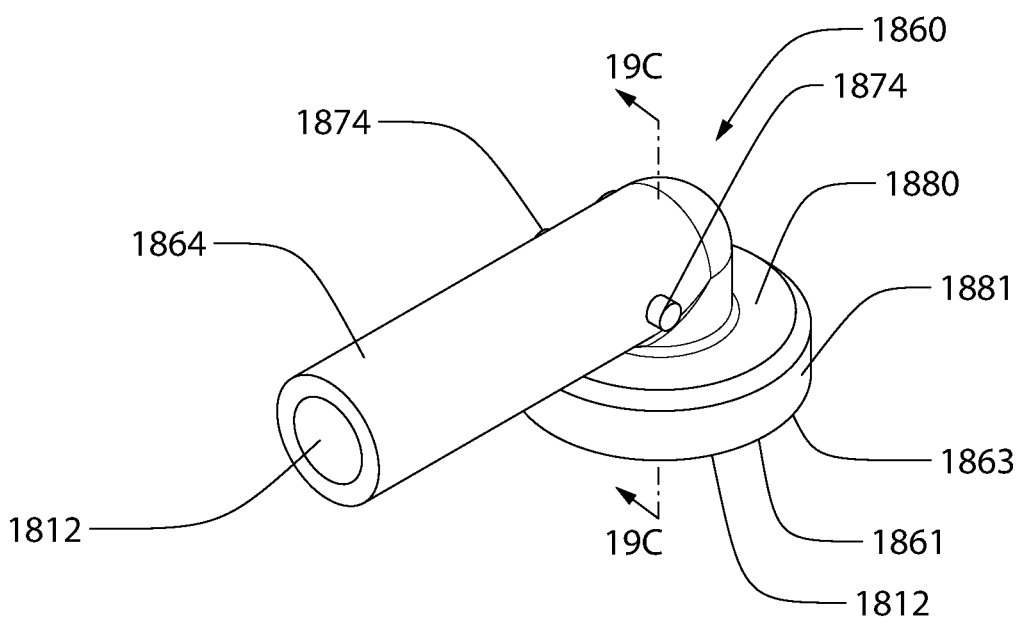
FIG. 19B is a perspective view of the insert of the fitting assembly of FIG. 19A, the insert having an elbow configuration.
Figure 19C:
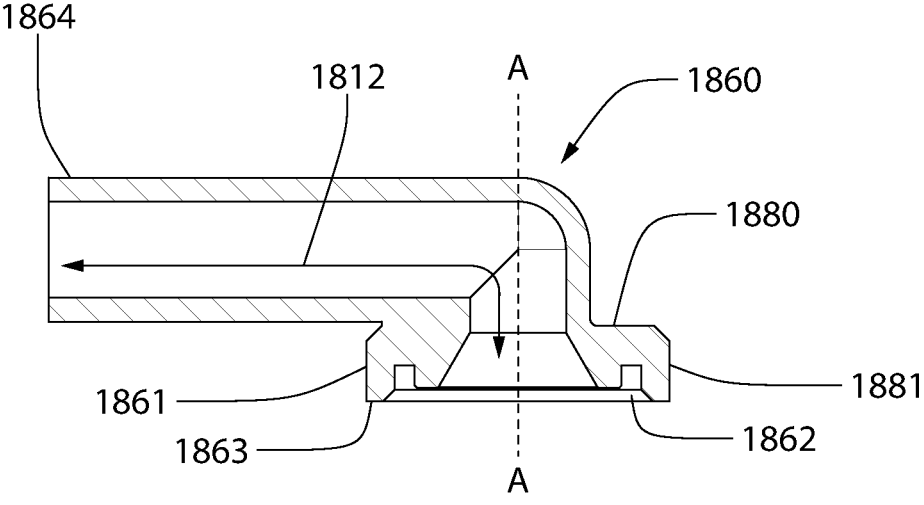
FIG. 19C is a cross-sectional view of the insert of FIG. 19B, taken along the line 19C-19C.

Fitting assembly 1800 is illustrated in FIGS. 19A-19C. The fitting assembly 1800 comprises a housing 1720 and an insert 1860. Just like the housing 1720 of the fitting assembly 1700, the housing 1720 is formed of portions 1510, 1610 discussed above. The insert 1860 has an elbow configuration, such that a fluid flow path 1812 extends from a port 1861 to a tube stub 1864. Once again, the housing 1720 has fastener passageways 108 that may extend from a recess 1722 to a seal side mounting surface 1714. Optionally, the passageways 108 may extend from the seal side mounting surface 1714 to an assembly surface 1715 instead of from the recess 1722 to the seal side mounting surface 1714. The use of different portion 1510, 1610 to form the housing 1720 allows the formation of two different entry portions for the seal cavity. This beneficially enables the use of the insert 1860 having the elbow configuration as shown without modification to the portions 1510, 1610. The tube stub 1864 exits the housing 1720 perpendicular to the port 1861.

Turning to FIGS. 19B and 19C, the insert 1860 is illustrated. The insert 1860 has a fluid flow path 1812 extending from the port 1861 to the tube stub 1864 as discussed above. The tube stub 1864 is suitable for joining directly to tubing, other inserts 1860, or other connections and connection methods as are known in the art. The port 1861 extends along a longitudinal axis A-A and is symmetrical about the longitudinal axis A-A. The tube stub 1864 extends perpendicular to the longitudinal axis A-A.

The insert 1860 further comprises a seal cavity 1862 and a distal surface 1863. The seal cavity 1862 is configured to receive a seal to seal the fluid flow path 1812 to a fluid flow path of a fluid flow component 200 or another fitting assembly. The distal surface 1863, in combination with the first surface of the housing 1720, collectively form the seal side mounting surface 1714 of the fitting assembly 1800. Preferably, the distal surface 1863 protrudes slightly from the first surface to ensure proper compression of a seal placed therebetween.

The insert 1860 further comprises a plurality of alignment features 1874, the alignment features 1874 engaging the slots in the portions 1510, 1610 of the housing 1720. The alignment features 1874 aid in positioning the insert 1860 within the housing 1720. The port 1861 has a port outer diameter 1881 and a flange surface 1880. The port outer diameter 1881 is sized to be smaller than the port receiving wall so that the port 1861 does not interfere with the housing 1720. The flange surface 1880 engages the flange receiving surface, preventing the insert 1860 from moving along the longitudinal axis A-A when compressed against the seal and a mating component. It is possible to utilize different inserts in the housings 1520, 1620 to achieve different flow routing as will be discussed in greater detail below.

FIGS. 20A-20F illustrate yet another embodiment of a fitting assembly 1900. The fitting assembly 1900 comprises a housing 1920 and an insert 1960. The insert 1960 has an elbow configuration. Thus, a fluid flow path 1912 extends from a port 1961 to a tube stub 1964. The housing 1920 is formed as a monolithic, integrally formed, component. A longitudinal axis A-A extends through to the port 1961.

The fitting assembly 1900 comprises a seal side mounting surface 1914 formed by a first surface 1921 of the housing 1920 and a distal surface 1963 of the insert 1960. The fitting assembly 1900 further comprises an assembly surface 1915 opposite the seal side mounting surface 1914. The assembly surface 1915 is formed by a second surface 1923 of the housing. However, in some embodiments, a portion of the assembly surface 1915 may be formed by the insert 1960. Fastener passageways 108 are formed in the housing 1920 and extend from recesses 1922 to the seal side mounting surface 1914. In other embodiments, the recesses 1922 may be omitted and the fastener passageways 108 may extend from the seal side mounting surface 1914 to the assembly surface 1915. Alternately, the recesses 1922 may be formed in the seal side mounting surface 1914.

The housing 1920 has a plurality of holes 1924, some of the holes 1924 formed in the second surface 1923 and some formed in the front surface 1927. Optionally, additional holes 1924 may be formed in the rear surface. The holes 1924 may be used for mounting additional components to the fitting assembly 1900, securing the fitting assembly to another object, or for any other desired use.

The housing 1920 also has an insert receiving cavity 1930 which receives the insert 1960. The insert receiving cavity 1930 comprises two entry portions 1931 and an insert portion 1932. One of the entry portions 1931 extends through the second surface 1923 and the other of the entry portions 1931 extends through the rear surface 1928. The entry portion 1931 that extends through the rear surface 1928 receives the tube stub 1964 while the insert portion 1932 receives the port 1961. The insert receiving cavity 1930 comprises a port receiving wall 1933 that has a generally cylindrical shape. The port receiving wall 1933 meets a flange receiving surface 1934 that extends substantially parallel to the first surface 1921. Thus, the flange receiving surface 1934 is substantially planar.

Adjacent the flange receiving surface 1934 is a perimeter surface 1935, the perimeter surface 1935 having alignment features 1936 formed therein. The alignment features 1936 extend parallel to the port receiving wall 1933. In the exemplary embodiment, the alignment features 1936 are slots, but they may have a variety of configurations. The housing 1920 further comprises an attachment feature 1938, the attachment feature 1938 formed into the entry portion 1931 extending through the rear surface 1928.

Figure 20A:
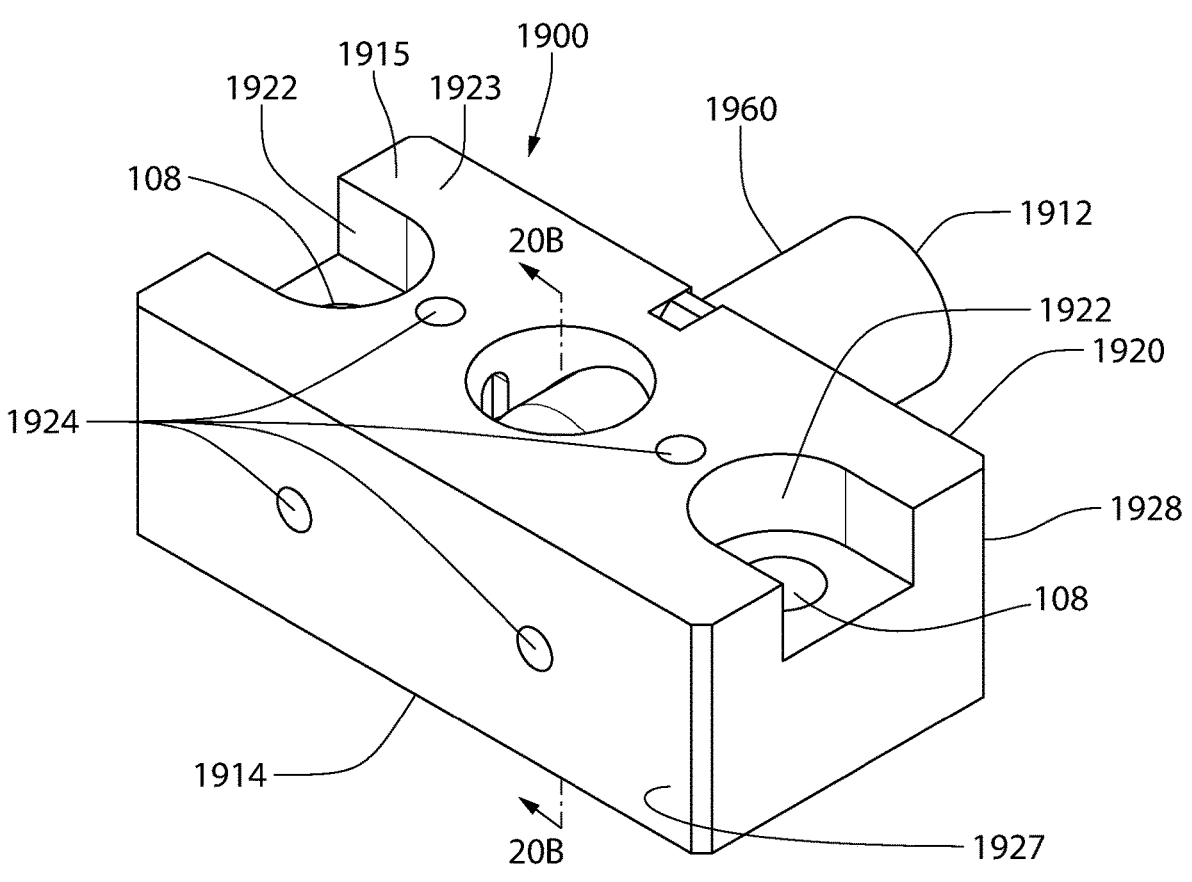
FIG. 20A is a perspective view of another embodiment of a fitting assembly of the present invention, the fitting assembly having an insert and a housing.
Figure 20B:
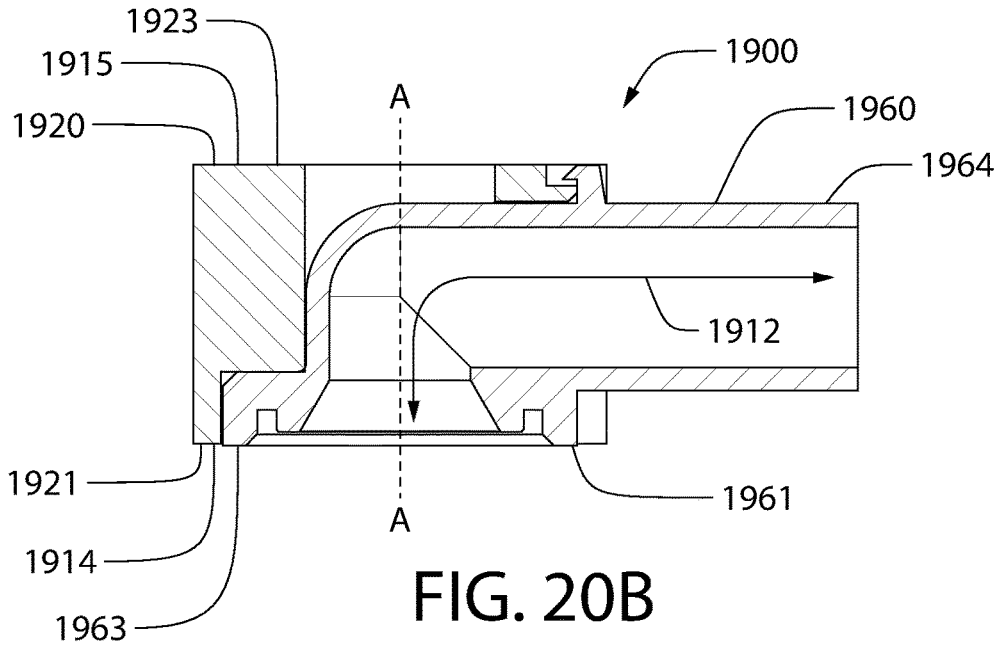
FIG. 20B is a cross-sectional view of the fitting assembly of FIG. 20A, taken along the line 20B-20B.
Figure 20C:
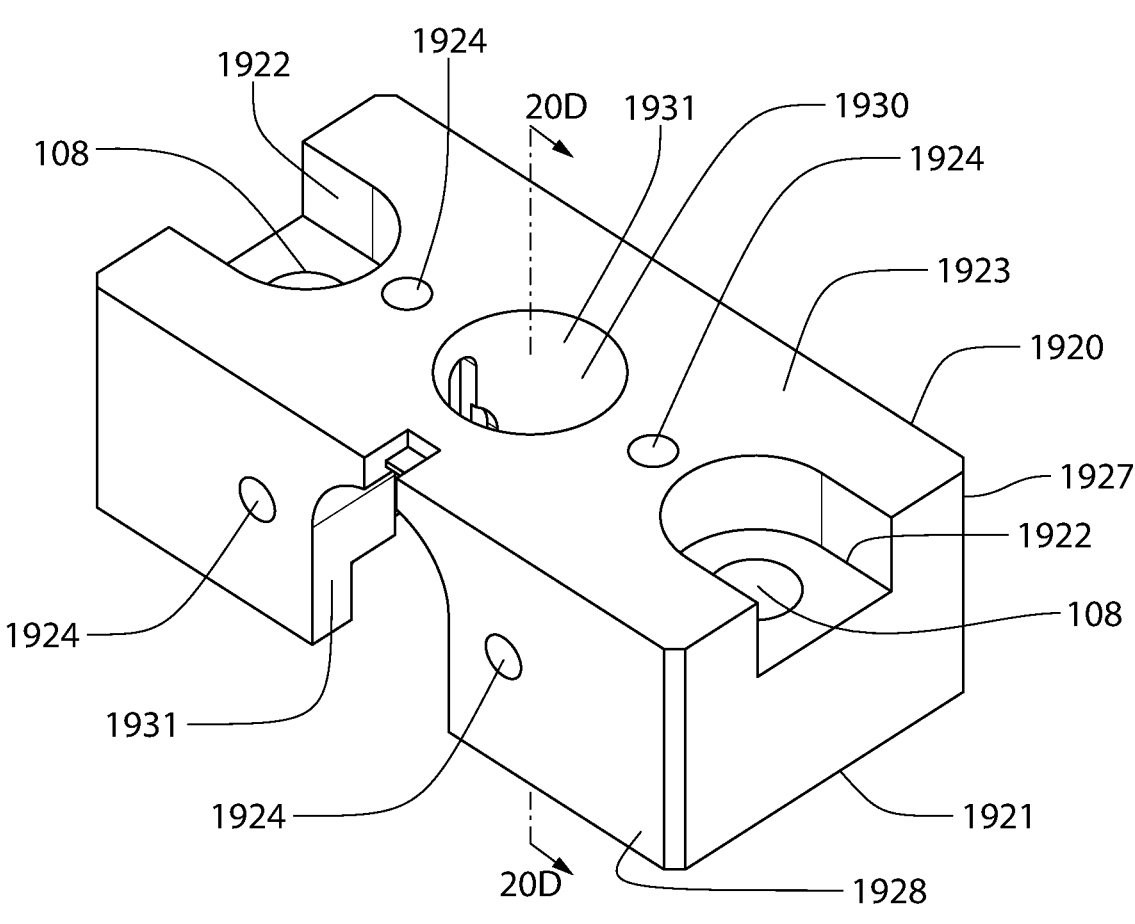
FIG. 20C is a perspective view of the housing of the fitting assembly of FIG. 20A.
Figure 20D:
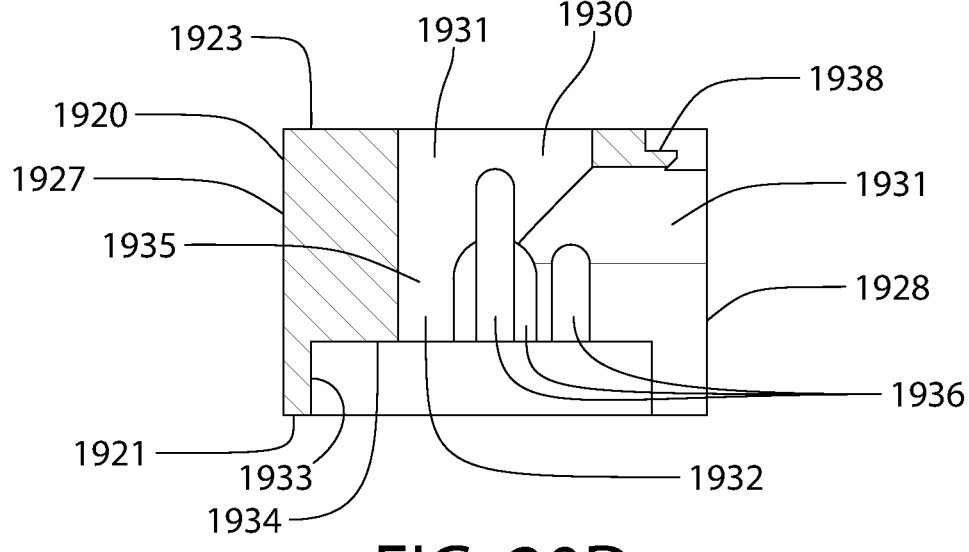
FIG. 20D is a cross-sectional view of the housing of FIG. 20C, taken along the line 20D-20D.
Figure 20E:
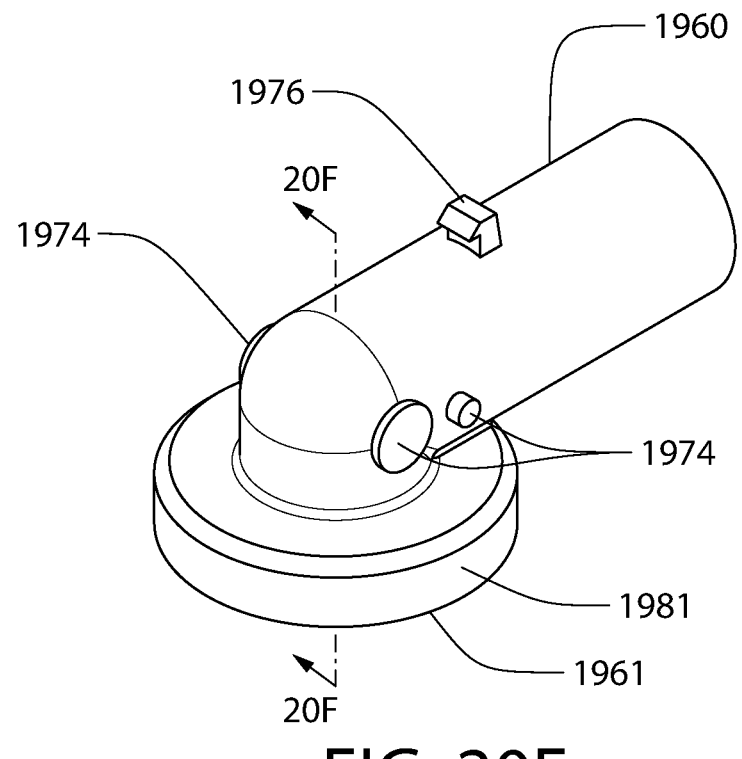
FIG. 20E is a perspective view of the insert of the fitting assembly of FIG. 20A, the insert having an elbow configuration.
Figure 20F:
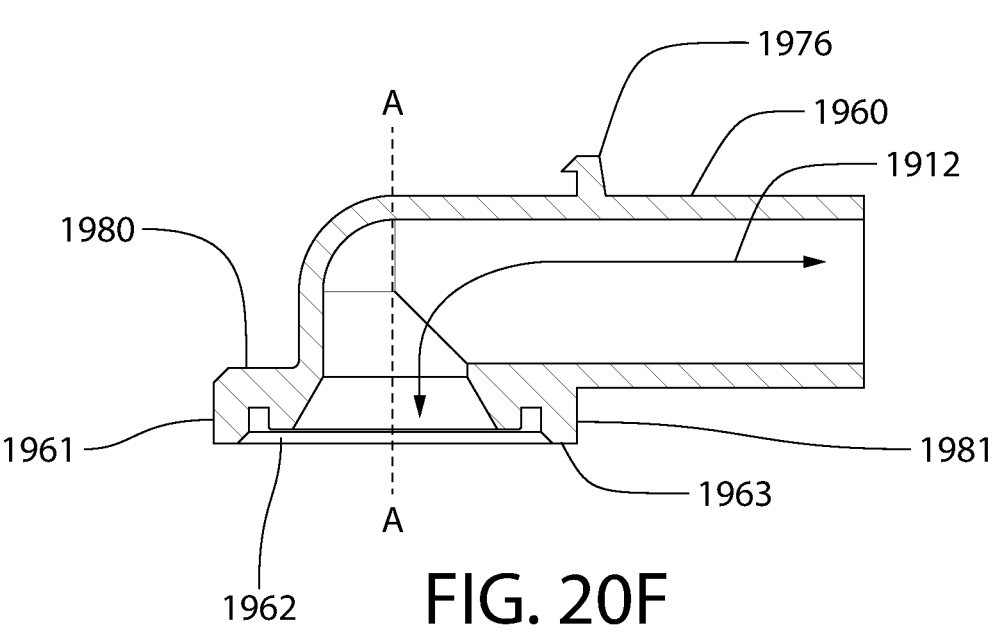
FIG. 20F is a cross-sectional view of the insert of FIG. 20E, taken along the line 20F-20F.
Figure 21A:
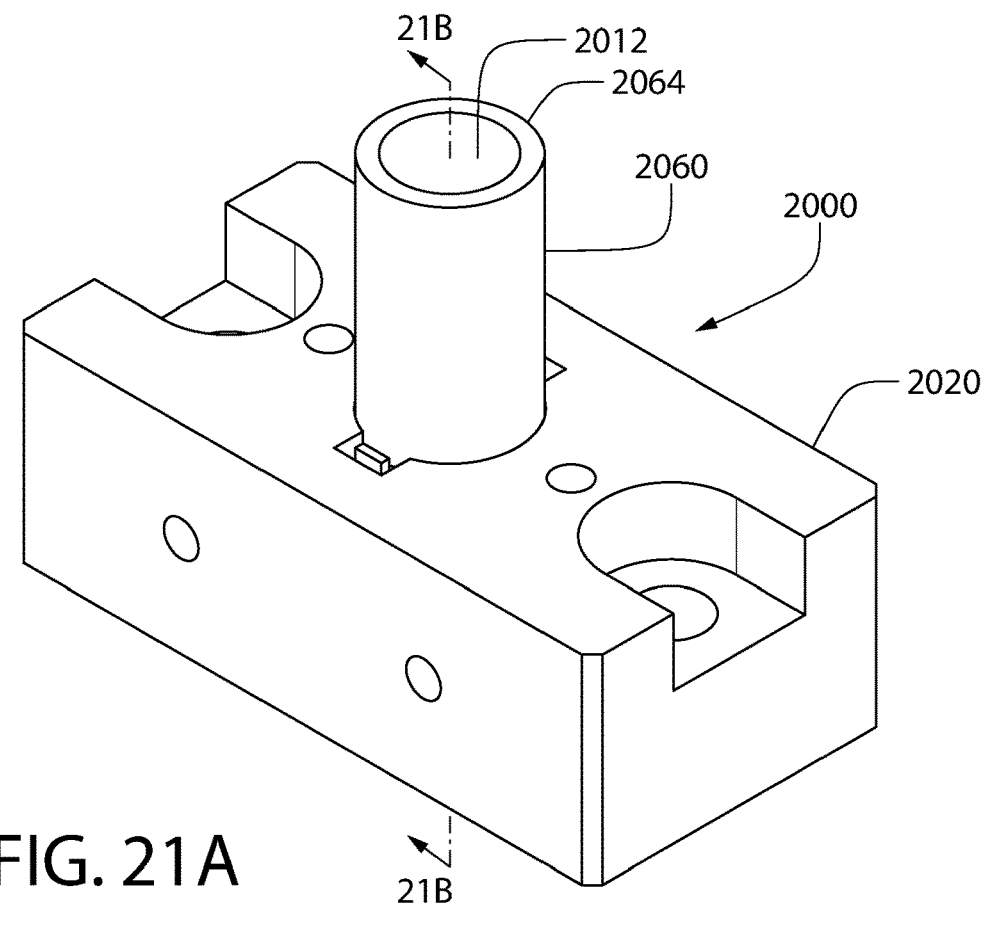
FIG. 21A is a perspective view of another embodiment of a fitting assembly of the present invention, the fitting assembly having an insert and a housing.
Figure 21B:
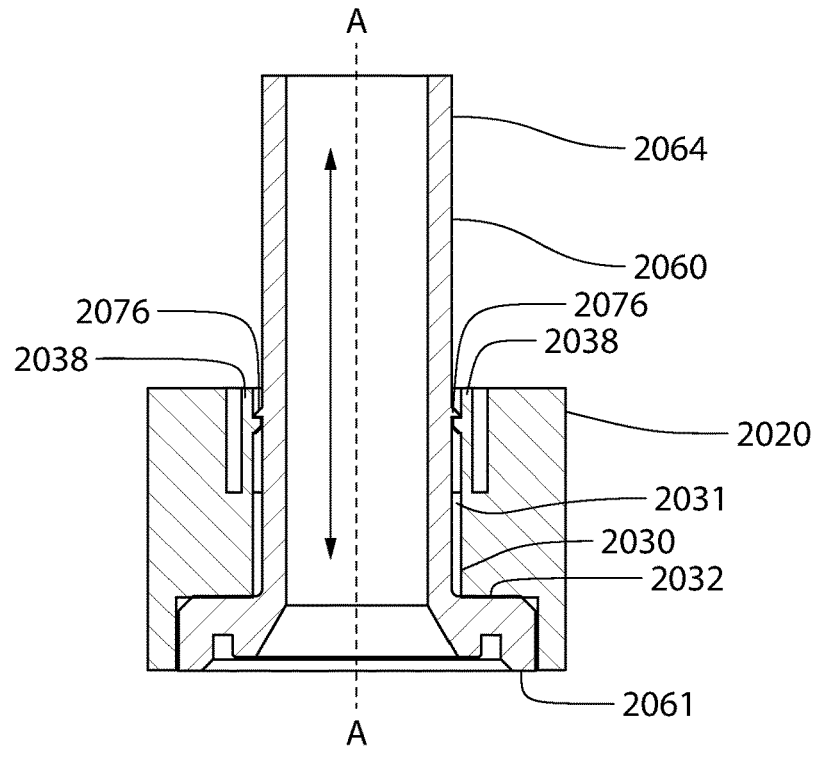
FIG. 21B is a cross-sectional view of the fitting assembly of FIG. 21A, taken along the line 21B-21B.
Figure 21C:
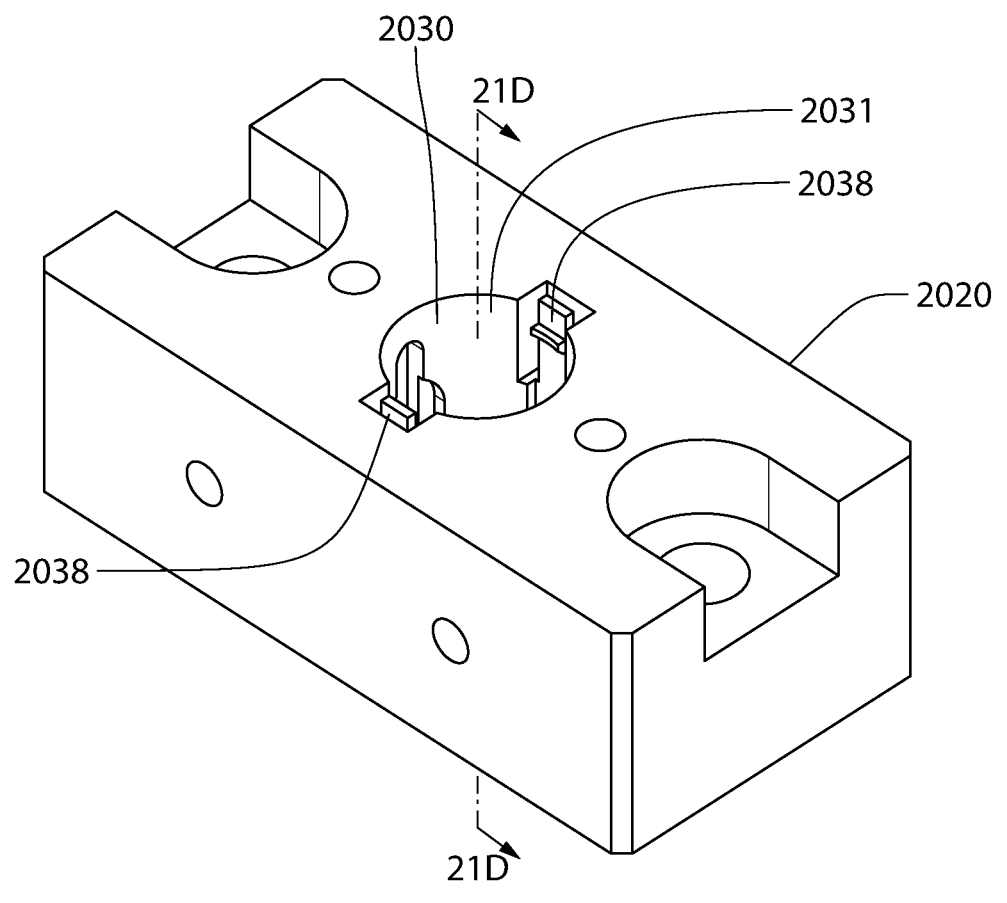
FIG. 21C is a perspective view of the housing of the fitting assembly of FIG. 21A.
Figure 21D:
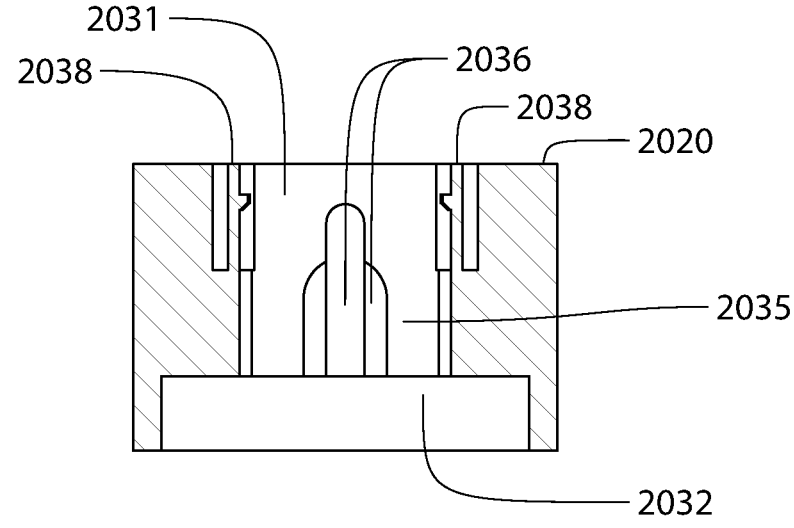
FIG. 21D is a cross-sectional view of the housing of FIG. 21C, taken along the line 21D-21D.
Figures 21E, 21F:
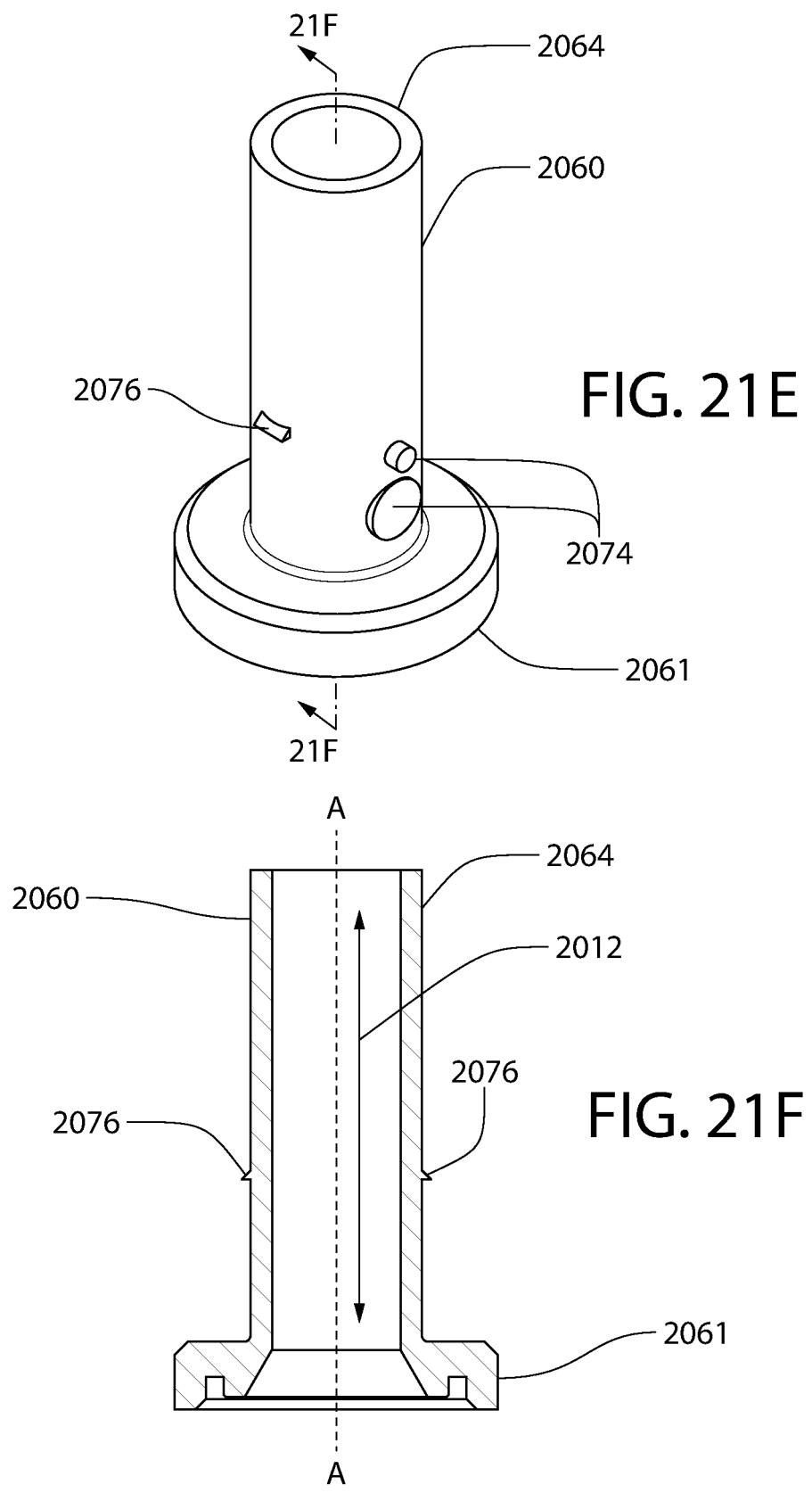
FIG. 21E is a perspective view of the insert of the fitting assembly of FIG. 21A, the insert having a straight configuration.
FIG. 21F is a cross-sectional view of the insert of FIG. 21E, taken along the line 21F-21F.

Turning to FIGS. 20E and 20F, the insert 1960 is illustrated. The insert 1960 has a fluid flow path 1912 extending from the port 1961 to the tube stub 1964 as discussed above. The tube stub 1964 is suitable for joining directly to tubing, other inserts 1960, or other connections and connection methods as are known in the art. The port 1961 extends along the longitudinal axis A-A and is symmetrical about the longitudinal axis A-A. The tube stub 1964 extends perpendicular to the longitudinal axis A-A.

The insert 1960 further comprises a seal cavity 1962 and a distal surface 1963. The seal cavity 1962 is configured to receive a seal to seal the fluid flow path 1912 to a fluid flow path of a fluid flow component 200 or another fitting assembly. The distal surface 1963, in combination with the first surface 1921 of the housing 1920, collectively form the seal side mounting surface 1914 of the fitting assembly 1900. Preferably, the distal surface 1963 protrudes slightly from the first surface 1921 to ensure proper compression of a seal placed therebetween.

The insert 1960 further comprises a plurality of alignment features 1974, the alignment features 1974 engaging the alignment features 1936 in the housing 1920. The alignment features 1974 aid in positioning the insert 1960 within the housing 1920. The alignment features 1974 may be cylindrical as illustrated, or may be any other shape suitable for engaging the alignment features 1936 in the housing 1920. The insert 1960 also comprises an attachment feature 1976. The attachment feature 1976 takes the form of a snap fastener hook which engages the attachment features 1938 of the housing 1920 to retain the insert 1960 in the housing 1920 and form the fitting assembly 1900.

In some embodiments, more than one set of attachment features 1938, 1976 may be utilized. In other embodiments, the attachment features 1976 of the insert 1960 may be bolts, screws, or other attachment mechanisms. Correspondingly, the attachment features 1938 may be holes, slots or other attachment mechanisms. Optionally, the attachment features 1938, 1976 may be transposed, such that the housing 1920 comprises the snap fastening hook and the insert 1960 comprises an engagement feature to receive the snap fastening hook.

The port 1961 has a port outer diameter 1981 and a flange surface 1980. The port outer diameter 1981 is sized to be smaller than the port receiving wall 1933 so that the port 1961 does not interfere with the housing 1920. The flange surface 1980 engages the flange receiving surface 1933, preventing the insert 1960 from moving along the longitudinal axis A-A when compressed against the seal and a mating component. As can be seen, the fitting assembly 1900 is functionally equivalent to the fitting assemblies 400, 800, 1500 but utilize different geometry to achieve the same function.

FIGS. 21A-21F illustrate yet another embodiment of a fitting assembly 2000. The fitting assembly 2000 comprises a housing 2020 and an insert 2060. The insert 2060 has a straight configuration. Thus, a fluid flow path 2012 extends from a port 2061 to a tube stub 2064. The housing 2020 is formed as a monolithic, integrally formed, component. A longitudinal axis A-A extends through the port 2061. The fitting assembly 2000 is similar to the fitting assembly 1900, with variations discussed in greater detail below.

The housing 2020 of the fitting assembly 2000 has an insert receiving cavity 2030 which receives the insert 2060. The insert receiving cavity 2030 comprises an entry portion 2031 and an insert portion 2032. The entry portion 2031 extends parallel to the longitudinal axis A-A and receives the tube stub 2064. The insert receiving cavity 2030 comprises a perimeter surface 2035, the perimeter surface 2035 having alignment features 2036 formed therein. The alignment features 2036 extend parallel to the longitudinal axis A-A. In the exemplary embodiment, the alignment features 2036 are slots, but they may have a variety of configurations. The housing 2020 further comprises an attachment feature 2038, the attachment feature 2038 formed into the entry portion 2031 of the insert receiving cavity 2030.

Turning to FIGS. 20E and 20F, the insert 2060 is illustrated. The insert 2060 has a fluid flow path 2012 extending from the port 2061 to the tube stub 2064 as discussed above. The port 2061 extends along the longitudinal axis A-A and is symmetrical about the longitudinal axis A-A. The tube stub 2064 also extends along the longitudinal axis A-A.

The insert 2060 further comprises a plurality of alignment features 2074, the alignment features 2074 engaging the alignment features 2036 in the housing 2020. The alignment features 2074 aid in positioning the insert 2060 within the housing 2020. The alignment features 2074 may be cylindrical as illustrated, or may be any other shape suitable for engaging the alignment features 2036 in the housing 2020. The insert 2060 also comprises a pair of attachment features 2076. The attachment features 2076 take the form of snap fastener hooks which engage the attachment features 2038 of the housing 2020 to retain the insert 2060 in the housing 2020 and form the fitting assembly 2000. As can be seen, the attachment features 2038 deflect and engage the attachment features 2076 of the insert 2060. Optionally, this arrangement might be reversed if desired.

FIGS. 22A-22F illustrate another embodiment of a fitting assembly 2100. The fitting assembly 2100 comprises a housing 2120 and an insert 2160. The insert 2160 has a branch tee configuration. Thus, a fluid flow path 2112 extends from a port 2161 to first and second tube stubs 2164. The housing 2120 is formed as a monolithic, integrally formed, component. A longitudinal axis A-A extends through the port 2161. The fitting assembly 2100 is similar to the fitting assembly 1900, with variations discussed in greater detail below.

The housing 2120 of the fitting assembly 2100 has an insert receiving cavity 2130 which receives the insert 2160. The insert receiving cavity 2130 comprises two entry portions 2131 and an insert portion 2132. The entry portions 2131 extend perpendicular to the longitudinal axis A-A and receive the tube stubs 2164. The insert receiving cavity 2130 comprises a perimeter surface 2135, the perimeter surface 2135 having alignment features 2136 formed therein. The alignment features 2136 extend parallel to the longitudinal axis A-A. In the exemplary embodiment, the alignment features 2136 are slots, but they may have a variety of configurations. The housing 2120 further comprises a pair of attachment features 2138, the attachment features 2138 formed into the entry portions 2131 of the insert receiving cavity 2030.

Figure 22A:
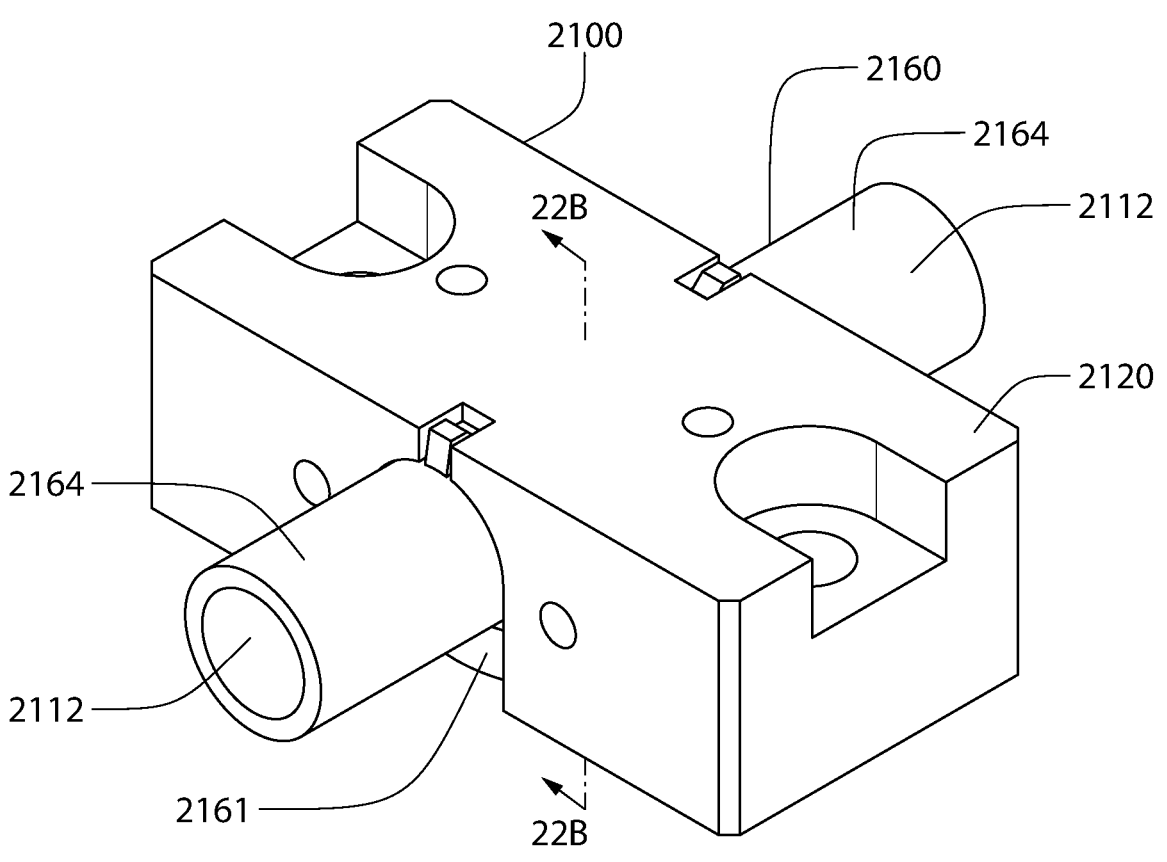
FIG. 22A is a perspective view of another embodiment of a fitting assembly of the present invention, the fitting assembly having an insert and a housing.
Figure 22B:
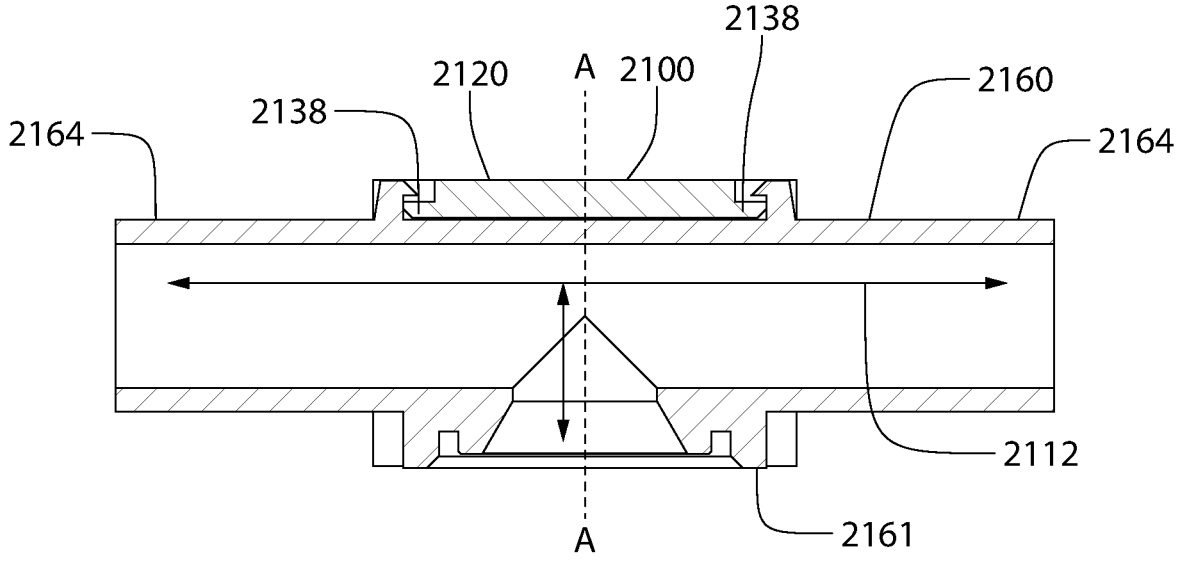
FIG. 22B is a cross-sectional view of the fitting assembly of FIG. 22A, taken along the line 22B-22B.
Figure 22C:
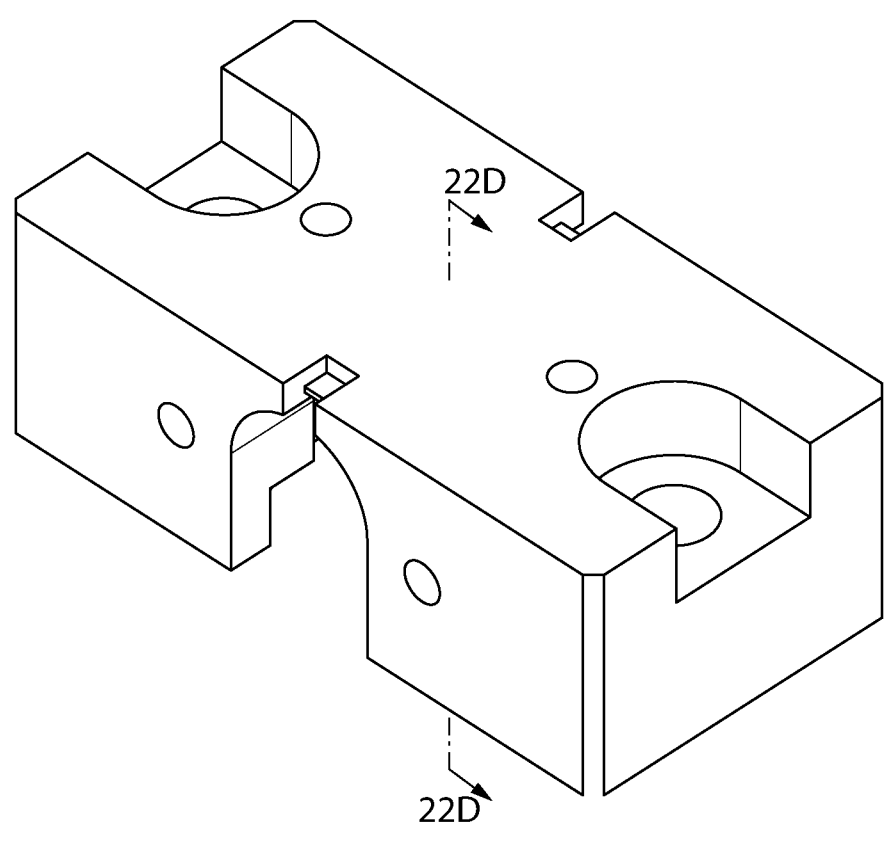
FIG. 22C is a perspective view of the housing of the fitting assembly of FIG. 22A.
Figure 22D:
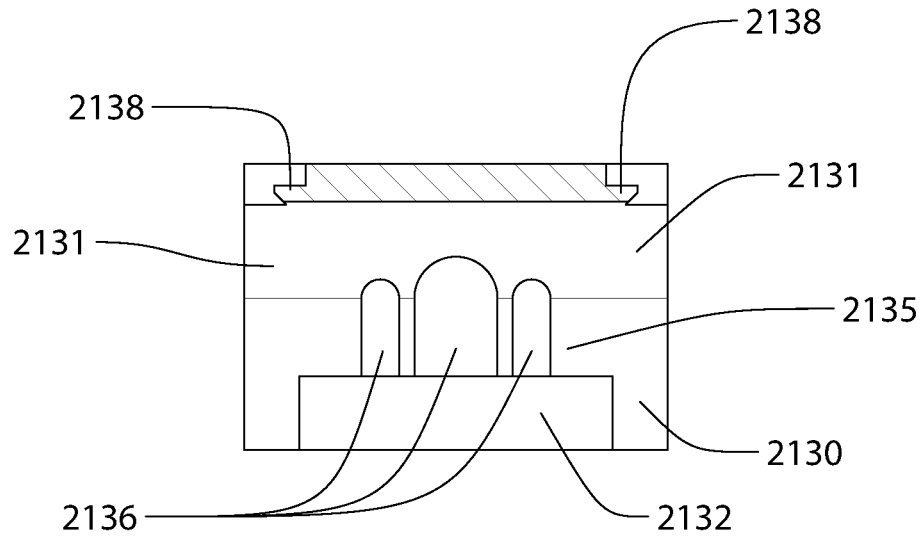
FIG. 22D is a cross-sectional view of the housing of FIG. 22C, taken along the line 22D-22D.
Figure 22E:
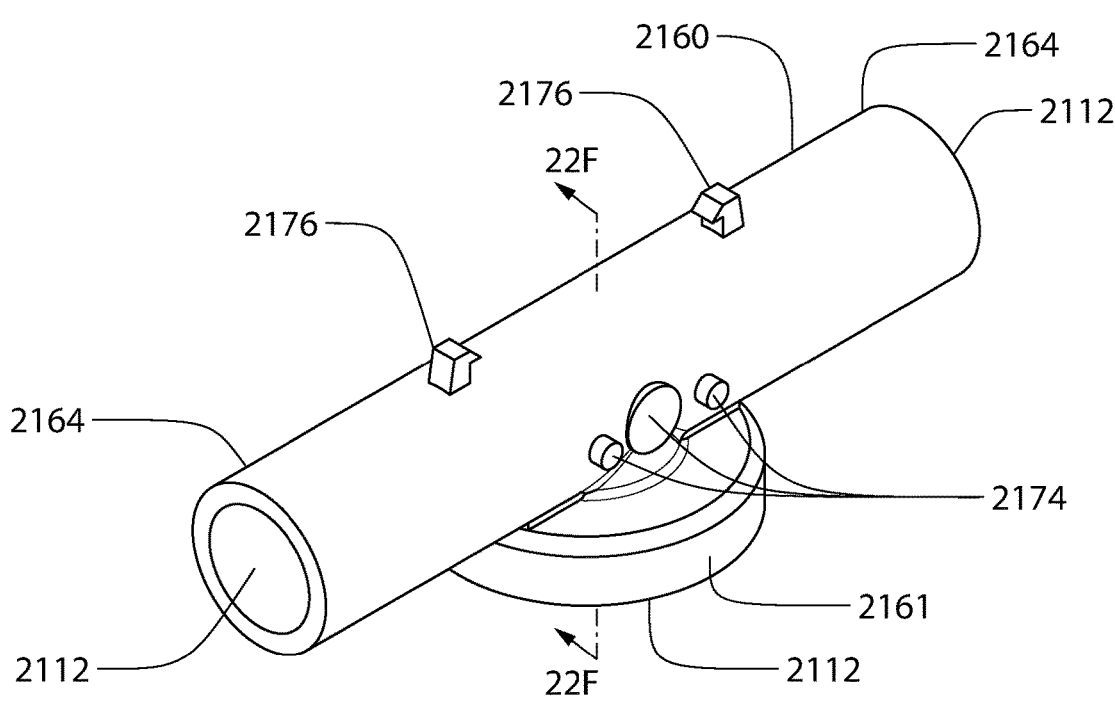
FIG. 22E is a perspective view of the insert of the fitting assembly of FIG. 22A, the insert having a branch tee configuration.
Figure 22F:
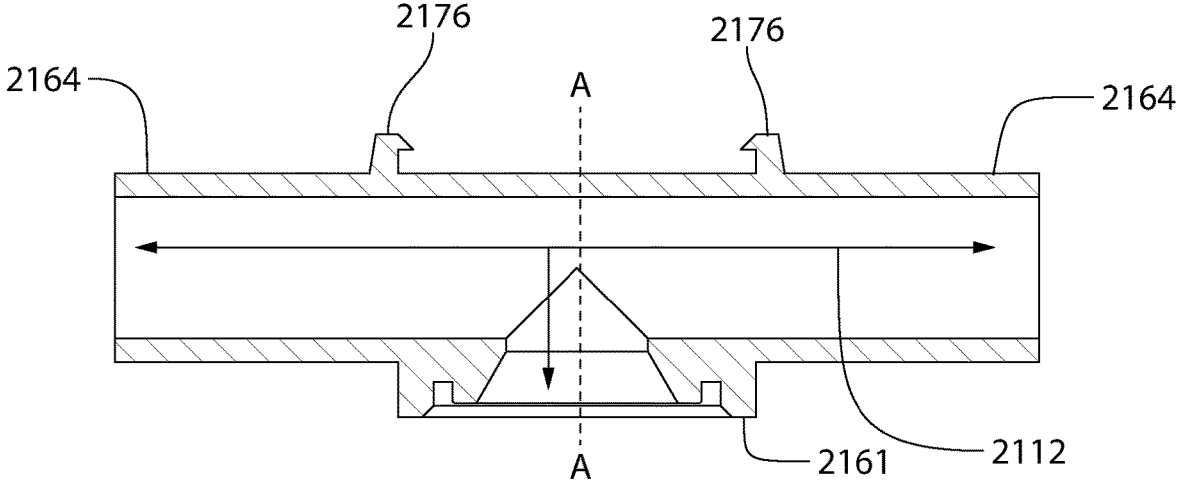
FIG. 22F is a cross-sectional view of the insert of FIG. 22E, taken along the line 22F-22F.

Turning to FIGS. 22E and 22F, the insert 2160 is illustrated. The insert 2160 has a fluid flow path 2112 extending from the port 2161 to the tube stub 2164 as discussed above. The port 2161 extends along the longitudinal axis A-A and is symmetrical about the longitudinal axis A-A. The tube stub 2164 also extends along the longitudinal axis A-A.

The insert 2160 further comprises a plurality of alignment features 2174, the alignment features 2174 engaging the alignment features 2136 in the housing 2120. The alignment features 2174 aid in positioning the insert 2160 within the housing 2120. The alignment features 2174 may be cylindrical as illustrated, or may be any other shape suitable for engaging the alignment features 2136 in the housing 2120. The insert 2160 also comprises a pair of attachment features 2176. The attachment features 2176 take the form of snap fastener hooks which engage the attachment features 2138 of the housing 2120 to retain the insert 2160 in the housing 2120 and form the fitting assembly 2100. As can be seen, the attachment features 2176 deflect and engage the attachment features 2138 of the housing 2120. Optionally, this arrangement might be reversed if desired.

FIGS. 23A-23D illustrate another embodiment of a fitting assembly 2200. The fitting assembly 2200 comprises the housing 1920 and an insert 2260. The insert 2260 has a run tee configuration. Thus, a fluid flow path 2212 extends from a port 2261 to first and second tube stubs 2264. The housing 1920 is identical to the housing 1920 discussed previously. A longitudinal axis A-A extends through the port 2261. The fitting assembly 2200 is similar to the fitting assembly 1900, with variations discussed in greater detail below.

Figures 23A, 23B:
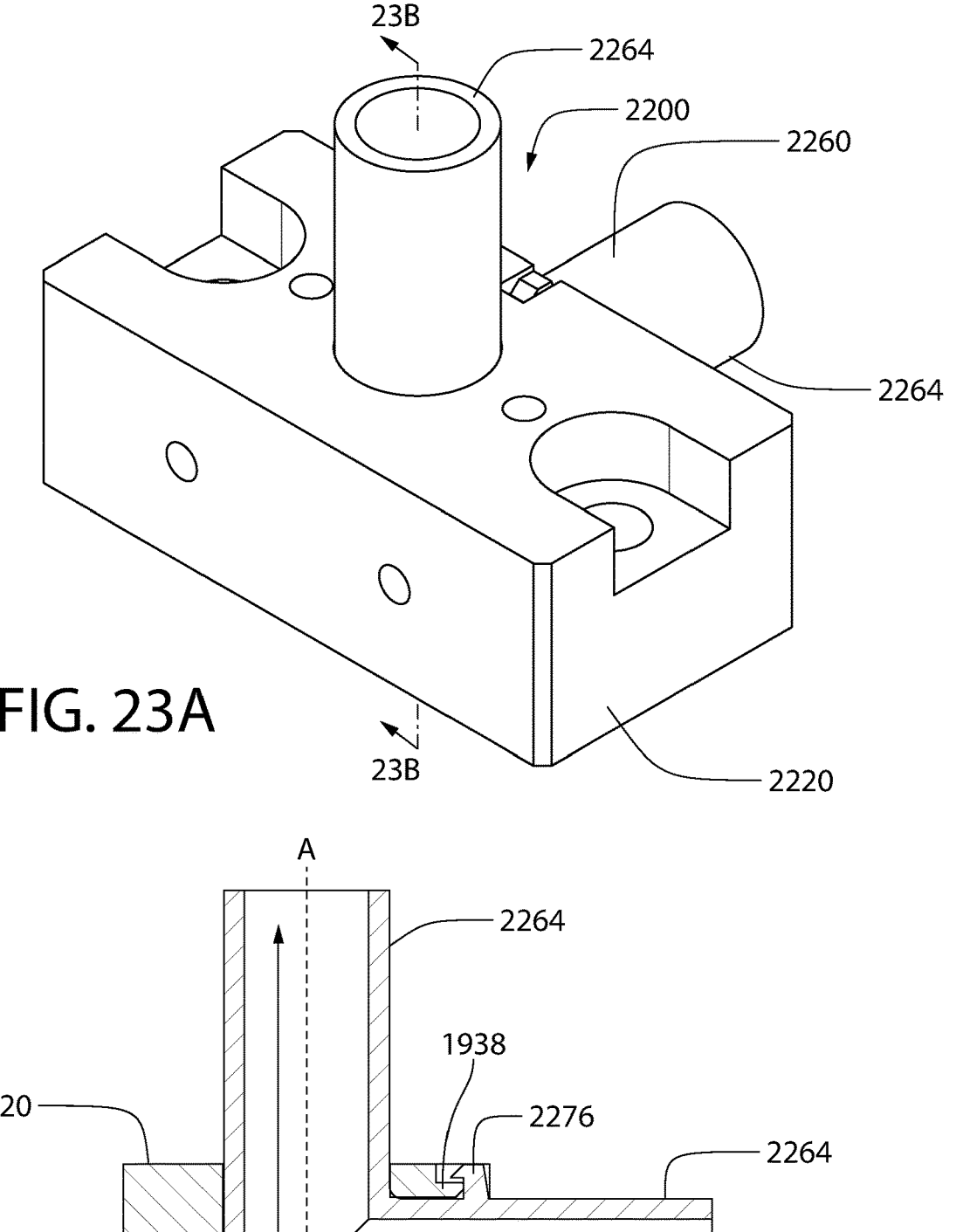
FIG. 23A is a perspective view of another embodiment of a fitting assembly of the present invention, the fitting assembly having an insert and a housing.
FIG. 23B is a cross-sectional view of the fitting assembly of FIG. 23A, taken along the line 23B-23B.
Figures 23C, 23D:
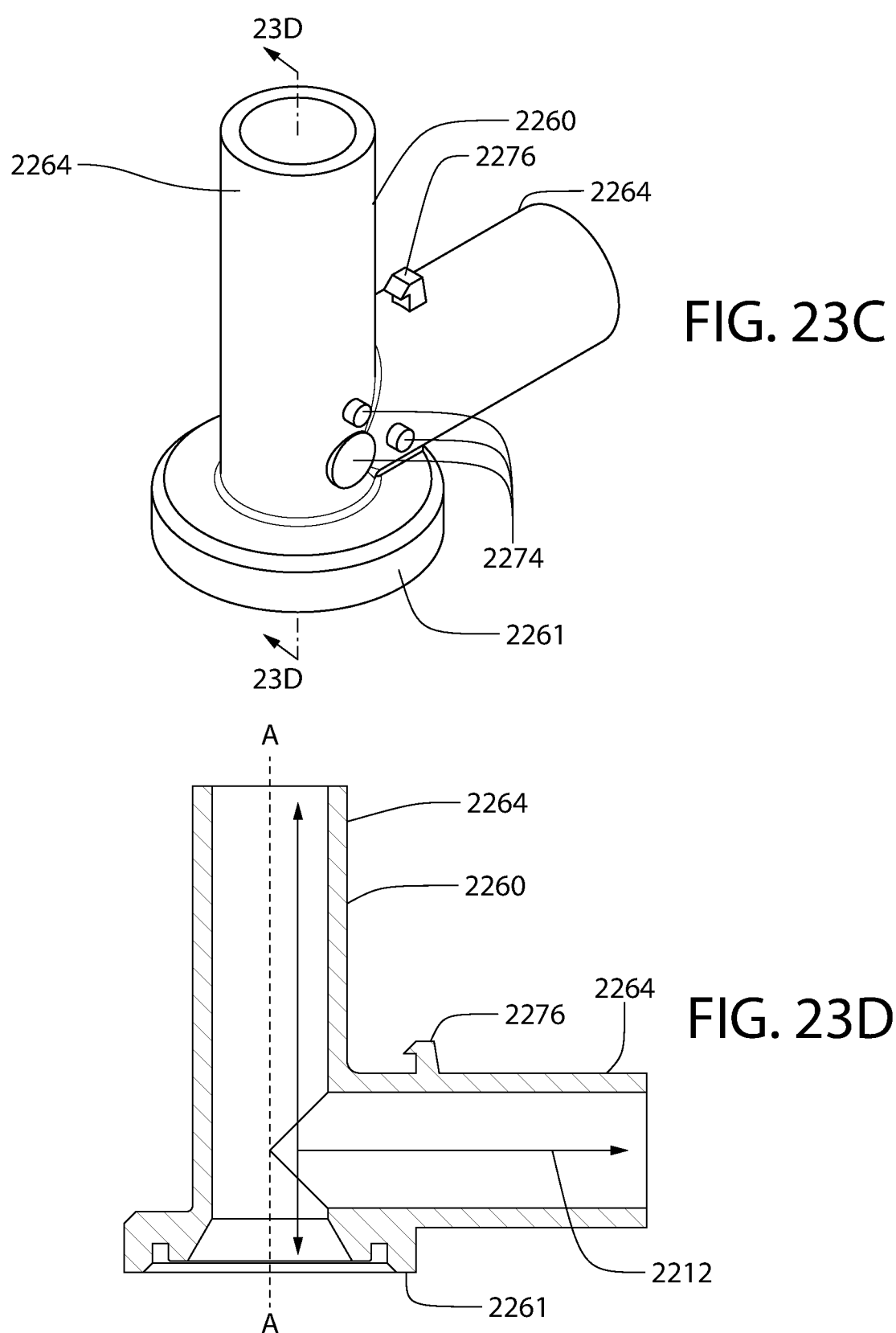
FIG. 23C is a perspective view of the insert of the fitting assembly of FIG. 23A, the insert having a run tee configuration.
FIG. 23D is a cross-sectional view of the insert of FIG. 23C, taken along the line 23D-23D.

Turning to FIGS. 23C and 23D, the insert 2260 is illustrated. The insert 2260 has a fluid flow path 2212 extending from the port 2261 to the tube stubs 2264 as discussed above. The port 2261 extends along the longitudinal axis A-A and is symmetrical about the longitudinal axis A-A. One tube stub 2264 also extends along the longitudinal axis A-A while the other tube stub 2264 is perpendicular to the longitudinal axis A-A.

The insert 2260 further comprises a plurality of alignment features 2274, the alignment features 2274 engaging the alignment features 1936 in the housing 1920. The alignment features 2274 aid in positioning the insert 2260 within the housing 1920. The alignment features 2274 may be cylindrical as illustrated, or may be any other shape suitable for engaging the alignment features 1936 in the housing 1920. The insert 2260 also comprises a pair of attachment features 2276. The attachment features 2276 take the form of snap fastener hooks which engage the attachment features 1938 of the housing 1920 to retain the insert 1960 in the housing 1920 and form the fitting assembly 2200. As can be seen, the attachment features 2276 deflect and engage the attachment features 1938 of the housing 1920. Optionally, this arrangement might be reversed if desired.

Turning to FIGS. 24A-H, another embodiment of a fitting assembly 2300 will be described. The fitting assembly 2300 comprises a housing 2320 and an insert 2360. The insert 2360 has a U configuration. Thus, a fluid flow path 2312 extends from a first port 2361 to a second port 2361. The ports 2361 need not be identical, but are identical in this embodiment. The housing 2320 is formed of two portions 2310. In the present embodiment, the portions 2310 are identical, but they may be different in other embodiments. A longitudinal axis A-A extends through the first port 2361 while an longitudinal axis B-B extends through the second port 2361 as shown. The longitudinal axis A-A is parallel to the longitudinal axis B-B.

The fitting assembly 2300 comprises a seal side mounting surface 2314 formed by a first surface 2321 of the housing 2320 and a distal surface 2363 of the insert 2360. An assembly surface 2315 of the fitting assembly 2300 is opposite the seal side mounting surface 2314. The assembly surface 2315 may engage another object such as the substrate panel 1402. Fastener passageways 108 in the housing 2320 are utilized to secure the fitting assembly 2300 to the object to which the fitting assembly 2300 is assembled. The fastener passageways 108 may extend from the seal side mounting surface 2314 to the assembly surface 2315 or may terminate in a recess 2322 formed into the housing 2320. The assembly surface 2315 is formed by a second surface 2323 of the housing 2320. However, in some embodiments, a portion of the assembly surface 2315 may be formed by the insert 2360.

FIGS. 24B-24F show a portion 2310 of the housing 2320. As can be seen, two identical portions 2310 of the housing 2320 form a single housing 2320. However, the portions 2310 need not be identical. A portion 2310 may be combined with another portion to form a housing, particularly if the insert 2360 has a different configuration. This enables modularity and a minimum of distinct components for a wide variety of flow configurations. The first surface 2321 and the opposite second surface 2323 are shown. When the portions 2310 are assembled, the first surface 2321 of the first portion 2310 and the first surface 2321 of a second portion 2310 form an entirety of the first surface 2321 of the housing 2320. Similarly, the second surface 2323 of the first portion 2310 and the second surface 2323 of a second portion 2310 collectively form an entirety of the second surface 2323 of the housing 2320.

The portion 2310 of the housing 2320 also comprises a recess 2322 formed into the second surface 2323. The recess 2322 of the portion 2310 forms the recess 2322 of the housing 2320. Fastener passageways 108 extend through the portion 2310. When two portions 2310 are coupled together, the fastener passageways 108 permit fasteners to extend through the fastener passageways 108 to mate to components such as the substrate panel 1402. An additional hole 2324 is provided in an interface surface 2325. The interface surface 2325 receives a corresponding interface surface 2325 of another portion 2310 to form a complete housing 2320. The interface surface 2325 further includes a protuberance 2326 which engages the hole 2324 provided in the interface surface 2325. The protuberance 2326 may have a concave tip, a conical tip, or a flat tip, and may further include a fillet or chamfer joining the tip to the body of the protuberance 2326. The protuberance 2326 is sized to limit movement in a radial direction with respect to the hole 2324 when the protuberance 2326 is inserted into the hole 2324. Thus, the portions 2310 are secured together along the plane of the interface surface 2325 and are not free to translate along the interface surface 2325 or rotate with respect to the interface surface 2325.

The portion 2310 further comprises a plurality of fingers 2327. The fingers 2327 are arranged such that two fingers 2327 are located on one end of the portion 2310 and one finger 2327 is located on an opposite end of the portion 2310. The fingers 2327 are spaced apart such that they interlock with fingers 2327 of a second portion 2310 when two portions 2310 are joined to form a housing 2320. The fingers 2327 may incorporate snap features such as the feature 2328 that aid in keeping the two portions 2310 coupled to form a housing 2320. Between the two fingers 2327 at the one end of the portion 2310 is a slot 2329, the slot 2329 sized to ensure a secure fit with the finger 2327 of the mating portion 2310. As can be seen, the fastener passageways 108 extend through all three fingers 2327 when two portions 2310 are joined to form a housing 2320, extending from the recess 2322 to the first surface 2321.

The portion 2310 also comprises an insert receiving cavity 2330 which receives an insert 2360. The insert receiving cavity 2330 comprises an entry portion 2331 and an insert portion 2332. The entry portion 2331 extends from the interface surface 2325 to the insert portion 2332 that receives one of the ports 2361. The insert receiving cavity 2330 comprises a port receiving wall 2333 that has a generally cylindrical shape. The port receiving wall 2333 meets a flange receiving surface 2334 that extends substantially parallel to the first surface 2321. Thus, the flange receiving surface 2334 is substantially planar.

Adjacent the flange receiving surface 2334 is a perimeter surface 2335, the perimeter surface 2335 extending from the flange receiving surface 2334 and surrounding the insert 2360. Slots 2336 are formed in the perimeter surface 2335. The slots 2336 extend parallel to the entry portion 2331 and terminate in an arcuate wall 2337.

Figure 24A:
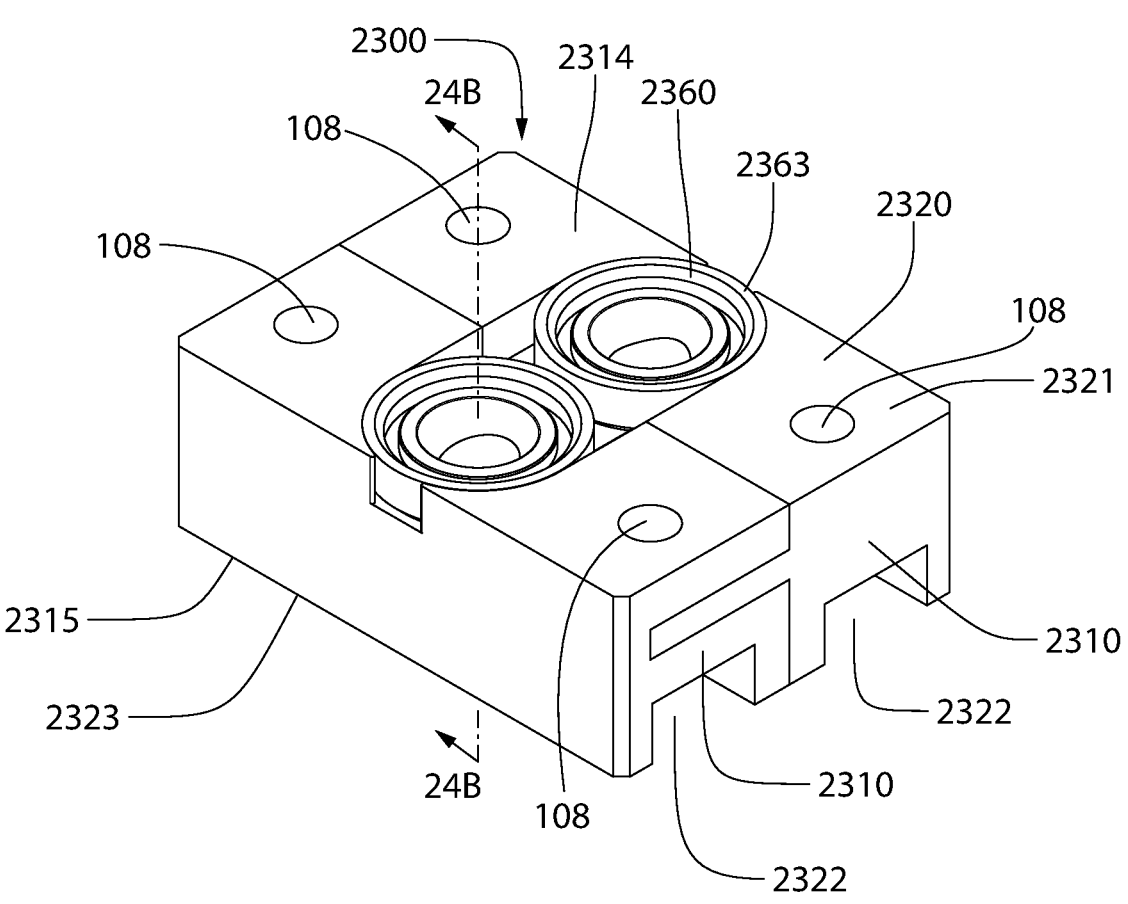
FIG. 24A is a perspective view of another embodiment of a fitting assembly of the present invention, the fitting assembly having an insert and a housing.
Figure 24B:
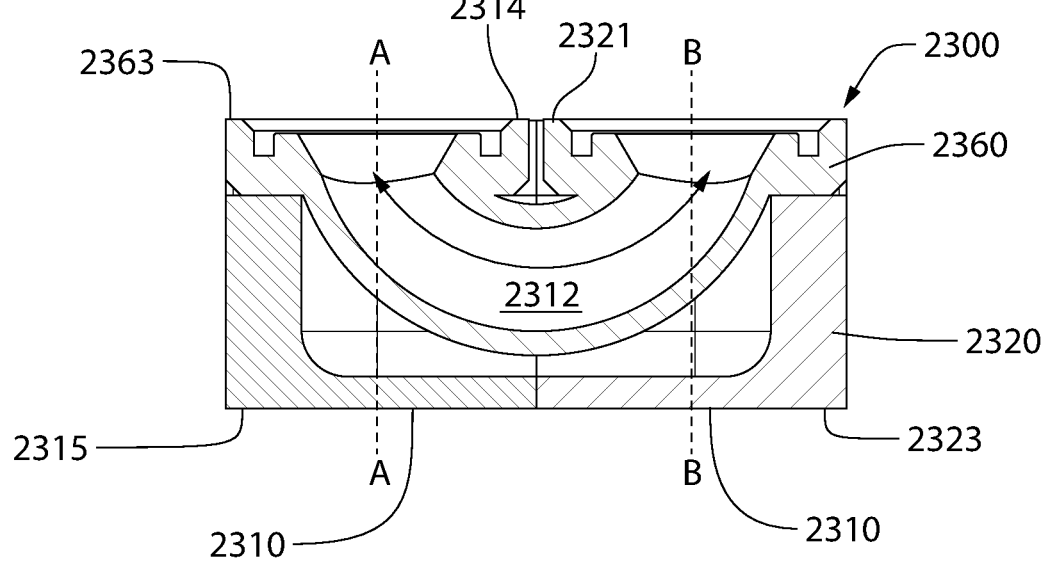
FIG. 24B is a cross-sectional view of the fitting assembly of FIG. 24A, taken along the line 24B-24B.
Figure 24C:
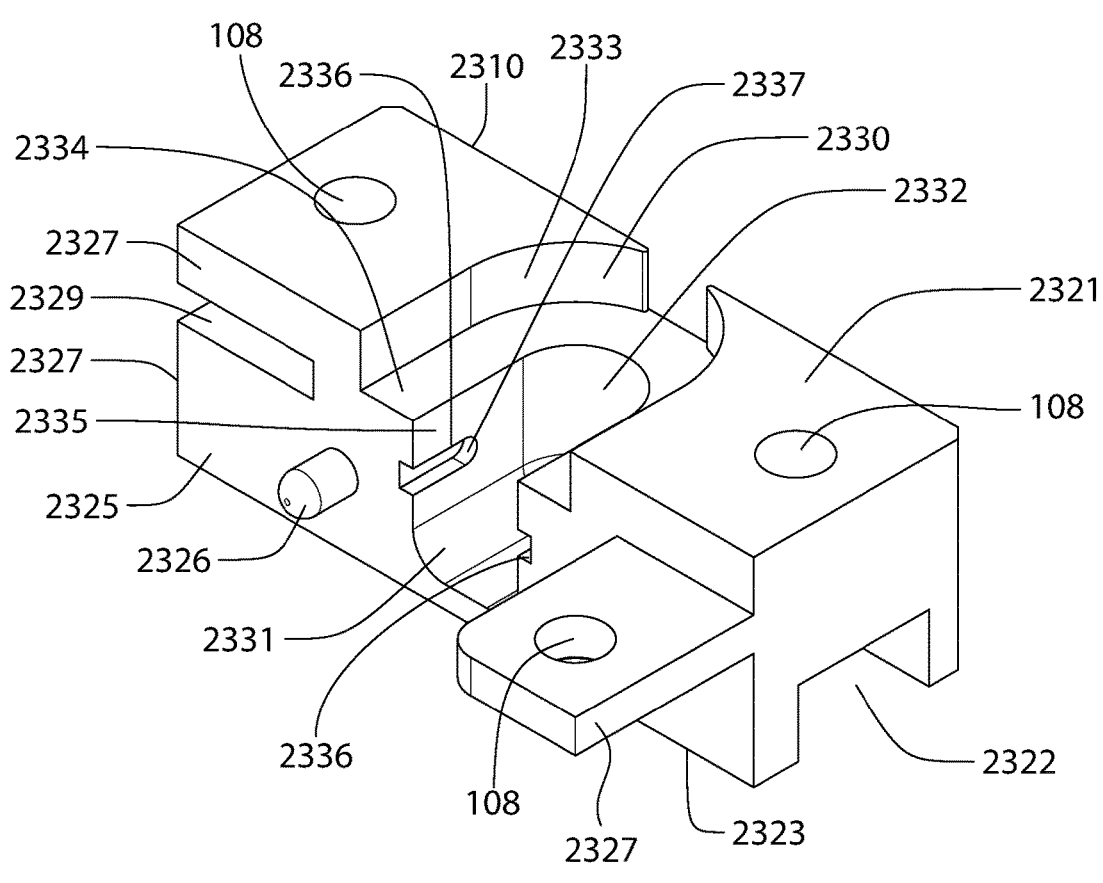
FIG. 24C is a perspective view of a portion of the housing of the fitting assembly of FIG. 24A.
Figure 24D:
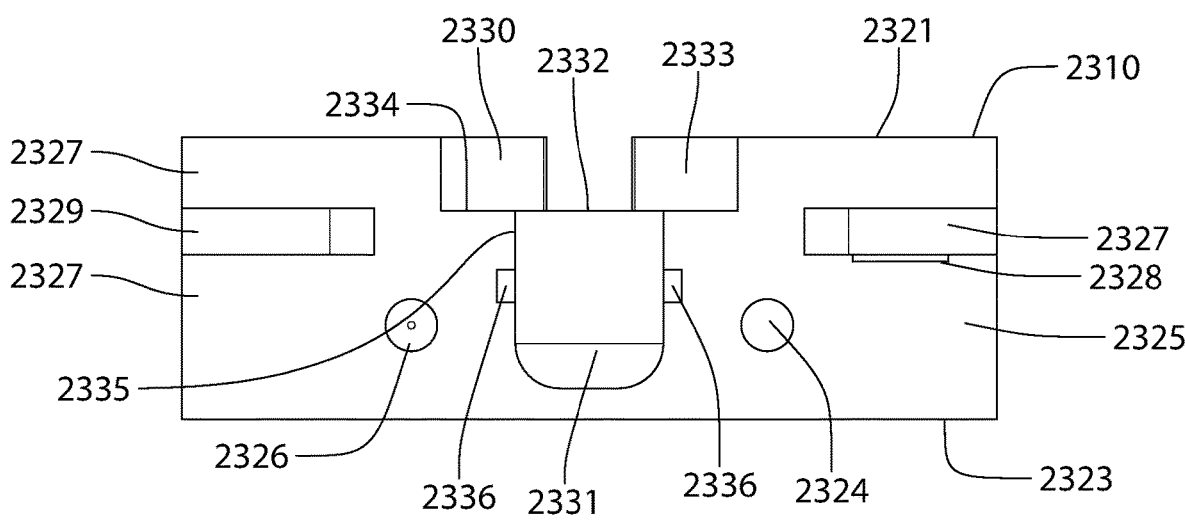
FIG. 24D is a front view of a portion of the housing of FIG. 24C.
Figure 24E:
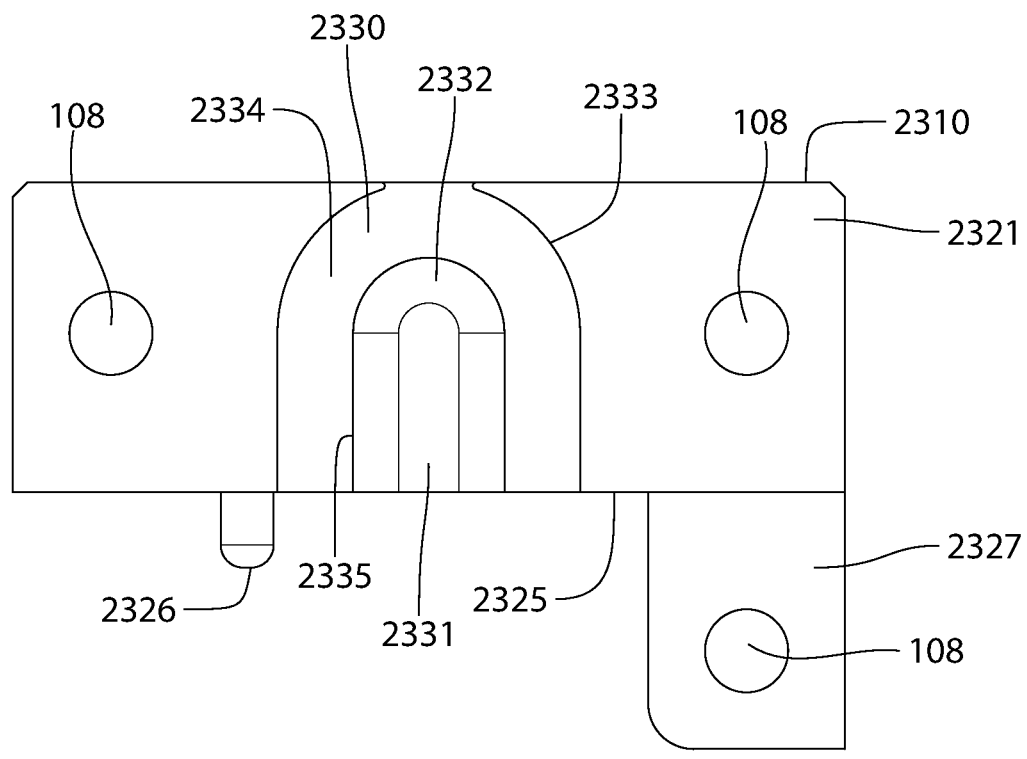
FIG. 24E is a top view of a portion of the housing of FIG. 24C.
Figure 24F:
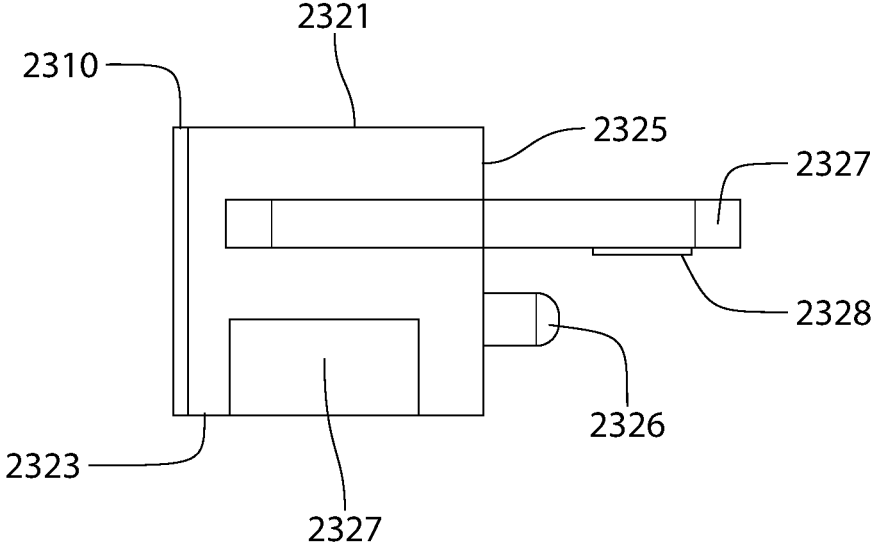
FIG. 24F is a left view of a portion of the housing of FIG. 24C.
Figures 24G, 24H:
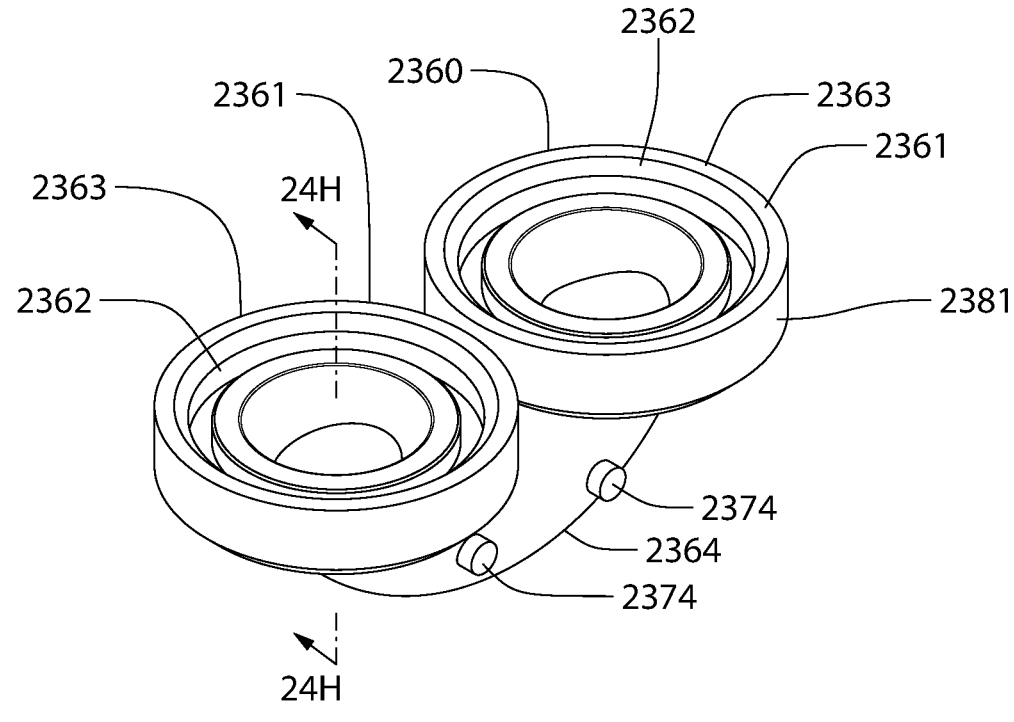
FIG. 24G is a perspective view of the insert of the fitting assembly of FIG. 24A.
FIG. 24H is a cross-sectional view of the insert of FIG. 24G, taken along the line 24H-24H.
Figure 25:
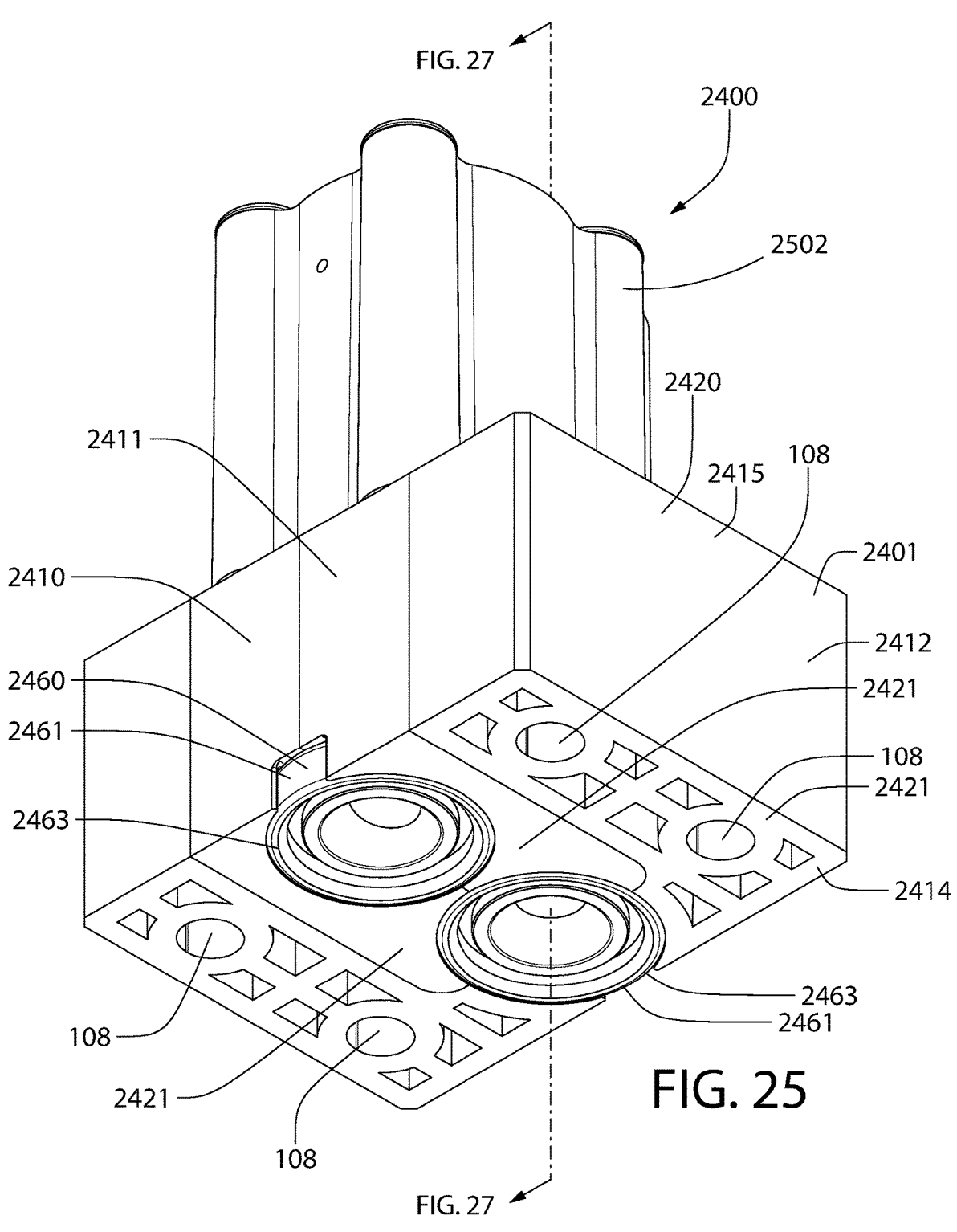
FIG. 25 is a bottom perspective view of a fluid flow component incorporating a fitting assembly according to the present invention.

Turning to FIGS. 24G and 24H, the insert 2360 is illustrated. The insert 2360 has a fluid flow path 2312 extending from the first port 2361 to a second port 2361 as discussed above. The first port 2361 extends along a longitudinal axis A-A and is symmetrical about the longitudinal axis A-A. The second port 2361 extends along a longitudinal axis B-B and is symmetrical about the longitudinal axis B-B. A conduit portion 2364 extends from the first port 2361 to the second port 2361.

The insert 2360 further comprises first and second seal cavities 2362 and first and second distal surfaces 2363. The seal cavities 2362 are configured to receive a seal to seal the fluid flow path 2312 to a fluid flow path of a fluid flow component 200 or another fitting assembly. The distal surfaces 2363, in combination with the first surface 2321 of the housing 2320, collectively form the seal side mounting surface 2314 of the fitting assembly 2300. Preferably, the distal surfaces 2363 protrude slightly from the first surface 2321 to ensure proper compression of a seal placed therebetween.

The insert 2360 further comprises a plurality of alignment features 2374, the alignment features 2374 engaging the slots 2336 in the portions 2310 of the housing 2320. The alignment features 2374 aid in positioning the insert 2360 within the housing 2320. The alignment features 2374 may be cylindrical as illustrated, or may be any other shape suitable for engaging the slots 2336 in the portions 2310 of the housing 2320. The ports 2361 each have a port outer diameter 2381 and a flange surface 2380. The port outer diameter 2381 is sized to be smaller than the port receiving wall 2333 so that the port 2361 does not interfere with the housing 2320. The flange surface 2380 engages the flange receiving surface 2333, preventing the insert 2360 from moving along the longitudinal axes A-A, B-B when compressed against the seal and a mating component.

Figure 26:
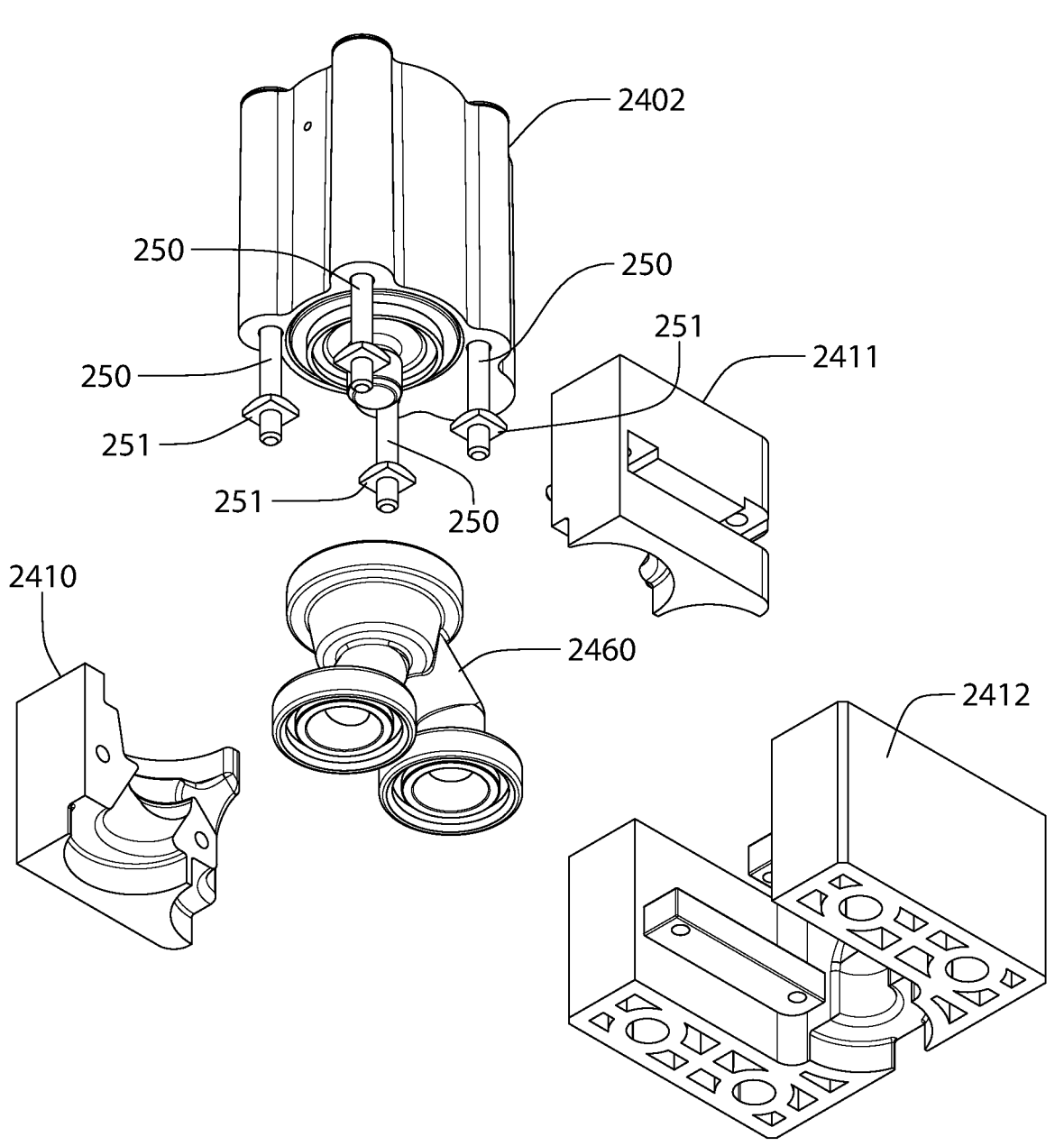
FIG. 26 is an exploded view of the fluid flow component of FIG. 25.

FIGS. 25-63 illustrate a fluid flow component 2400 incorporating a fitting assembly 2401. The fluid flow component 2400 of the present embodiment is a valve used to control flow of a fluid from a first port 2461 to a second port 2461. The fluid flow component 2400 comprises an upper component assembly 2502 and the fitting assembly 2401. The fitting assembly comprises a first support portion 2410, a second support portion 2411, an insert 2460, and a base portion 2412. The insert 2460 comprises the first and second ports 2461. The first and second support portions 2410, 2411 surround the insert 2460 and provide additional structural strength to the insert 2460. The base portion 2412 surrounds the first and second support portions 2410, 2411 and further reinforces the insert 2460. The upper component assembly 2502 and the fitting assembly 2401 are joined by fasteners 250 and nuts 251 as shown in FIG. 26.

Figure 27:
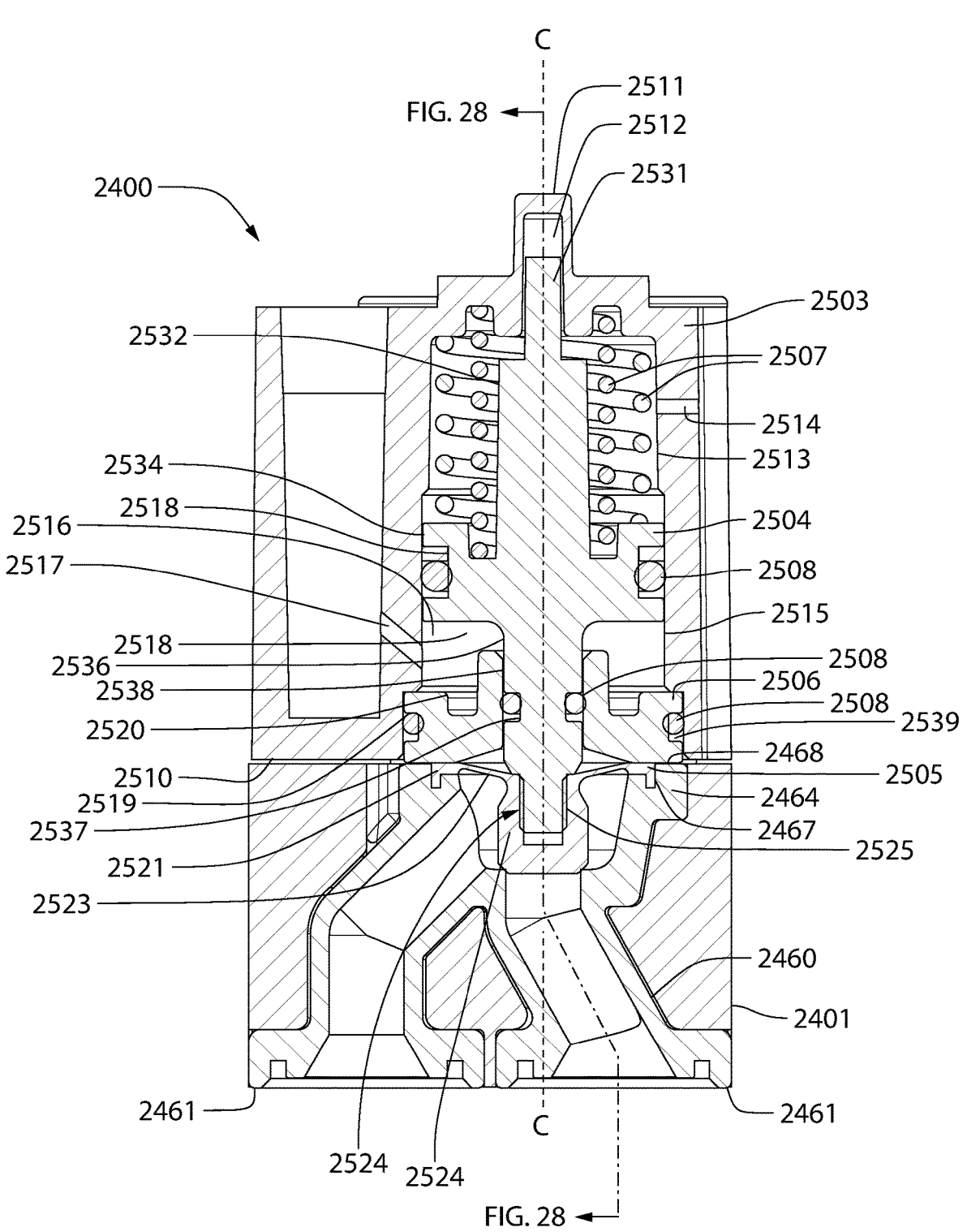
FIG. 27 is a cross-sectional view of the fluid flow component of FIG. 25, taken along line 27-27.
Figure 28:
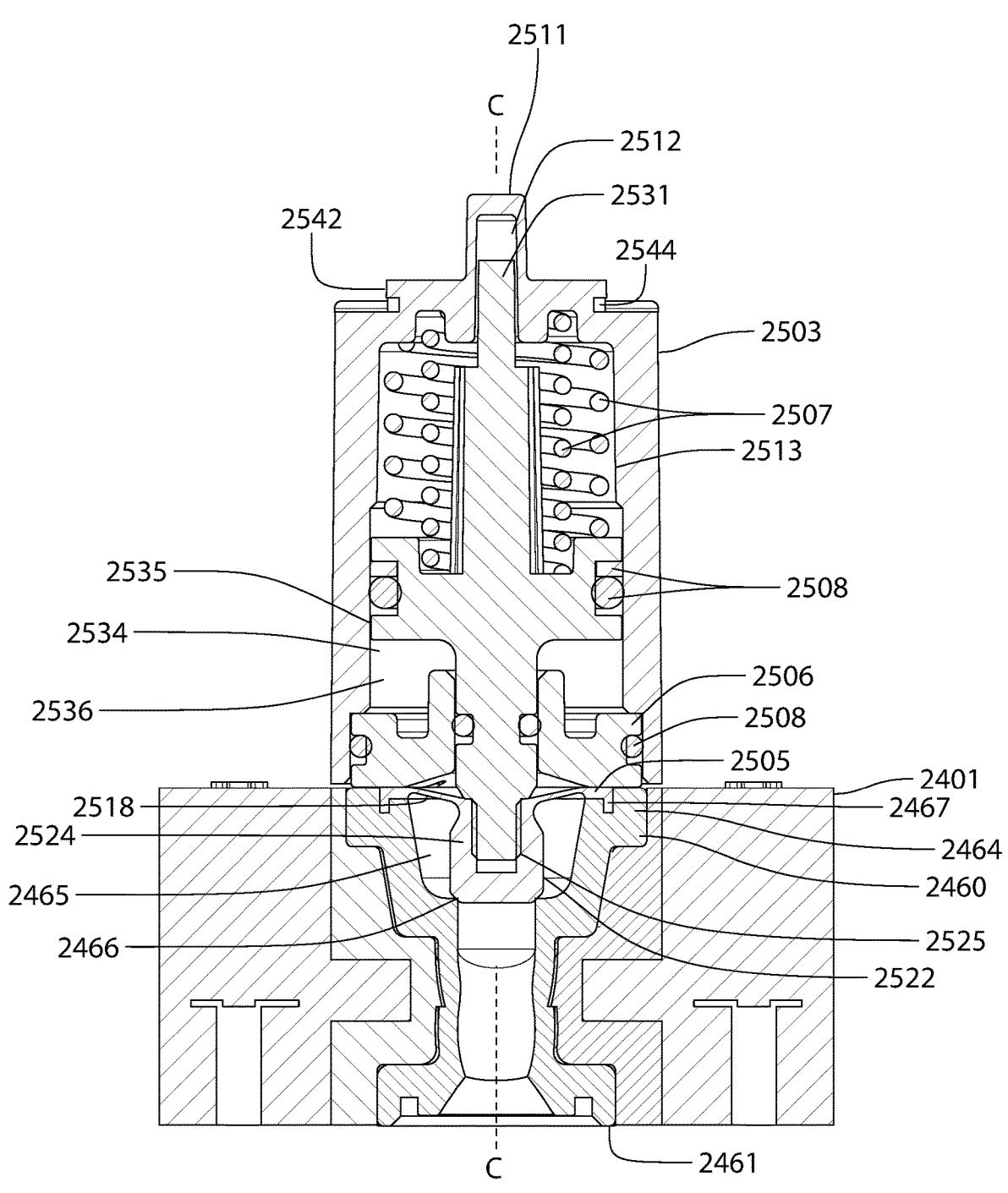
FIG. 28 is a cross-sectional view of the fluid flow component of FIG. 27, taken along line 28-28.
Figure 29:
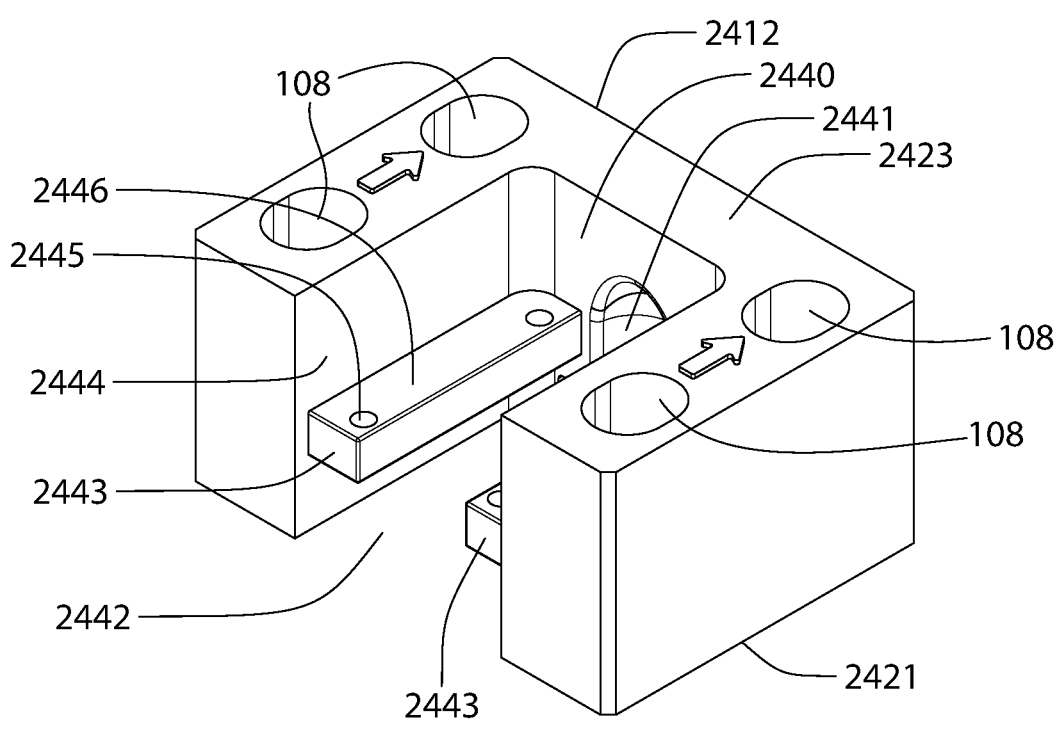
FIG. 29 is a perspective view of a base portion of the housing of the fluid flow component of FIG. 25.
Figure 30:
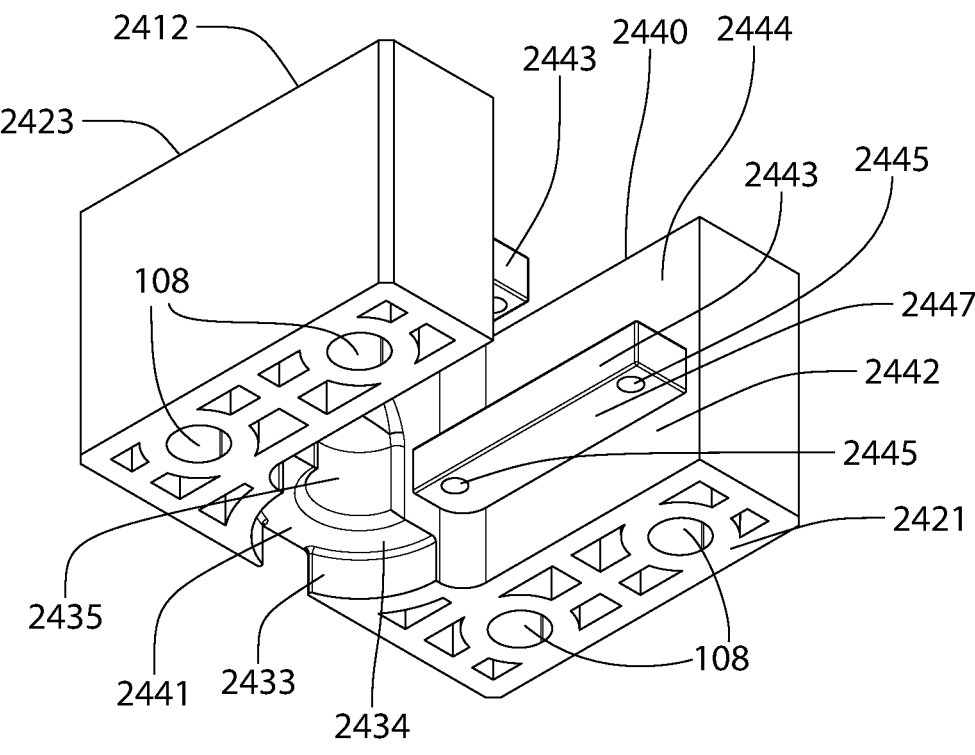
FIG. 30 is a bottom perspective view of the base portion of the housing of the fluid flow component of FIG. 25.
Figures 31, 32:
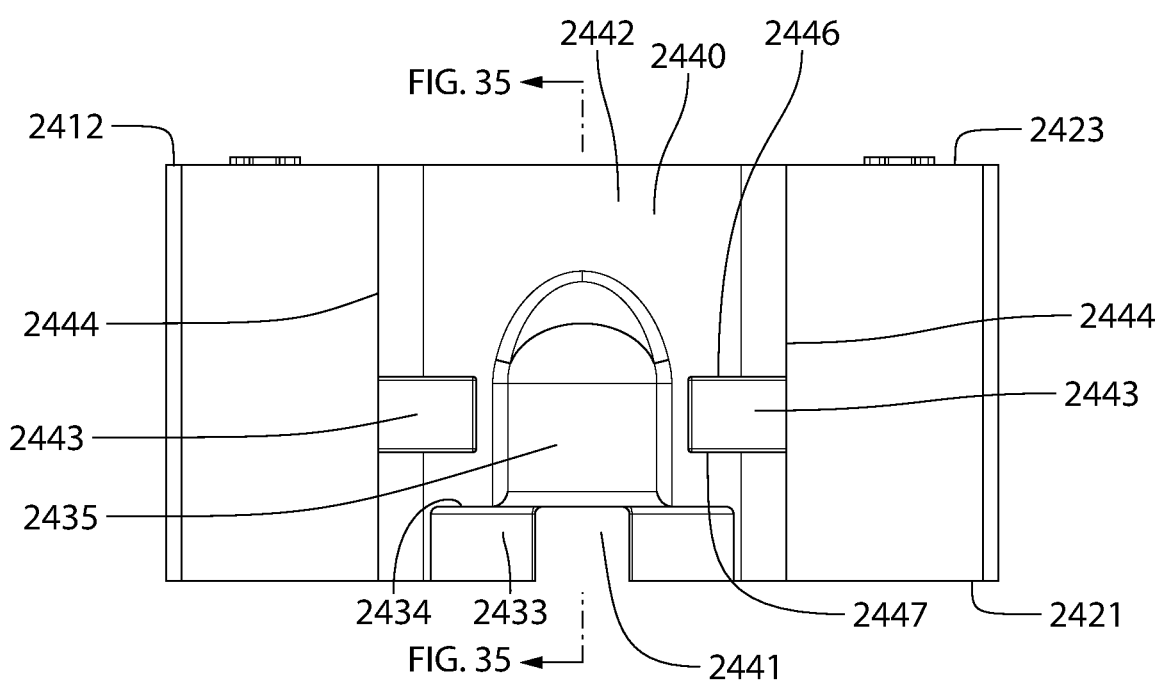
FIG. 31 is a front view of the base portion of the housing of the fluid flow component of FIG. 25.
FIG. 32 is a rear view of the base portion of the housing of the fluid flow component of FIG. 25.
Figure 33:
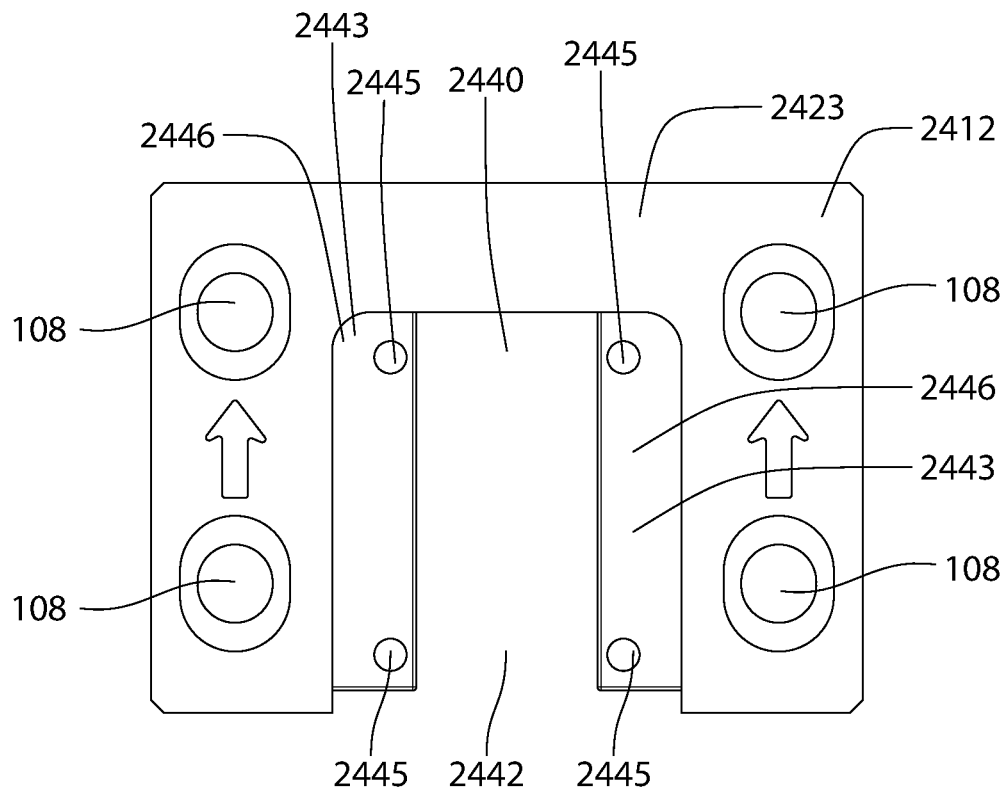
FIG. 33 is a top view of the base portion of the housing of the fluid flow component of FIG. 25.
Figure 34:
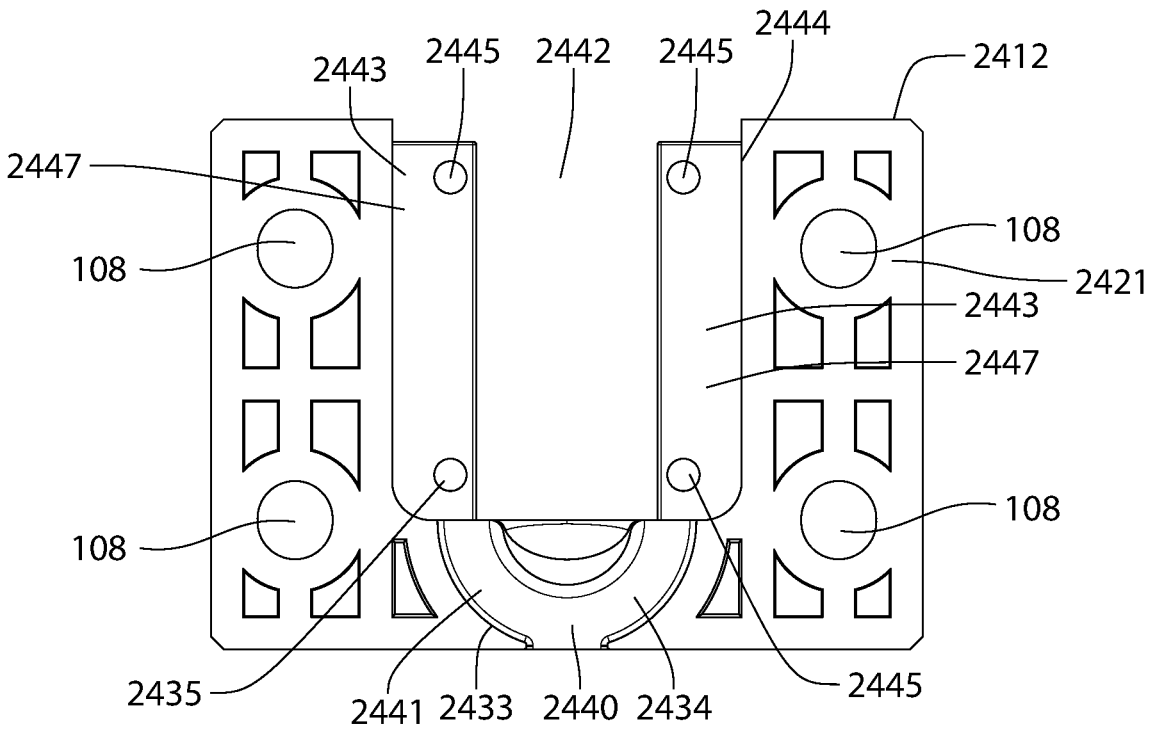
FIG. 34 is a bottom view of the base portion of the housing of the fluid flow component of FIG. 25.
Figure 35:
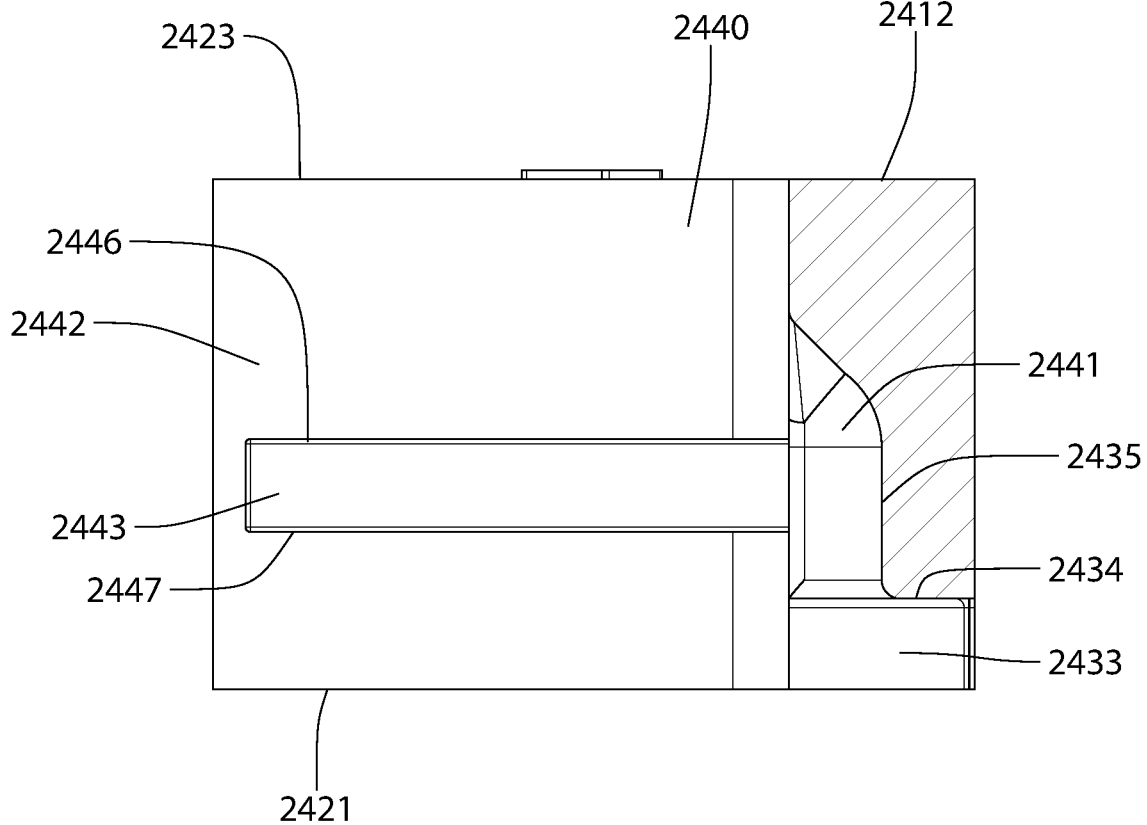
FIG. 35 is a cross-sectional view of the base portion of the housing of the fluid flow component of FIG. 31, taken along line 35-35.
Figure 36:
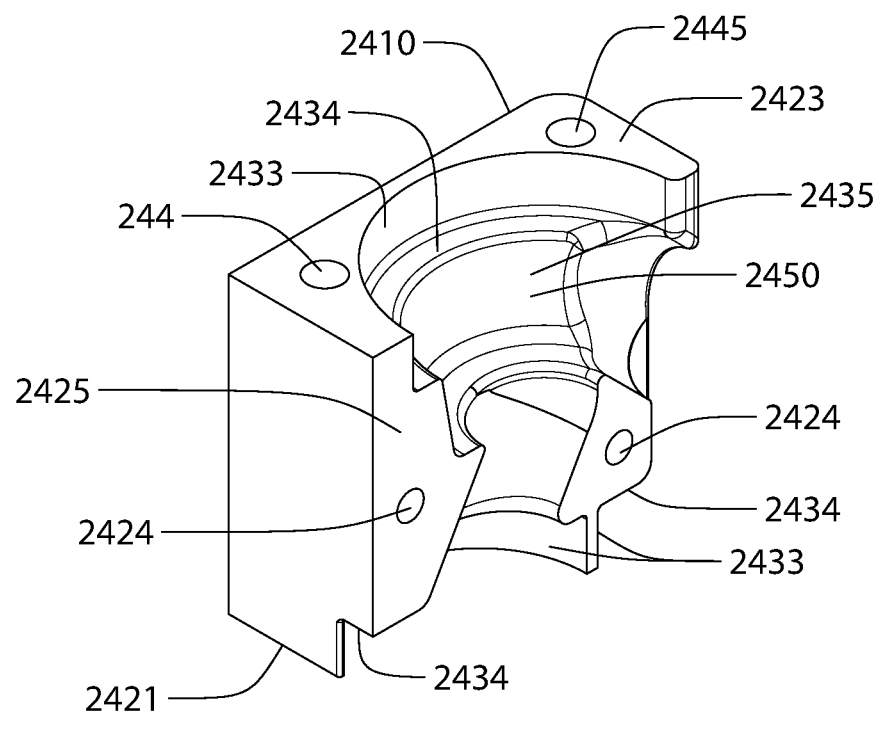
FIG. 36 is a perspective view of a first support portion of the housing of the fluid flow component of FIG. 25.
Figure 37:
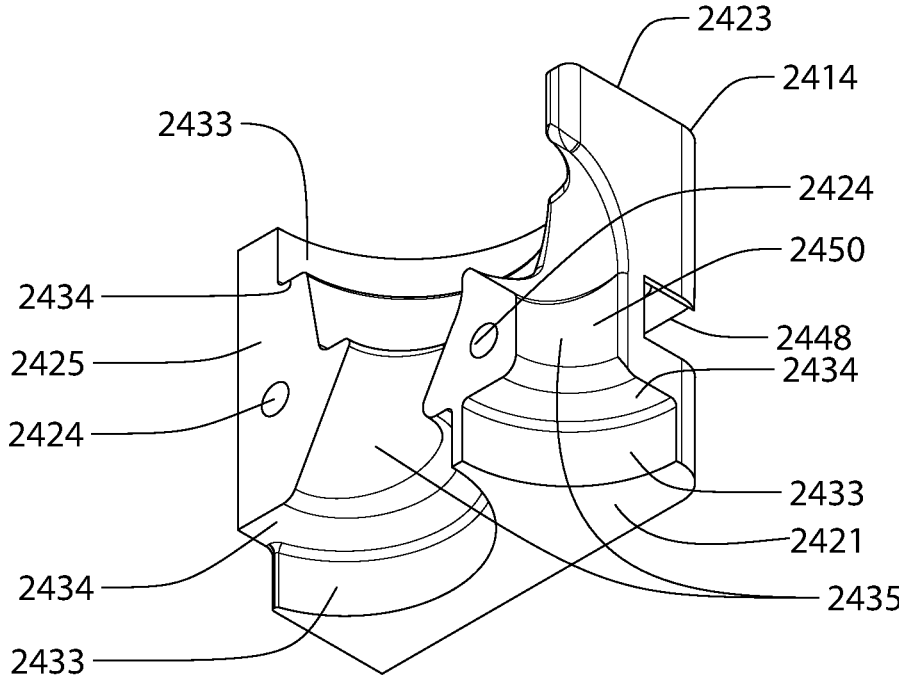
FIG. 37 is a bottom perspective view of the first support portion of the housing of the fluid flow component of FIG. 25.
Figure 38:
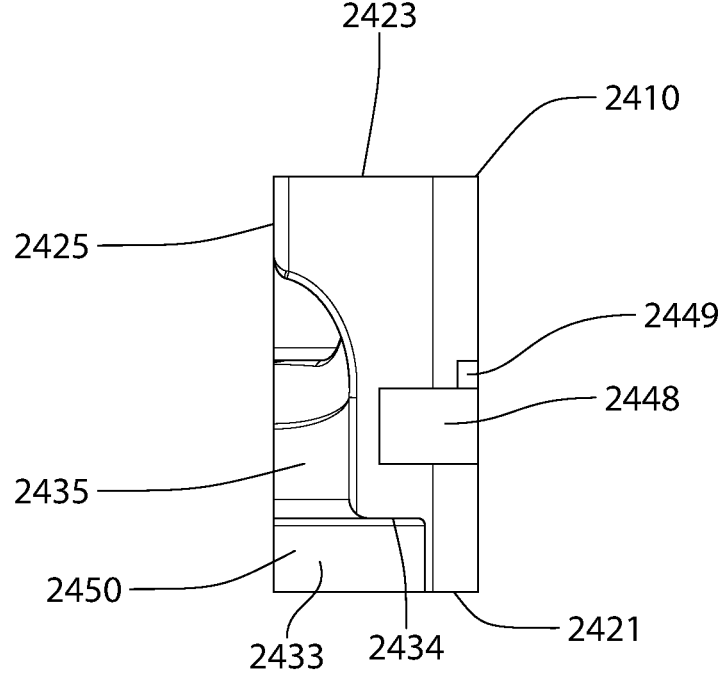
FIG. 38 is a rear view of the first support portion of the housing of the fluid flow component of FIG. 25.
Figure 39:
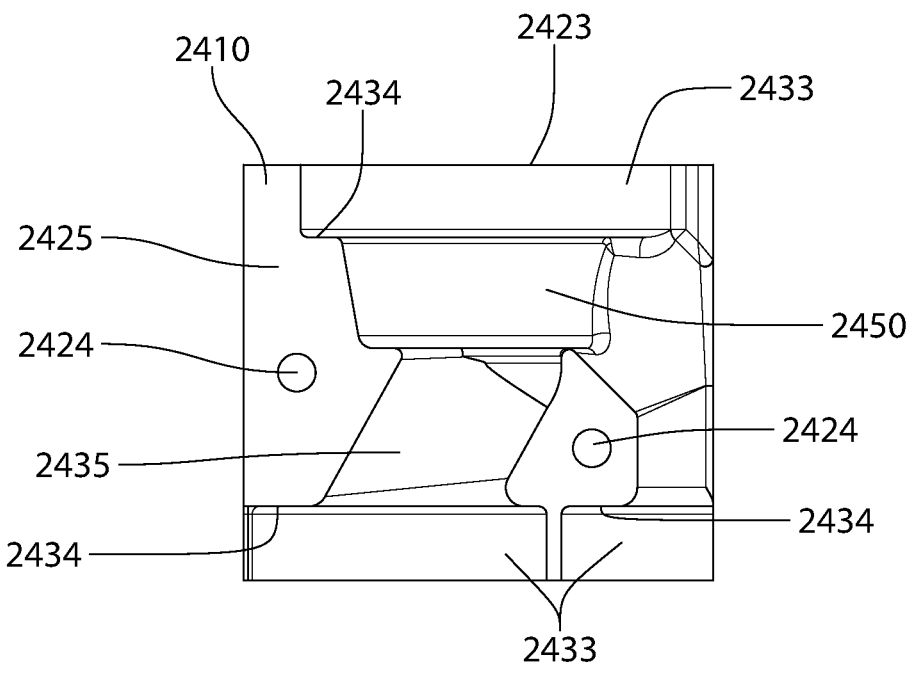
FIG. 39 is a left view of the first support portion of the housing of the fluid flow component of FIG. 25.
Figure 40:
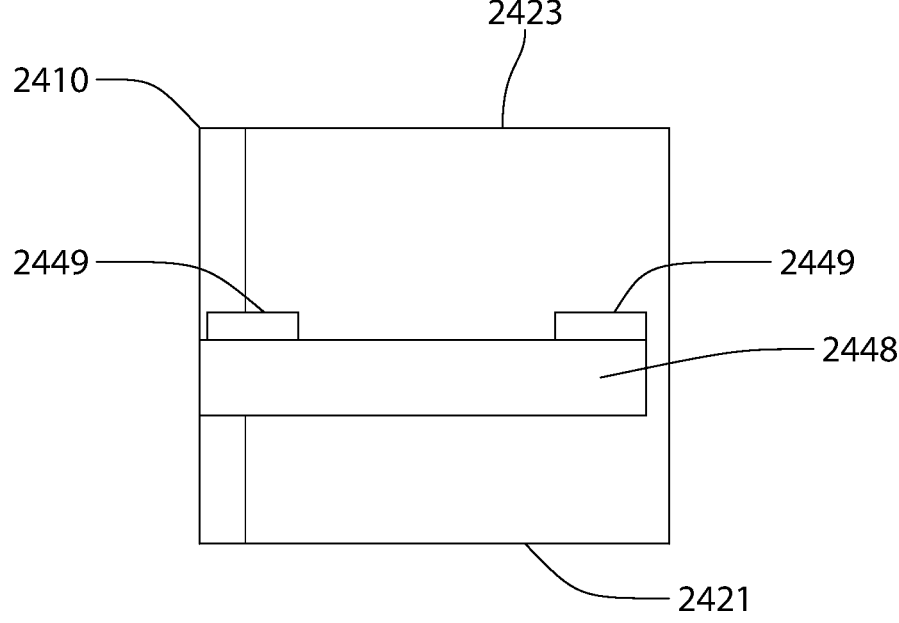
FIG. 40 is a right view of the first support portion of the housing of the fluid flow component of FIG. 25.
Figure 41:
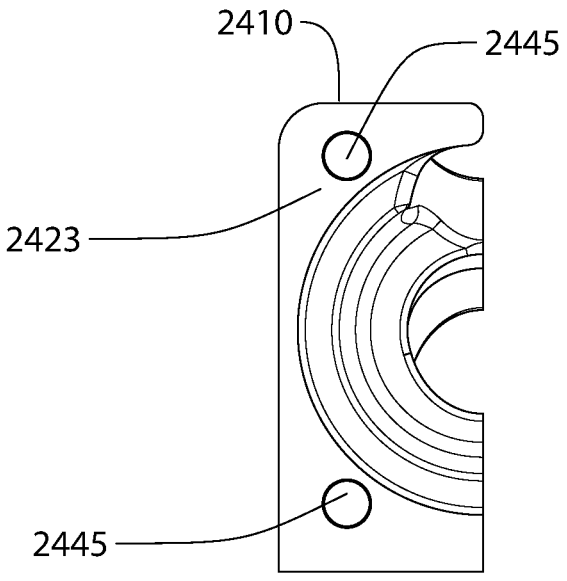
FIG. 41 is a top view of the first support portion of the housing of the fluid flow component of FIG. 25.
Figure 42:
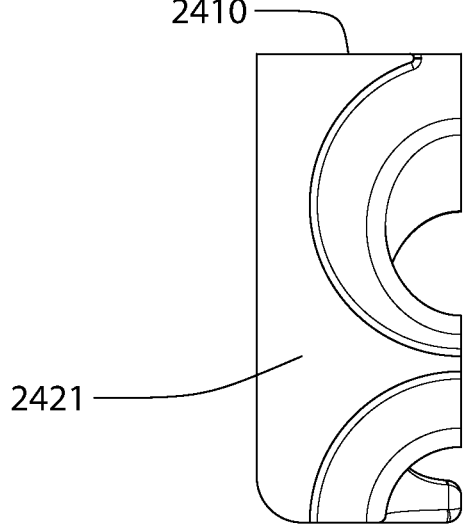
FIG. 42 is a bottom view of the first support portion of the housing of the fluid flow component of FIG. 25.
Figure 43:
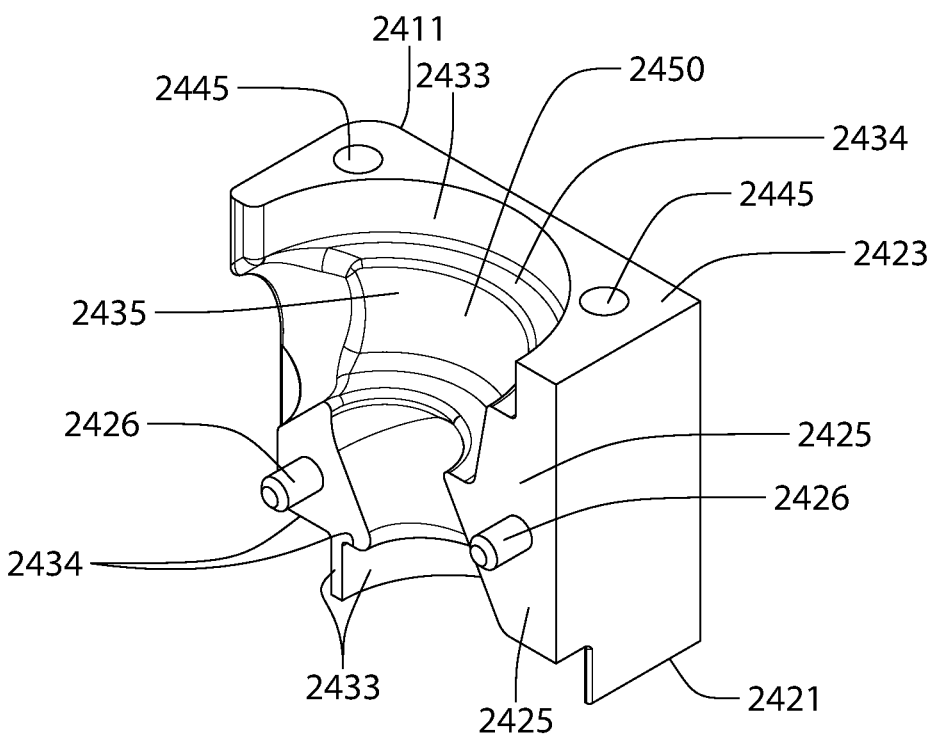
FIG. 43 is a perspective view of a second support portion of the housing of the fluid flow component of FIG. 25.
Figure 44:
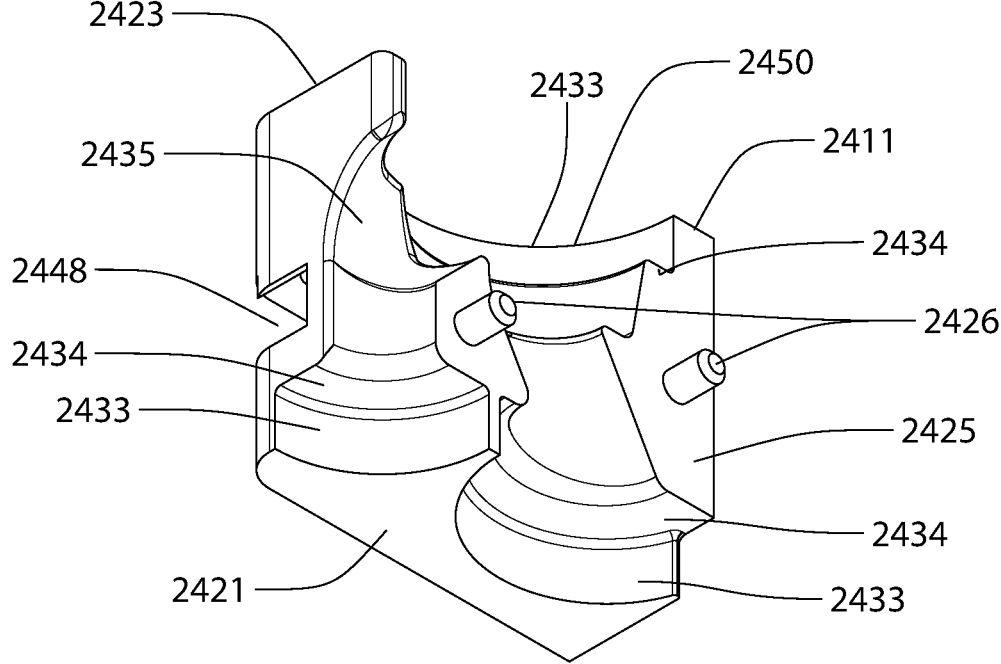
FIG. 44 is a bottom perspective view of the second support portion of the housing of the fluid flow component of FIG. 25.
Figure 45:
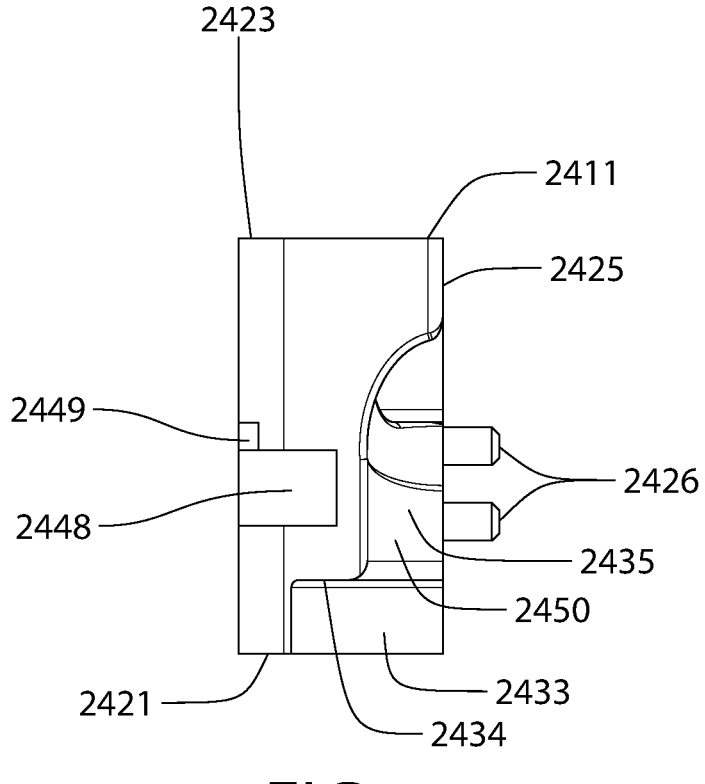
FIG. 45 is a rear view of the second support portion of the housing of the fluid flow component of FIG. 25.
Figure 46:
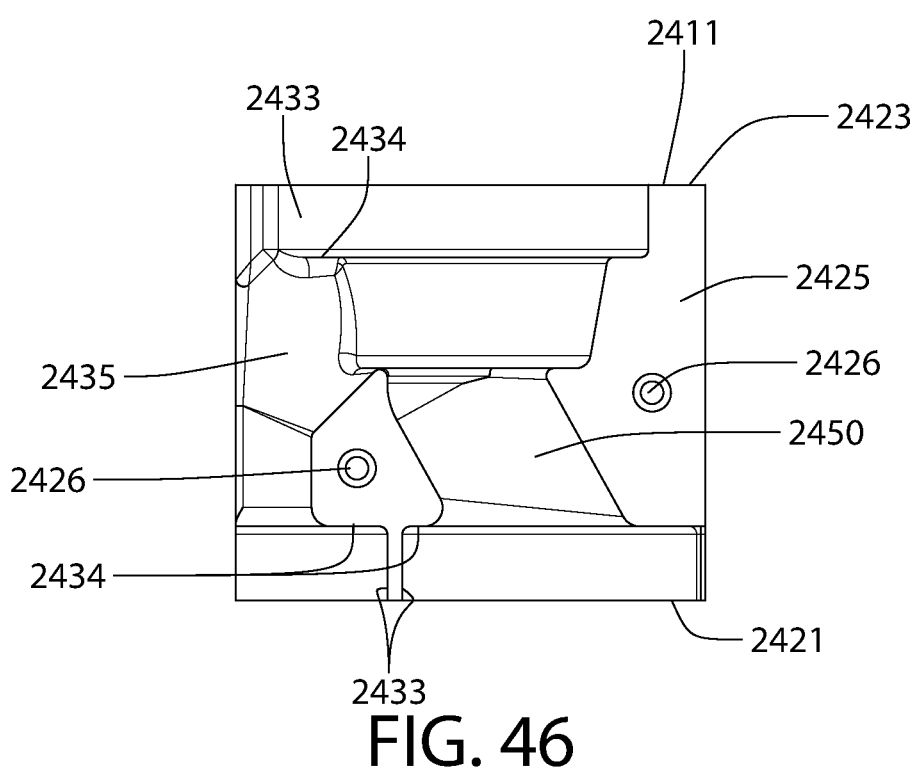
FIG. 46 is a left view of the second support portion of the housing of the fluid flow component of FIG. 25.
Figure 47:
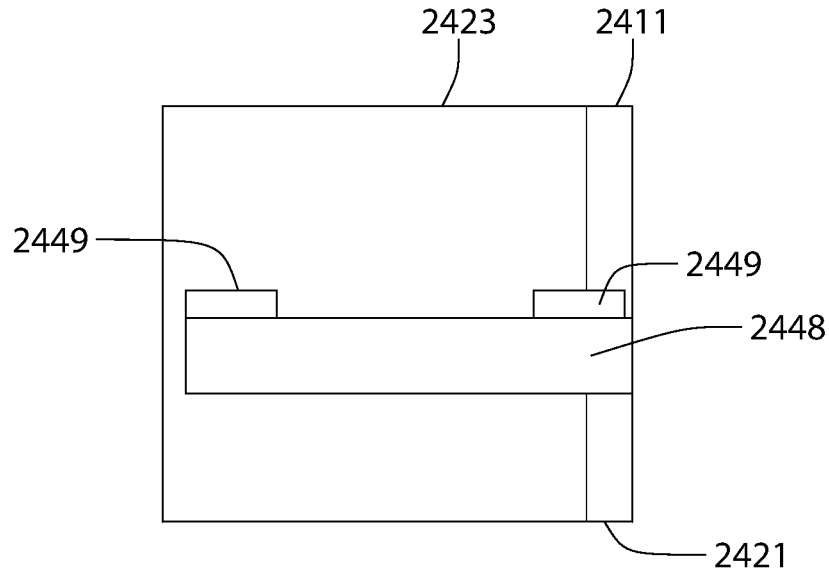
FIG. 47 is a right view of the second support portion of the housing of the fluid flow component of FIG. 25.
Figure 48:
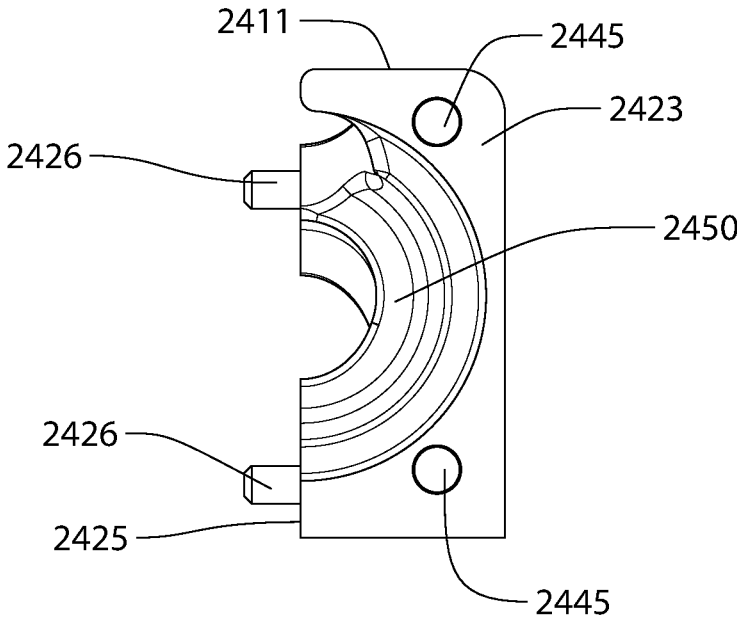
FIG. 48 is a top view of the second support portion of the housing of the fluid flow component of FIG. 25.
Figure 49:
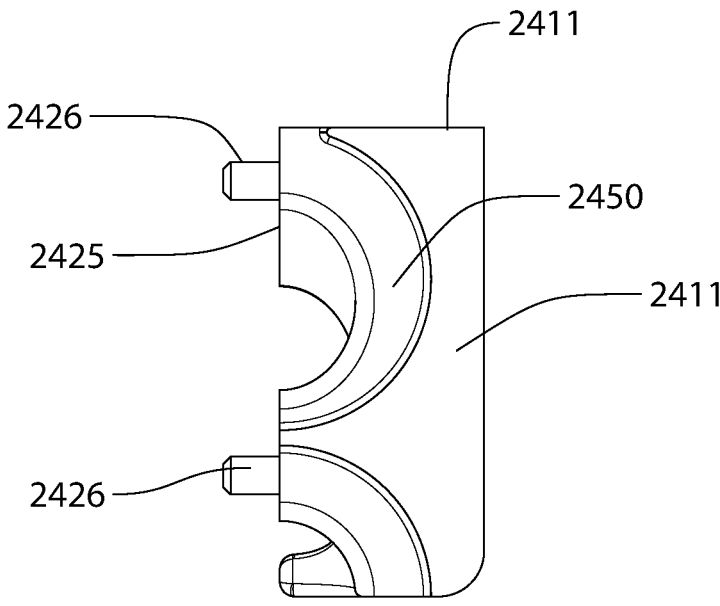
FIG. 49 is a bottom view of the second support portion of the housing of the fluid flow component of FIG. 25.
Figure 50:
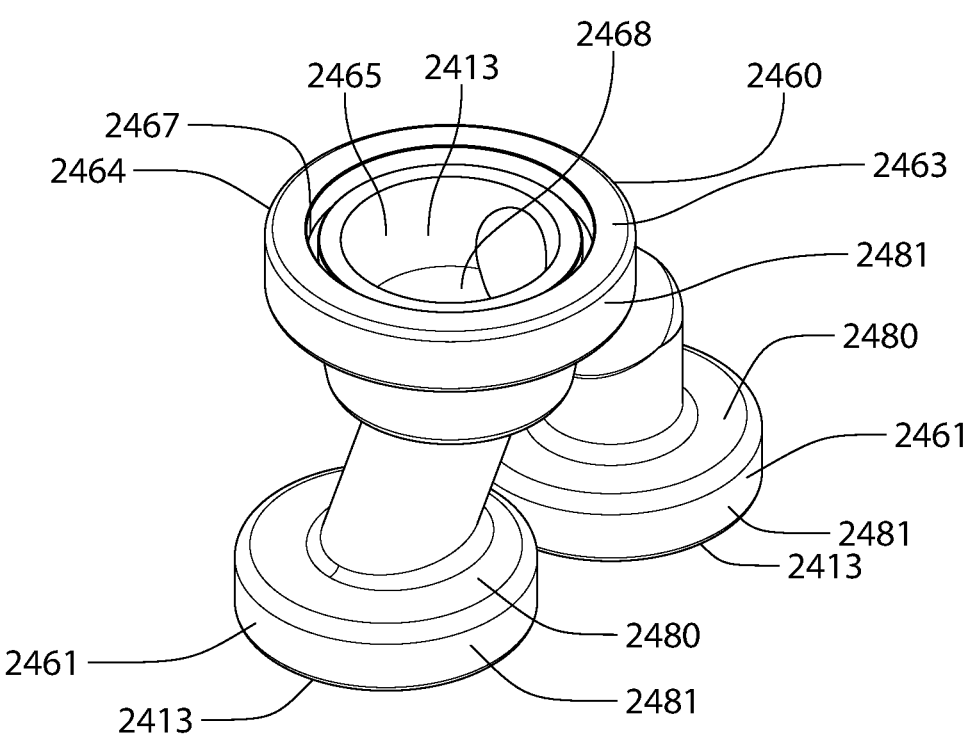
FIG. 50 is a perspective view of the insert of the fluid flow component of FIG. 25.
Figure 51:
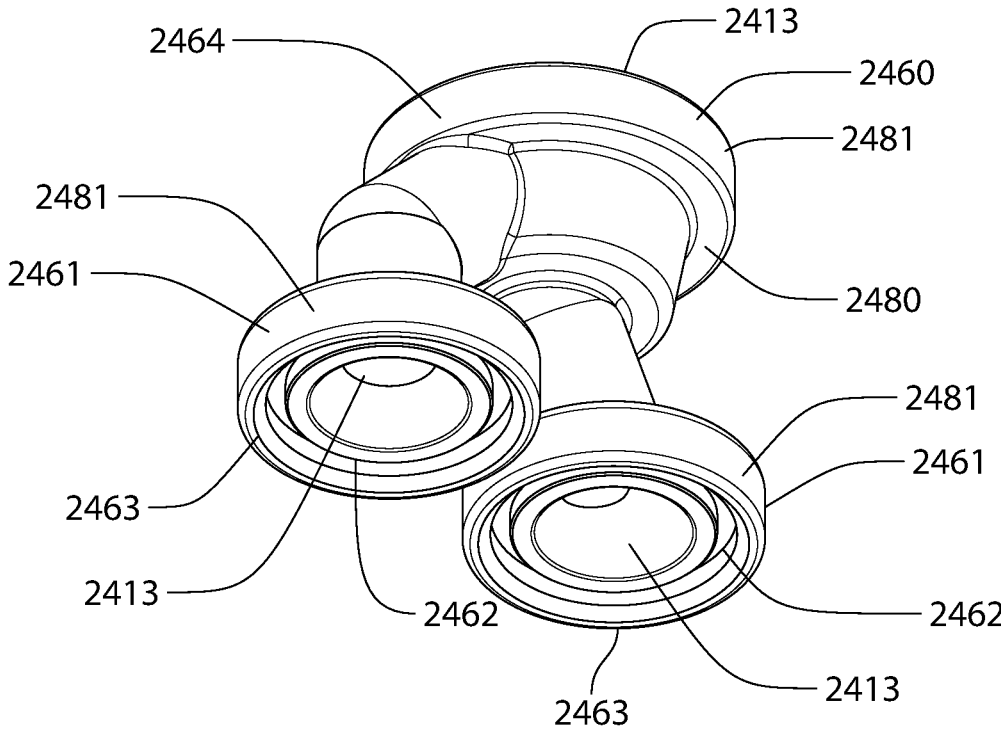
FIG. 51 is a bottom perspective view of the insert of the fluid flow component of FIG. 25.
Figures 54, 55:
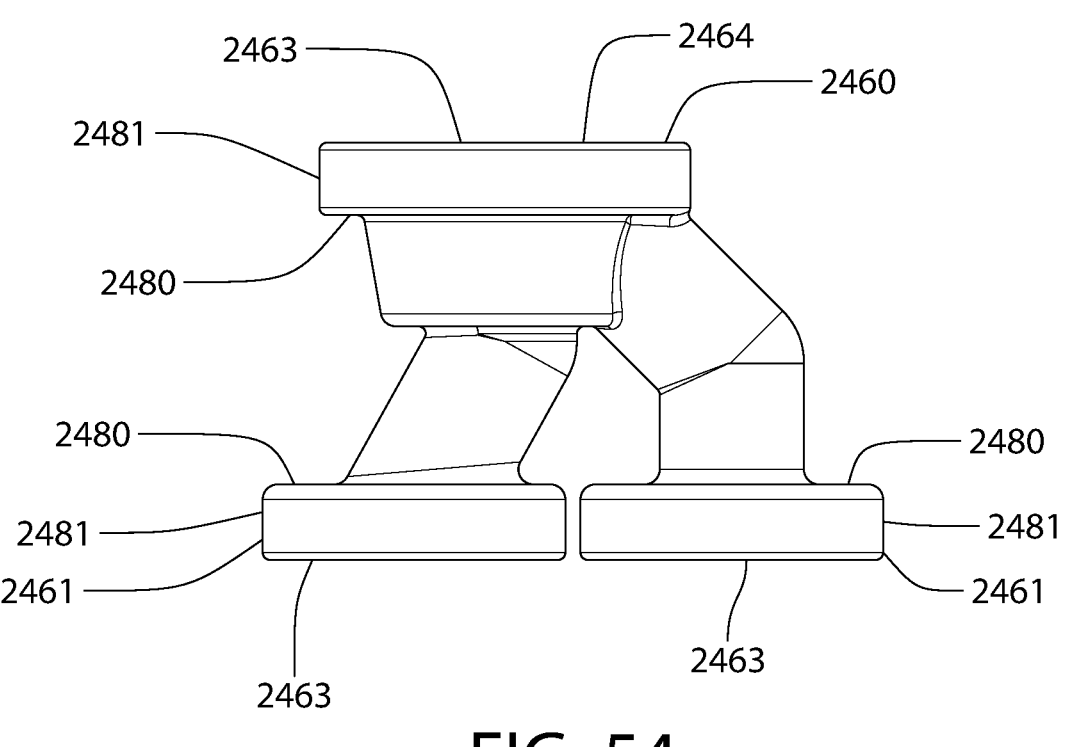
FIG. 54 is a right view of the insert of the fluid flow component of FIG. 25.
FIG. 55 is a left view of the insert of the fluid flow component of FIG. 25.
Figure 56:
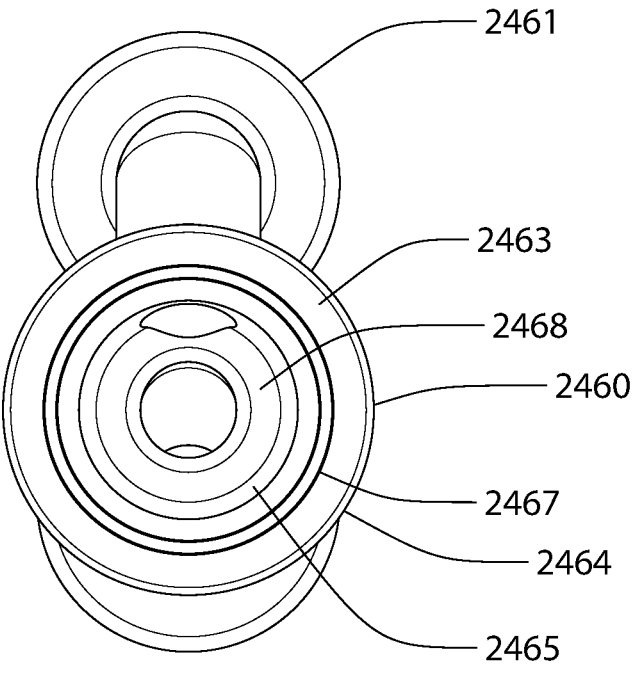
FIG. 56 is a top view of the insert of the fluid flow component of FIG. 25.
Figure 57:
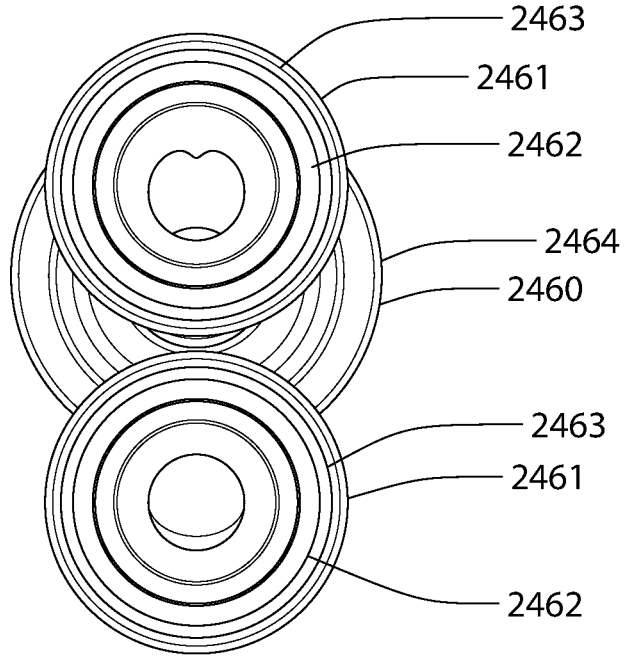
FIG. 57 is a bottom view of the insert of the fluid flow component of FIG. 25.
Figure 58:
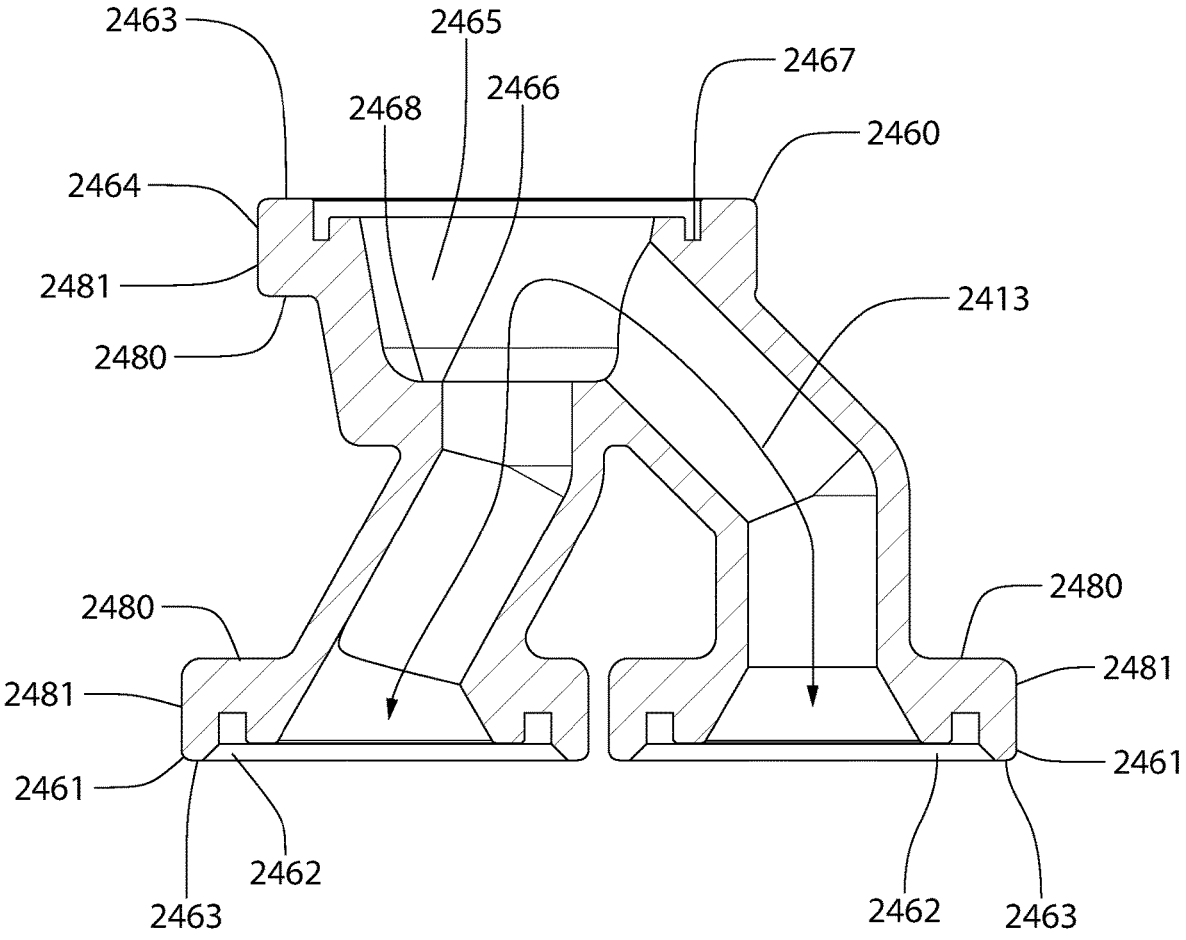
FIG. 58 is a cross-sectional view of the insert of the fluid flow component of FIG. 52, taken along line 58-58.
Figure 59:
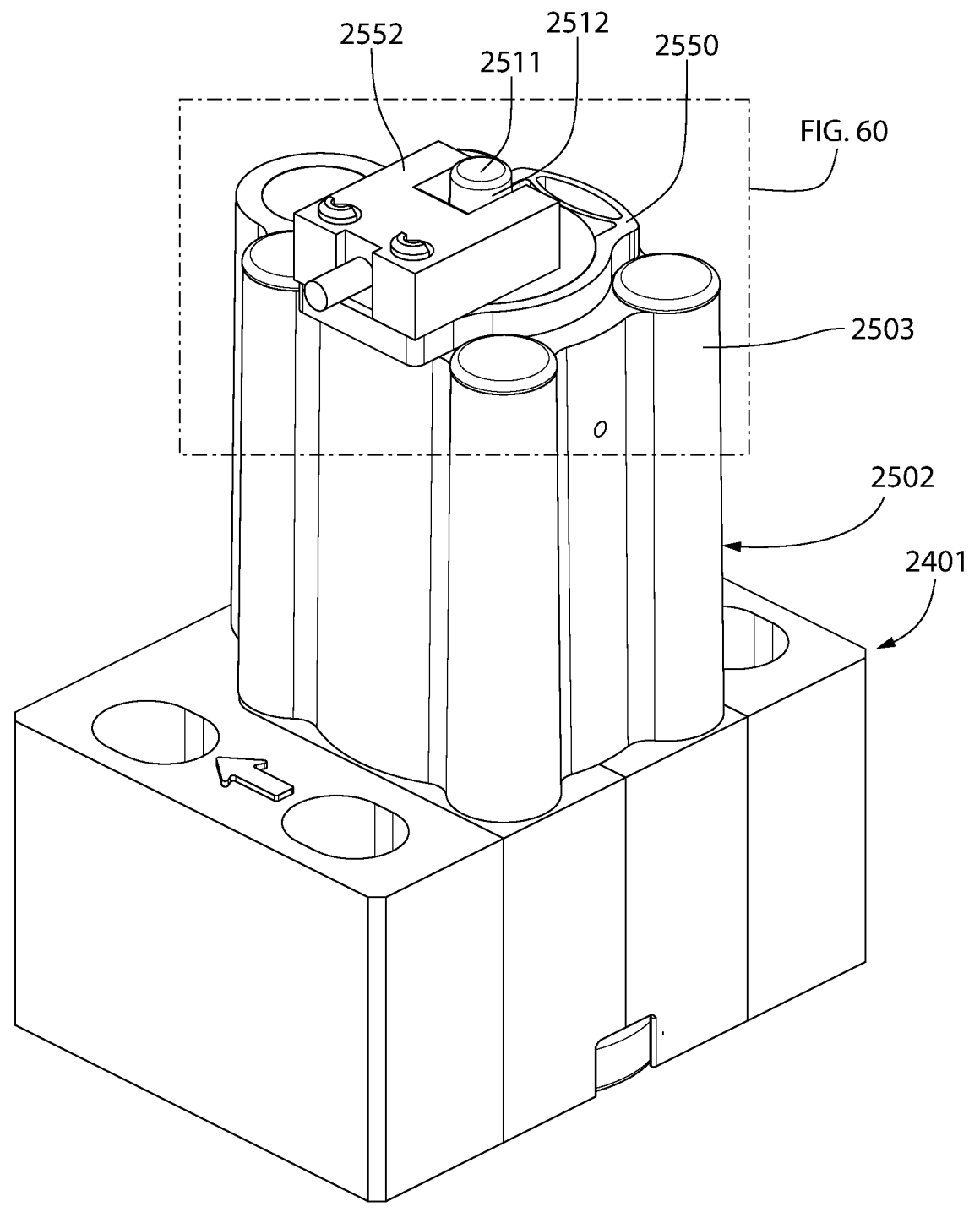
FIG. 59 is a perspective view of the fluid flow component of FIG. 25 with a sensor and sensor bracket attached to the fluid flow component.
Figure 60:
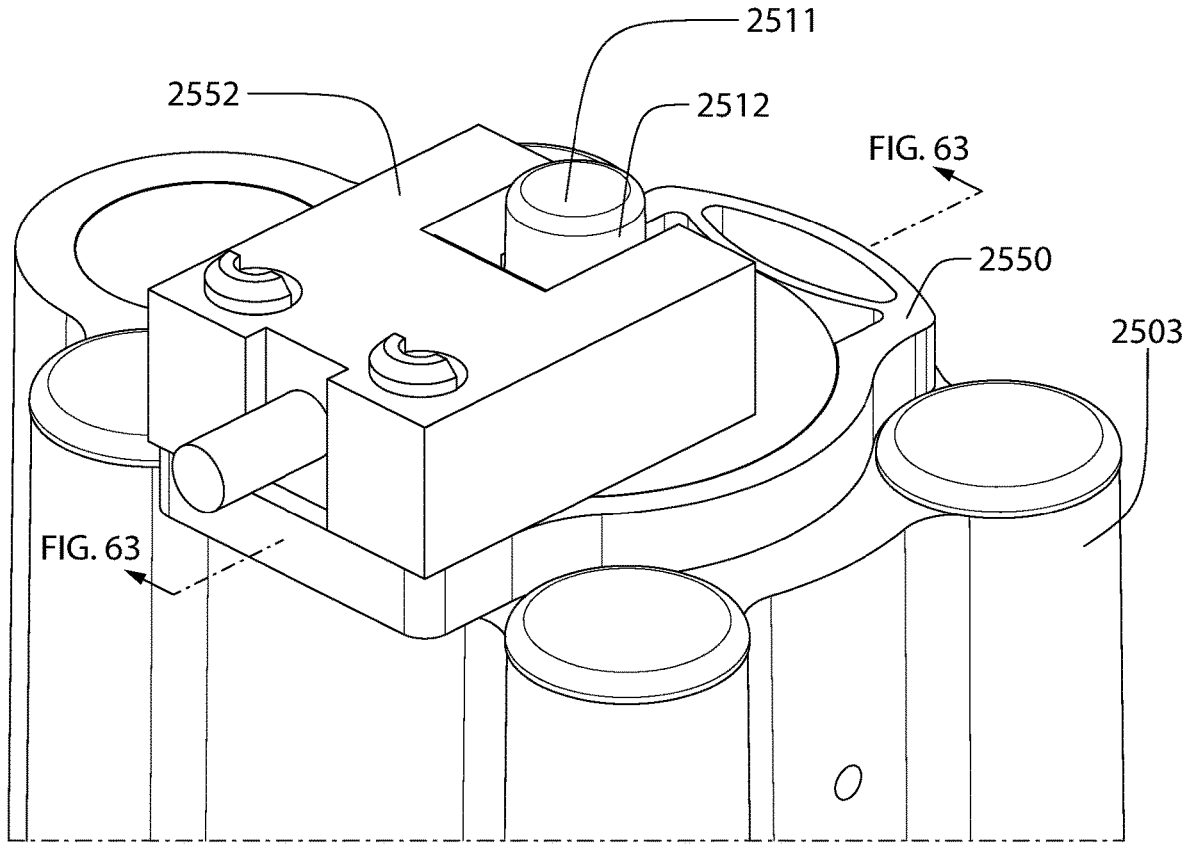
FIG. 60 is a detail view of the fluid flow component, sensor, and sensor bracket of FIG. 59.
Figure 61:
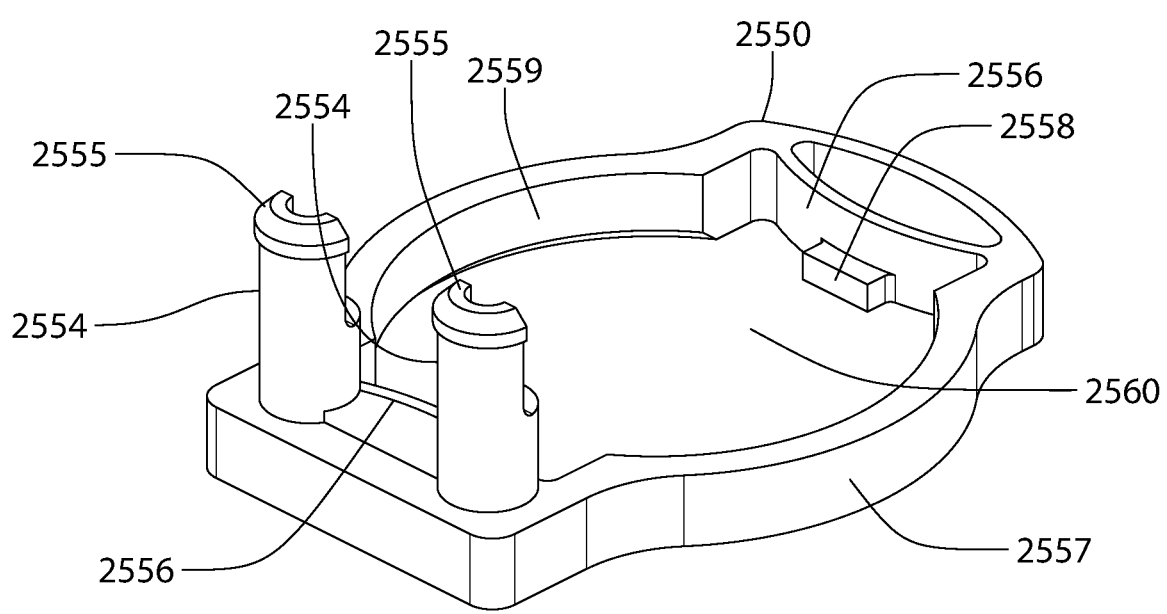
Figure 62:
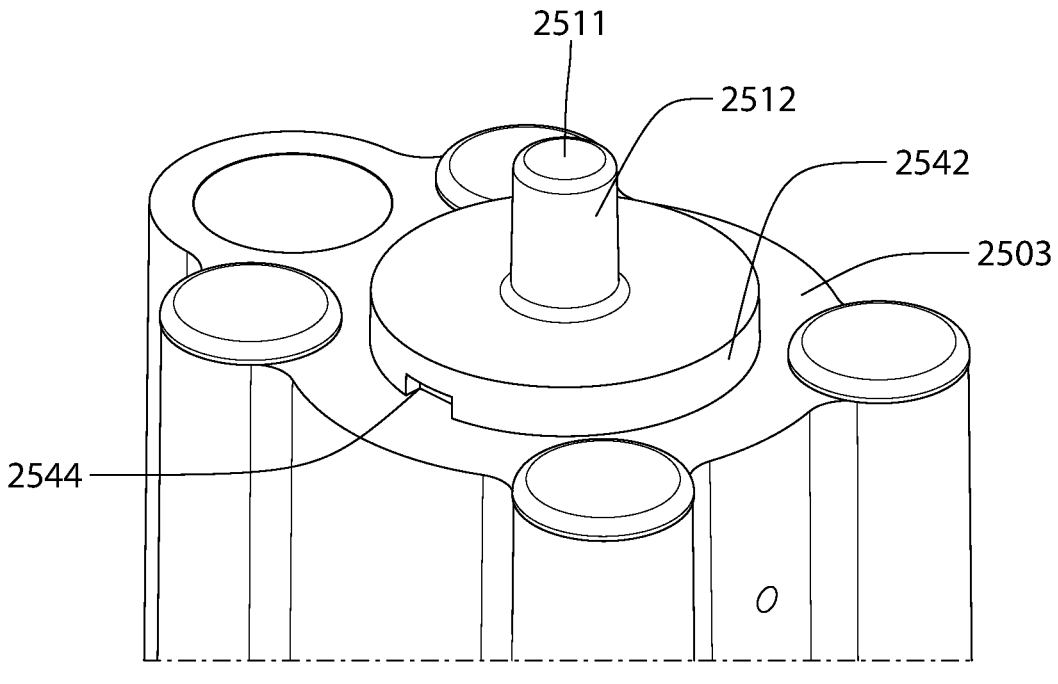
Figure 63:
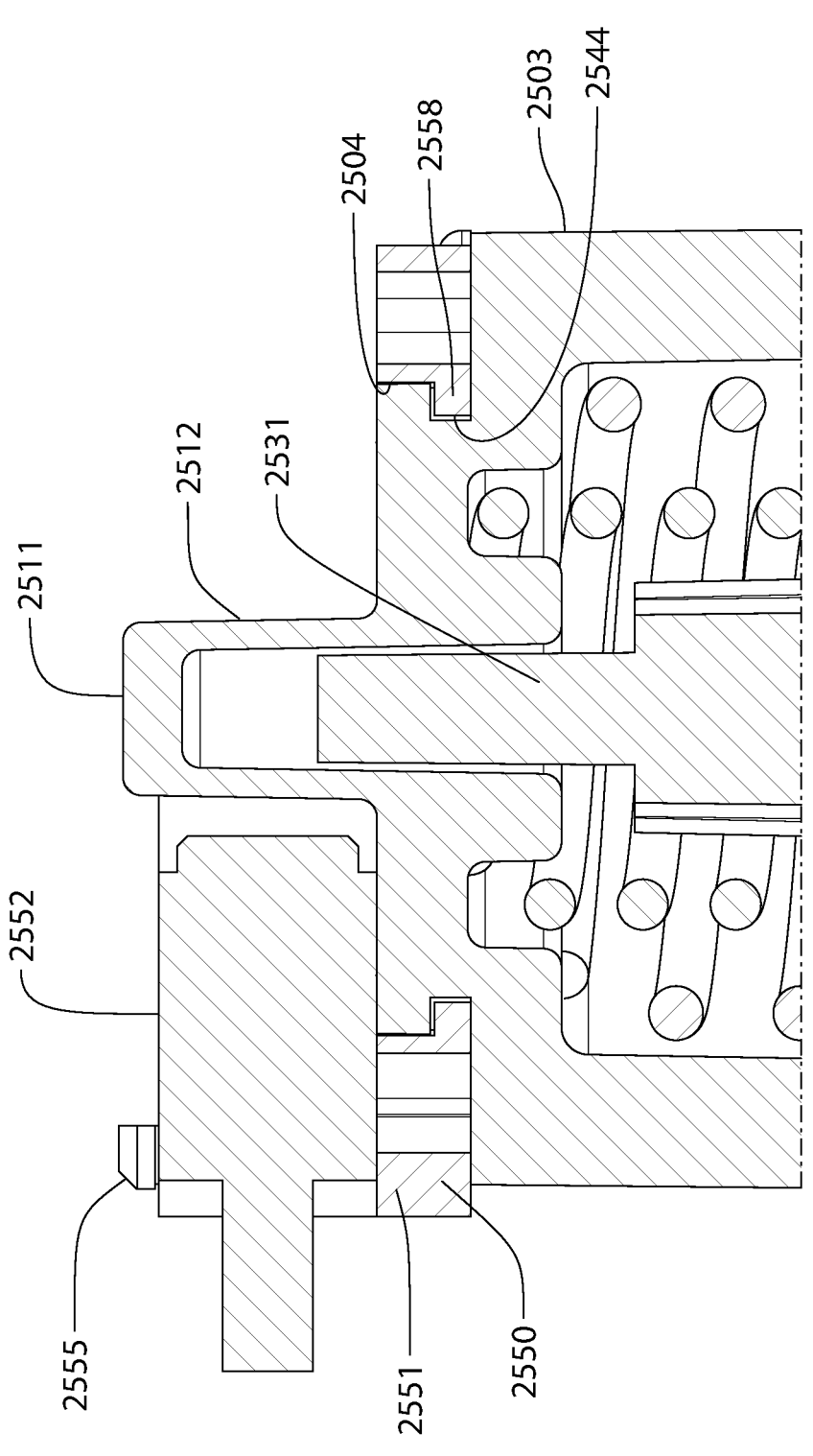

Turning to FIGS. 27 and 28, cross-sections of the fluid flow component 2400 are shown in greater detail. The upper component assembly 2502 comprises an upper housing 2503, a piston 2504, a diaphragm 2505, a diaphragm retainer 2506, and one or more biasing elements 2507. In addition, one or more seals 2508 may be used to seal various portions of the upper housing 2503. These seals 2508 may take the form of O-rings or other seals formed in any desired geometry and cross-section.

The upper housing 2503 may be molded from a transparent or translucent polymer material to allow visual or sensor-based determination of the state of the valve. Preferably, the upper housing 2503 is molded from a transparent polymer material. However, in other embodiments, the upper housing 2503 may be molded or otherwise formed from an opaque material and need not necessarily be formed from polymer. The upper housing 2503 extends from a proximal end 2510 to a distal end 2511 along an axis C-C. A hollow sensor portion 2512 is formed at the distal end 2511. Adjacent the sensor portion 2512 is a tapered section 2513 which extends from the sensor portion 2512 to a cylindrical section 2515. The tapered section 2513 receives the one or more biasing elements 2507. In some embodiments, the biasing elements 2507 are springs, such as coil springs. In other embodiments, the biasing elements 2507 may be Belleville washers, elastomeric elements, or other devices capable of applying a restoring force when compressed. Optionally, a vent aperture 2514 is provided in the tapered section 2513 to equalize the pressure inside the tapered section 2513 with the outside environment. In some embodiments, the biasing elements 2507 may be omitted if desired.

The cylindrical section 2515 receives the piston 2504. The piston 2504 engages an interior wall 2516 of the cylindrical section 2515, either directly or via a seal 2508. A pilot passage 2517 provides a fluid connection between an external fluid source and a pressure chamber 2518 formed by the piston 2504 and the interior wall 2516 of the cylindrical section 2515. The pressure chamber 2518 is further bounded by an upper surface 2520 of the diaphragm retainer 2506. Thus, the piston 2504 moves along the axis C-C when the pressure chamber 2518 is pressurized or de-pressurized. Depending on the balance of forces created by the pressure in the pressure chamber 2518 and the biasing elements 2507, the piston 2504 moves up or down along the axis C-C.

Adjacent the cylindrical section 2515 is the retainer section 2519. The retainer section 2519 receives the diaphragm retainer 2506 and provides a limit to how far the diaphragm retainer 2506 can move upward along the axis C-C. Additional seals 2508 seal the retainer section 2519 to the diaphragm retainer 2506 and the diaphragm retainer 2506 to the piston 2504. This ensures that the pressure chamber 2518 is sealed except for the pilot passage 2517 which allows control over the pressure in the pressure chamber 2518.

The piston 2504 extends through the diaphragm retainer 2506 and engages the diaphragm 2505. The diaphragm 2505 rests within a diaphragm receiving cavity 2467 formed in a component port 2464 of the insert 2460. In the present embodiment, the diaphragm receiving cavity 2467 is an annular groove formed to receive an outer edge 2521 of the diaphragm 2505. A closure member 2522 is joined to the outer edge 2521 of the diaphragm 2505 by a membrane 2523. The membrane 2523 has a reduced thickness along the axis C-C as compared with the outer edge 2521 and the closure member 2522. The closure member 2522 further incorporates a connection feature 2524 which engages a corresponding connection feature 2525 of the piston 2504. In the present embodiments, the connection features 2524, 2525 are female and male threads which allow joining of the closure member 2522 to the piston 2504. The connection features 2524, 2525 allow the closure member 2522 to move along the axis C-C with the piston 2504, controlling opening of the valve. Thus, the upper component assembly 2502 is fluidly coupled to the component port 2464.

The piston 2504 comprises an indicator portion 2531 that moves within the hollow sensor portion 2512. The indicator portion 2531 may be visible through the hollow sensor portion 2512 if the upper housing 2503 is formed from a transparent or translucent material. The indicator portion 2531 may be sensed by a sensor positioned adjacent the hollow sensor portion 2512. If transparent or translucent material is used for the upper housing 2503, an optical sensor may be used. Alternately, the indicator portion 2531 may contain a magnet or a metallic component which may be detected by another type of sensor such as a hall effect sensor, a reluctance sensor, a reed switch, or other types of sensors known in the art. The indicator portion 2531 moves along the axis C-C as the piston 2504 moves. In the illustrated embodiment, the indicator portion 2531 moves upward when the valve opens and downward when the valve closes.

The piston 2504 further comprises a biasing element guide 2532 that maintains the biasing elements 2507 approximately centered about the axis C-C and prevent buckling of the biasing elements 2507. Preferably, the biasing element guide 2532 is not in contact with the biasing elements 2507, but can aid with assembly of the upper component assembly 2502. Further optionally, the biasing element guide 2532 may incorporate splines, flats, or other features which facilitate assembly of the connection features 2524, 2525 of the diaphragm 2505 and the piston 2504.

The piston 2504 comprises an annular ring 2534 which engages the cylindrical section 2515 of the upper housing 2503. The annular ring 2534 incorporates a seal groove 2535 to receive a pair of seals 2508, but this may optionally be omitted and sealing features may be formed directly on the annular ring 2534 such as lips or simply a close fit between the cylindrical section 2515 and the annular ring 2534. Greater or fewer seal grooves 2535 and greater or fewer seals 2508 may be utilized as desired.

Below the annular ring 2534, the piston 2504 comprises a stem portion 2536 that extends from the annular ring 2534 to the connection portion 2525 along the axis C-C. The stem portion 2536 comprises a seal groove 2537 which receives a seal 2508 that engages an inner surface 2538 of the diaphragm retainer 2506. The diaphragm retainer 2506 further comprises a seal groove 2539 that receives a seal 2508 that engages the inner surface of the retainer section 2519. Finally, the diaphragm retainer 2506 may include a vent to equalize pressure in the space between an upper surface of the diaphragm 2505 and a lower surface of the diaphragm retainer 2506. The arrangement of the seals 2508 and seal grooves 2535, 2537, 2539 could be switched, such that the mating components could incorporate seal grooves 2535, 2537, 2539 and seals 2508. The arrangement of the seals 2508 and seal grooves 2535, 3537, 3539 may be altered as desired.

The closure member 2522 of the diaphragm 2505 rests within a chamber 2465 formed into the component port 2464. The chamber 2465 incorporates a seat 2466 that receives the closure member 2522 when the fluid flow component 2400 is in a closed state. The closure member 2522 is spaced from the seat 2466 when the fluid flow component 2400 is in an open state, opening a pathway for fluid to flow from the first port 2461 to the second port 2461. FIGS. 27 and 28 illustrate the fluid flow component 2400 in the closed state.

As discussed above, the fitting assembly 2401 comprises the insert 2460, the first support portion 2410, the second support portion 2411, and the base portion 2412. The first support portion 2410, second support portion 2411, and the base portion 2412 collectively form a housing 2420 for the insert 2460. The fitting assembly 2401 has a seal side mounting surface 2414 and an opposite assembly surface 2415. The seal side mounting surface 2414 is formed by first surfaces 2421 of the first support portion 2410, second support portion 2411, and base portion 2412 and distal surfaces 2463 of the first and second ports 2461 of the insert 2460. The assembly surface 2415 is formed by second surfaces 2423 of the first support portion 2410, the second support portion 2411, and the base portion 2412 and a distal surface 2463 of the component port 2464.

Fastener passageways 108 extend from the seal side mounting surface 2414 to the assembly surface 2415. As with the other embodiments, the fastener passageways 108 permit the passage of a fastener 108 and may include counter-bores, recesses, or other features to recess portions of the fasteners or provide space between the fitting assembly 2401 and mating components. These features may be formed in either of the seal side mounting surface 2414 or the assembly surface 2415. As can be seen, the fastener passageways 108 are formed through the base portion 2412 in the present embodiment. However, the fastener passageways may also be formed into other components of the fitting assembly 2401 as desired.

Turning to FIGS. 29-35, the base portion 2412 is illustrated in greater detail. The base portion has a first surface 2421 and an opposite second surface 2423 as discussed above. The base portion 2412 further comprises a support cavity 2440 that receives the insert 2460 and the first and second support portions 2410, 2411. The support cavity 2440 comprises an insert cavity portion 2441 and a support cavity portion 2442.

A pair of rails 2443 extend from interior walls 2444 of the support cavity portion 2442. The rails 2443 comprise a plurality of holes 2445 formed therein. Optionally, the holes 2445 may be threaded or may be cylindrical holes. The holes 2445 extend through the rails 2443, but may be blind holes extending only a portion of the thickness of the rails 2443. The rails 2443 are positioned partway between the first surface 2421 and the second surface 2423 and have an upper rail surface 2446 and a lower rail surface 2447.

The insert cavity portion 2441 forms a portion of an insert receiving cavity, the other portions of the insert receiving cavity being formed by cavities in the first and second support portions 2410, 2411. The insert cavity portion 2441 has a port receiving wall 2433 that has a generally cylindrical shape. The port receiving wall 2433 meets a flange receiving surface 2434 that extends substantially parallel to the first surface 2421. A perimeter surface 2435 extends from the flange receiving surface 2434.

Turning to FIGS. 36-42, the first support portion 2410 is illustrated. The first support portion 2410 comprises a first surface 2421 and an opposite second surface 2423 as discussed above. The first support portion 2410 further comprises an insert cavity portion 2450 that forms another portion of the insert receiving cavity. The insert cavity portion 2450 comprises three port receiving walls 2433 that have a generally cylindrical shape. The port receiving walls 2433 meet flange receiving surfaces 2434 that extend substantially parallel to the first surface 2421. A perimeter surface 2435 extends from the flange receiving surfaces 2434.

The first support portion 2410 further comprises a plurality of holes 2445 that extend through the second surface 2423 to a slot 2448. Optionally, the holes 2445 extend beyond the slot 2448. The slot 2448 receives one of the rails 2443 of the base portion 2412. The holes 2445 of the first support portion 2410 align with holes 2445 of the base portion 2412 when the first support portion 2410 is assembled with the base portion 2412. Pockets 2449 may be configured to receive nuts and aid in assembly of the fluid flow component 2400. In the present embodiment, nuts 251 fit within the pockets 2449 and receive fasteners 250 that extend through the holes 2445 in the first support portion 2410. Preferably, the fasteners 250 extend through the nuts 251 and into the holes 2445 in the rails 2443. The first support portion 2410 also comprises two holes 2424 formed into an interface surface 2425, the interface surface 2425 in contact with the second support portion 2411 when the first and second support portions 2410, 2411 are assembled.

Turning to FIGS. 43-49, the second support portion 2411 is illustrated. The second support portion 2411 comprises a first surface 2421 and an opposite second surface 2423 as discussed above. The second support portion 2411 further comprises an insert cavity portion 2450 that forms another portion of the insert receiving cavity. The insert cavity portion 2450 comprises has three port receiving walls 2433 that have a generally cylindrical shape. The port receiving walls 2433 meet flange receiving surfaces 2434 that extend substantially parallel to the first surface 2421. A perimeter surface 2435 extends from the flange receiving surfaces 2434.

The second support portion 2411 further comprises a plurality of holes 2445 that extend through the second surface 2423 to a slot 2448. Optionally, the holes 2445 extend beyond the slot 2448. The slot 2448 receives one of the rails 2443 of the base portion 2412. The holes 2445 of the second support portion 2411 align with holes 2445 of the base portion 2412 when the second support portion 2411 is assembled with the base portion 2412. Pockets 2449 may be configured to receive nuts and aid in assembly of the fluid flow component 2400. In the present embodiment, nuts 251 fit within the pockets 2449 and receive fasteners 250 that extend through the holes 2445 in the first support portion 2410. Preferably, the fasteners 250 extend through the nuts 251 and into the holes 2445 in the rails 2443.

The second support portion 2411 also comprises two protuberances 2426 formed into an interface surface 2425, the interface surface 2425 in contact with the first support portion 2410 when the first and second support portions 2410, 2411 are assembled. The protuberances 2426 engage the holes 2424 of the first support portion 2410 to prevent relative rotation or translation of the first support portion 2410 with respect to the second support portion 2411, except translation in the longitudinal direction of the holes 2424. This ensures that the insert 2460 is captured securely between the first and second support portions 2410, 2411.

FIGS. 50-58 illustrate the insert 2460. The insert 2460 has a fluid flow path 2413 that extends from the first port 2461 to the component port 2464, then from the component port 2464 to the second port 2461. The insert 2460 further comprises seal cavities 2462 and distal surfaces 2463. The seal cavities 2462 are configured to receive a seal to seal the fluid flow path 2413 to a fluid flow path of a fluid flow component or fitting assembly. The distal surfaces 2463, in combination with the first surfaces 2421 of the first and second support portions 2410, 2411 and the base portion 2412, collectively form the seal side mounting surface 2414 of the fitting assembly 2401. Preferably, the distal surfaces 2463 protrude slightly from the first surfaces 2421 to ensure proper compression of a seal placed therebetween.

The component port 2464 of the insert 2460 further comprises a distal surface 2463 that preferably protrudes slightly above the second surfaces 2423. The chamber 2465 is formed into the component port 2464 with a seat 2466 located on a floor 2468 of the chamber 2465. The diaphragm receiving cavity 2467 is formed into the distal surface 2463 and receives the outer edge 2521 of the diaphragm 2505, allowing the diaphragm 2505 to seal the fluid flow path 2413 at the component port 2464 from the outside environment. The diaphragm receiving cavity 2467 is an annular groove, but may be formed in alternate configurations. The outer edge 2521 is formed as an annular rib which engages the annular groove of the diaphragm receiving cavity 2467.

The first and second ports 2461 have a port outer diameter 2481 and a flange surface 2480. Similarly, the component port 2464 has a port outer diameter 2481 and a flange surface 2480. The port outer diameters 2481 are sized to be smaller than the port receiving walls 2433 so that the ports 2461, 2464 do not interfere with the first and second support portions 2410, 2411 or the base portion 2412. The flange surfaces 2480 engage the flange receiving surfaces 2434, preventing the insert 2460 from moving when compressed against the seal and a mating component.

Turning to FIGS. 59-63, optional accessories for the fluid flow component 2400 are illustrated. A sensor bracket 2550 and sensor 2552 are attached to the upper housing 2503 of the upper component assembly 2502 as illustrated. The sensor 2552 may be an optical sensor, hall effect sensor, reluctance sensor, reed switch, or other type of sensor. The sensor 2552 is positioned adjacent the hollow sensor portion 2512 at the distal end 2511 of the upper housing 2503. Optionally, the sensor 2552 may surround the hollow sensor portion 2512, or it may simply be positioned in proximity with the hollow sensor portion 2512. As the piston 2504 moves, the movement of the indicator portion 2531 of the piston 2504 within the hollow sensor portion 2512 can be detected by the sensor 2552. This can be utilized for detecting the state of the fluid flow component 2400, including whether the fluid flow component 2400 is in an on state or an off state.

The sensor 2552 mounts to the sensor bracket 2550, which in turn engages features on the upper housing 2503. The sensor bracket 2550 comprises two mounting elements 2554 which are generally cylindrical and configured to engage corresponding holes in the sensor 2552. The mounting elements 2554 incorporate snap retention features 2555 at their distal ends. The mounting elements 2554 are coupled to a frame 2557. At opposite sides of the frame 2557, biasing elements 2556 are formed. The biasing elements 2556 each have a protuberance 2558 thereon. The biasing elements 2556 are generally arcuate in shape and extend from the frame 2557. The biasing elements 2556 are configured to deflect, to allow displacement of the protuberances 2558.

The frame 2557 further comprises a central aperture 2560 having an interior wall 2559. The interior wall 2559 engages a boss 2542 formed on the upper housing 2503. The protuberances 2558 engage recesses 2544 to retain the sensor bracket 2550 on the upper housing 2503. The protuberances 2558 prevent translation of the sensor bracket 2550 along the axis C-C while the engagement of the interior wall 2559 against the boss 2542 prevents radial motion of the sensor bracket 2550 with respect to the axis C-C. The protuberances 2558 further prevent rotation of the sensor bracket 2550 about the axis C-C by virtue of their engagement with the recesses 2544. Preferably, the sensor bracket 2550 is formed as an integral, monolithic, component. The sensor bracket 2550 may be molded, machined, or formed through any means known in the art. Optionally, the biasing elements 2556 may be separately formed of a different material.

The sensor bracket 2550 is installed on the fluid flow component 2400 by compressing the biasing elements 2556 such that the protuberances 2558 can slide over the boss 2542 of the upper housing 2503. The biasing elements 2556 are released and allowed to engage the recesses 2544, locking the sensor bracket 2550 in position. The mounting elements 2554 further retain the sensor 2552 by snap-action of the snap retention features 2555. The mounting elements 2554 are positioned on the sensor bracket 2550 to ensure that the sensor 2552 is able to sense the indicator portion 2531 of the piston 2504. Sensing capabilities can be added to the fluid flow component 2400 with a minimum of installation time. Information generated by the sensor 2552 can then be used in a control system, either internal or external to the fluid flow component 2400. The fluid flow component 2400 need not be a valve, and may be one of numerous other types of fluid flow components such as transducers, actuators, check valves, proportional valves, and so on.

Turning to FIGS. 64-75, yet another embodiment of a fluid flow component 2600 is illustrated. The fluid flow component 2600 incorporates a fitting assembly 2601 and an upper assembly 2602. The fluid flow component 2600 of the present embodiment is a valve used to control flow of a fluid from a first port 2661 to a second port 2661. However, other embodiments are contemplated, including sensors, transducers, actuators, and other devices.

The fitting assembly 2601 comprises a first support portion 2610, a second support portion 2611, and an insert 2660. The first support portion 2610 and the second support portion 2611 collectively form a housing 2620. The insert 2660 comprises the first and second ports 2661. The first and second support portions 2610, 2611 surround the insert 2660 and provide additional structural strength to the insert 2660.

Figure 64:
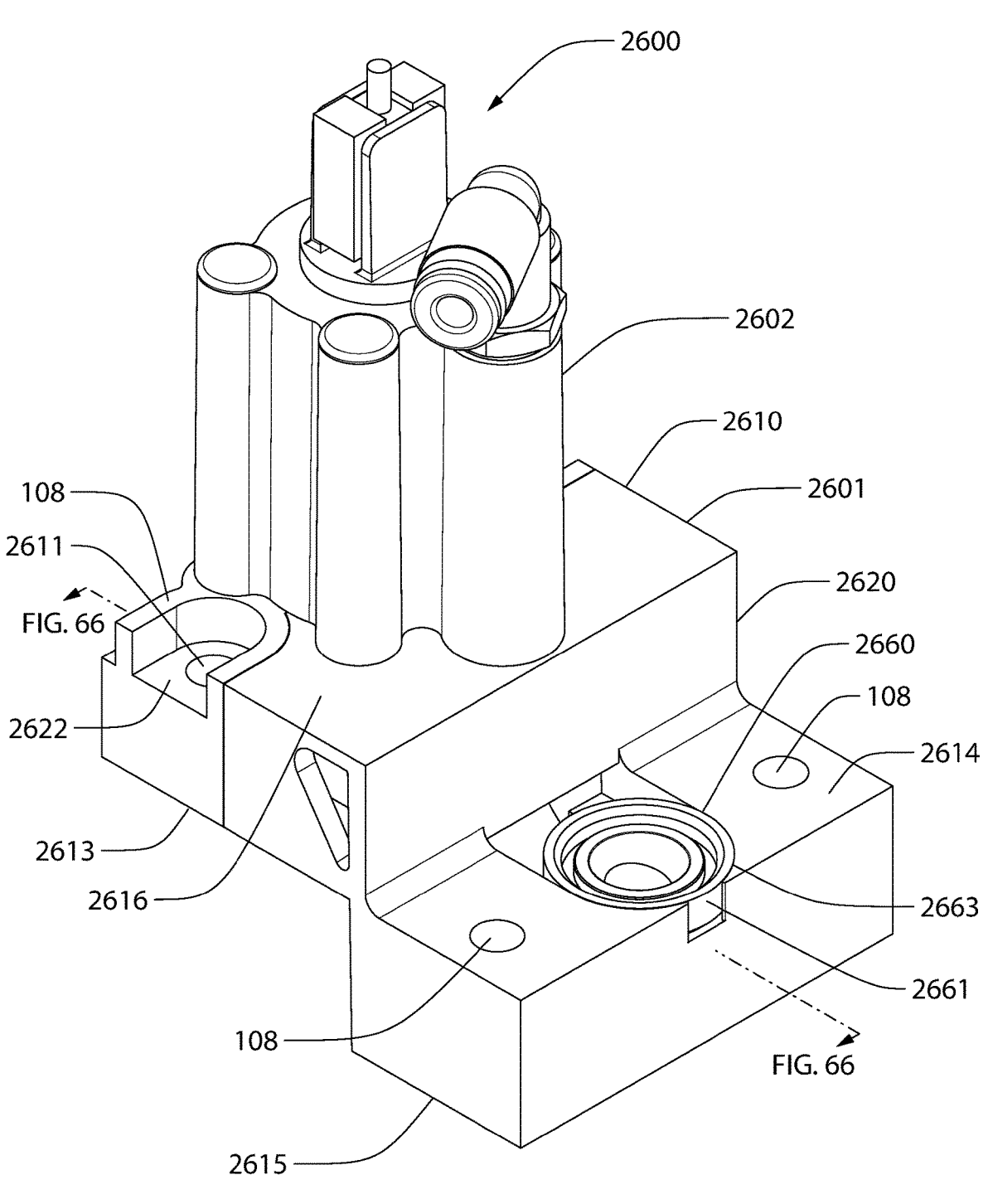
Figure 65:
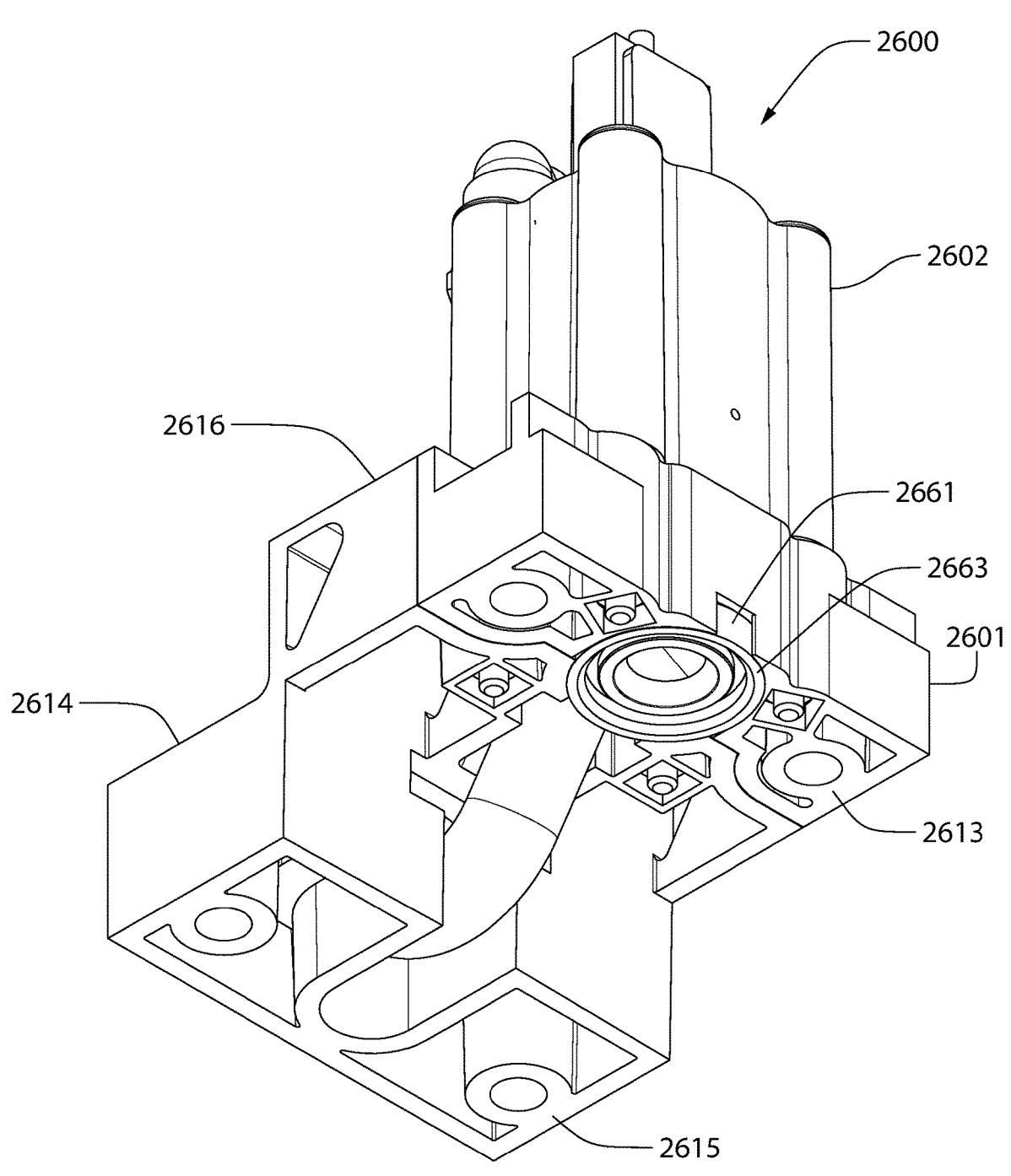
Figure 66:
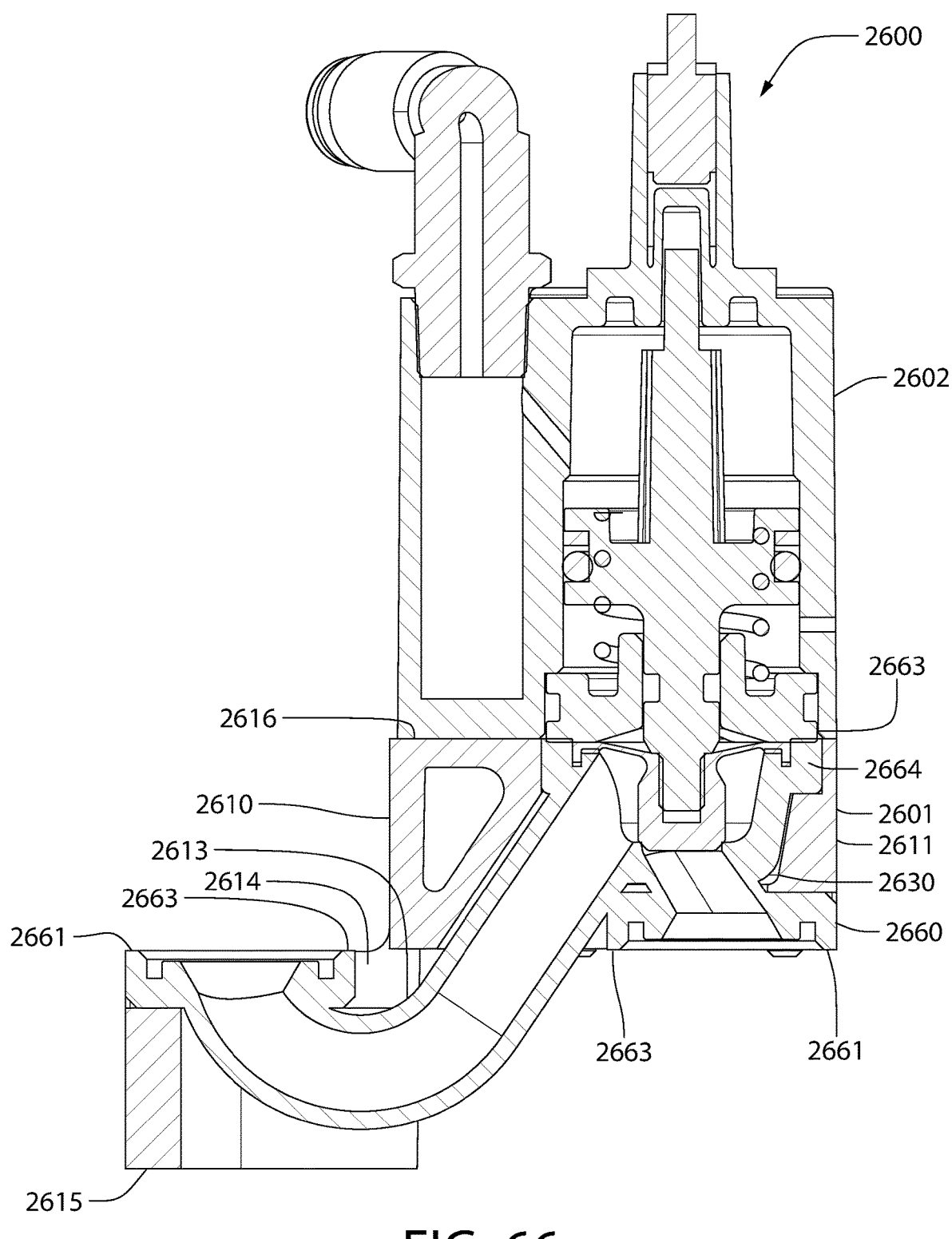

The fitting assembly 2601 comprises a first seal side mounting surface 2613, a second seal side mounting surface 2614, a first assembly surface 2615, and a second assembly surface 2616. The first seal side mounting surface 2613 has a first one of the ports 2661 therein and is facing downward as shown in FIG. 64. The second seal side mounting surface 2614 has a second one of the ports 2661 therein and is facing upward as shown in FIG. 64. The first assembly surface 2615 is facing downward as shown in FIG. 64 and the second assembly surface 2616 is facing upward. Otherwise stated, the first seal side mounting surface 2613 is opposite the second seal side mounting surface 2614 and the first assembly surface 2615 is opposite the second assembly surface. The first seal side mounting surface 2613 is also opposite the second assembly surface 2616 and the second seal side mounting surface 2614 is opposite the first assembly surface 2615.

The upper assembly 2602 mounts to the second assembly surface 2616 via fasteners and nuts extending through the housing 2620. The first assembly surface 2615 may mount to another component or the panel 1402. The first and second seal side mounting surfaces 2613, 2614 receive fluid flow components, substrate blocks, or other devices, allowing fluid to flow therebetween. The first and second ports 2661 face in opposite directions and are located at different heights with respect to one another. In other words, the first assembly surface 2615 is parallel to the second assembly surface 2616 but not coincident with the second assembly surface 2616. By facing the first and second ports 2661 in opposite directions, it is possible to eliminate a substrate block that serves only to couple fluid flow from one component to the next. Instead, a fluid flow component can be directly mounted to the fluid flow component 2600, allowing reduction in total packaging size of a fluid flow device and reducing total component count. Fewer seals are required, and total cost can be reduced.

A plurality of fastener passageways 108 extend through the first seal side mounting surface 2613 to recesses 2622 formed in the second assembly surface 2616. Optionally, the recesses 2622 may be omitted. Additional fastener passageways 108 extend through the second seal side mounting surface 2614 to the first assembly surface 2615. Optionally, recesses 2622 may be added. The recesses 2622 may extend from any one of the first and second assembly surfaces 2615, 2616 or the first and second seal side mounting surfaces 2613, 2614. As with the other embodiments, the fastener passageways 108 permit the passage of a fastener 108 and may include counter-bores, recesses, or other features to recess portions of the fasteners or provide space between the fitting assembly 2601 and mating components. The fastener passageways 108 may also be formed into other components of the fitting assembly 2601 as desired.

Figure 69:
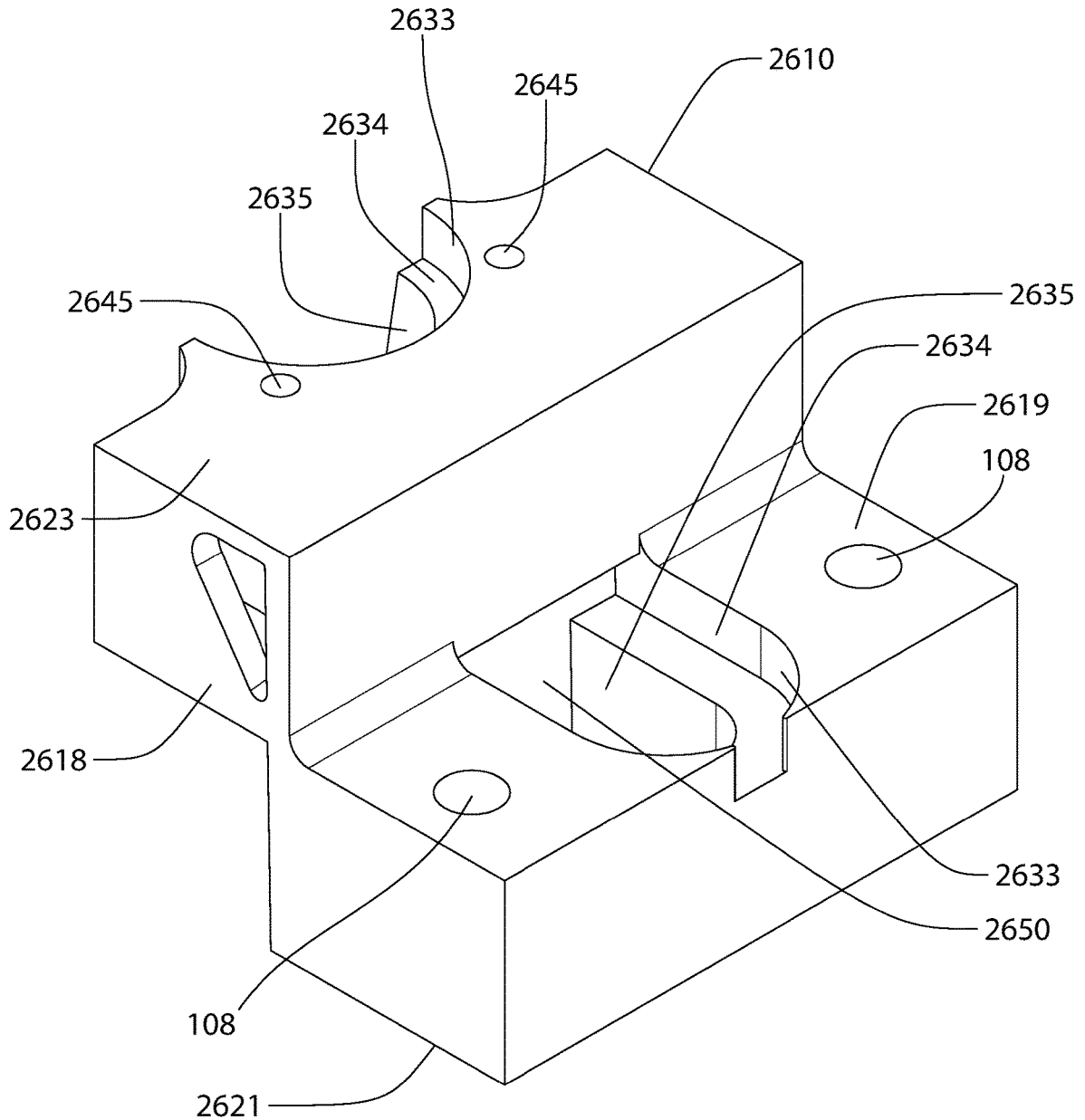
Figure 70:
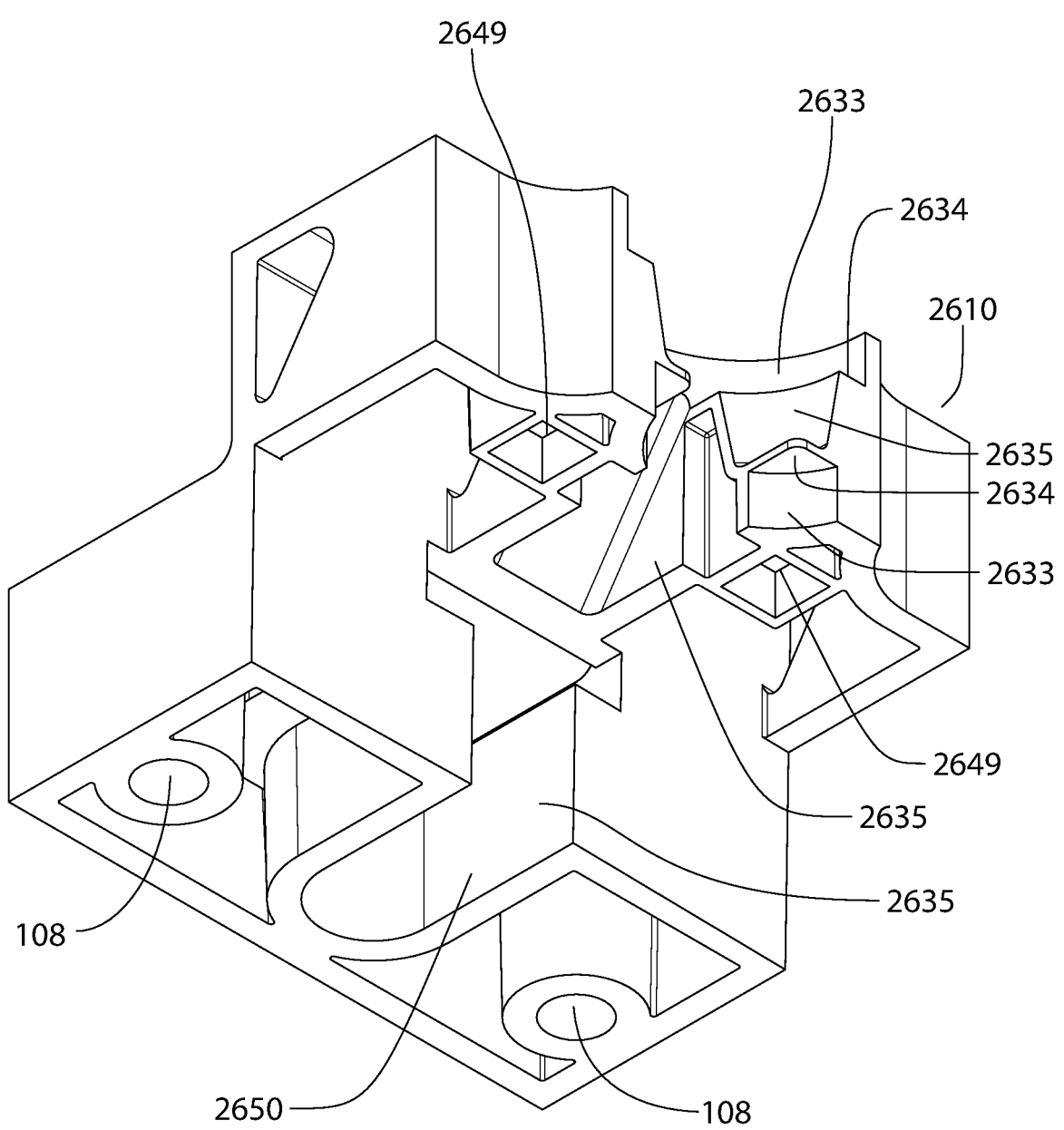

Turning to FIGS. 69 and 70, the first support portion 2610 is illustrated. The first support portion 2610 comprises a first surface 2618 and an opposite second surface 2623. The first portion further comprises a third surface 2619 and an opposite fourth surface 2621. The first surface 2618 and a distal surface 2663 of a first one of the ports 2661 collectively form a portion of the first seal side mounting surface 2613, the distal surface 2663 of the port 2661 preferably protruding slightly from the first surface 2618. The second surface 2623 and a distal surface 2663 of a component port 2664 collectively form a portion of the second assembly surface 2616, the distal surface 2663 of the component port 2664 preferably protruding slightly from the second surface 2623. The third surface 2619 and a distal surface 2663 of a second one of the ports 2661 collectively form the second seal side mounting surface 2614, the distal surface 2663 preferably protruding slightly from the third surface 2619. The fourth surface 2621 forms an entirety of the first assembly surface 2615.

The first support portion 2610 further comprises an insert cavity portion 2650 that forms a portion of an insert receiving cavity 2630, the insert receiving cavity 2630 formed within the first support portion 2610 and the second support portion 2611 to receive the insert 2660. The insert cavity portion 2650 comprises two port receiving walls 2633 that have a generally cylindrical shape. The port receiving walls 2633 meet flange receiving surfaces 2634 that extends substantially parallel to the first, second, and third surfaces 2618, 2623, 2619. A perimeter surface 2635 extends from the flange receiving surfaces 2634.

The first support portion 2610 further comprises a plurality of holes 2645 that extend through the second surface 2623 to the first surface 2618. Pockets 2649 may be configured to receive nuts and aid in assembly of the fluid flow component 2600. In the present embodiment, nuts fit within the pockets 2649 and receive fasteners that extend through the holes 2645 in the first support portion 2610. In addition, the fastener passageways 108 extend through the first support portion 2610.

Figure 71:
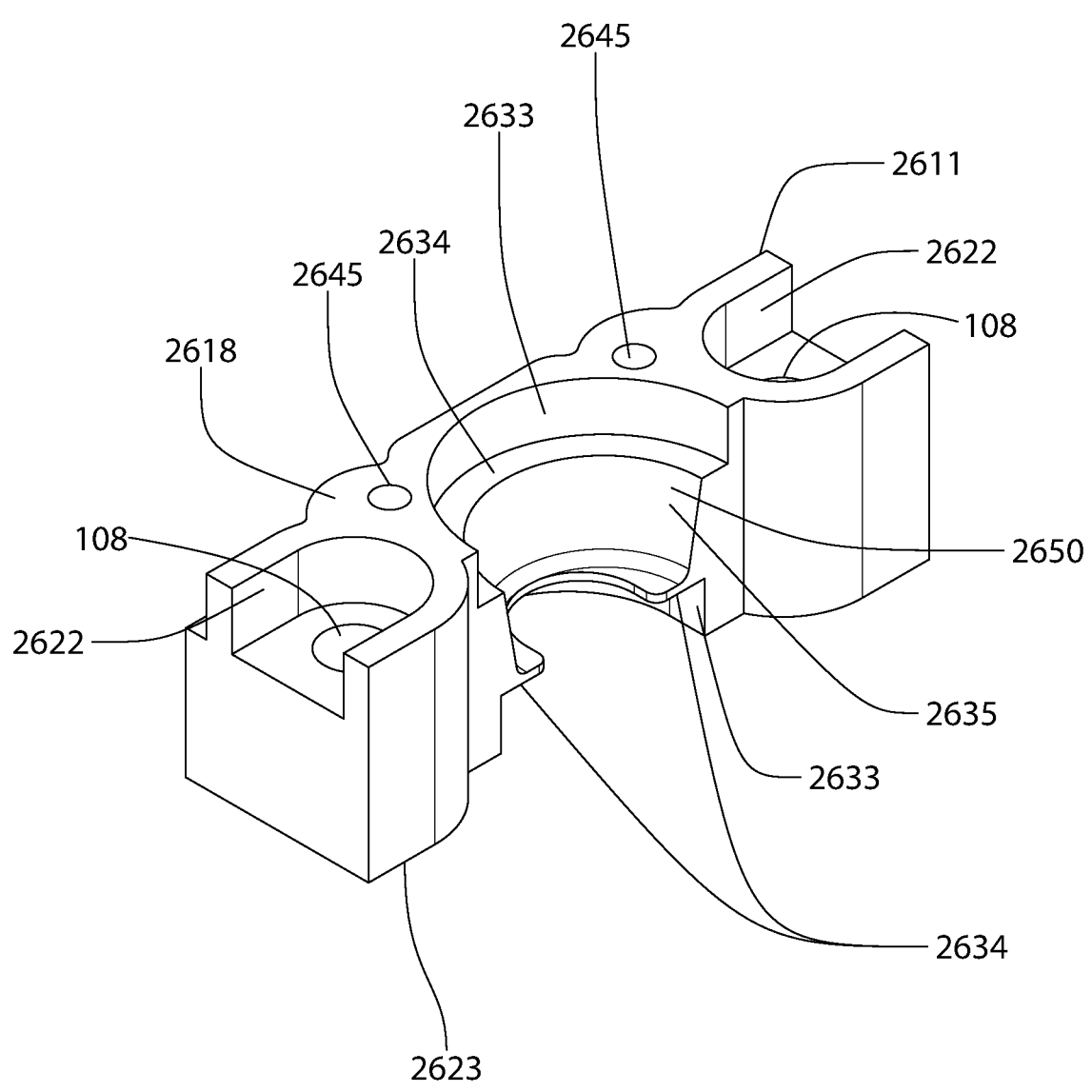
Figure 72:
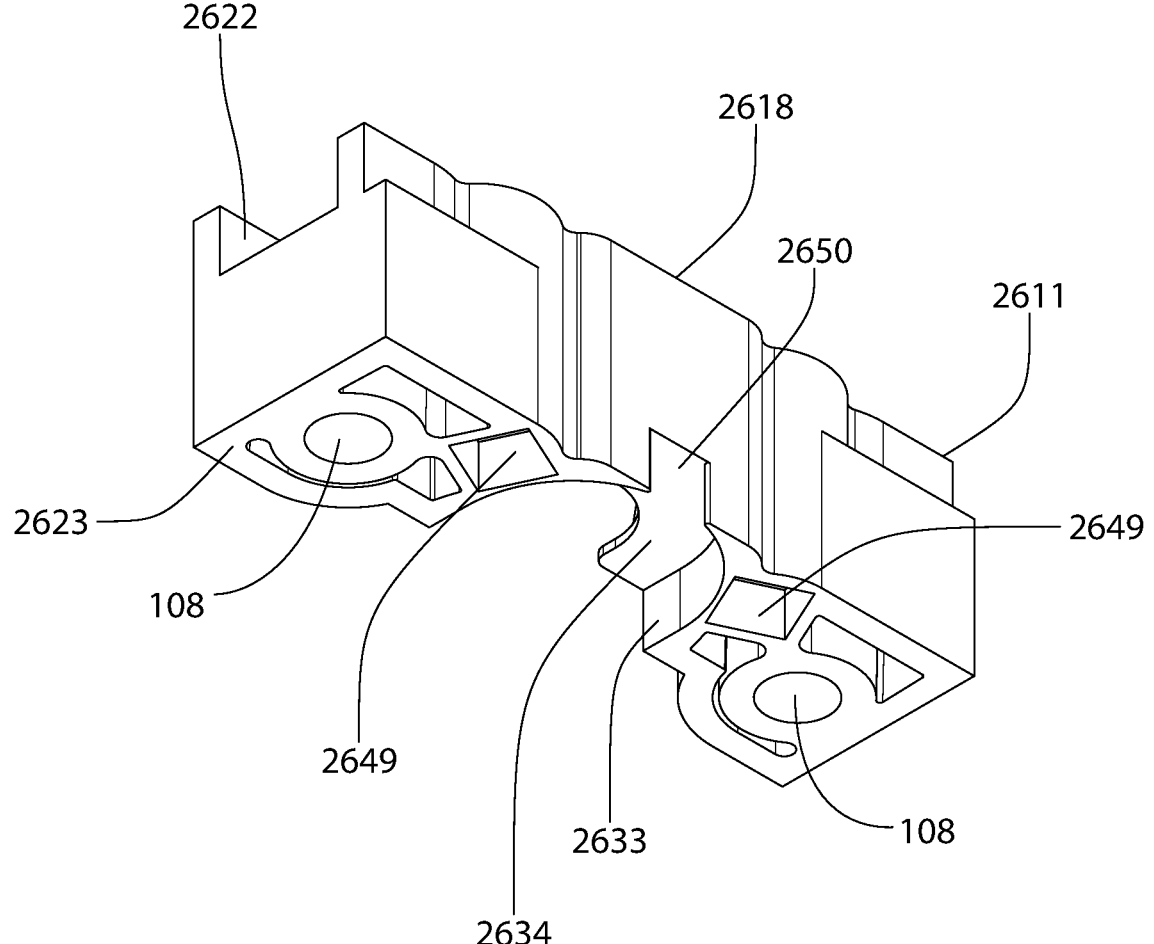

Turning to FIGS. 71 and 72, the second support portion 2611 is illustrated. The second support portion 2611 comprises a first surface 2618 and an opposite second surface 2623 as discussed above. The first surfaces 2618 of the first and second support portions 2610, 2611 and the distal surface 2663 of the first one of the ports 2661 collectively form the first seal side mounting surface 2613. The second surfaces 2623 of the first and second support portions 2610, 2611 and the distal surface 2663 of the component port 2664 collectively form the second assembly surface 2616.

The second support portion 2611 further comprises an insert cavity portion 2650 that forms another portion of the insert receiving cavity. The insert cavity portion 2650 comprises has two port receiving walls 2633 that have a generally cylindrical shape. The port receiving walls 2633 meet flange receiving surfaces 2634 that extend substantially parallel to first, second, and third surfaces 2618, 2623, 2619. A perimeter surface 2635 extends from the flange receiving surfaces 2634.

The second support portion 2611 further comprises a plurality of holes 2645 that extend through the second surface 2623 to the first surface 2618. Pockets 2649 may be configured to receive nuts and aid in assembly of the fluid flow component 2600. In the present embodiment, nuts fit within the pockets 2649 and receive fasteners that extend through the holes 2645 in the first support portion 2610. In addition, the fastener passageways 108 extend through the first support portion 2610. Recesses 2622 are formed into the first surface 2618 of the second support portion 2611.

FIGS. 73-75 illustrate the insert 2660. The insert 2460 has a fluid flow path 2612 that extends from the first port 2661 to the component port 2664, then from the component port 2664 to the second port 2661. The insert 2660 further comprises seal cavities 2662 and distal surfaces 2663. The seal cavities 2662 are configured to receive a seal to seal the fluid flow path 2612 to a fluid flow path of a fluid flow component or fitting assembly. The component port 2664 of the insert 2660 further comprises a distal surface 2663 that preferably protrudes slightly above the second surfaces 2623.

The first and second ports 2661 have a port outer diameter 2681 and a flange surface 2680. Similarly, the component port 2664 has a port outer diameter 2681 and a flange surface 2680. The port outer diameters 2681 are sized to be smaller than the port receiving walls 2633 so that the ports 2661, 2664 do not interfere with the first and second support portions 2610, 2611. The flange surfaces 2680 engage the flange receiving surfaces 2634, preventing the insert 2660 from moving when compressed against the seal and a mating component.

The insert 2660 further comprises a plurality of alignment features 2674, the alignment features 2674 engaging features formed in the perimeter surface 2635 of the first and second support portions 2610, 2611 of the housing 2620. The alignment features 2674 aid in positioning the insert 2660 within the housing 2620.

FIGS. 76-84 illustrate a fluid flow component 2700 incorporating a fitting assembly 2701. The fluid flow component 2700 of the present embodiment is a sensor used to measure a temperature or pressure of a fluid flowing from a first port 2761 to a second port 2761. In this embodiment, the fluid flow component 2700 is a temperature sensor, but other embodiments may incorporate both pressure and temperature measurement, just pressure measurement, or any other sensing function. The fluid flow component 2700 comprises an upper component assembly 2702 and the fitting assembly 2701. The fitting assembly 2701 comprises a first support portion 2710, a second support portion 2711, an insert 2760, and a base portion 2712. The insert 2760 comprises the first and second ports 2761. The first and second support portions 2710, 2711 surround the insert 2760 and provide additional structural strength to the insert 2760. The base portion 2712 surrounds the first and second support portions 2710, 2711 and further reinforces the insert 2760. The upper component assembly 2702 and the fitting assembly 2701 are joined by fasteners 250 as shown in FIG. 77.

FIGS. 77 and 78 illustrate the components of the upper component assembly 2702 and the fitting assembly 2701 in greater detail. The upper component assembly 2702 comprises an upper housing 2703, a housing retainer 2704, a connector 2705, an O-ring 2706, a sensor 2707, a spacer 2708, and a sensing element 2709. The upper housing 2703 is secured to the fitting assembly 2701 by the housing retainer 2704 and the O-ring 2706 seals the upper housing 2703 to the fitting assembly 2701, ensuring that the sensor 2707 and the connector 2705 are sealed from moisture. The sensor 2707 is spaced from the sensing element 2709 by the spacer 2708, the spacer 2708 being pressed against the sensing element 2709 by the upper housing 2703. In other embodiments, the spacer 2708 may be omitted and the sensor 2707 may be mounted directly to the sensing element 2709. The sensing element 2709 allows sensing of the temperature of the fluid while isolating the sensor 2707 from the fluid. The sensing element 2709 engages the insert 2760 as will be discussed in greater detail below.

As discussed above, the fitting assembly 2701 comprises the insert 2760, the first support portion 2710, the second support portion 2711, and the base portion 2712. The first support portion 2710, second support portion 2711, and the base portion 2712 collectively form a housing 2720 for the insert 2760. The fitting assembly 2701 has a seal side mounting surface 2714 and an opposite assembly surface 2715. The seal side mounting surface 2714 is formed by first surfaces 2721 of the first support portion 2710, second support portion 2711, and base portion 2712 and distal surfaces 2763 of the first and second ports 2761 of the insert 2760. The assembly surface 2715 is formed by second surfaces 2723 of the first support portion 2710, the second support portion 2711, and the base portion 2712 and a distal surface 2768 of a component port 2764 of the insert 2760.

As discussed above, the insert 2760 has a component port 2764, a first port 2761, and a second port 2761. A fluid flow path 2713 extends from the first port 2761 to the component port 2764 and then from the component port 2764 to the second port 2761. Thus, fluid may flow through the flow path 2713 from the first port 2761 to the second port 2761, flowing past the component port 2764. The component port 2764 is fluidly connected to the fluid flow path 2713 between the first and second ports 2761.

Fastener passageways 108 extend from the seal side mounting surface 2714 to the assembly surface 2715. As with the other embodiments, the fastener passageways 108 permit the passage of a fastener 108 and may include counter-bores, recesses, or other features to recess portions of the fasteners or provide space between the fitting assembly 2701 and mating components. These features may be formed in either of the seal side mounting surface 2714 or the assembly surface 2715. As can be seen, the fastener passageways 108 are formed through the base portion 2712 in the present embodiment. However, the fastener passageways may also be formed into other components of the fitting assembly 2701 as desired.

Turning to FIGS. 79 and 80, the base portion 2712 is illustrated in greater detail. The base portion has a first surface 2721 and an opposite second surface 2723 as discussed above. The base portion 2712 further comprises a support cavity 2740 that receives the insert 2760 and the first and second support portions 2710, 2711. The support cavity 2740 is formed into the first surface 2721 and includes an aperture 2743. The component port 2764 extends through the aperture 2743. The support cavity further 2740 comprises two insert cavity portions 2741 and a support cavity portion 2742. The aperture 2743 is formed into the support cavity portion 2742. The support cavity portion 2742 is the portion of the support cavity 2740 which encloses and receives the first and second support portions 2710, 2711 while the insert cavity portions 2741 are the portions which receive and are in direct contact with the insert 2760. The insert cavity portions 2741 support portions of the first and second ports 2761.

A plurality of holes 2745 are formed through the base portion 2712 from the second surface 2723 to the support cavity portion 2742 of the support cavity 2740. Optionally, the holes 2745 may be threaded or may be cylindrical holes. The holes 2745 serve to couple the base portion 2712 to the first and second support portions 2710, 2711 and to secure the components of the upper component assembly 2702 to the fitting assembly 2701. More specifically, fasteners 250 extend through the holes 2745 and engage the housing retainer 2704 to secure the upper component assembly 2702 to the fitting assembly 2701.

The insert cavity portions 2741 form a portion of an insert receiving cavity, the other portions of the insert receiving cavity being formed by cavities in the first and second support portions 2710, 2711. The insert cavity portions 2741 each have a port receiving wall 2733 that has a generally cylindrical shape. The port receiving wall 2733 meets a flange receiving surface 2734 that extends substantially parallel to the first surface 2721.

The first and second support portions 2710, 2711 are shown in FIGS. 83 and 84. Each of the first and second support portions has an insert cavity portion 2750 that forms another portion of the insert receiving cavity. The insert cavity portion 2750 comprises port receiving walls 2733 that have a generally arcuate shape. The port receiving walls 2733 meet flange receiving surfaces 2734 that extend substantially parallel to the first surface 2721. A perimeter surface 2735 extends from the flange receiving surfaces 2734.

The first and second support portions 2710, 2711 further comprise a plurality of holes 2745 that extend through the first and second support portions 2710, 2711. The holes 2745 of the first and second support portions 2710, 2711 align with holes 2745 of the base portion 2712 when the first and second support portions 2710, 2711 are assembled with the base portion 2712.

FIGS. 81 and 82 illustrate the insert 2760. The insert 2760 has a fluid flow path 2713 that extends from the first port 2761 to the component port 2764, then from the component port 2764 to the second port 2761 as discussed above. The insert 2760 further comprises seal cavities 2762 and distal surfaces 2763. The seal cavities 2762 are configured to receive a seal to seal the fluid flow path 2713 to a fluid flow path of a fluid flow component or fitting assembly. The distal surfaces 2763, in combination with the first surfaces 2721 of the first and second support portions 2710, 2711 and the base portion 2712, collectively form the seal side mounting surface 2714 of the fitting assembly 2701. Preferably, the distal surfaces 2763 protrude slightly from the first surfaces 2721 to ensure proper compression of a seal placed therebetween.

The component port 2764 of the insert 2760 further comprises a distal surface 2763 that preferably protrudes slightly above the second surfaces 2423. A chamber 2765 is formed into the component port 2764 with a seal cavity 2766 surrounding the chamber 2765. The seal cavity 2766 is formed into the distal surface 2763 and receives the sensing element 2709. Optionally, the sensing element 2709 may seal by engaging the seal cavity 2766 of the insert 2760 or the sensing element 2709 may seal by engaging a separate seal located within the seal cavity 2766. In yet other embodiments, the sensing element 2709 may seal by engaging both features of the seal cavity 2766 and separate seals such as O-rings. In this manner, multiple sealing methods may be used to seal the component port 2764 and ensure leak proof connection between the component port 2764 and the sensing element 2709.

The first and second ports 2761 have a port outer diameter 2781 and a flange surface 2780. Similarly, the component port 2764 has a port outer diameter 2781 and a flange surface 2780. The port outer diameters 2781 are sized to be smaller than the port receiving walls 2733 so that the ports 2761, 2764 do not interfere with the first and second support portions 2710, 2711 or the base portion 2712. The flange surfaces 270 engage the flange receiving surfaces 2734, preventing the insert 2760 from moving when compressed against the seal and a mating component.

FIGS. 85-95 illustrate yet another embodiment of a fitting assembly 2800 and the components which make up the fitting assembly 2800. The fitting assembly 2800 shown in FIGS. 85 and 86 comprises an insert 2860 and a housing 2820. The insert 2860 has a wye configuration. Thus, a fluid flow path 2812 extends from a first one of the ports 2861 to a tube stub 2864, then on to a second one of the ports 2861. A conduit portion 2865 extends from the first port 2861 to the second port 2861. The tube stub 2864 is configured to be joined to tubing or another fluid conducting device via welding, a compression fitting, or any other means of making a fluid-tight connection. For instance, the tube stub 2864 may be fitted with a coupling means to mechanically couple to another device. Alternately, the tube stub 2864 may simply be joined to tubing so that fluid can be routed to another location. The ports 2861 need not be identical, but are identical in this embodiment. A longitudinal axis A-A extends through the first port 2861 while a longitudinal axis B-B extends through the second port 2861 as shown. The longitudinal axis A-A is parallel to the longitudinal axis B-B.

The fitting assembly 2800 comprises a seal side mounting surface 2814 formed by a first surface 2821 of the housing 2820 and a distal surface 2863 of the insert 2860. The port 2861 of the insert 2860 comprises the seal cavity 2862 to receive a seal 300. An assembly surface 2815 is opposite the seal side mounting surface 2814. The assembly surface 2815 may engage another object such as the substrate panel 1402. Fastener passageways 108 in the housing 2820 are utilized to secure the fitting assembly 2800 to the object to which the fitting assembly 2800 is assembled. The fastener passageways 108 may extend to the assembly surface 2815 or may terminate in a recess 2822 formed into the housing 2820. As is apparent, the assembly surface 2815 is formed by a second surface 2823 of the housing 2820. However, in some embodiments, a portion of the assembly surface 2815 may be formed by the insert 2860.

FIGS. 87-93 show a portion 2810 of the housing 2820. As can be seen, two identical portions 2810 of the housing 2820 form a single housing 2820. However, the portions 2810 need not be identical. A portion 2810 may be combined with another portion to form a housing, particularly if the insert 2860 has a different configuration. This enables modularity and a minimum of distinct components for a wide variety of flow configurations. The first surface 2821 and the opposite second surface 2823 are shown. When the portions 2810 are assembled, the first surface 2821 of the first portion 2810 and the first surface 2821 of a second portion 2810 form an entirety of the first surface 2821 of the housing 2820. Similarly, the second surface 2823 of the first portion 2810 and the second surface 2823 of a second portion 2810 collectively form an entirety of the second surface 2823 of the housing 2820.

The portion 2810 of the housing 2820 also comprises a recess 2822 formed into the second surface 2823. The recess 2822 of the portion 2810 forms the recess 2822 of the housing 2820. Fastener passageways 108 extend through the portion 2810. When two portions 2810 are coupled together, the fastener passageways 108 permit fasteners to extend through the fastener passageways 108 to mate to components such as the substrate panel 1402. An additional hole 2824 is provided in an interface surface 2825.

The interface surface 2825 receives a corresponding interface surface 2825 of another portion 2810 to form a complete housing 2820. The interface surface 2825 further includes a protuberance 2826 which engages the hole 2824 provided in the interface surface 2825. The protuberance 2826 may have a concave tip, a conical tip, or a flat tip, and may further include a fillet or chamfer joining the tip to the body of the protuberance 2826. The protuberance 2826 is sized to limit movement in a radial direction with respect to the hole 2824 when the protuberance 2826 is inserted into the hole 2824. Thus, the portions 2810 are secured together along the plane of the interface surface 2825 and are not free to translate along the interface surface 2825 or rotate with respect to the interface surface 2825. Separately, additional holes 2824 are provided in various surfaces of the housing 2820. Some are formed in the second surface 2823 while others are formed in the rear surface. The holes 2824 may be used for mounting additional components to the fitting assembly 2800, securing the fitting assembly 2800 to another object, or for any other desired use.

The portion 2810 further comprises a plurality of fingers 2827. The fingers 2827 are arranged such that two fingers 2827 are located on one end of the portion 2810 and one finger 2827 is located on an opposite end of the portion 2810. The fingers 2827 are spaced apart such that they interlock with fingers 2827 of a second portion 2810 when two portions 2810 are joined to form a housing 2820. The fingers 2827 may incorporate snap features such as a hook 2828. The hook 2828 engages a corresponding snap receiver 2841. Collectively, the hook 2828 and snap receiver 2841 aid in keeping the two portions 2810 coupled to form a housing 2820. Between the two fingers 2827 at the one end of the portion 2810 is a slot 2829, the slot 2829 sized to ensure a secure fit with the finger 2827 of the mating portion 2810. In addition, another slot 2829 is adjacent the single finger 2827 at the opposite end of the portion 2810. This slot 2829 receives the upper one of the fingers 2827 at the one end of the mating portion 2810. As can be seen, the fastener passageways 108 extend through all three fingers 2827 when two portions 2810 are joined to form a housing 2820, extending from the recess 2822 to the first surface 2821.

The portion 2810 also comprises an insert receiving cavity 2830 which receives an insert 2860. The insert receiving cavity 2830 comprises an entry portion 2831 and an insert portion 2832. The entry portion 2831 extends from the interface surface 2825 to the insert portion 2832 that receives one of the ports 2861. The insert receiving cavity 2830 comprises a port receiving wall 2833 that has a generally cylindrical shape. The port receiving wall 2833 meets a flange receiving surface 2834 that extends substantially parallel to the first surface 2821. Thus, the flange receiving surface 2834 is substantially planar.

Adjacent the flange receiving surface 2834 is a perimeter surface 2835, the perimeter surface 2835 extending from the flange receiving surface 2834 and surrounding the insert 2860. Slots 2836 are formed in the perimeter surface 2835. The slots 2836 extend parallel to the entry portion 2831 and terminate at an end slot 2837 within the insert portion 2832. Thus, the slots 2836 are joined by the end slot 2837 to form a profile that extends along three sides of a rectangle. Alternately, the slots 2836 may join the end slot 2837 to form a generally "U" shaped profile. In addition, a recess 2840 is formed into the perimeter surface 2835. The recess 2840 is formed into both the entry portion 2831 and the insert portion 2832. The recess 2840 extends from the second surface 2823 of the housing 2820.

Turning to FIGS. 94 and 95, the insert 2860 is illustrated. The insert 2860 has a fluid flow path 2812 extending from the first port 2861 to a second port 2861 as discussed above. The first port 2861 extends along a longitudinal axis A-A and is symmetrical about the longitudinal axis A-A. The second port 2861 extends along a longitudinal axis B-B and is symmetrical about the longitudinal axis B-B. A tube stub 2864 extends from the first port 2861 along the longitudinal axis A-A and forms a part of the flow path 2812. A conduit portion 2865 extends from the first port 2861 to the second port 2861, the conduit portion 2865 forming the boundary for the fluid flow path 2812. The tube stub 2864 extends from the conduit portion 2865.

The insert 2860 further comprises first and second seal cavities 2862 and first and second distal surfaces 2863. The seal cavities 2862 are configured to receive a seal to seal the fluid flow path 2812 to a fluid flow path of a fluid flow component 200 or another fitting assembly. The distal surfaces 2863, in combination with the first surface 2821 of the housing 2820, collectively form the seal side mounting surface 2814 of the fitting assembly 2800. Preferably, the distal surfaces 2863 protrude slightly from the first surface 2821 to ensure proper compression of a seal placed therebetween.

The insert 2860 further comprises a plurality of alignment features 2874, the alignment features 2874 engaging the slots 2836 in the portions 2810 of the housing 2820. The alignment features 2874 aid in positioning the insert 2860 within the housing 2820. The alignment features 2874 may be cylindrical as illustrated, or may be any other shape suitable for engaging the slots 2836 in the portions 2810 of the housing 2820. The ports 2861 each have a port outer diameter 2881 and a flange surface 2880. The port outer diameter 2881 is sized to be smaller than the port receiving wall 2833 so that the port 2861 does not interfere with the housing 2820. The flange surface 2880 engages the flange receiving surface 2833, preventing the insert 2860 from moving along the longitudinal axes A-A, B-B when compressed against the seal and a mating component.

Turning to FIGS. 96-99, another embodiment of a fitting assembly 2900 is illustrated. The fitting assembly 2900 comprises an insert 2960 and a housing 2820, the housing 2820 identical to the housing 2820 discussed above with respect to the fitting assembly 2800. The fitting assembly 2900 utilizes two portions 2810, but the fitting assembly 2960 is distinct from the fitting assembly 2860.

The insert 2960 has a U configuration. Thus, a fluid flow path 2912 extends from a first one of the ports 2961 to a second one of the ports 2961. A conduit portion 2965 extends from the first port 2961 to the second port 2961. An alignment feature 2964 comprises an outer surface 2966 and an end surface 2967. The outer surface 2966 of the alignment feature 2964 extends from the end surface 2967 to the conduit portion 2965. The ports 2961 need not be identical, but are identical in this embodiment. A longitudinal axis A-A extends through the first port 2961 and the alignment feature 2964. A longitudinal axis B-B extends through the second port 2961 as shown. The longitudinal axis A-A is parallel to the longitudinal axis B-B.

The fitting assembly 2900 comprises a seal side mounting surface 2914 formed by the first surface 2821 of the housing 2820 and a distal surface 2963 of the insert 2960. The port 2961 of the insert 2960 comprises a seal cavity 2962 to receive a seal 300. An assembly surface 2915 is opposite the seal side mounting surface 2914. The assembly surface 2915 may engage another object such as the substrate panel 1402. The fastener passageways 108 in the housing 2820 are utilized to secure the fitting assembly 2900 to the object to which the fitting assembly 2900 is assembled. The fastener passageways 108 may extend to the assembly surface 2915 or may terminate in the recess 2822 formed into the housing 2820. As is apparent, the assembly surface 2915 is formed by the second surface 2823 of the housing 2820. However, in some embodiments, a portion of the assembly surface 2915 may be formed by the insert 2960.

FIGS. 98 and 99 illustrate the insert 2960 in greater detail. The insert 2960 has a fluid flow path 2912 extending from the first port 2961 to a second port 2961 as discussed above. The first port 2961 extends along a longitudinal axis A-A and is symmetrical about the longitudinal axis A-A. The second port 2961 extends along a longitudinal axis B-B and is symmetrical about the longitudinal axis B-B. An alignment feature 2964 extends along the longitudinal axis A-A and forms no part of the fluid flow path 2912. A conduit portion 2965 extends from the first port 2961 to the second port 2961, the conduit portion 2965 forming the boundary for the fluid flow path 2912.

The insert 2960 further comprises first and second seal cavities 2962 and first and second distal surfaces 2963. The seal cavities 2962 are configured to receive a seal to seal the fluid flow path 2912 to a fluid flow path of a fluid flow component 200 or another fitting assembly. The distal surfaces 2963, in combination with the first surface 2821 of the housing 2820, collectively form the seal side mounting surface 2914 of the fitting assembly 2900. Preferably, the distal surfaces 2963 protrude slightly from the first surface 2821 to ensure proper compression of a seal placed therebetween.

The insert 2960 further comprises a plurality of alignment features 2974, the alignment features 2974 engaging the slots 2836 in the portions 2810 of the housing 2820. The alignment features 2974 aid in positioning the insert 2960 within the housing 2820. The alignment features 2974 may be cylindrical as illustrated, or may be any other shape suitable for engaging the slots 2836 in the portions 2810 of the housing 2820. The ports 2961 each have a port outer diameter 2981 and a flange surface 2980. The port outer diameter 2981 is sized to be smaller than the port receiving wall 2833 so that the port 2961 does not interfere with the housing 2820. The flange surface 2980 engages the flange receiving surface 2833, preventing the insert 2960 from moving along the longitudinal axes A-A, B-B when compressed against the seal and a mating component.

FIGS. 100-117 illustrate yet another embodiment of a fitting assembly 3000 and the components which make up the fitting assembly 3000. The fitting assembly 3000 shown in FIGS. 100 and 101 comprises an insert 3060 and a housing 3020. The insert 3060 has a run tee configuration. Thus, a fluid flow path 3012 extends from a port 3061 to first and second tube stubs 3064. The tube stubs 3064 are configured to be joined to tubing or another fluid conducting device via welding, a compression fitting, or any other means of making a fluid-tight connection. For instance, the tube stubs 3064 may be fitted with a coupling means to mechanically couple to another device. Alternately, the tube stubs 3064 may simply be joined to tubing so that fluid can be routed to another location. A longitudinal axis A-A extends through the port 3061 and one of the tube stubs 3064. The second tube stub 3064 extends perpendicular to the longitudinal axis A-A.

The fitting assembly 3000 comprises a seal side mounting surface 3014 formed by a first surface 3021 of the housing 3020 and a distal surface 3063 of the insert 3060. The port 3061 of the insert 3060 comprises the seal cavity 3062 to receive a seal 300. An assembly surface 3015 is opposite the seal side mounting surface 3014. The assembly surface 3015 may engage another object such as the substrate panel 1402. Fastener passageways 108 in the housing 3020 are utilized to secure the fitting assembly 3000 to the object to which the fitting assembly 3000 is assembled. The fastener passageways 108 may extend to the assembly surface 3015 or may terminate in a recess 3022 formed into the housing 3020. As is apparent, the assembly surface 3015 is formed by a second surface 3023 of the housing 3020. However, in some embodiments, a portion of the assembly surface 3015 may be formed by the insert 3060.

FIGS. 102-108 show a first portion 3010 of the housing 3020, while FIGS. 109-115 show a second portion 3110 of the housing 3020. As can be seen, the first and second portions 3010, 3110 form a single housing 3020. Optionally, two of a first or second portion 3010, 3110 may be used, depending on requirements. This enables modularity and a minimum of distinct components for a wide variety of flow configurations.

Turning to the first portion 3010, portions of the first surface 3021 and the opposite second surface 3023 are shown. When the first and second portions 3010, 3110 are assembled, the portions of the first surface 3021 of the first and second portions 3010, 3110 form an entirety of the first surface 3021 of the housing 3020. Similarly, the portions of the second surface 3023 of the first and second portions 3010, 3110 collectively form an entirety of the second surface 3023 of the housing 3020.

The first portion 3010 of the housing 3020 also comprises a portion of the recess 3022 formed into the second surface 3023. The portion of the recesses 3022 of the first and second portions 3010, 3110 collectively form the recess 3022 of the housing 3020. Fastener passageways 108 extend through the first portion 3010. When the first and second portions 3010, 3110 are coupled together, the fastener passageways 108 permit fasteners to extend through the fastener passageways 108 to mate to components such as the substrate panel 1402. An additional hole 3024 is provided in an interface surface 3025.

The interface surface 3025 receives a corresponding interface surface of the second portion 3110 to form a complete housing 3020. The interface surface 3025 further includes a protuberance 3026 which is configured to engage a hole provided in an interface surface of the second portion 3110. The hole in the interface surface of the second portion 3110 is preferably identical to the hole 3024 to facilitate mixing and matching combinations of first and second portions 3010, 3110. The protuberance 3026 may have a concave tip, a conical tip, or a flat tip, and may further include a fillet or chamfer joining the tip to the body of the protuberance 3026. The protuberance 3026 is sized to limit movement in a radial direction with respect to the corresponding hole when the protuberance 3026 is inserted into the hole. Thus, the first and second portions 3010, 3110 are secured together along the plane of the interface surface 3025 and are not free to translate along the interface surface 3025 or rotate with respect to the interface surface 3025. Separately, additional holes 3024 are provided in various surfaces of the housing 3020. Some are formed in the second surface 3023 while others are formed in the rear surface. The holes 3024 may be used for mounting additional components to the fitting assembly 3000, securing the fitting assembly 3000 to another object, or for any other desired use.

The first portion 3010 further comprises a plurality of fingers 3027. The fingers 3027 are arranged such that two fingers 3027 are located on one end of the first portion 3010 and one finger 3027 is located on an opposite end of the first portion 3010. The fingers 3027 are spaced apart such that they interlock with fingers of the second portion 3110 when first and second portions 3010, 3110 are joined to form a housing 3020. The fingers 3027 may incorporate snap features such as a hook 3028. The hook 3028 may engage a corresponding snap receiver. The first portion 3041 comprises a snap receiver 3041 to receive a hook from a corresponding portion such as the second portion 3110.

Collectively, the hook 3028 and snap receiver 3041 aid in keeping the first and second portions 3010, 3110 coupled to form a housing 3020. Between the two fingers 3027 at the one end of the first portion 3010 is a slot 3029, the slot 3029 sized to ensure a secure fit with a finger of the mating second portion 3110. In addition, another slot 3029 is adjacent the single finger 3027 at the opposite end of the first portion 3010. This slot 3029 receives the upper one of the fingers at the one end of the mating second portion 3110. As can be seen, the fastener passageways 108 extend through all three fingers when the first and second portions 3010, 3110 are joined to form a housing 3020, extending from the recess 3022 to the first surface 3021.

The first portion 3010 also comprises an insert receiving cavity 3030 which receives an insert 3060. The insert receiving cavity 3030 comprises an insert portion 3032. The insert portion 3032 receives the port 3061. The insert receiving cavity 3030 comprises a port receiving wall 3033 that has a generally cylindrical shape. The port receiving wall 3033 meets a flange receiving surface 3034 that extends substantially parallel to the first surface 3021. Thus, the flange receiving surface 3034 is substantially planar.

Adjacent the flange receiving surface 3034 is a perimeter surface 3035, the perimeter surface 3035 extending from the flange receiving surface 3034 and surrounding the insert 3060. Slots 3036 are formed in the perimeter surface 3035. The slots 3036 extend parallel to the entry portion 3031 and terminate at an end slot 3037 within the insert portion 3032. Thus, the slots 3036 are joined by the end slot 3037 to form a profile that extends along three sides of a rectangle. Alternately, the slots 3036 may join the end slot 3037 to form a generally "U" shaped profile. In addition, a recess 3040 is formed into the perimeter surface 3035. The recess 3040 extends from the second surface 3023 of the housing 3020.

The second portion 3110 of the housing 3020 also comprises a portion of the recess 3022 formed into the second surface 3023. As discussed above, the portion of the recesses 3022 of the first and second portions 3010, 3110 collectively form the recess 3022 of the housing 3020. Fastener passageways 108 extend through the first portion 3010. When the first and second portions 3010, 3110 are coupled together, the fastener passageways 108 permit fasteners to extend through the fastener passageways 108 to mate to components such as the substrate panel 1402. An additional hole 3124 is provided in an interface surface 3125.

The interface surface 3125 receives a corresponding interface surface 3025 of the first portion 3010 to form a complete housing 3020. The interface surface 3125 further includes a protuberance 3126 which is configured to engage the hole 3024 provided in the interface surface 3025 of the first portion 3010. The hole 3124 in the interface surface of the second portion 3110 is preferably identical to the hole 3024 of the first portion 3010 to facilitate mixing and matching combinations of first and second portions 3010, 3110. The protuberance 3126 may have a concave tip, a conical tip, or a flat tip, and may further include a fillet or chamfer joining the tip to the body of the protuberance 3126. The protuberance 3126 is sized to limit movement in a radial direction with respect to the hole 3024 when the protuberance 3126 is inserted into the hole 3024. Thus, the first and second portions 3010, 3110 are secured together along the planes of the interface surfaces 3025, 3125 and are not free to translate along the interface surfaces 3025, 3125 or rotate with respect to the interface surfaces 3025, 3125. Separately, additional holes 3124 are provided in various surfaces of the housing 3020. Some are formed in the second surface 3023 while others are formed in the rear surface. The holes 3124 may be used for mounting additional components to the fitting assembly 3000, securing the fitting assembly 3000 to another object, or for any other desired use.

The second portion 3110 further comprises a plurality of fingers 3127. The fingers 3127 are arranged such that two fingers 3127 are located on one end of the second portion 3110 and one finger 3127 is located on an opposite end of the second portion 3110. The fingers 3127 are spaced apart such that they interlock with fingers of the first portion 3010 when first and second portions 3010, 3110 are joined to form a housing 3020. The fingers 3127 may incorporate snap features such as a hook 3128. The hook 3128 may engage a corresponding snap receiver such as the snap receiver 3041. The second portion 3110 also comprises a snap receiver 3141 to receive the hook 3028. Collectively, the hooks 3028, 3128 and snap receivers 3041, 3141 aid in keeping the first and second portions 3010, 3110 coupled to form a housing 3020. Between the two fingers 3127 at the one end of the second portion 3110 is a slot 3129, the slot 3129 sized to ensure a secure fit with a finger of the mating first portion 3010. In addition, another slot 3129 is adjacent the single finger 3127 at the opposite end of the second portion 3110. This slot 3129 receives the upper one of the fingers at the one end of the mating first portion 3110. As can be seen, the fastener passageways 108 extend through all three fingers when the first and second portions 3010, 3110 are joined to form a housing 3020, extending from the recess 3022 to the first surface 3021.

The second portion 3010 also comprises an insert receiving cavity 3130 which receives an insert 3060. The insert receiving cavity 3130 comprises an insert portion 3132 and an entry portion 3131. The insert portion 3132 receives the port 3061. The entry portion 3131 extends from the insert portion 3132 to a rear surface 3142 of the second portion 3110. The insert receiving cavity 3130 comprises a port receiving wall 3133 that has a generally cylindrical shape. The port receiving wall 3133 meets a flange receiving surface 3134 that extends substantially parallel to the first surface 3021. Thus, the flange receiving surface 3134 is substantially planar.

Adjacent the flange receiving surface 3134 is a perimeter surface 3135, the perimeter surface 3135 extending from the flange receiving surface 3134 and surrounding the insert 3060. Slots 3136 are formed in the perimeter surface 3135. The slots 3136 extend parallel to the entry portion 3131 and terminate in an arcuate wall 3137. In addition, a recess 3140 is formed into the perimeter surface 3135. The recess 3140 extends from the second surface 3023 of the housing 3020.

Turning to FIGS. 116 and 117, the insert 3060 is illustrated. The insert 3060 has a fluid flow path 3012 extending from the port 3061 to the first and second tube stubs 3064 as discussed above. The port 3061 extends along a longitudinal axis A-A and is symmetrical about the longitudinal axis A-A. The first tube stub 3064 is also symmetrical about the longitudinal axis A-A and forms a part of the flow path 3012. The second tube stub 3064 extends perpendicular to the longitudinal axis A-A and forms a part of the flow path 3012.

The insert 3060 further comprises a seal cavity 3062 and a distal surface 3063. The seal cavity 3062 is configured to receive a seal to seal the fluid flow path 3012 to a fluid flow path of a fluid flow component 200 or another fitting assembly. The distal surface 3063, in combination with the first surface 3021 of the housing 3020, collectively form the seal side mounting surface 3014 of the fitting assembly 3000. Preferably, the distal surface 3063 protrudes slightly from the first surface 3021 to ensure proper compression of a seal placed therebetween.

The insert 3060 further comprises a plurality of alignment features 3074, the alignment features 3074 engaging the slots 3036 and the recesses 3040, 3140 in the first and second portions 3010, 3110 of the housing 3020. The alignment features 3074 aid in positioning the insert 3060 within the housing 3020. The alignment features 3074 may be cylindrical as illustrated, or may be any other shape suitable for engaging the slots 3036 and recesses 3040, 3140 in the first and second portions 3010, 3110 of the housing 3020. The port 3061 has a port outer diameter 3081 and a flange surface 3080. The port outer diameter 3081 is sized to be smaller than the port receiving walls 3033, 3133 so that the port 3061 does not interfere with the housing 3020. The flange surface 3080 engages the flange receiving surfaces 3034, 3134, preventing the insert 3060 from moving along the longitudinal axis A-A when compressed against the seal and a mating component.

FIGS. 118-121 illustrate yet another embodiment of a fitting assembly 3100 and the components which make up the fitting assembly 3100. The fitting assembly 3100 shown in FIGS. 118 and 119 comprises an insert 3160 and a housing 3120. The housing 3120 is formed of two of the second portions 3110 as discussed above. The insert 3160 has a branch tee configuration. Thus, a fluid flow path 3112 extends from a port 3161 to first and second tube stubs 3164. The tube stubs 3164 are configured to be joined to tubing or another fluid conducting device via welding, a compression fitting, or any other means of making a fluid-tight connection. For instance, the tube stubs 3164 may be fitted with a coupling means to mechanically couple to another device. Alternately, the tube stubs 3164 may simply be joined to tubing so that fluid can be routed to another location. A longitudinal axis A-A extends through the port 3161 and perpendicular to the tube stubs 3164.

The fitting assembly 3100 comprises a seal side mounting surface 3114 formed by a first surface 3121 of the housing 3120 and a distal surface 3163 of the insert 3160. The port 3161 of the insert 3160 comprises the seal cavity 3162 to receive a seal 300. An assembly surface 3115 is opposite the seal side mounting surface 3114. The assembly surface 3115 may engage another object such as the substrate panel 1402. Fastener passageways 108 in the housing 3120 are utilized to secure the fitting assembly 3100 to the object to which the fitting assembly 3100 is assembled. The fastener passageways 108 may extend to the assembly surface 3115 or may terminate in a recess 3122 formed into the housing 3120. As is apparent, the assembly surface 3115 is formed by a second surface 3123 of the housing 3120. However, in some embodiments, a portion of the assembly surface 3115 may be formed by the insert 3160.

Turning to FIGS. 120 and 121, the insert 3160 is illustrated. The insert 3160 has a fluid flow path 3112 extending from the port 3161 to the first and second tube stubs 3164 as discussed above. The port 3161 extends along a longitudinal axis A-A and is symmetrical about the longitudinal axis A-A. The first and second tube stubs 3164 extend perpendicular to the longitudinal axis A-A and form a part of the flow path 3112.

The insert 3160 further comprises a seal cavity 3162 and a distal surface 3163. The seal cavity 3162 is configured to receive a seal to seal the fluid flow path 3112 to a fluid flow path of a fluid flow component 200 or another fitting assembly. The distal surface 3163, in combination with the first surface 3121 of the housing 3120, collectively form the seal side mounting surface 3114 of the fitting assembly 3100. Preferably, the distal surface 3163 protrudes slightly from the first surface 3121 to ensure proper compression of a seal placed therebetween.

The insert 3160 further comprises a plurality of alignment features 3174, the alignment features 3174 engaging the slots 3136 in the second portions 3110 of the housing 3120. The alignment features 3174 aid in positioning the insert 3160 within the housing 3120. The alignment features 3174 may be cylindrical as illustrated, or may be any other shape suitable for engaging the slots 3136 or the recesses 3140 in the second portions 3110 of the housing 3120. The port 3161 has a port outer diameter 3181 and a flange surface 3180.

The port outer diameter 3181 is sized to be smaller than the port receiving walls 3133 so that the port 3161 does not interfere with the housing 3120. The flange surface 3180 engages the flange receiving surfaces 3134, preventing the insert 3160 from moving along the longitudinal axis A-A when compressed against the seal and a mating component.

FIGS. 122-125 illustrate yet another embodiment of a fitting assembly 3200 and the components which make up the fitting assembly 3200. The fitting assembly 3200 shown in FIGS. 122 and 123 comprises an insert 3260 and a housing 3020. The housing 3020 is formed of one of each of the first and second portions 3010, 3110 as discussed above. The insert 3260 has an elbow configuration. Thus, a fluid flow path 3212 extends from a port 3261 to a tube stub 3264. The tube stub 3264 is configured to be joined to tubing or another fluid conducting device via welding, a compression fitting, or any other means of making a fluid-tight connection. For instance, the tube stub 3264 may be fitted with a coupling means to mechanically couple to another device. Alternately, the tube stub 3264 may simply be joined to tubing so that fluid can be routed to another location. A longitudinal axis A-A extends through the port 3261 and perpendicular to the tube stub 3264.

The fitting assembly 3200 comprises a seal side mounting surface 3214 formed by a first surface 3021 of the housing 3020 and a distal surface 3263 of the insert 3260. The port 3261 of the insert 3260 comprises the seal cavity 3262 to receive a seal 300. An assembly surface 3215 is opposite the seal side mounting surface 3214. The assembly surface 3215 may engage another object such as the substrate panel 1402. Fastener passageways 108 in the housing 3020 are utilized to secure the fitting assembly 3200 to the object to which the fitting assembly 3200 is assembled. The fastener passageways 108 may extend to the assembly surface 3215 or may terminate in a recess 3022 formed into the housing 3020. As is apparent, the assembly surface 3215 is formed by a second surface 3023 of the housing 3020. However, in some embodiments, a portion of the assembly surface 3215 may be formed by the insert 3260.

Turning to FIGS. 124 and 125, the insert 3260 is illustrated. The insert 3260 has a fluid flow path 3212 extending from the port 3261 to the tube stub 3264 as discussed above. The port 3261 extends along a longitudinal axis A-A and is symmetrical about the longitudinal axis A-A. The tube stub 3264 extends perpendicular to the longitudinal axis A-A and forms a part of the flow path 3212.

The insert 3260 further comprises a seal cavity 3262 and a distal surface 3263. The seal cavity 3262 is configured to receive a seal to seal the fluid flow path 3212 to a fluid flow path of a fluid flow component 200 or another fitting assembly. The distal surface 3263, in combination with the first surface 3021 of the housing 3020, collectively form the seal side mounting surface 3214 of the fitting assembly 3200. Preferably, the distal surface 3263 protrudes slightly from the first surface 3021 to ensure proper compression of a seal placed therebetween.

The insert 3260 further comprises a plurality of alignment features 3274, the alignment features 3274 engaging the slots 3036, 3136 in the first and second portions 3010, 3110 of the housing 3020. The alignment features 3274 aid in positioning the insert 3260 within the housing 3020. The alignment features 3274 may be cylindrical as illustrated, or may be any other shape suitable for engaging the slots 3036, 3136 or the recesses 3040, 3140 in the first and second portions 3010, 3110 of the housing 3020. The port 3261 has a port outer diameter 3281 and a flange surface 3280. The port outer diameter 3281 is sized to be smaller than the port receiving walls 3033, 3133 so that the port 3261 does not interfere with the housing 3020. The flange surface 3280 engages the flange receiving surfaces 3034, 3134, preventing the insert 3260 from moving along the longitudinal axis A-A when compressed against the seal and a mating component.

FIGS. 126-129 illustrate yet another embodiment of a fitting assembly 3300 and the components which make up the fitting assembly 3300. The fitting assembly 3300 shown in FIGS. 126 and 127 comprises an insert 3360 and a housing 3320. The housing 3320 is formed of two of the first portions 3010 as discussed above. The insert 3360 has a straight configuration. Thus, a fluid flow path 3312 extends from a port 3361 to a tube stub 3364. The tube stub 3364 is configured to be joined to tubing or another fluid conducting device via welding, a compression fitting, or any other means of making a fluid-tight connection. For instance, the tube stub 3364 may be fitted with a coupling means to mechanically couple to another device. Alternately, the tube stub 3364 may simply be joined to tubing so that fluid can be routed to another location. A longitudinal axis A-A extends through the port 3361 and the tube stub 3364.

The fitting assembly 3300 comprises a seal side mounting surface 3314 formed by a first surface 3321 of the housing 3320 and a distal surface 3363 of the insert 3360. The port 3361 of the insert 3360 comprises the seal cavity 3362 to receive a seal 300. An assembly surface 3315 is opposite the seal side mounting surface 3314. The assembly surface 3315 may engage another object such as the substrate panel 1402. Fastener passageways 108 in the housing 3320 are utilized to secure the fitting assembly 3300 to the object to which the fitting assembly 3300 is assembled. The fastener passageways 108 may extend to the assembly surface 3315 or may terminate in a recess 3022 formed into the housing 3320. As is apparent, the assembly surface 3315 is formed by a second surface 3323 of the housing 3320. However, in some embodiments, a portion of the assembly surface 3315 may be formed by the insert 3360.

Turning to FIGS. 128 and 129, the insert 3360 is illustrated. The insert 3360 has a fluid flow path 3312 extending from the port 3361 to the tube stub 3364 as discussed above. The port 3361 extends along a longitudinal axis A-A and is symmetrical about the longitudinal axis A-A. The tube stub 3364 extends parallel to the longitudinal axis A-A and forms a part of the flow path 3312.

The insert 3360 further comprises a seal cavity 3362 and a distal surface 3363. The seal cavity 3362 is configured to receive a seal to seal the fluid flow path 3312 to a fluid flow path of a fluid flow component 200 or another fitting assembly. The distal surface 3363, in combination with the first surface 3321 of the housing 3320, collectively form the seal side mounting surface 3314 of the fitting assembly 3300. Preferably, the distal surface 3363 protrudes slightly from the first surface 3321 to ensure proper compression of a seal placed therebetween.

The insert 3360 further comprises a plurality of alignment features 3374, the alignment features 3374 engaging the recesses 3040 in the first portions 3010 of the housing 3320. The alignment features 3374 aid in positioning the insert 3360 within the housing 3320. The alignment features 3374 may be cylindrical as illustrated, or may be any other shape suitable for engaging the slots 3036 or the recesses 3040 in the first portions 3010 of the housing 3320. The port 3361 has a port outer diameter 3381 and a flange surface 3380. The port outer diameter 3381 is sized to be smaller than the port receiving walls 3033 so that the port 3361 does not interfere with the housing 3320. The flange surface 3380 engages the flange receiving surfaces 3034, preventing the insert 3360 from moving along the longitudinal axis A-A when compressed against the seal and a mating component.

FIGS. 130-133 illustrate yet another embodiment of a fitting assembly 3400 and the components which make up the fitting assembly 3400. The fitting assembly 3400 shown in FIGS. 130 and 131 comprises an insert 3460 and a housing 3320. The housing 3320 is formed of two of the first portions 3010 as discussed above. The insert 3460 has a straight configuration. Thus, a fluid flow path 3412 extends from a port 3461 to a tube stub 3464. The tube stub 3464 is configured to be joined to tubing or another fluid conducting device via welding, a compression fitting, or any other means of making a fluid-tight connection. For instance, the tube stub 3464 may be fitted with a coupling means to mechanically couple to another device. Alternately, the tube stub 3464 may simply be joined to tubing so that fluid can be routed to another location. A longitudinal axis A-A extends through the port 3461 and the tube stub 3464.

The fitting assembly 3400 comprises a seal side mounting surface 3414 formed by a first surface 3321 of the housing 3320 and a distal surface 3463 of the insert 3460. The port 3461 of the insert 3460 comprises the seal cavity 3462 to receive a seal 300. An assembly surface 3415 is opposite the seal side mounting surface 3414. The assembly surface 3415 may engage another object such as the substrate panel 1402. Fastener passageways 108 in the housing 3320 are utilized to secure the fitting assembly 3400 to the object to which the fitting assembly 3400 is assembled. The fastener passageways 108 may extend to the assembly surface 3415 or may terminate in a recess 3022 formed into the housing 3320. As is apparent, the assembly surface 3415 is formed by a second surface 3323 of the housing 3320. However, in some embodiments, a portion of the assembly surface 3415 may be formed by the insert 3460.

Turning to FIGS. 132 and 133, the insert 3460 is illustrated. The insert 3460 has a fluid flow path 3412 extending from the port 3461 to the tube stub 3464 as discussed above. The port 3461 extends along a longitudinal axis A-A and is symmetrical about the longitudinal axis A-A. The tube stub 3464 extends parallel to the longitudinal axis A-A and forms a part of the flow path 3412.

The insert 3460 further comprises a seal cavity 3462 and a distal surface 3463. The seal cavity 3462 is configured to receive a seal to seal the fluid flow path 3412 to a fluid flow path of a fluid flow component 200 or another fitting assembly. The distal surface 3463, in combination with the first surface 3321 of the housing 3320, collectively form the seal side mounting surface 3414 of the fitting assembly 3400. Preferably, the distal surface 3463 protrudes slightly from the first surface 3321 to ensure proper compression of a seal placed therebetween.

The insert 3460 further comprises an alignment feature 3474, the alignment feature 3474 engaging the recesses 3040 in the first portions 3010 of the housing 3320. The alignment feature 3474 is formed as an annular ring instead of a plurality of protuberances. The alignment feature 3474 aids in positioning the insert 3460 within the housing 3420. The alignment feature 3474 may be an annular ring as illustrated, and have any variation in cross-section as may be suitable for engaging the slots 3036 or the recesses 3040 in the first portions 3010 of the housing 3320. The alignment feature 3474 need not encircle an entirety of the insert 3460. The port 3461 has a port outer diameter 3481 and a flange surface 3480. The port outer diameter 3481 is sized to be smaller than the port receiving walls 3033 so that the port 3461 does not interfere with the housing 3320. The flange surface 3480 engages the flange receiving surfaces 3034, preventing the insert 3460 from moving along the longitudinal axis A-A when compressed against the seal and a mating component.

It is conceived that any fitting assembly, comprising any of the disclosed inserts, may be utilized in either substrate block 104 or component configuration depending on the required flow path. Indeed, it is even contemplated that a fitting assembly may form an entirety of the fluid flow component. Further, it is contemplated that two fitting assemblies may be mated to conduct fluid from a fluid flow component to a substrate block 104. It is further contemplated that two fitting assemblies may be utilized in an "inline" configuration whereby the fitting assemblies need not be joined to a substrate panel 1402 and may instead simply be joined together and supported by tubing, a component, or other method. As is apparent, the fitting assemblies may be utilized in a modular manner to enable flexible design and assembly without the need for a large number of purpose-designed fittings.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A system for processing articles, the system comprising:
  a fluid supply configured to supply a process fluid;
  a process chamber configured to process articles; and
  a fluid delivery module, the fluid delivery module comprising:
    an inlet fluidly coupled to the fluid supply;
    an outlet fluidly coupled to the process chamber;
    a flow passage extending from the inlet to the outlet;
    a substrate panel;
    a first component for controlling flow, the first component comprising a first port comprising a seal cavity, a second port comprising a seal cavity, and a first flow path extending from the first port to the second port, the first flow path forming a first portion of the flow passage;
    a plurality of substrate blocks, a first substrate block of the plurality of substrate blocks comprising a housing and an insert, the insert comprising a port and a second flow path extending from the port, the port comprising a seal cavity, the second flow path forming a second portion of the flow passage, and the insert positioned within an insert receiving cavity of the housing; and
    a seal positioned within the seal cavity of the first port of the first component and the seal cavity of the insert of the first substrate block;
  wherein the plurality of substrate blocks are in contact with the substrate panel and the first component is coupled to the substrate panel and the first substrate block, and
  wherein the port of the insert comprises a flange surface opposite a distal surface and a port outer diameter extending between the distal surface and the flange surface.

2. The system of claim 1, wherein the insert comprises an alignment feature and the insert receiving cavity comprises an alignment slot, the alignment feature positioned within the alignment slot.

3. The system of claim 1, wherein the insert comprises a collar, the collar comprising a first collar surface, an outer diameter, and a second collar surface, the second collar surface parallel to the first collar surface.

4. The system of claim 1, wherein the insert comprises a longitudinal axis, the longitudinal axis extending through a center of the port and wherein the insert extends along a longitudinal axis, the longitudinal axis aligned with the port.

5. The system of claim 1, wherein the insert further comprises a tube stub and the insert receiving cavity comprises an entry portion and an insert portion.

6. The system of claim 5, wherein the tube stub extends through the entry portion of the insert receiving cavity.

7. The system of claim 5, wherein the insert comprises a longitudinal axis and wherein the entry portion of the insert receiving cavity constrains motion of the insert about the longitudinal axis.

8. A system for processing articles, the system comprising:
  a fluid supply configured to supply a process fluid;
  a process chamber configured to process articles; and
  a fluid delivery module, the fluid delivery module comprising:
    an inlet fluidly coupled to the fluid supply;
    an outlet fluidly coupled to the process chamber;
    a flow passage extending from the inlet to the outlet;
    a substrate panel;
    a first component for controlling flow, the first component comprising a housing comprising an insert receiving cavity, an insert located within the insert receiving cavity, the insert comprising a first port, the first port comprising an insert seal cavity, the insert seal cavity comprising a circumferential groove, the first component further comprising a second port comprising a seal cavity and a first flow path extending from the first port to the second port, the first flow path forming a first portion of the flow passage;
    a plurality of substrate blocks, a first substrate block of the plurality of substrate blocks comprising a block seal cavity and a second flow path, the second flow path forming a second portion of the flow passage, the block seal cavity comprising a block port and a circumferential groove extending around the block port; and
    a seal positioned within the insert seal cavity and the block seal cavity, wherein the seal comprises a first flange extending into the circumferential groove of the insert seal cavity and a second flange extending into the circumferential groove of the block seal cavity;
  wherein the plurality of substrate blocks are in contact with the substrate panel and the first component is coupled to the substrate panel and the first substrate block.

9. The system of claim 8, wherein the insert receiving cavity comprises a flange receiving surface, a first collar receiving surface, and a perimeter surface extending between the flange receiving surface and the first collar receiving surface, each of the flange receiving surface, the first collar receiving surface, and the perimeter surface in physical contact with the insert; and wherein the insert further comprises a collar, the flange receiving surface receives a flange surface of the first port of the insert, the first collar receiving surface receives a first collar surface of the collar, and the perimeter surface receives an outer diameter of the insert, the outer diameter of the insert extending from the first collar surface of the collar to the flange surface of the first port.

10. The system of claim 8, wherein the insert receiving cavity comprises an entry portion and an insert portion, a portion of the first flow path extends through the entry portion of the insert receiving cavity.

11. The system of claim 10, wherein the insert comprises a longitudinal axis and wherein the entry portion of the insert receiving cavity constrains motion of the insert about the longitudinal axis.

12. The system of claim 8, wherein the port of the insert comprises a flange surface opposite a distal surface and a port outer diameter extending between the distal surface and the flange surface.

13. The system of claim 8, wherein the insert comprises an alignment feature and the insert receiving cavity comprises an alignment slot, the alignment feature positioned within the alignment slot.

14. A fluid delivery module, comprising:
an inlet configured to be placed in fluid communication with a fluid supply;
an outlet configured to be placed in fluid communication with a process chamber;
a flow passage extending from the inlet to the outlet;
a substrate panel;

a flow control component for controlling flow in the flow passage, the flow control component comprising:
a first port comprising a component seal cavity;
a second port; and
a component flow path extending from the first port to the second port, the component flow path forming a portion of the flow passage;
a first substrate block mounted to the substrate panel, the first substrate block comprising:
a housing comprising an insert receiving cavity; and
an insert positioned in the insert receiving cavity, the insert comprising:
an insert seal cavity; and
an insert flow path, the insert flow path forming a portion of the flow passage;
a second substrate block mounted to the substrate panel, wherein the flow control component is mounted to the first substrate block and the second substrate block; and
a seal positioned within the component seal cavity and the insert seal cavity.

15. The fluid delivery module of claim 14, wherein the component seal cavity comprises a circumferential groove, wherein the insert seal cavity comprises a circumferential groove, wherein the seal comprises a first flange extending into the circumferential groove of the component seal cavity, and wherein the seal comprises a second flange extending into the circumferential groove of the insert seal cavity.

* * * * *